US012677591B2

(12) United States Patent
Fluegge et al.

(10) Patent No.: US 12,677,591 B2
(45) Date of Patent: Jul. 7, 2026

(54) ORGANIC ELECTROLUMINESCENT DEVICE

(71) Applicant: Samsung Display Co., Ltd., Yongin-si (KR)

(72) Inventors: Harald Fluegge, Karlsruhe (DE); Sandra Bonus, Cologne (DE); Christian Kasparek, Heidelberg (DE)

(73) Assignee: Samsung Display Co., Ltd., Yongin-si (KR)

( * ) Notice: Subject to any disclaimer, the term of this patent is extended or adjusted under 35 U.S.C. 154(b) by 989 days.

(21) Appl. No.: 17/821,611

(22) Filed: Aug. 23, 2022

(65) Prior Publication Data

US 2023/0033974 A1 Feb. 2, 2023

Related U.S. Application Data

(63) Continuation of application No. 16/814,083, filed on Mar. 10, 2020, now Pat. No. 11,462,692.

(30) Foreign Application Priority Data

Mar. 21, 2019 (EP) .................................... 19164281

(51) Int. Cl.

*H01L 51/00* (2006.01)
*C09K 11/06* (2006.01)
*H10K 85/60* (2023.01)
*H10K 50/11* (2023.01)
*H10K 101/10* (2023.01)

(52) U.S. Cl.

CPC ............ *H10K 85/654* (2023.02); *C09K 11/06* (2013.01); *H10K 85/626* (2023.02); *H10K 85/6572* (2023.02); *C09K 2211/1018* (2013.01); *H10K 50/11* (2023.02); *H10K 2101/10* (2023.02)

(58) Field of Classification Search

None

See application file for complete search history.

(56) References Cited

U.S. PATENT DOCUMENTS

| | | | | |
|---|---|---|---|---|
| 10,177,330 | B2 | 1/2019 | Pieh et al. | |
| 10,263,196 | B2 | 4/2019 | Danz et al. | |
| 10,411,211 | B2 | 9/2019 | Tsukamoto et al. | |
| 10,998,506 | B2 | 5/2021 | Xia | |
| 11,329,244 | B2 | 5/2022 | Li et al. | |
| 11,462,692 | B2 * | 10/2022 | Fluegge | H10K 85/6572 |
| 11,508,927 | B2 | 11/2022 | Duan et al. | |
| 11,637,245 | B2 | 4/2023 | Duan et al. | |
| 2014/0167027 | A1 | 6/2014 | Yersin et al. | |
| 2015/0236274 | A1 | 8/2015 | Hatakeyama et al. | |
| 2016/0315274 | A1 | 10/2016 | Lennartz et al. | |
| 2017/0077418 | A1 | 3/2017 | Stoessel et al. | |
| 2018/0182980 | A1 | 6/2018 | Lennartz et al. | |
| 2018/0309069 | A1 | 10/2018 | Xie | |
| 2018/0323395 | A1 * | 11/2018 | Haldi | H10K 50/82 |
| 2019/0207112 | A1 | 7/2019 | Hatakeyama et al. | |
| 2019/0341571 | A1 | 11/2019 | Liaptsis et al. | |
| 2020/0035922 | A1 | 1/2020 | Ogiwara et al. | |
| 2020/0052212 | A1 | 2/2020 | Tasaki et al. | |
| 2020/0203617 | A1 | 6/2020 | Duan et al. | |

FOREIGN PATENT DOCUMENTS

| | | | |
|---|---|---|---|
| CN | 105720200 | A | 6/2016 |
| CN | 106972109 | A | 7/2017 |
| CN | 108352455 | A | 7/2018 |
| CN | 109192874 | A | 1/2019 |
| CN | 109411633 | A | 3/2019 |
| CN | 109411634 | A | 3/2019 |
| CN | 109422770 | A | 3/2019 |
| EP | 3 666 779 | A1 | 6/2020 |
| WO | WO 2015/135624 | A1 | 9/2015 |
| WO | WO 2017/005699 | A1 | 1/2017 |
| WO | WO 2017/188111 | A1 * | 11/2017 |
| WO | WO 2018/181188 | A1 | 10/2018 |
| WO | WO 2018/186404 | A1 | 10/2018 |

OTHER PUBLICATIONS

Hatakeyama et al. (Advanced Materials, 2016, 28(14):2777-2781,DOI:10.1002/adma.201505491.

Kondakov (Philosophical Transactions of the Royal Society A: Mathematical, Physical and Engineering Sciences, 2015, 373:20140321.

Okinaka et al., Society for Information Display International Symposium Digest of Technical Papers, 2015, 46 (1):312-315,DOI:10.1002/sdtp.10480.

Zysman-Colman et al. (Advance Materials, 2017, 29(22): 1605444, DOI:10.1002/adma.201605444).

* cited by examiner

*Primary Examiner* — Tae H Yoon

(74) *Attorney, Agent, or Firm* — Womble Bond Dickinson (US) LLP

(57) ABSTRACT

The present invention relates to organic electroluminescent devices comprising a light-emitting layer B comprising a triplet-triplet annihilation (TTA) material, a thermally activated delayed fluorescence (TADF) material and a near-range-charge-transfer (NRCT) emitter material, which exhibits a narrow—expressed by a small full width at half maximum (FWHM)—emission. Further, the present invention relates to a method for obtaining a desired light spectrum and achieving suitable (long) lifespans of an organic electroluminescent device according to the present invention.

19 Claims, 1 Drawing Sheet

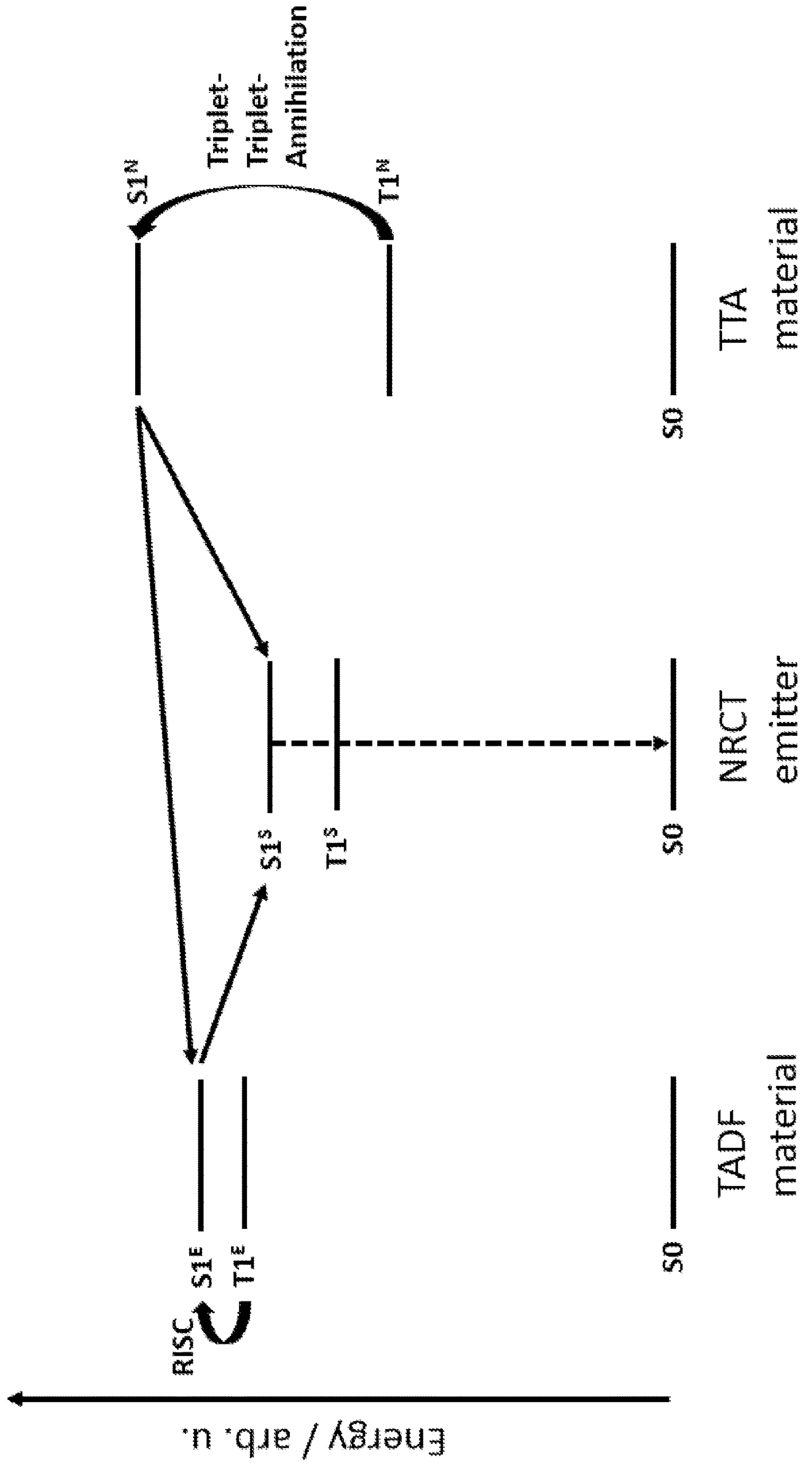
Triplet-
Triplet-
Annihilation
S1N
T1N
S0
TTA
material
S1S
T1S
S0
NRCT
emitter
S1E
T1E
RISC
S0
TADF
material
Energy / arb. u.

ORGANIC ELECTROLUMINESCENT DEVICE

CROSS-REFERENCE TO RELATED APPLICATION

This application is a continuation of U.S. patent application Ser. No. 16/814,083, filed Mar. 10, 2020, now U.S. Pat. No. 11,462,692, which claims priority to and the benefit of European Patent Application No. 19164281.8, filed on Mar. 21, 2019, the entire contents of which are incorporated herein by reference.

BACKGROUND

The present invention relates to organic electroluminescent devices comprising a light-emitting layer B comprising a triplet-triplet annihilation (TTA) material, a thermally activated delayed fluorescence (TADF) material and a near-range charge transfer (NRCT) emitter material, which exhibits a narrow—expressed by a small full width at half maximum (FWHM)—emission. Further, the present invention relates to a method for obtaining a desired light spectrum and achieving suitable (long) lifespans of an organic electroluminescent device according to the present invention.

BRIEF DESCRIPTION OF THE DRAWING

The accompanying drawing shows an example of the relation between the energy levels of the TADF material, the NRCT emitter and the TTA material.

DESCRIPTION

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as e.g. screens, displays and illumination devices. In contrast to most electroluminescent devices essentially based on inorganics, organic electroluminescent devices based on organics are often rather flexible and producible in particularly thin layers. The OLED-based screens and displays already available today bear particularly beneficial brilliant colors, contrasts and are comparably efficient with respect to their energy consumption.

A central element of an organic electroluminescent device for generating light is a light-emitting layer placed between an anode and a cathode. When a voltage (and current) is applied to an organic electroluminescent device, holes and electrons are injected from an anode and a cathode, respectively, to the light-emitting layer. Typically, a hole transport layer is located between light-emitting layer and the anode, and an electron transport layer is located between light-emitting layer and the cathode. The different layers are sequentially disposed. Excitons of high energy are then generated by recombination of the holes and the electrons. The decay of such excited states (e.g., singlet states such as S1 and/or triplet states such as T1) to the ground state (S0) desirably leads to light emission.

In order to enable efficient energy transport and emission, an organic electroluminescent device comprises one or more host compounds and one or more emitter compounds as dopants. Challenges when generating organic electroluminescent devices are thus the improvement of the illumination level of the devices (i.e., brightness per current), obtaining a desired light spectrum and achieving suitable (long) lifespans.

There were attempts to improve photophysical properties of electroluminescent devices by means of combining different material with each other. WO 2018/181188 describes the combination of a TADF material with another compound that has a lower first singlet state S1 than the TADF material. WO 2018/186404 describes the use of a dopant and two further compounds selected from a large list of compounds with different structural properties in layers. These prior art documents, however, do not teach optimized combinations of photoactive materials combined in a single emitting layer.

WO 2015/135624 teaches an OLED which comprises a TADF material in combination with a sterically shielded fluorescent compound. WO 2015/135624 does neither teach beneficial relations between singlet energy states of different optically active materials nor the combination of specific types of emitter materials with other optically active materials such as triplet-triplet annihilation materials. The specific examples disclosed in WO 2015/135624 as shown in Table 2 thereof refer to materials having less beneficial optical properties such as emission maxima at longer wavelengths in the green or yellow range of the spectrum (emission maximum at >500 nm) and TADF materials bearing singlet energy levels below that of the other optically active materials.

There is still a need for efficient and stable OLEDs that emit in the blue region of the visible light spectrum, which would be expressed by a small CIEy value. Accordingly, there is still the unmet technical need for organic electroluminescent devices which have a long lifetime, in particular in the blue range.

An interesting parameter is the onset of the emission of the emitter expressed by the S1 energy. High energy photons, particularly in combination with further polarons or excited states, may lead to degradation of the organic materials, if the bond dissociation energy (BDE) of the weakest bond is exceeded. As a consequence, the S1 energy of the emitter contributing the main component of the emission should be as low as possible and thus an emitter with a small FWHM needs to be employed for blue emissive OLEDs. In addition, other materials—such as the host materials—should not contribute to the emission, as the S1 energy of the host needs to be even higher in energy than the one of the emitters to avoid quenching. Consequently, an efficient energy transfer from all materials within the emission layer to the emitter material is required.

Within the organic electroluminescent device comprising the triplet-triplet annihilation material, the TADF material and the NRCT emitter material, an effective extension of the lifetime of the organic electroluminescent device is achieved.

Surprisingly, it has been found that an organic electroluminescent device's light-emitting layer comprising a triplet-triplet annihilation material, a thermally activated delayed fluorescence (TADF) material and a near-range charge transfer NRCT emitter material, which exhibits a narrow—expressed by a small full width at half maximum (FWHM)—blue emission, provides an organic electroluminescent device having good lifetime and quantum yields and exhibiting blue emission. Herein, the main emission of the device occurs from the near-range charge transfer (NRCT) emitter. The combination of thermally activated fluorescence and triplet-triplet annihilation bears unexpected technical advantages as has been shown experimentally.

Surprisingly, energy transfer within the device is nevertheless sufficient enough to yield a blue emission with small FWHM and thus a low CIEy color coordinate.

Accordingly, one aspect of the present invention relates an organic electroluminescent device comprising a light-emitting layer B comprising:

(i) a triplet-triplet annihilation (TTA) material $H^N$, which has a lowermost excited singlet state energy level $S1^N$, a lowermost excited triplet state energy level $T1^N$, (ii) a thermally activated delayed fluorescence (TADF) material $E^B$, which has a lowermost excited singlet state energy level $S1^E$ and a lowermost excited triplet state energy level $T1^E$; and (iii) an organic near-range-charge-transfer (NRCT) emitter $S^B$, which has a lowermost excited singlet state energy level $S1^S$ and a lowermost excited triplet state energy level $T1^S$, wherein the relations expressed by the following formulas (1) to (3) apply:

$$S1^E > S1^S \quad (1)$$

$$S1^N > S1^S \quad (2)$$

$$S1^S < 2.95\ \text{eV} \quad (3).$$

According to the invention, the lowermost excited singlet state of the TADF material $E^B$ is higher in energy than the lowermost excited singlet state of $S^B$.

The lowermost excited singlet state of the host material $H^N$ is higher in energy than the organic near-range-charge-transfer (NRCT) emitter $S^B$.

In one embodiment, the lowermost excited singlet state of the host material $H^N$ is higher in energy than the lowermost excited singlet state of the TADF material $E^B$.

The lowermost excited singlet state of $S^B$, i.e. the onset of the emission spectrum of $S^B$, is smaller than 2.95 eV, preferably smaller than 2.90 eV, more preferably smaller than 2.85 eV, even more preferably smaller than 2.80 eV or even smaller than 2.75 eV.

Surprisingly it was found, that the main contribution to the emission band of the optoelectronic device according to the invention can be attributed to the emission of $S^B$ indicating a sufficient transfer of energy transfer from $E^B$ to $S^B$ and from the triplet-triplet annihilation material $H^N$ to $E^B$ and/or $S^B$.

The accompanying drawing shows an example of the relation between the energy levels of the TADF material, the NRCT emitter and the TTA material. S0 represents the ground state. The curved arrow at the TADF material illustrates the reversed intersystem crossing (RISC) from the lowermost excited triplet state energy level T1E of the TADF material to the lowermost excited singlet state energy level S1E of the TADF material.

The curved arrow at the TTA material illustrates the triplet-triplet annihilation from the lowermost excited triplet state energy level $T1^N$ of the TTA material to the lowermost excited singlet state energy level $S1^N$ of the TTA material.

The dashed arrow at the NRCT emitter illustrates the emission from the lowermost excited singlet state energy level $S1^S$.

Solid lines illustrate energy transfer processes between different lowermost excited singlet states S1. In detail, an energy transfer from $S1^N$ to either $S1^E$ or $S1^S$, and the energy transfer from $S1^E$ to $S1^S$.

In one embodiment of the invention, the TADF material, the NRCT emitter and the TTA material are combined in a single light emitting layer B. Therefore, in the light emitting layer B, the TADF material, the NRCT emitter and the TTA material are preferably distributed in an (essentially) randomized mixture. In other words, the TADF material, the NRCT emitter and the TTA material do preferably not form distinguishable layers. In one embodiment of the invention, the TADF material, the NRCT emitter and the TTA material are admixed with each other in a single light emitting layer B. In one embodiment of the invention, the light emitting layer B is obtained from a mixture or co-deposition of the TADF material, the NRCT emitter and the TTA material and optional one or more further materials.

In one embodiment of the invention, twice the energy of the lowermost excited triplet state energy level $T1^N$ of the TTA material is larger than the energy of the lowermost excited singlet state energy level $S1^S$ of the NRCT emitter, i.e., $2\times T1^N > S1^S$.

In one embodiment of the invention, the energy difference between the lowermost excited singlet state energy level $S1^E$ of the TADF material and the lowermost excited singlet state energy level $S1^S$ of the NRCT emitter fulfills the relation:

$0.0\ \text{eV} \leq S1^E - S1^S \leq 0.4$ eV, preferably $0.0\ \text{eV} \leq S1^E - S1^S \leq 0.3$ eV.

In one embodiment of the invention, the absolute value of the difference between the lowermost excited triplet state energy level $T1^E$ of the TADF material and the lowermost excited singlet state energy level $S1^S$ of the NRCT emitter fulfills the relation: $T1^E > S1^S$. In one embodiment of the invention, the absolute value of the difference between the lowermost excited triplet state energy level $T1^E$ of the TADF material and the lowermost excited singlet state energy level $S1^S$ of the NRCT emitter fulfills the relation: $0.0\ \text{eV} \leq |T1^E - S1^S| \leq 0.3$ eV In one embodiment of the invention, the absolute value of the difference between the lowermost excited triplet state energy level $T1^E$ of the TADF material and the lowermost excited triplet state energy level $T1^S$ of the NRCT emitter fulfills the relation: $T1^E > T1^S$. In one embodiment of the invention, the absolute value of the difference between the lowermost excited triplet state energy level $T1^E$ of the TADF material and the lowermost excited triplet state energy level $T1^S$ of the NRCT emitter fulfills the relation: $0.0\ \text{eV} \leq |T1^E - T1^S| \leq 0.5$ eV In one embodiment of the invention, the energy of the lowermost excited triplet state energy level $T1^E$ of the TADF material is larger than the energy of the lowermost excited triplet state energy level $T1^N$ of the TTA material, i.e., $T1^E > T1^N$.

In one embodiment of the invention, the energy of the lowermost excited triplet state energy level $T1^S$ of the NRCT emitter is larger than the energy of the lowermost excited triplet state energy level $T1^N$ of the TTA material, i.e., $T1^S > T1^N$.

In one embodiment of the invention, the energy of the lowermost excited triplet state energy level $T1^E$ of the TADF material is larger than the energy of the lowermost excited triplet state energy level $T1^S$ of the NRCT emitter, i.e., $T1^E > T1^S$.

In one embodiment of the invention, the difference between the lowermost excited singlet state energy level $S1^N$ of the TTA material and the lowermost excited singlet state energy level $S1^S$ of the NRCT emitter fulfills the relation: $0.0\ \text{eV} \leq S1^N - S1^S \leq 0.8$ eV.

In one embodiment of the invention, the difference between the lowermost excited singlet state energy level $S1^N$ of the TTA material and the lowermost excited singlet state energy level $S1^S$ of the NRCT emitter fulfills the relation: $0.0\ \text{eV} \leq S1^N - S1^S \leq 0.4$ eV.

In one embodiment of the invention, the lowermost excited singlet state energy level $S1^N$ of the TTA material, the lowermost excited singlet state energy level $S1^E$ of the TADF material, and the lowermost excited singlet state energy level $S1^S$ of the NRCT emitter fulfill the relation: $S1^N > S1^E > S1^S$.

In one embodiment of the invention, the lowermost excited singlet state energy level $S1^N$ of the TTA material, the lowermost excited singlet state energy level $S1^E$ of the TADF material, and the lowermost excited singlet state energy level $S1^S$ of the NRCT emitter fulfill the relation: $S1^N > S1^E > S1^S$, wherein $$0.0\ \text{eV} \le S1^N - S1^S \le 0.8\ \text{eV}.$$

In one embodiment of the invention, the lowermost excited singlet state energy level $S1^N$ of the TTA material, the lowermost excited singlet state energy level $S1^E$ of the TADF material, and the lowermost excited singlet state energy level $S1^S$ of the NRCT emitter fulfill the relation: $S1^N > S1^E > S1^S$, wherein $$0.0\ \text{eV} \le S1^N - S1^S \le 0.4\ \text{eV}.$$

In one embodiment of the invention, $T1^E > S1^S$.

In one embodiment of the invention, the lowermost excited singlet state energy level $S1^N$ of the TTA material, the lowermost excited triplet state energy level $T1^E$ of the TADF material, and the lowermost excited singlet state energy level $S1^S$ of the NRCT emitter fulfill the relation: $S1^N > T1^E > S1^S$.

In one embodiment of the invention, the lowermost excited singlet state energy level $S1^N$ of the TTA material, the lowermost excited triplet state energy level $T1^E$ of the TADF material, and the lowermost excited singlet state energy level $S1^S$ of the NRCT emitter fulfill the relation: $S1^N > T1^E > S1^S$, wherein $$0.0\ \text{eV} \le S1^N - S1^S \le 0.8\ \text{eV}.$$

In one embodiment of the invention, the lowermost excited singlet state energy level $S1^N$ of the TTA material, the lowermost excited triplet state energy level $T1^E$ of the TADF material, and the lowermost excited singlet state energy level $S1^S$ of the NRCT emitter fulfill the relation: $S1^N > T1^E > S1^S$, wherein $$0.0\ \text{eV} \le S1^N - S1^S \le 0.4\ \text{eV}.$$

In one embodiment of the invention, the lowermost excited singlet state energy level $S1^N$ of the TTA material, the lowermost excited triplet state energy level $T1^E$ of the TADF material, and the lowermost excited singlet state energy level $S1^S$ of the NRCT emitter fulfill the relation: $S1^N > T1^E > S1^S$, wherein $$0.0\ \text{eV} \le S1^N - S1^S \le 0.4\ \text{eV, and } 0.0\ \text{eV} \le |T1^E - S1^S| \le 0.3\ \text{eV}.$$

In one embodiment of the invention, $T1^E > T1^N$. In one embodiment of the invention, $S1^S > T1^N$. In one embodiment of the invention, $T1^S > T1^N$. In one embodiment of the invention, $T1^E > T1^S > T1^N$.

In one embodiment of the invention, $S1^N > S1^E > T1^E > S1^S > T1^S > T1^N$.

In one embodiment of the invention, the energetic difference between $S1^E$ and $T1^E$ ($\Delta(S1^E - T1^E)$, $\Delta E_{ST}$ value (E)) is smaller than the energetic difference between $S1^N$ and $T1^N$ ($\Delta(S1^N - T1^N)$, $\Delta E_{ST}$ value (N)). In one embodiment of the invention, $\Delta(S1^N - T1^N)$ is at least 1.5 fold, at least 2 fold, at least 3 fold, at least 4 fold or at least 5 fold larger than $\Delta(S1^E - T1^E)$.

In one embodiment of the invention, the energetic difference between $S1^S$ and $T1^S$ ($\Delta(S1^S - T1^S)$, $\Delta E_{ST}$ value (S)) is smaller than $\Delta(S1^N - T1^N)$. In one embodiment of the invention, $\Delta(S1^N - T1^N)$ is at least 1.5 fold, at least 2 fold, at least 3 fold, at least 4 fold or at least 5 fold larger than $\Delta(S1^S - T1^S)$.

In one embodiment of the invention, $\Delta(S1^E - T1^E) < \Delta(S1^S - T1^S)$.

In one embodiment of the invention, $\Delta(S1^E - T1^E) < \Delta(S1^S - T1^S) < \Delta(S1^N - T1^N)$.

In one embodiment of the invention, $\Delta(S1^E - T1^E) < \Delta(S1^S - T1^S) < \Delta(S1^N - T1^N)$, wherein $\Delta$ $(S1^N - T1^N)$ is at least 1.5 fold, at least 2 fold, at least 3 fold, at least 4 fold or at least 5 fold larger than $\Delta(S1^S - T1^S)$.

In a preferred embodiment, $S1^N$ is in the range of from 1 to 5 eV, from 1.2 to 4 eV, from 1.4 to 3.8 eV, from 1.4 to 1.8 eV, from 1.6 to 2.0 eV, from 1.8 to 2.2 eV, from 2.0 to 2.5 eV, from 2.0 to 3.5 eV, from 2.5 to 3.5 eV, or from 2.8 to 4.0 eV. In a preferred embodiment, $S1^N$ is in the range of from 3.0 to 3.5 eV or from 3.1 to 3.2 eV.

In a preferred embodiment, the emission of the organic electroluminescent device mainly occurs from the NRCT emitter. In other words, the TTA material and/or the TADF material preferably transfer energy to the NRCT emitter and the NRCT emitter emits light.

The triplet-triplet annihilation (TTA) material $H^N$ has a highest occupied molecular orbital HOMO($H^N$) having an energy $E^{HOMO}(H^N)$ and a lowest unoccupied molecular orbital LUMO($H^N$) having an energy $E^{LUMO}(H^N)$.

The TTA material enables triplet-triplet annihilation. Triplet-triplet annihilation may preferably result in a photon upconversion. Accordingly, two, three or even more photons may facilitate photon upconversion from the lowermost excited triplet state ($T1^N$) to the first excited singlet state $S1^N$ of the TTA material $H^N$. In a preferred embodiment, two photons facilitate photon upconversion from $T1^N$ to $S1^N$. Triplet-triplet annihilation may thus be a process that through a number of energy transfer steps, may combine two (or optionally more than two) low frequency photons into one photon of higher frequency.

Optionally, the TTA material may comprise an absorbing moiety, the sensitizer moiety, and an emitting moiety (or annihilator moiety). In this context, an emitter moiety may, for example, be a polycyclic aromatic moiety such as, benzene, biphenyl, triphenyl, triphenylene, naphthalene, anthracene, phenalene, phenanthrene, fluorene, pyrene, chrysene, perylene, azulene. In a preferred embodiment, the polycyclic aromatic moiety comprises an anthracene moiety or a derivative thereof. A sensitizer moiety and an emitting moiety may be located in two different chemical compounds (i.e., separated chemical entities) or may be both moieties embraced by one chemical compound.

In a preferred embodiment, the TTA material of the present invention at least comprises or is the TTA emitter moiety. The TTA material may optionally, but not necessarily, also comprise the sensitizer moiety—either also two separate chemical compounds or combined with each other in a single compound. When the TTA material does not comprise the sensitizer moiety, another compound present in the electroluminescent device may provide such properties.

The thermally activated delayed fluorescence (TADF) material $E^B$ has a highest occupied molecular orbital HOMO ($E^B$) having an energy $E^{HOMO}(E^B)$ and a lowest unoccupied molecular orbital LUMO($E^B$) having an energy $E^{LUMO}(E^B)$.

In one embodiment of the invention, the lowest unoccupied molecular orbital LUMO($E^B$) of the TADF material, having an energy $E^{LUMO}(E^B)$, and the lowest unoccupied molecular orbital LUMO($H^N$) of the TTA material, having an energy $E^{LUMO}(H^N)$, fulfill the relation:

$$E^{LUMO}(E^B)<E^{LUMO}(H^N)$$

In one embodiment of the invention, the highest occupied molecular orbital HOMO($H^N$) of the TTA material, having an energy $E^{HOMO}(H^N)$, and the highest occupied molecular orbital HOMO($E^B$) of the TADF material having an energy $E^{HOMO}(E^B)$, fulfill the relation:

$$E^{HOMO}(H^N)>E^{HOMO}(E^B)$$

According to the invention, a triplet-triplet annihilation (TTA) material may convert energy from first excited triplet states $T1^N$ to first excited singlet states $S1^N$ by triplet-triplet annihilation.

According to the present invention, a TTA material is characterized in that it exhibits triplet-triplet annihilation from the lowermost excited triplet state ($T1^N$) resulting in a triplet-triplet annihilated first excited singlet state $S1^N$, having an energy of up to two times the energy of $T1^N$.

In one embodiment of the present invention, a TTA material may be characterized in that it exhibits triplet-triplet annihilation from $T1^N$ resulting in $S1^N$, having an energy of 1.01 to 2 fold, 1.1 to 1.9 fold, 1.2 to 1.5 fold, 1.4 to 1.6 fold, or 1.5 to 2 fold times the energy of $T1^N$.

As used herein, the terms "TTA material" and "TTA compound" may be understood interchangeably.

Typical "TTA material" can be found in the state of the art related to blue fluorescent OLEDs, as described by Kondakov (Philosophical Transactions of the Royal Society A: Mathematical, Physical and Engineering Sciences, 2015, 373:20140321). Such blue fluorescent OLEDs employ aromatic hydrocarbons such as anthracene derivatives as the main component (host) in the EML.

In a preferred embodiment, the TTA material enables sensitized triplet-triplet annihilation. Optionally, the TTA material may comprise one or more polycyclic aromatic structures. In a preferred embodiment, the TTA material comprises at least one polycyclic aromatic structure and at least one further aromatic residue.

In a preferred embodiment, the TTA material bears larger singlet-triplet energy splitting, i.e., an energy difference between its first excited singlet state $S1^N$ and its lowermost excited triplet state $T1^N$ of at least 1.1 fold, at least 1.2 fold, at least 1.3 fold, at least 1.5 fold and preferably not more than 2 fold.

In a preferred embodiment of the invention, $H^N$ is an anthracene derivative.

In one embodiment, $H^N$ is an anthracene derivate as described in WO 2018/186404 (in particular pages 71 to 95 thereof).

In one embodiment, $H^N$ is an anthracene derivate of the following formula (4)

(4)

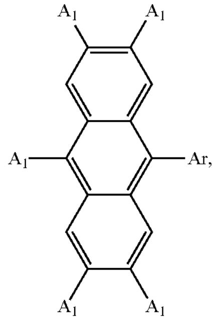

wherein each Ar is independently from each other selected from the group consisting of $C_6$-$C_{60}$-aryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl;

and $C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and each $A_1$ is independently from each other selected from the group consisting of consisting of hydrogen;

deuterium;

$C_6$-$C_{60}$-aryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; $C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and $C_1$-$C_{40}$-(hetero)alkyl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

In one embodiment, $H^N$ is an anthracene derivate of the following formula (4), wherein each Ar is independently from each other selected from the group consisting of $C_6$-$C_{20}$-aryl, which is optionally substituted with one or more residues selected from the group consisting of $C_6$-$C_{20}$-aryl, $C_3$-$C_{20}$-heteroaryl, halogen, and $C_1$-$C_{210}$-(hetero)alkyl;

and $C_3$-$C_{20}$-heteroaryl, which is optionally substituted with one or more residues selected from the group consisting of $C_6$-$C_{20}$-aryl, $C_3$-$C_{20}$-heteroaryl, halogen, and $C_1$-$C_1$-(hetero)alkyl; and each $A_1$ is independently from each other selected from the group consisting of consisting of hydrogen, deuterium, $C_6$-$C_{20}$-aryl, which is optionally substituted with one or more residues selected from the group consisting of $C_6$-$C_{20}$-aryl, $C_3$-$C_{20}$-heteroaryl, halogen, and $C_1$-$C_{10}$-(hetero)alkyl, $C_3$-$C_{20}$-heteroaryl, which is optionally substituted with one or more residues selected from the group consisting of $C_6$-$C_{20}$-aryl, $C_3$-$C_{20}$-heteroaryl, halogen, and $C_1$-$C_{10}$-(hetero)alkyl; and $C_1$-$C_{10}$-(hetero)alkyl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

In one embodiment, $H^N$ is an anthracene derivate of the following formula (4), wherein at least one of $A_1$ is hydrogen. In one embodiment, $H^N$ is an anthracene derivate of the following formula (4), wherein at least two of $A_1$ are hydrogen. In one embodiment, $H^N$ is an anthracene derivate of the following formula (4), wherein at least three of $A_1$ are hydrogen. In one embodiment, $H^N$ is an anthracene derivate of the following formula (4), wherein all of $A_1$ are each hydrogen.

In one embodiment, $H^N$ is an anthracene derivate of the following formula (4), wherein one of Ar is a residue selected from the group consisting of phenyl, naphthyl, phenanthryl, pyrenyl, triphenylenyl, dibenzoanthracenyl, fluorenyl, benzofluorenyl, anthracenyl, phenanthrenyl, benzonaphtofuranyl, benzonaphtothiopehnyl, dibenzofuranyl, dibenzothiopehnyl, which may be each optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

In one embodiment, $H^N$ is an anthracene derivate of the following formula (4), wherein both Ar are residues each independently from each other selected from the group consisting of phenyl, naphthyl, phenanthryl, pyrenyl, triphenylenyl, dibenzoanthracenyl, fluorenyl, benzofluorenyl, anthracenyl, phenanthrenyl, benzonaphtofuranyl, benzonaphtothiopehnyl, dibenzofuranyl, dibenzothiopehnyl, which may be each optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

In one embodiment, $H^N$ is an anthracene derivate selected from the following:

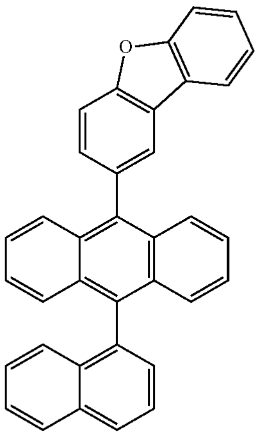

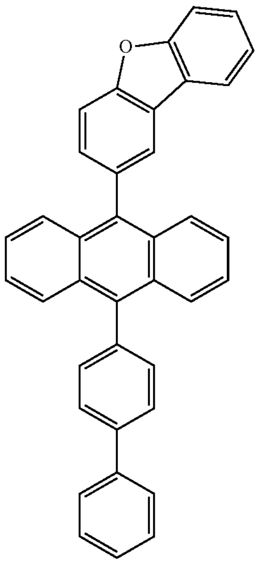

-continued

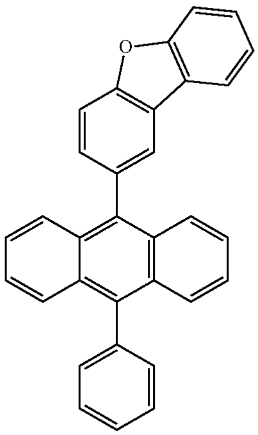

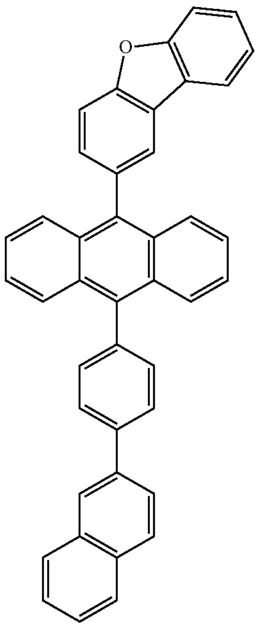

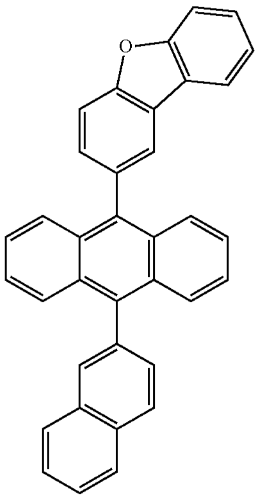

-continued
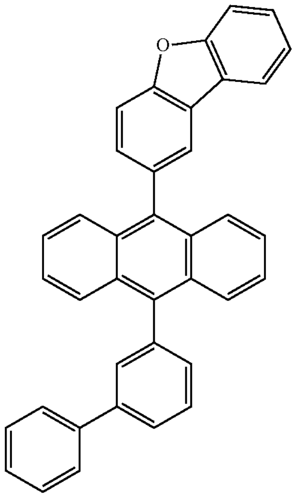
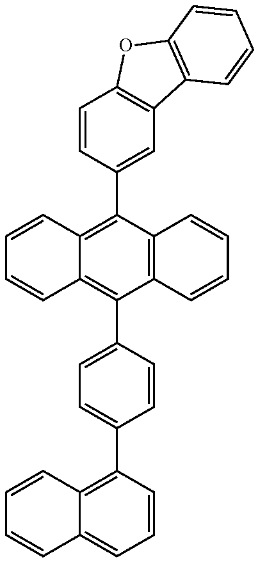
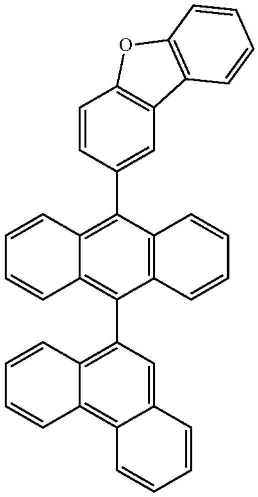
-continued
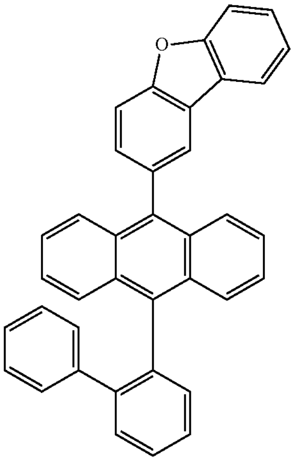
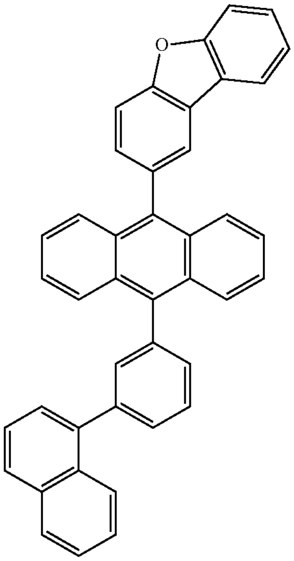
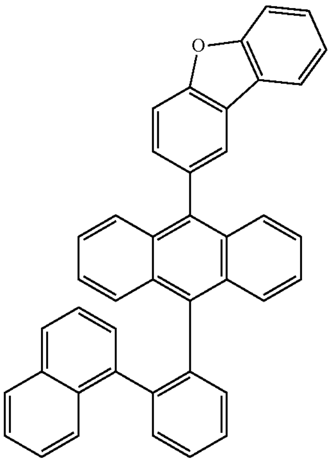

-continued
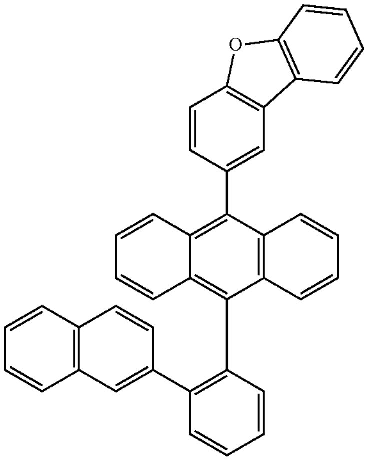
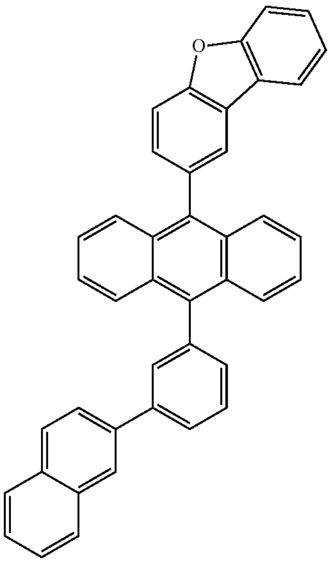
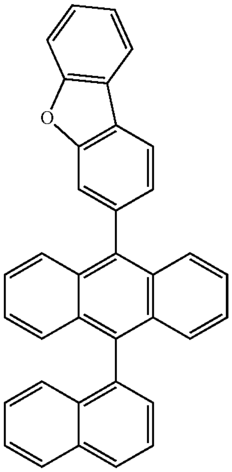
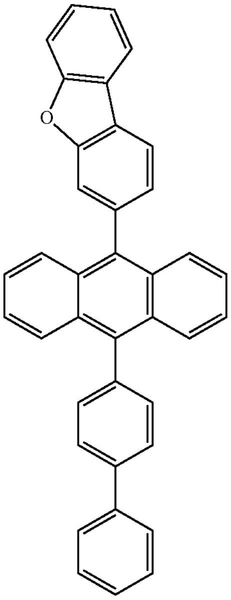
-continued
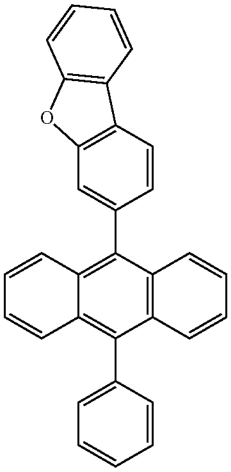
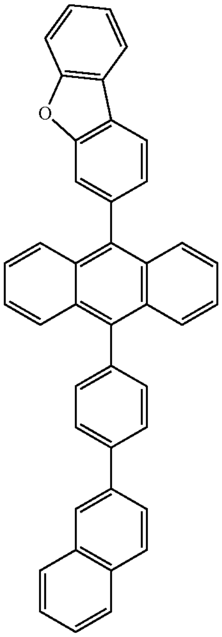
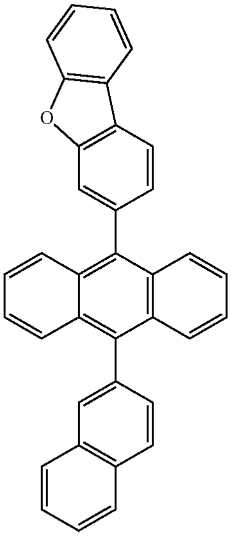
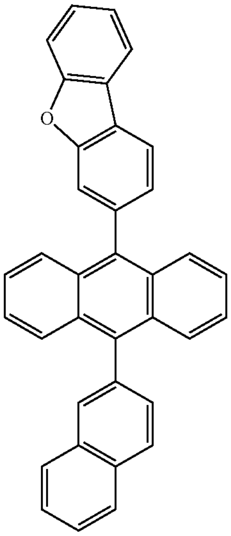

-continued
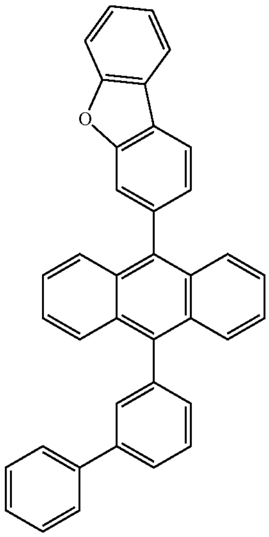
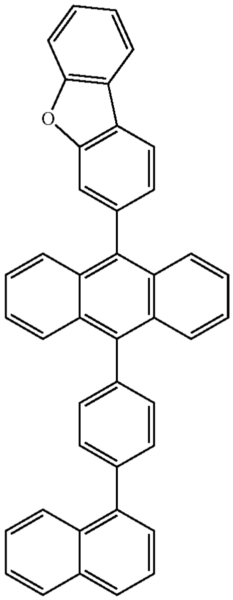
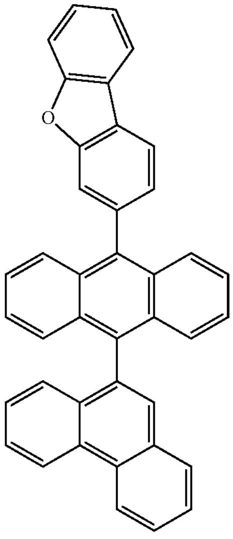
-continued
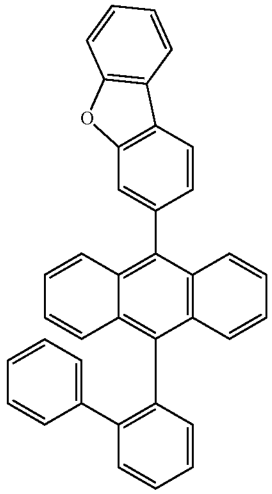
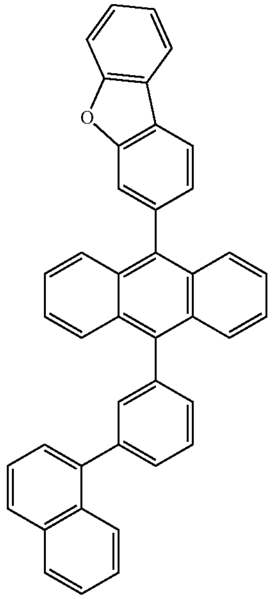
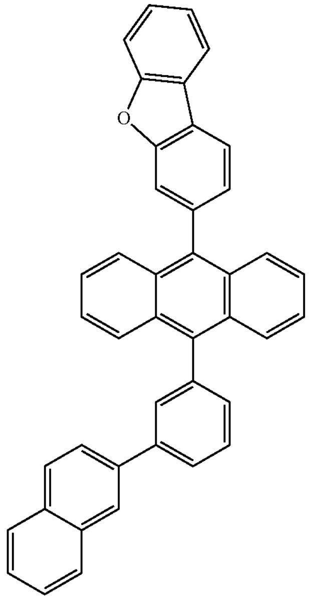

-continued
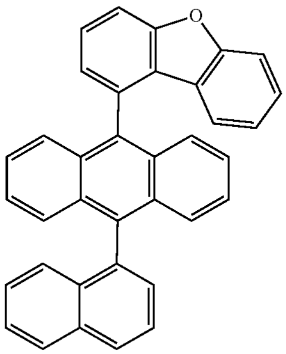
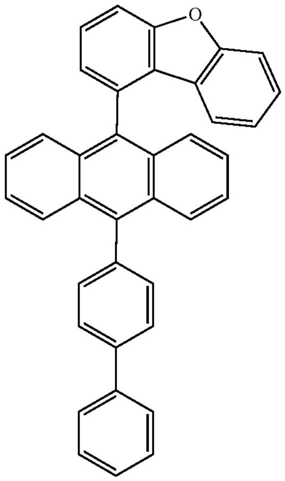
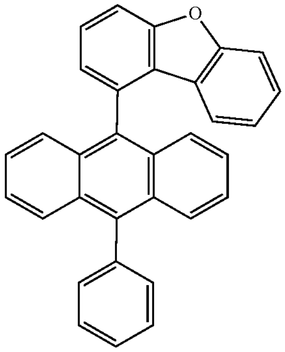
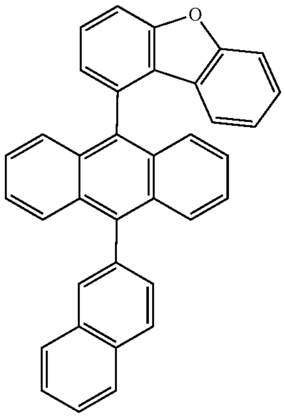
-continued
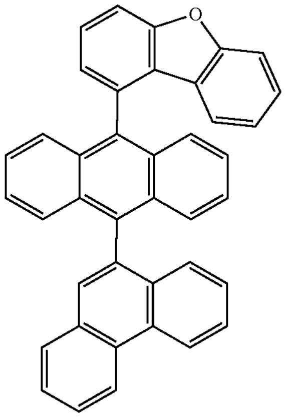
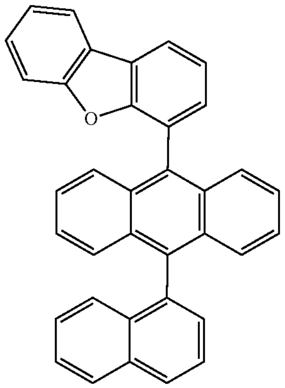
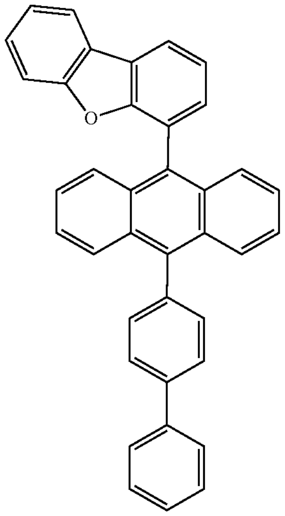
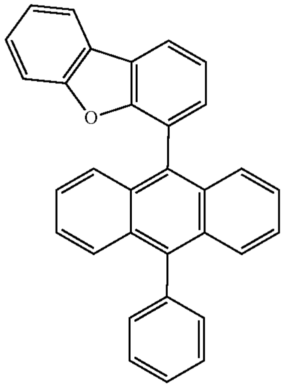

-continued
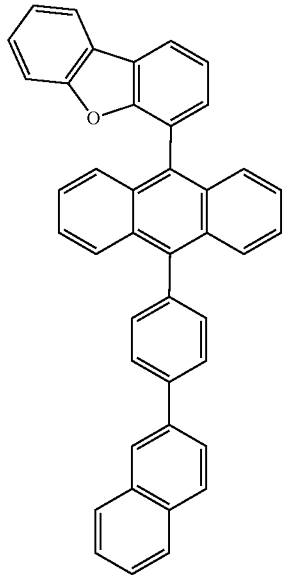
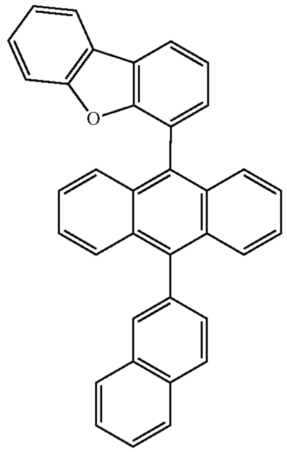
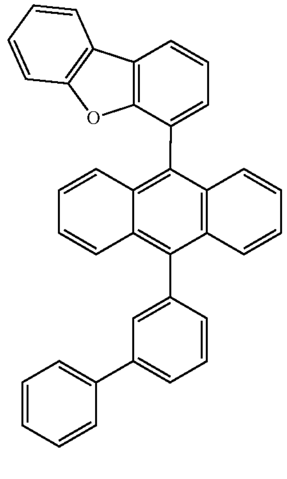
-continued
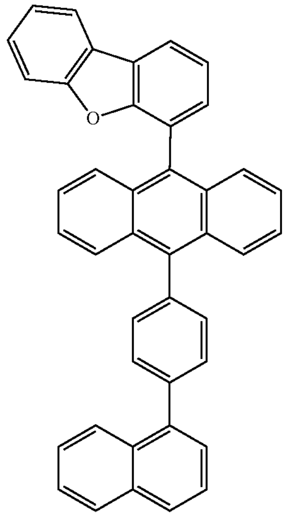
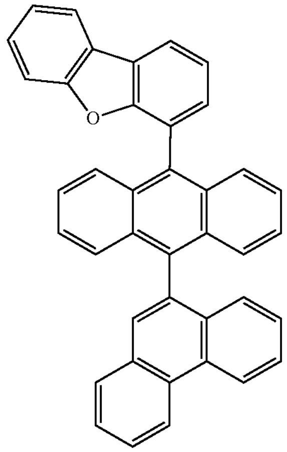
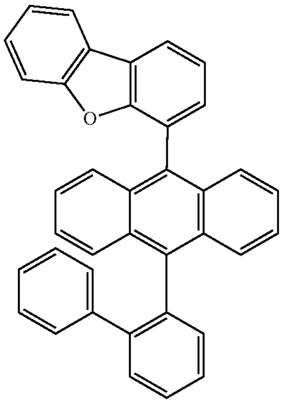

-continued
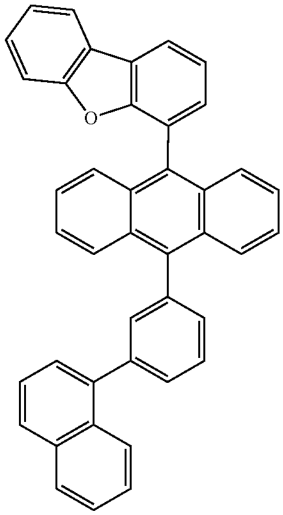
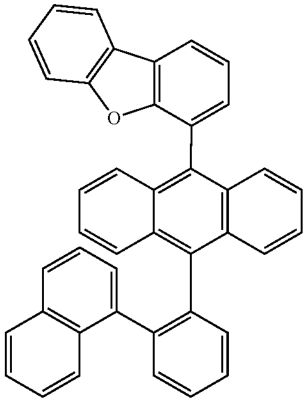
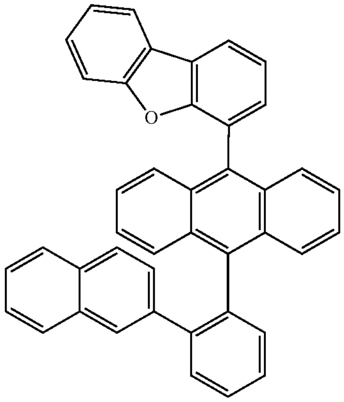
-continued
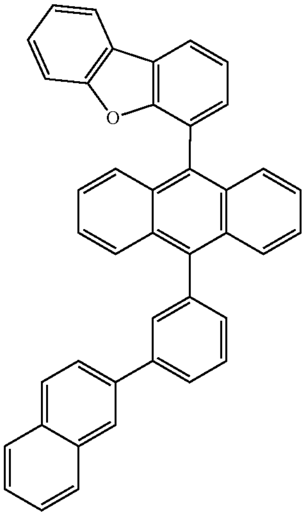
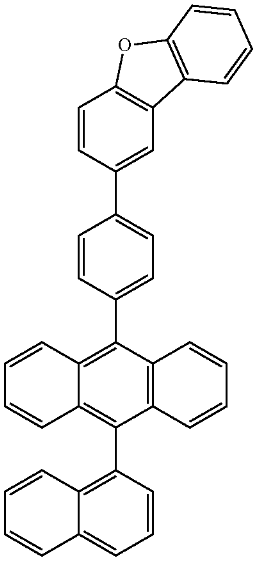
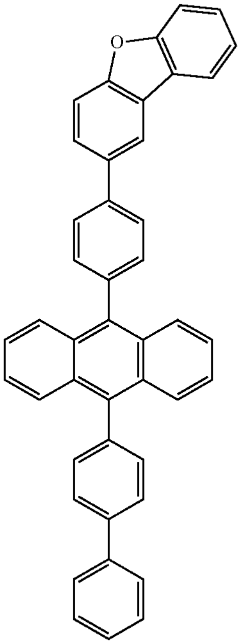

-continued
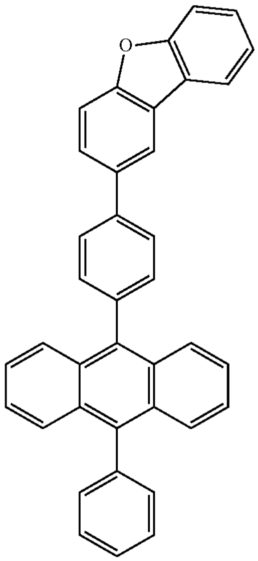
-continued
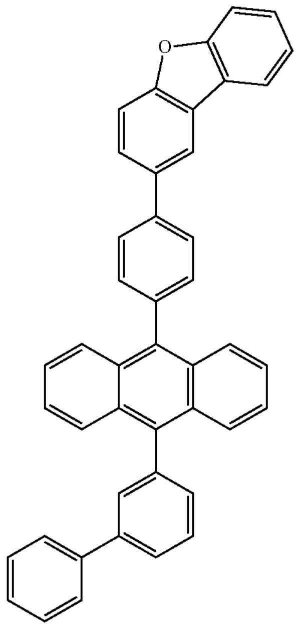
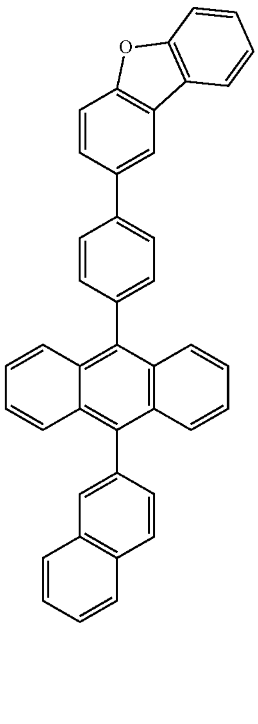
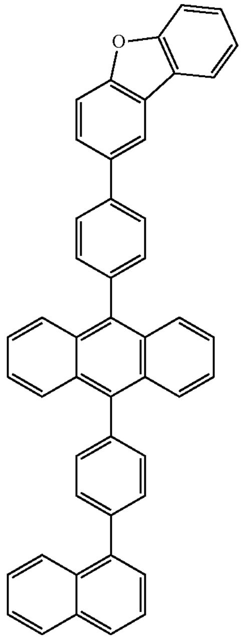

-continued
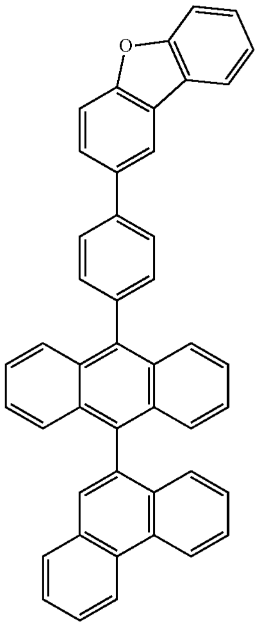
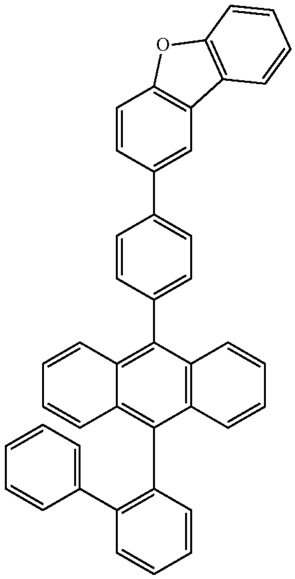
-continued
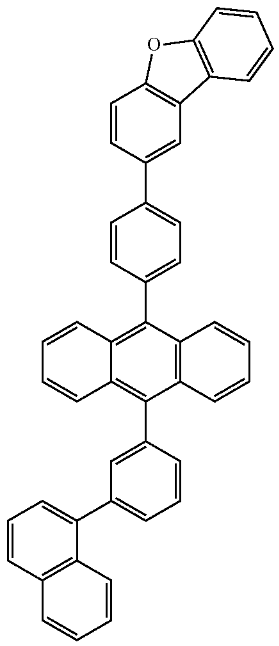
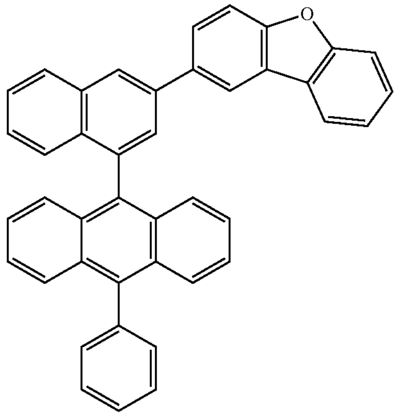
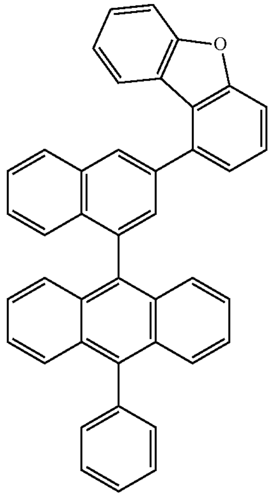

-continued
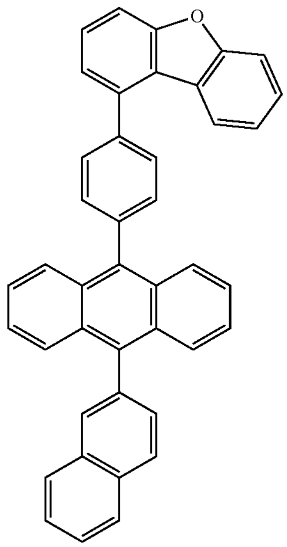
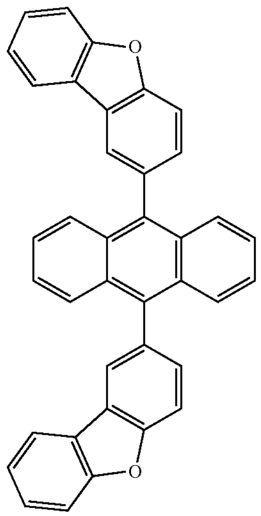
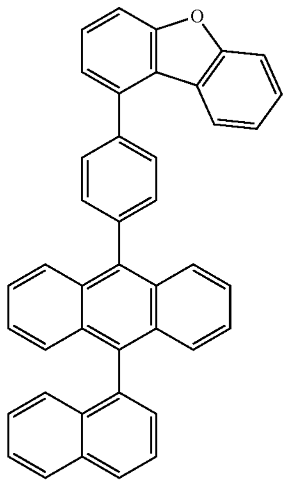
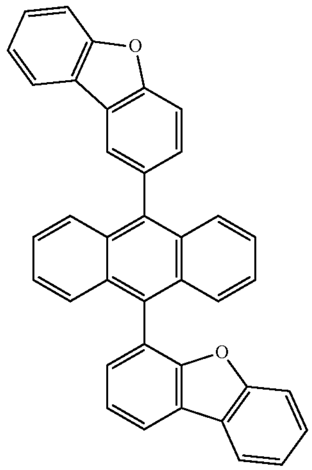
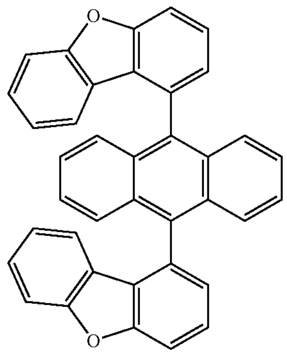
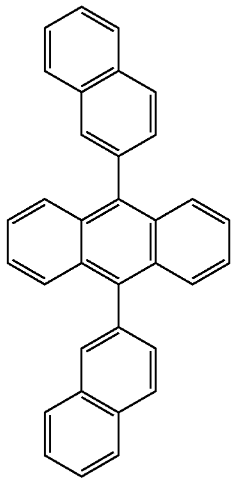
-continued -continued
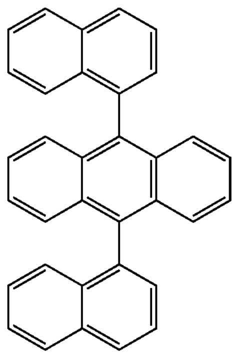
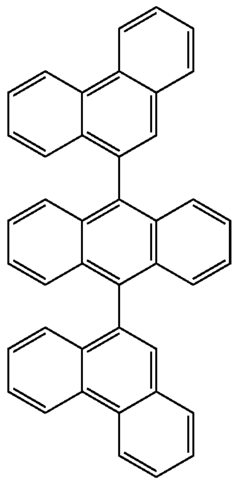
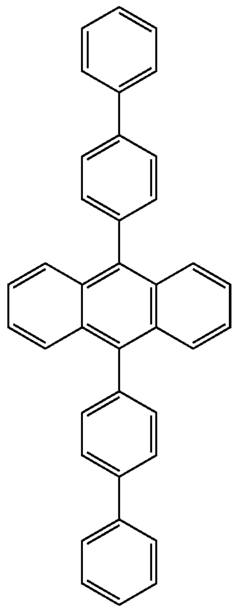
-continued
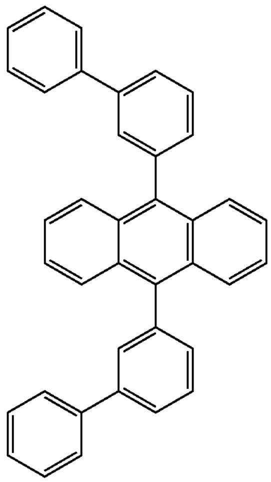
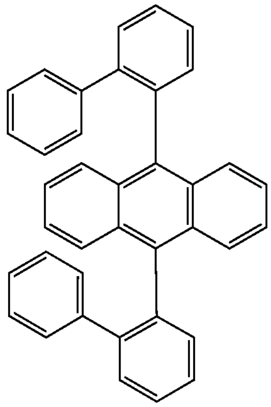
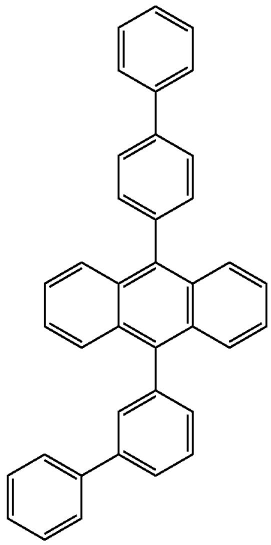

-continued
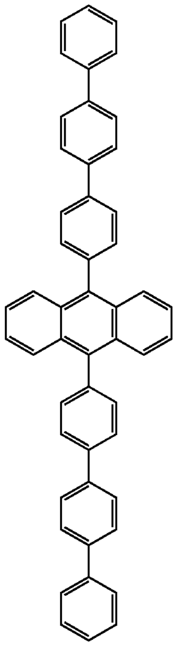
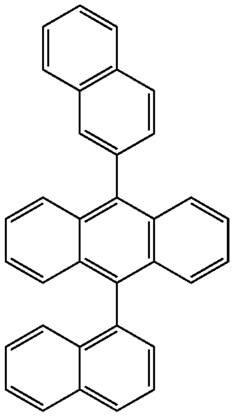
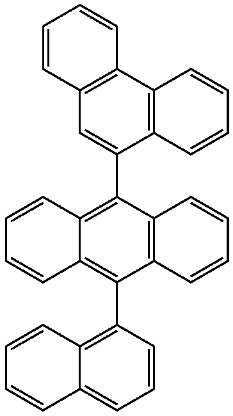
-continued
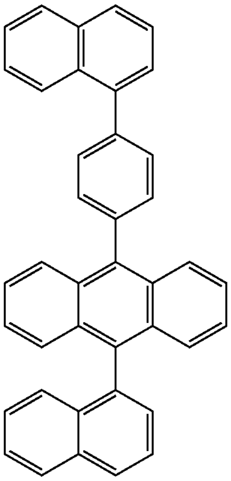
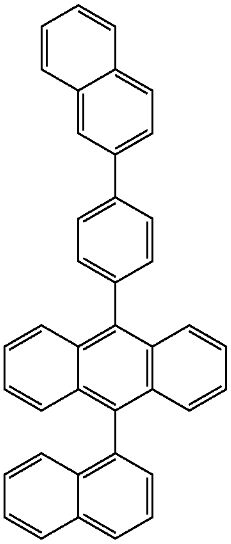
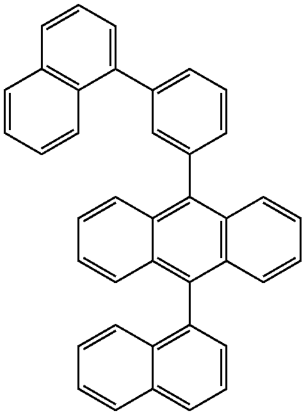

-continued
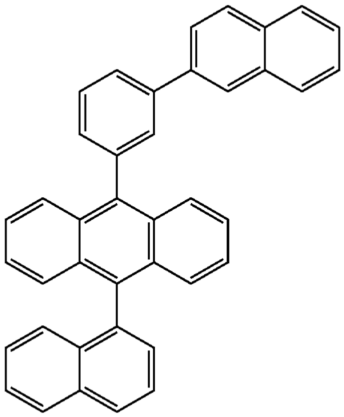
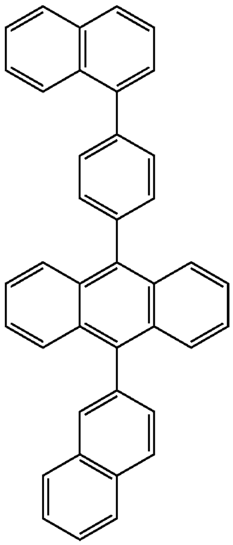
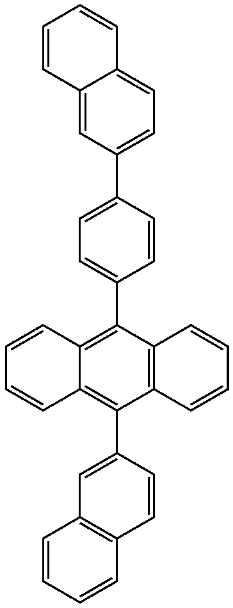
-continued
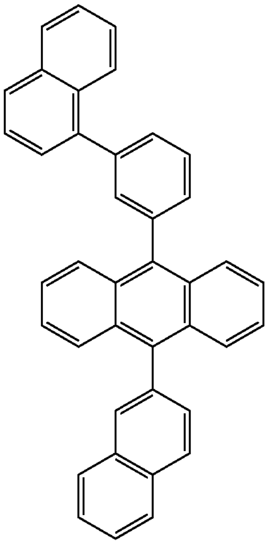
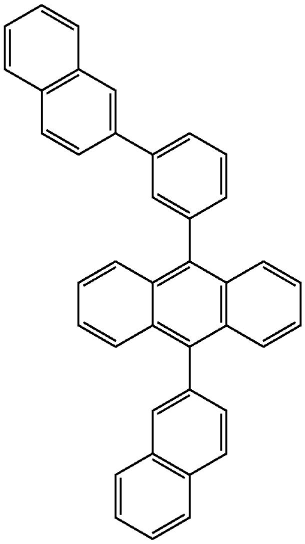
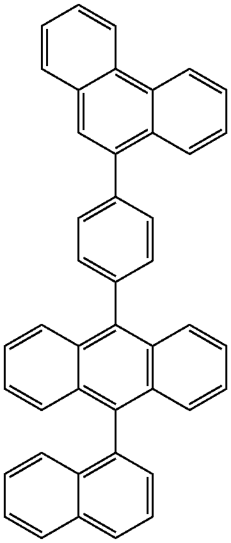

-continued
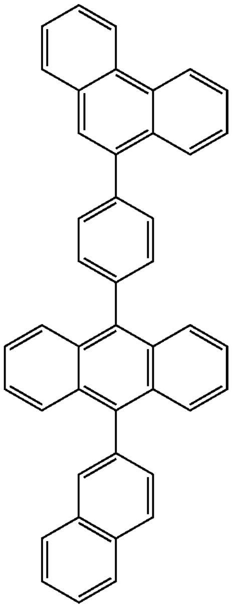
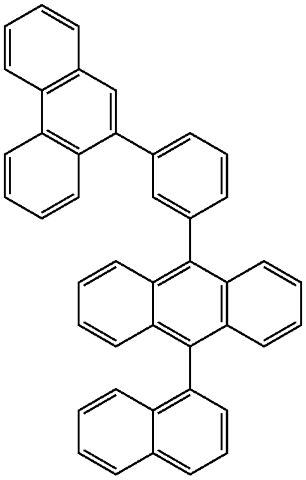
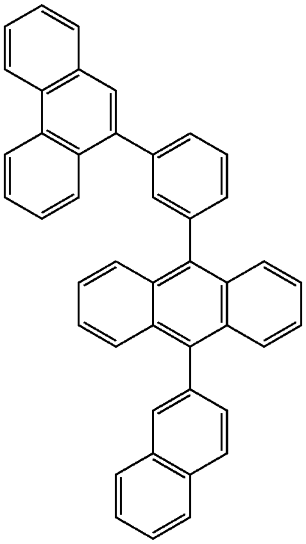
-continued
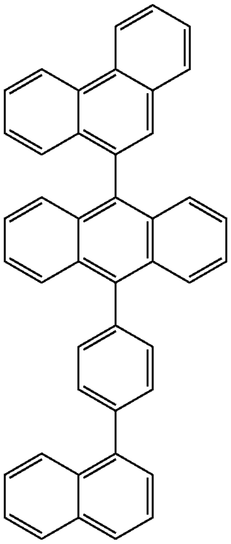
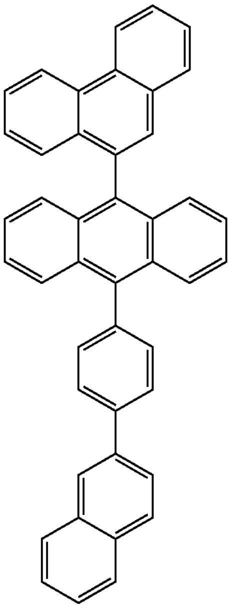
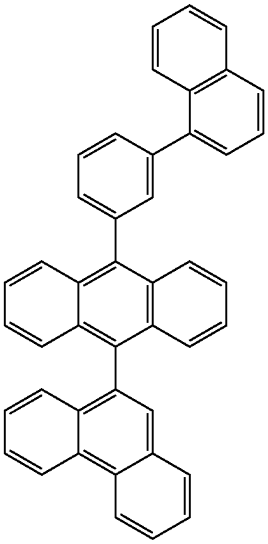

-continued
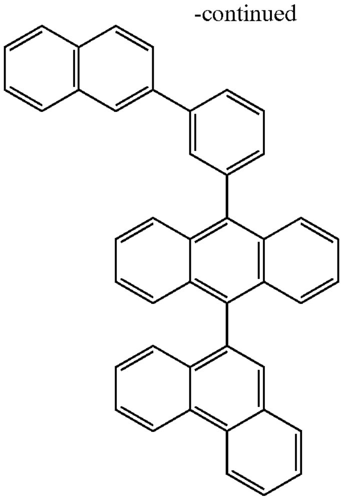
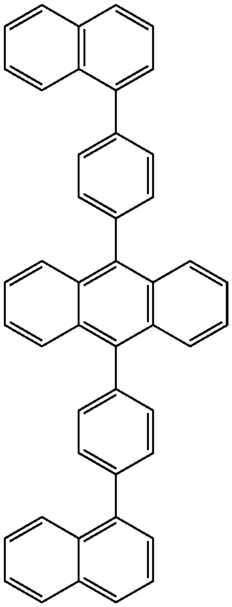
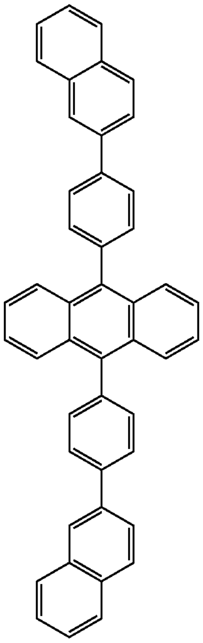
-continued
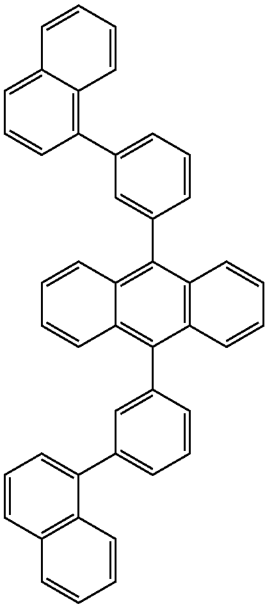
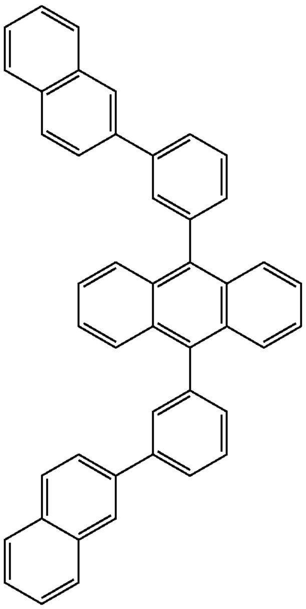

-continued
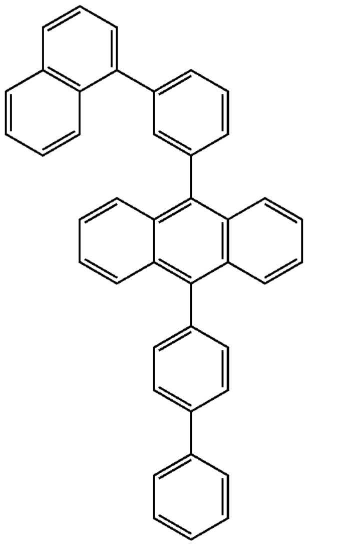
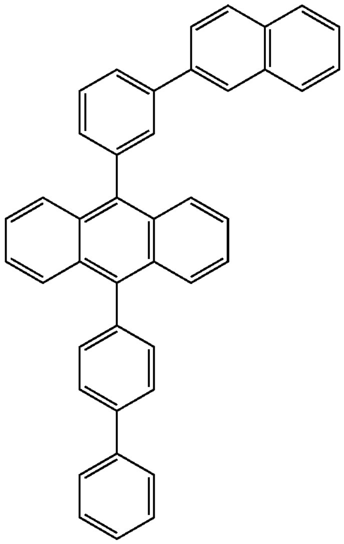
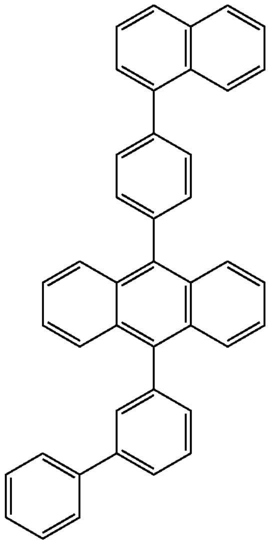
-continued
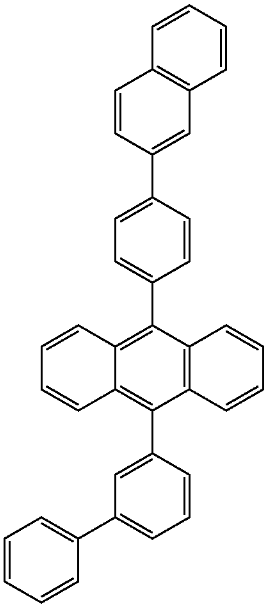
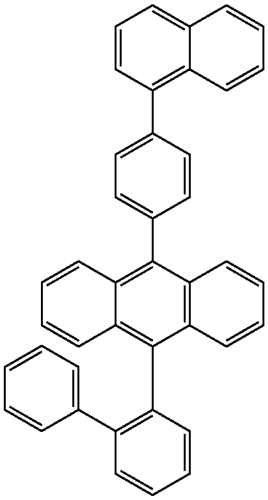
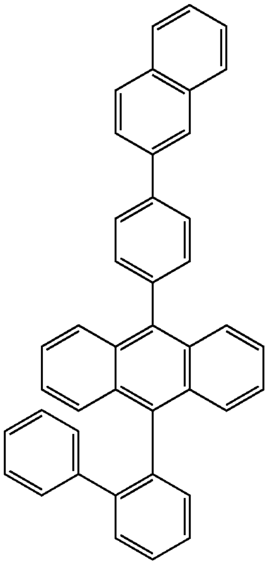

-continued
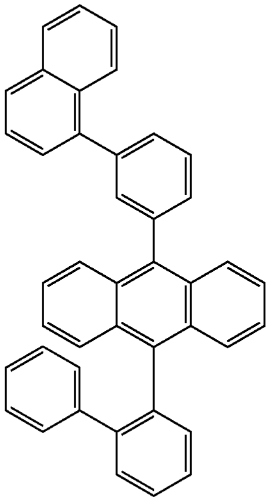
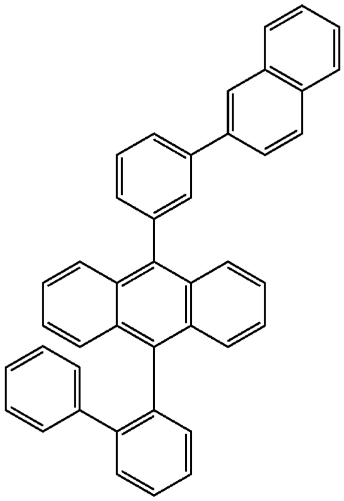
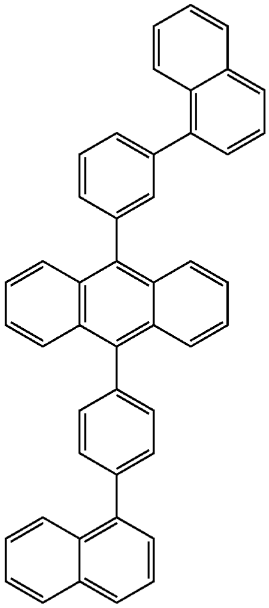
-continued
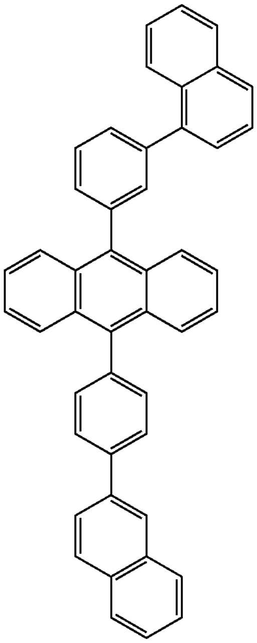
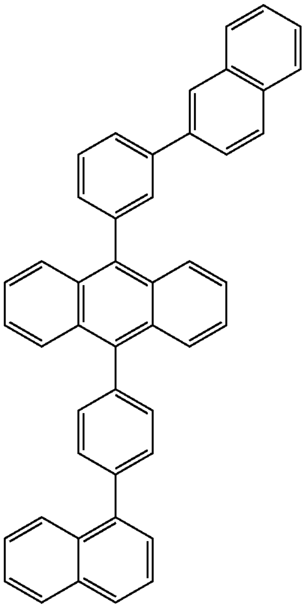

-continued
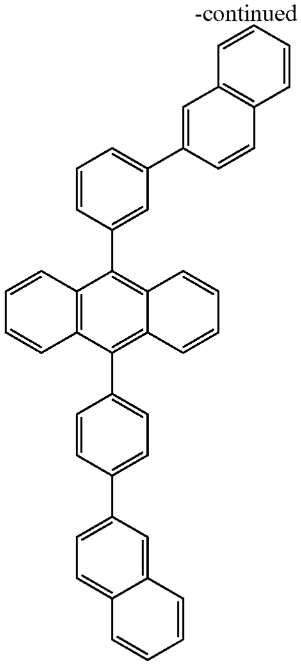
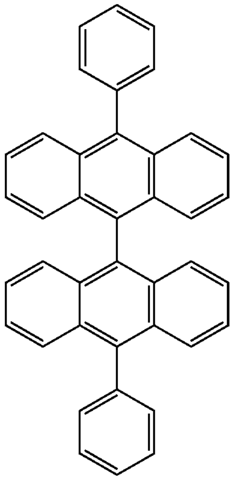
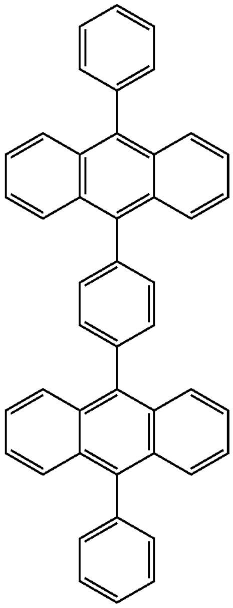
-continued
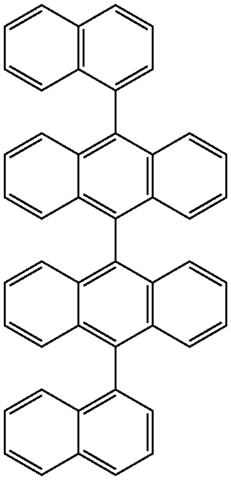
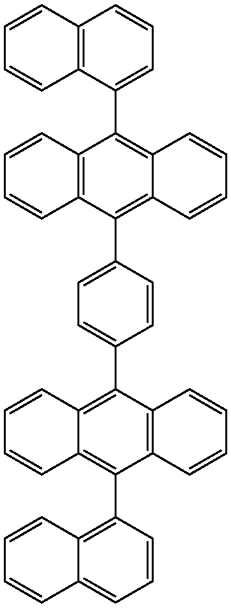
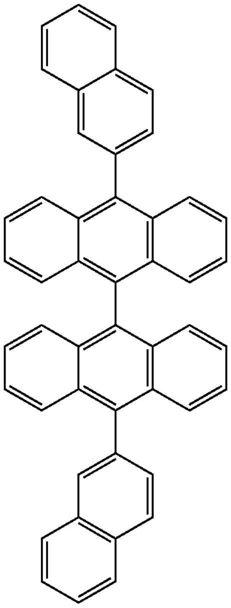

-continued
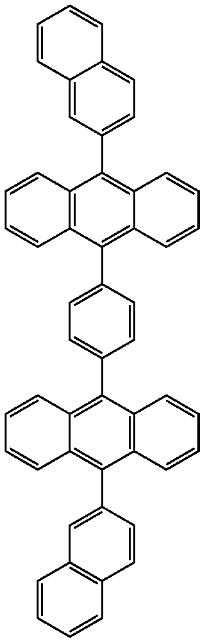
-continued
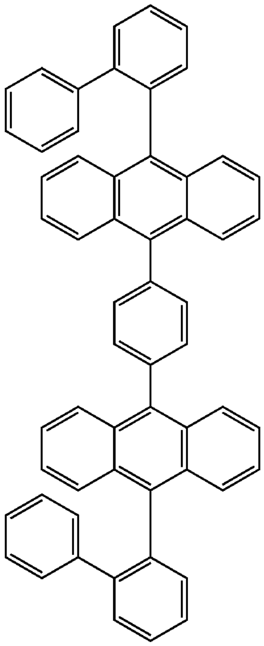
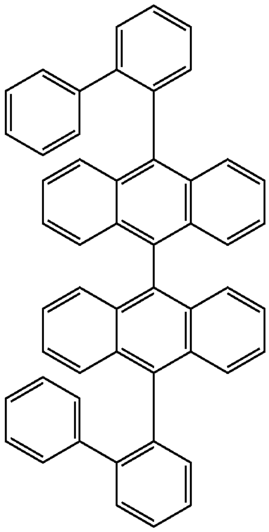
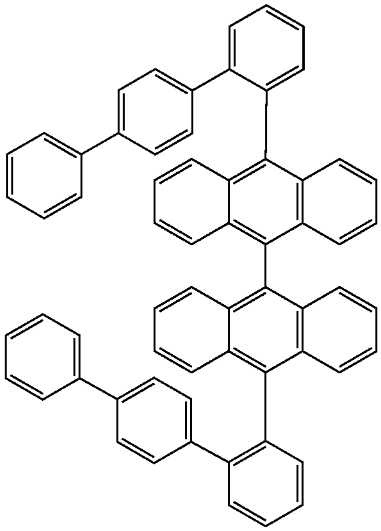

-continued
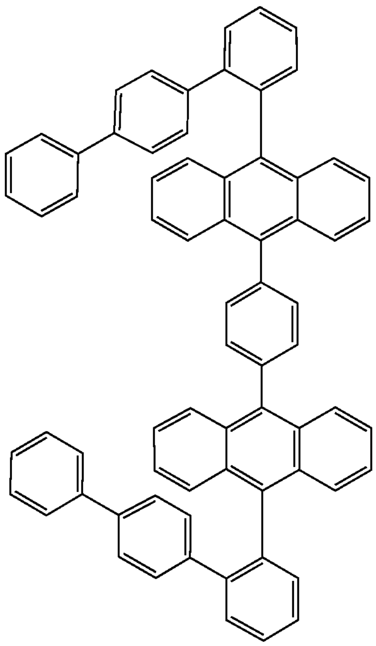
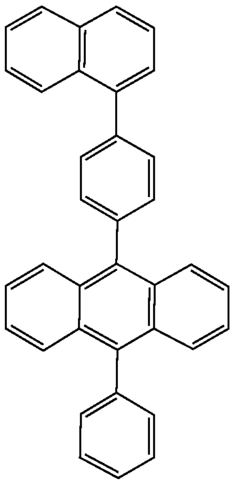
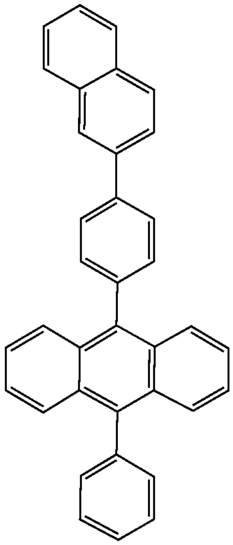
-continued
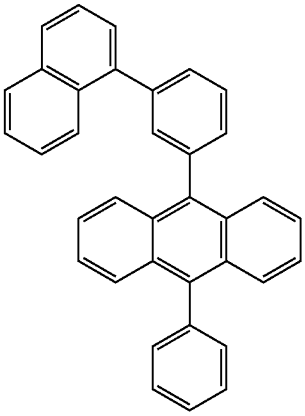
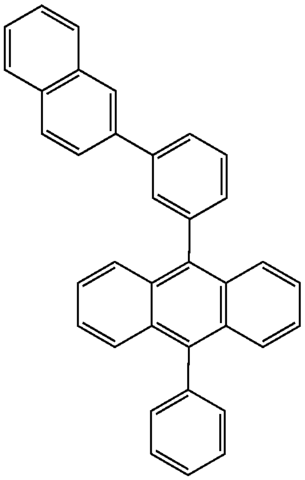
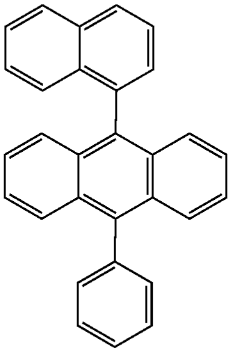
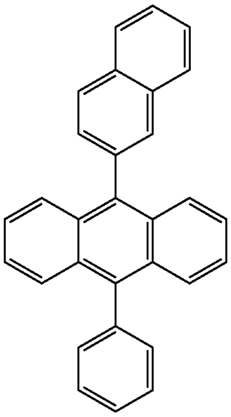

-continued
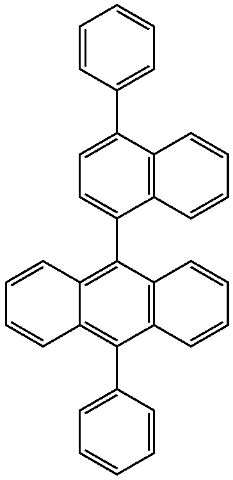
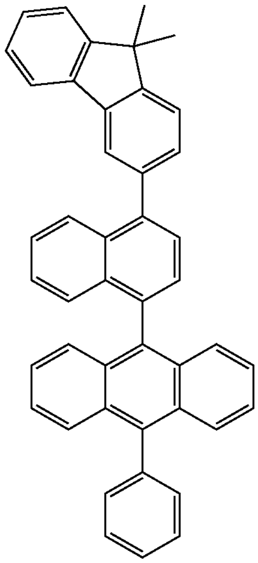
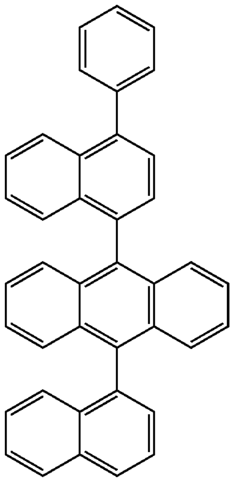
-continued
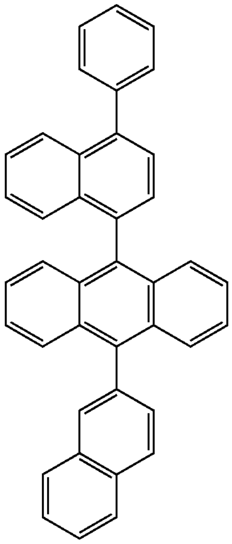
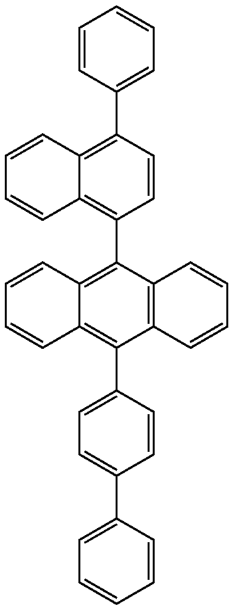
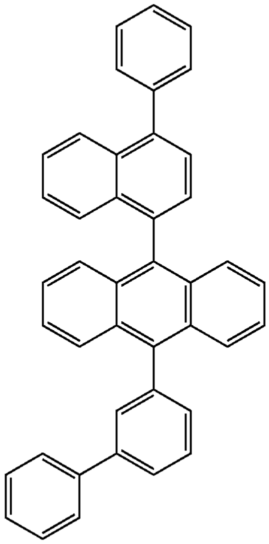

-continued
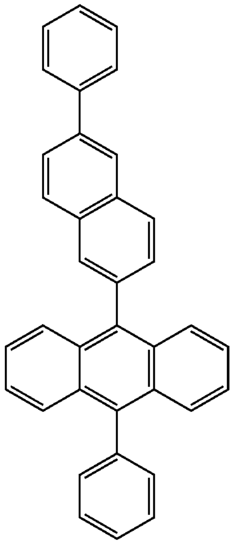
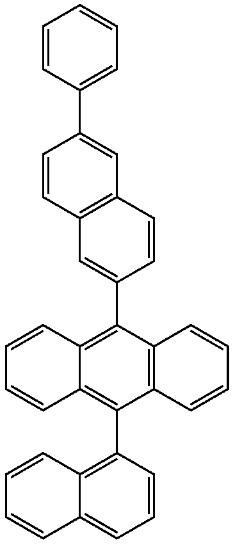
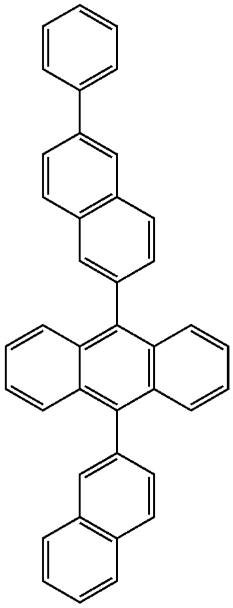
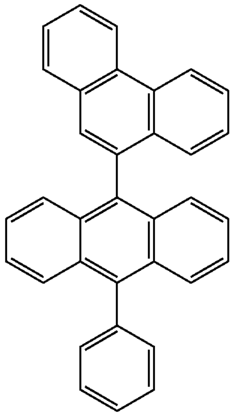
-continued
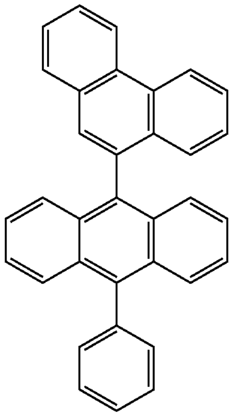
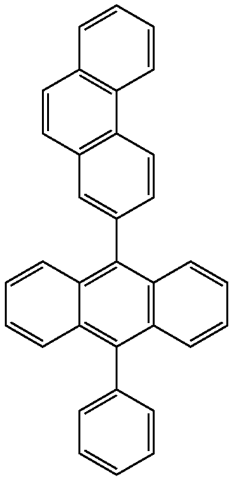
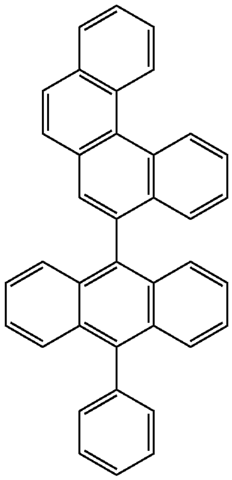

-continued
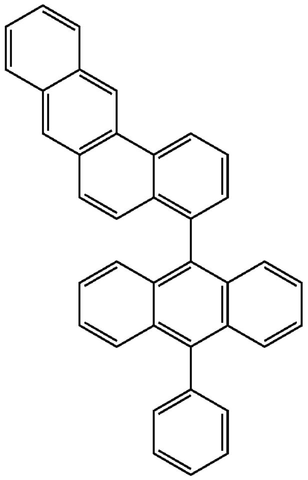
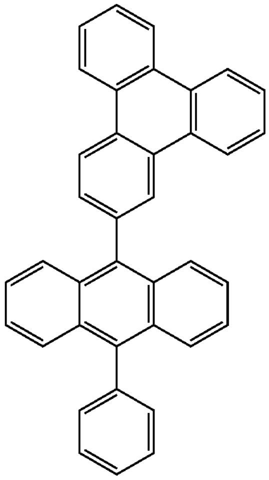
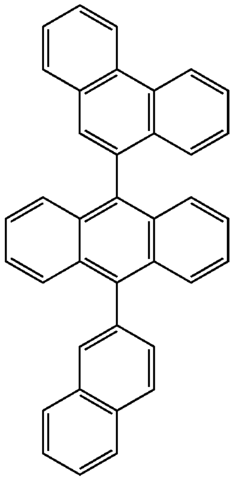
-continued
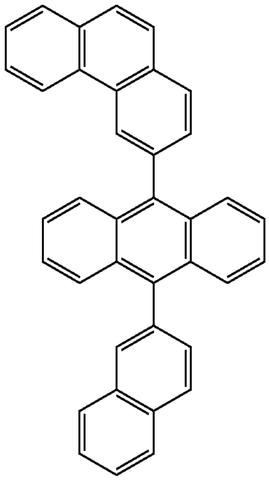
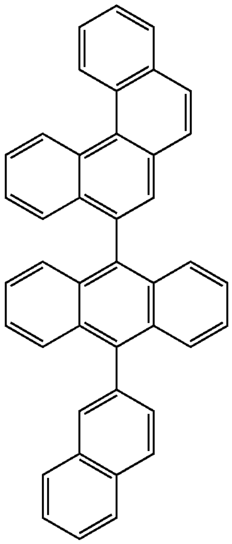
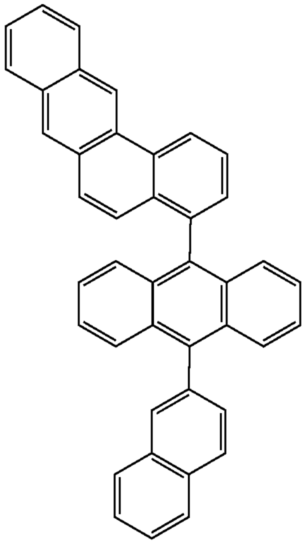

-continued
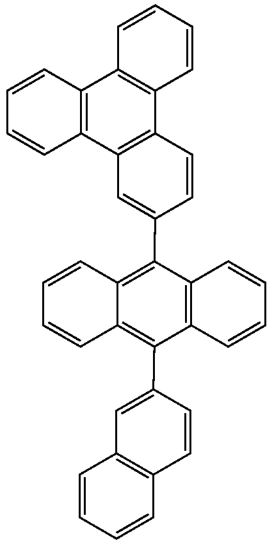
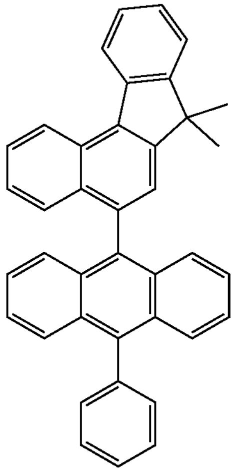
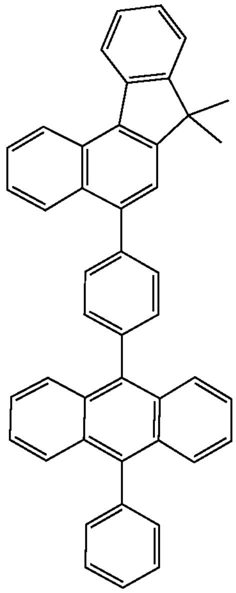
-continued
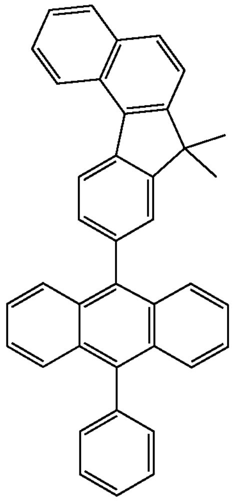
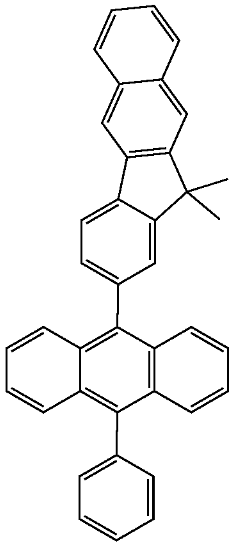
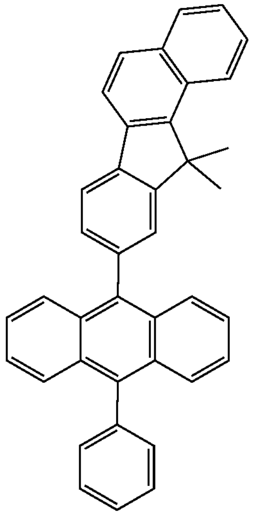

-continued
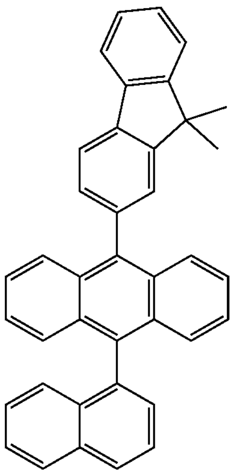
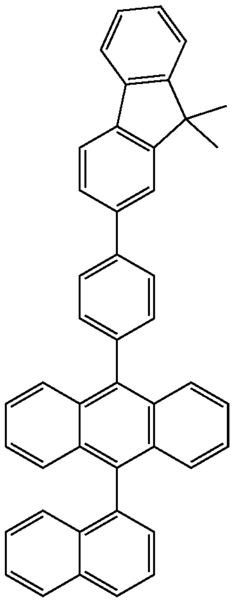
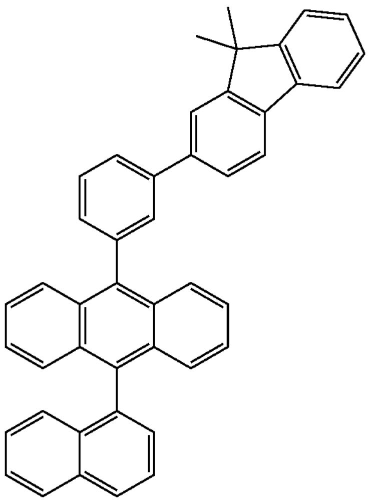
-continued
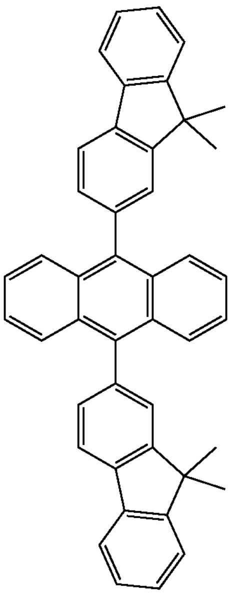
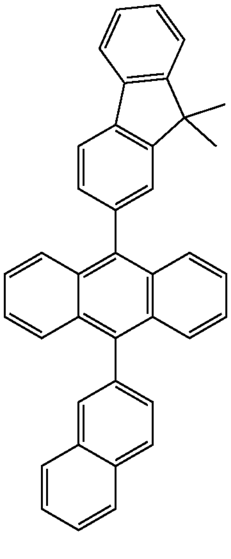

-continued
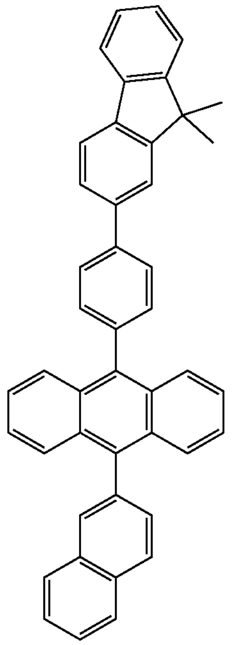
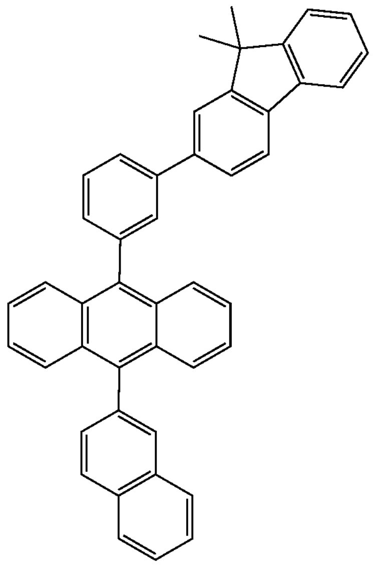
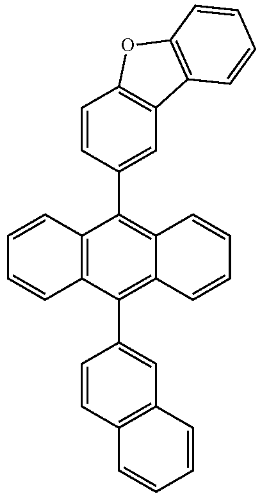
-continued
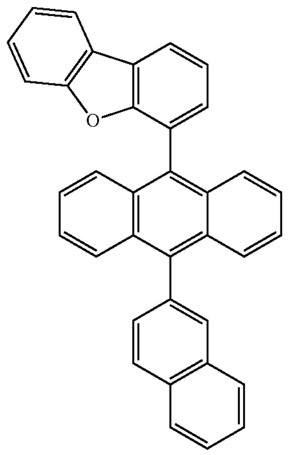
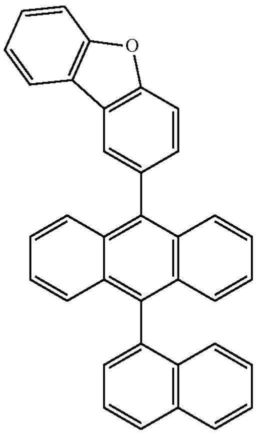
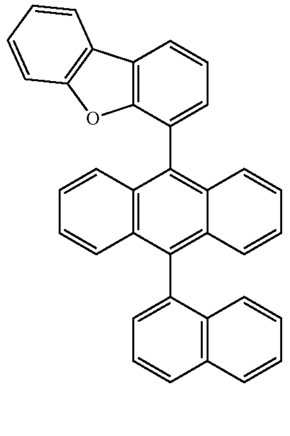

-continued
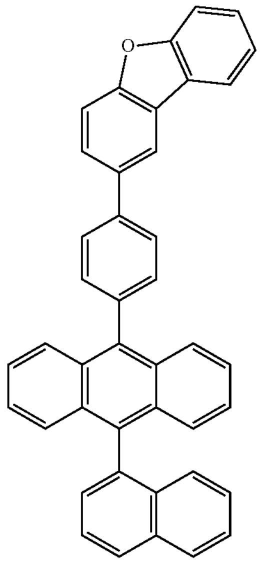
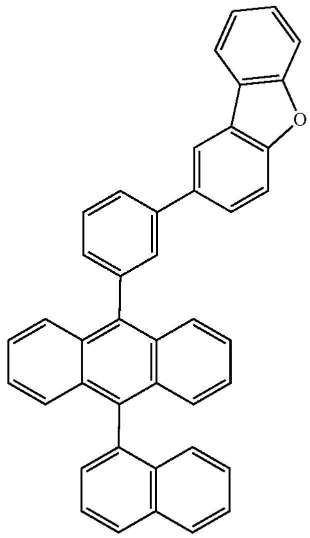
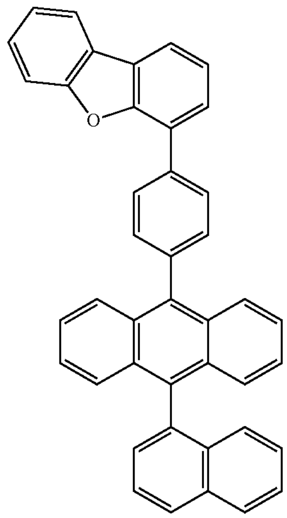
-continued
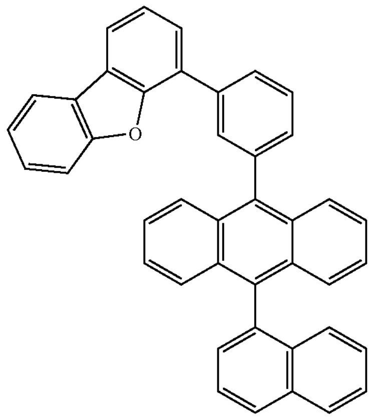
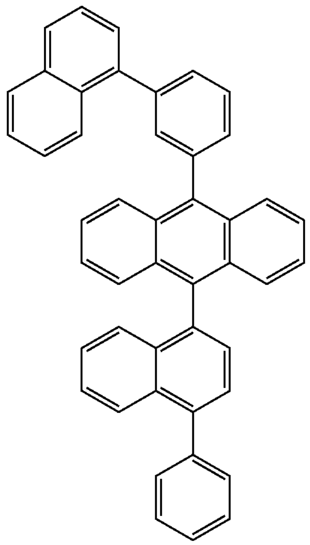
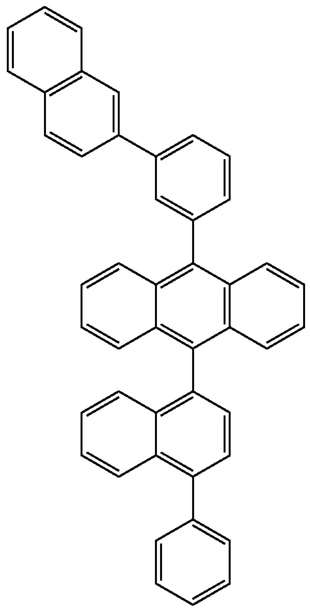

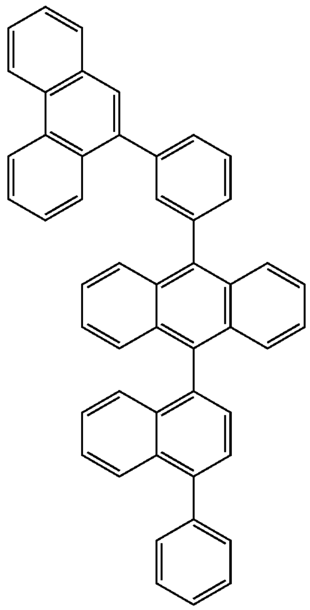
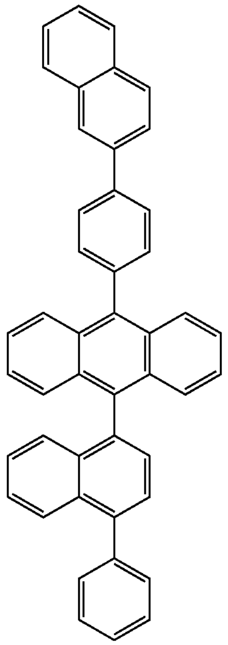
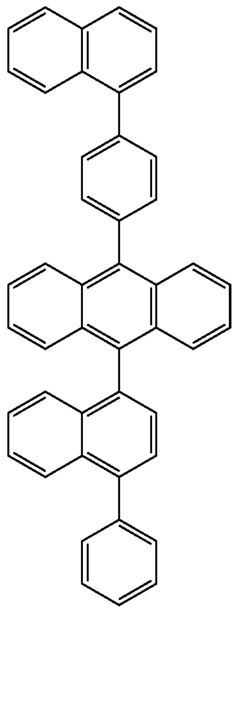
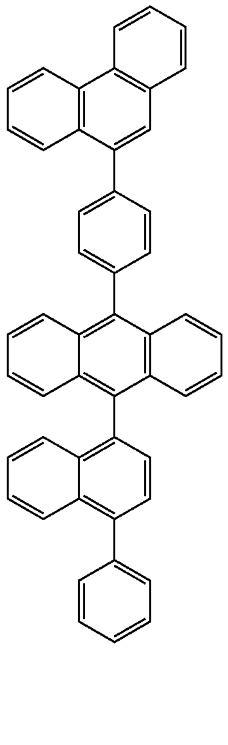

-continued
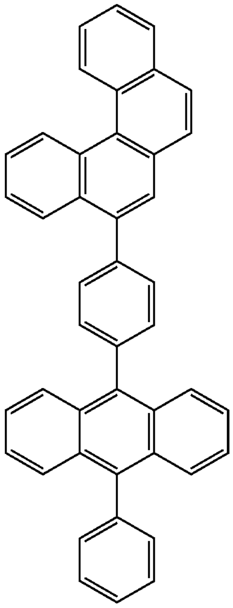
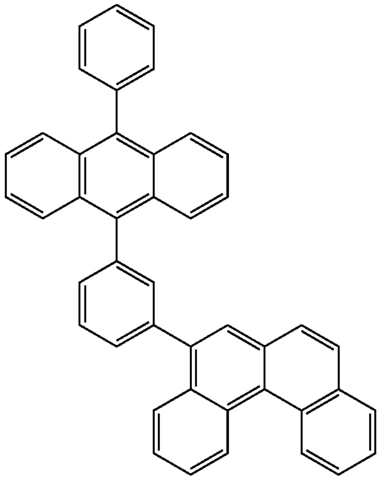
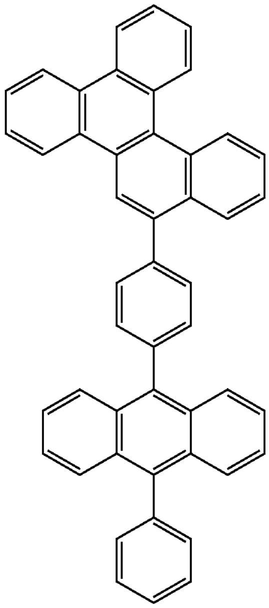
-continued
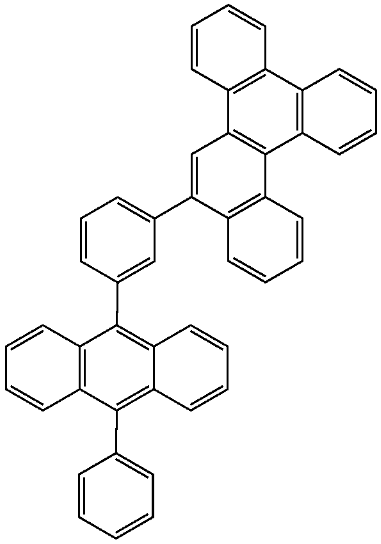
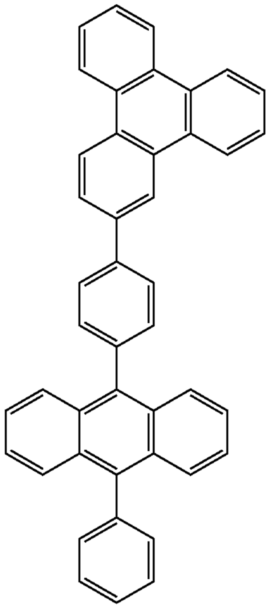
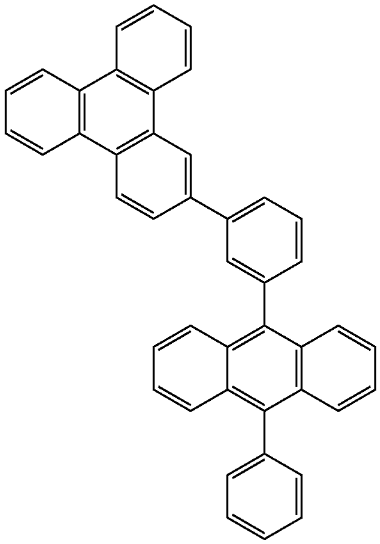

-continued
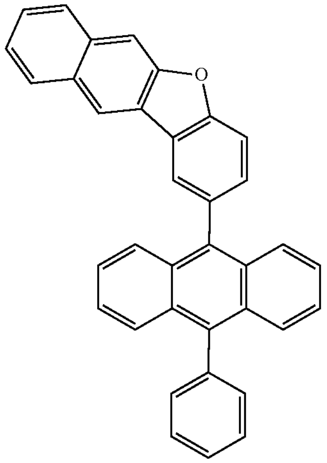
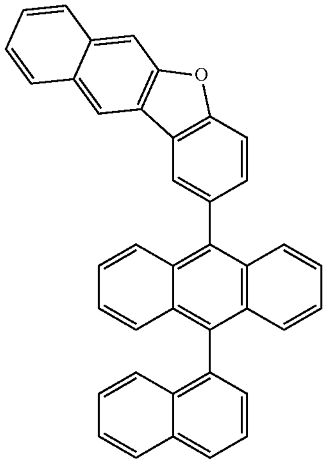
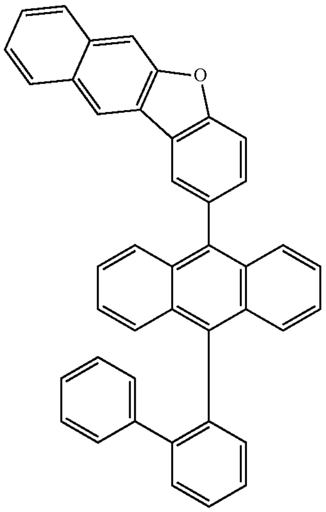
-continued
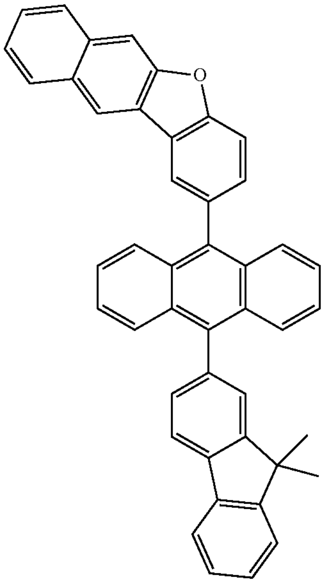
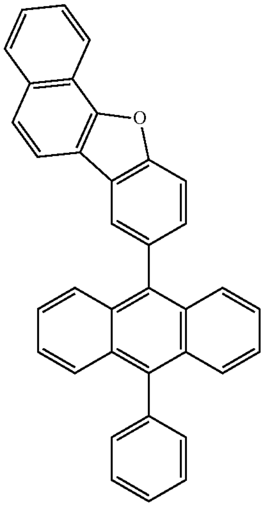
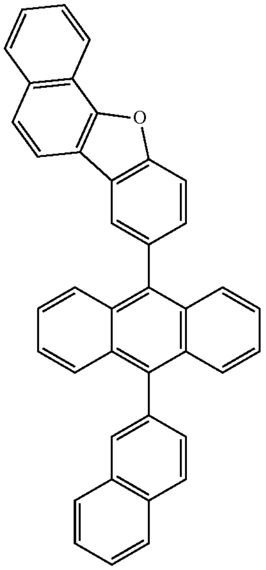

-continued
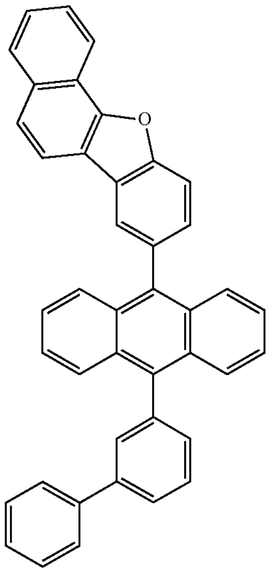
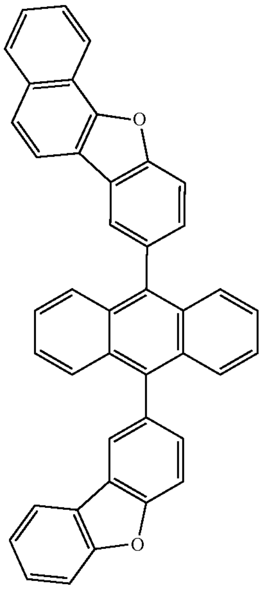
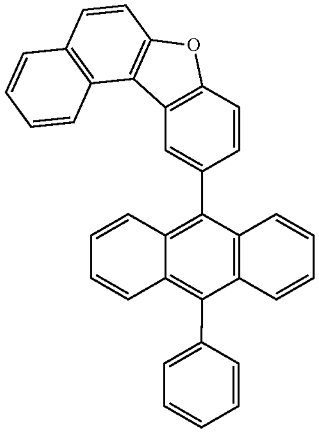
-continued
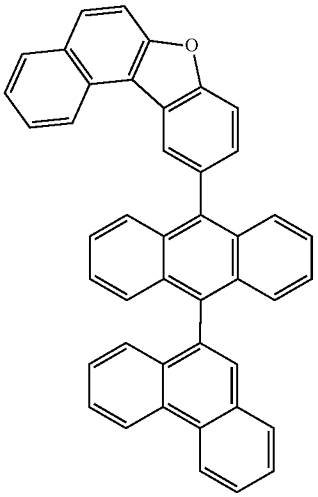
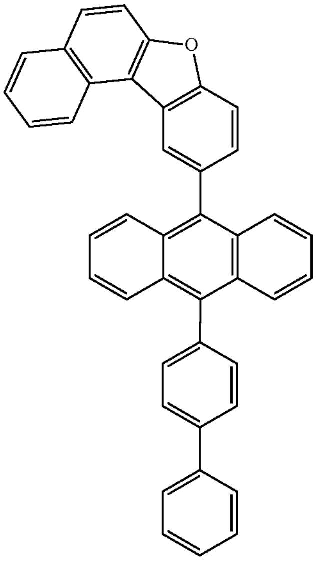
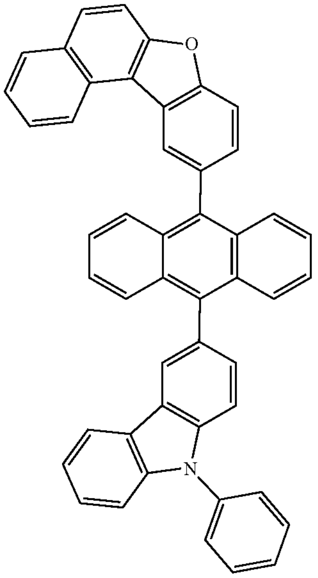

-continued
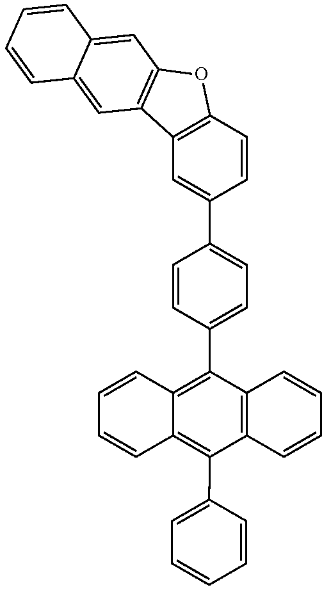
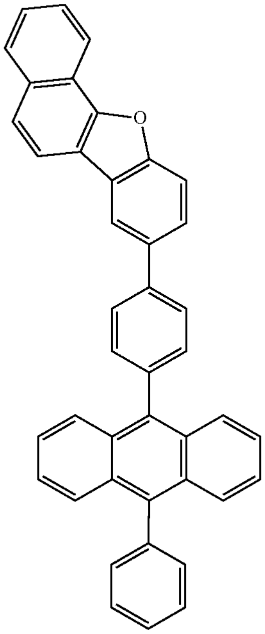
-continued
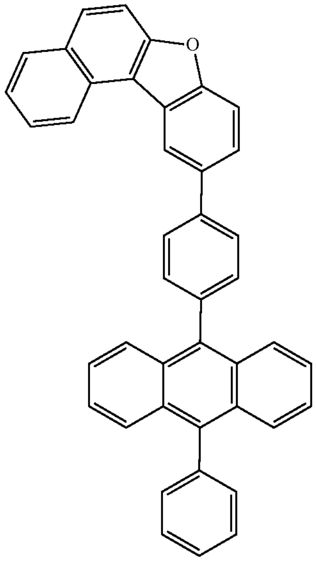
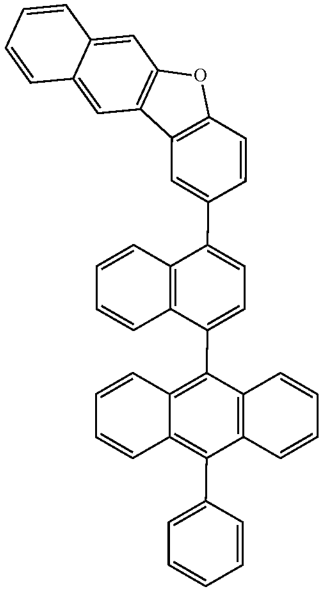
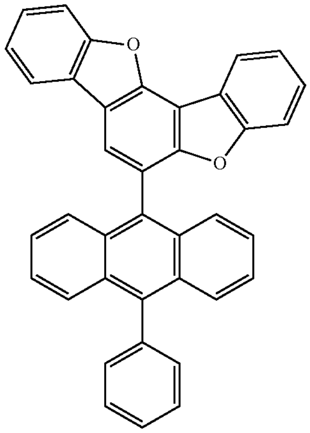

-continued
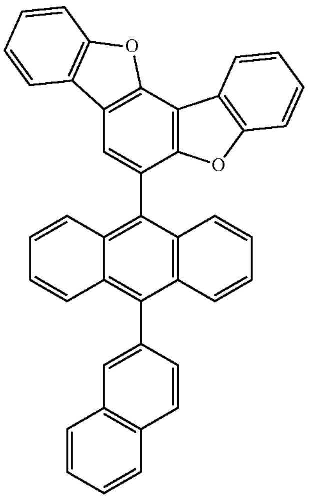
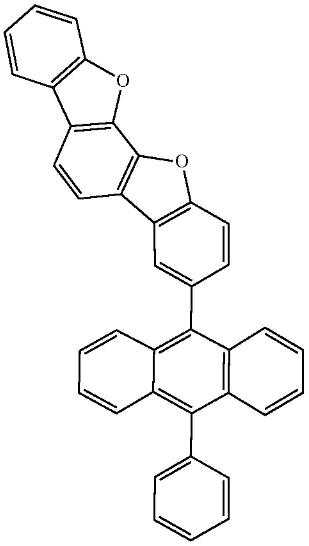
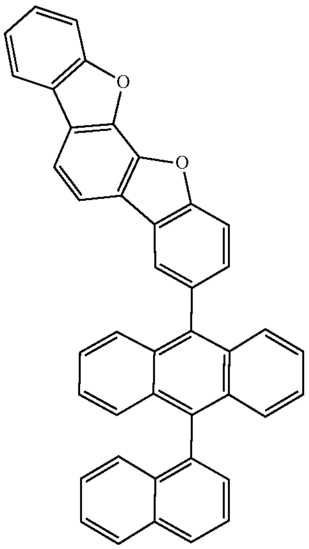
-continued
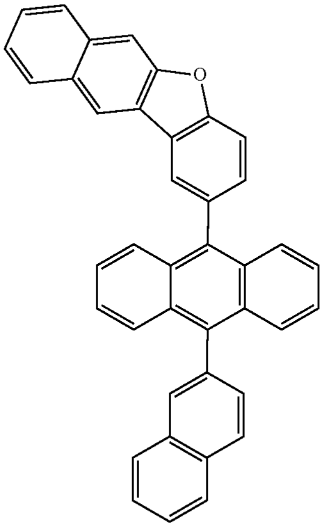
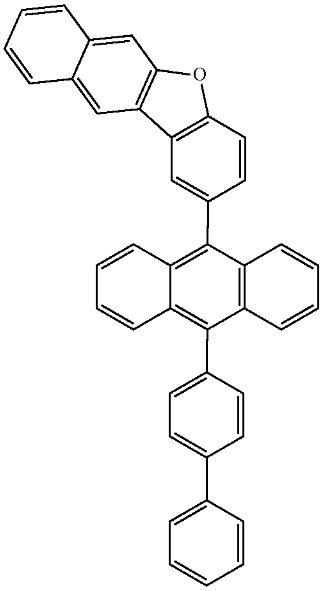
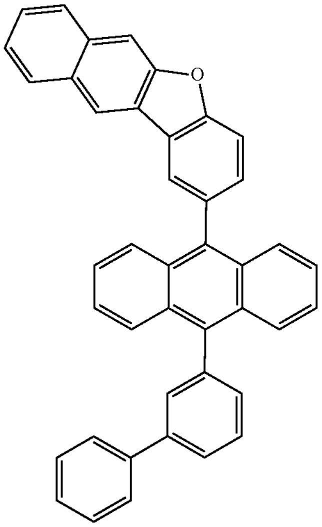

-continued
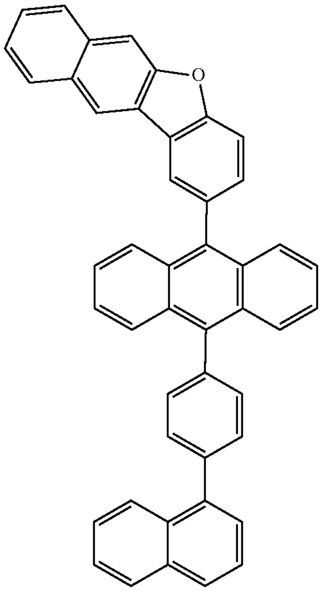
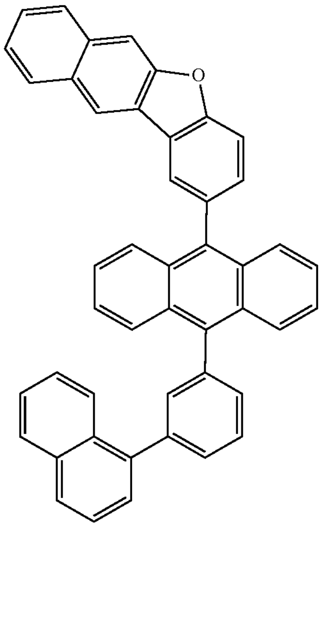
-continued
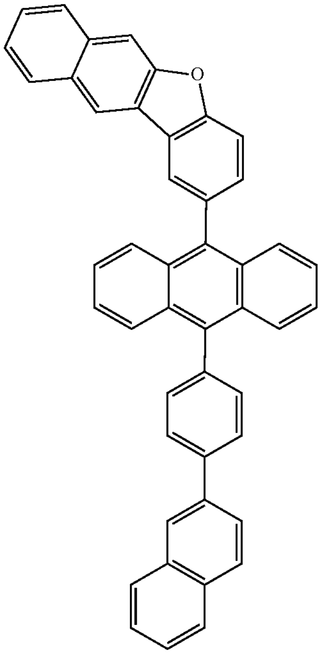
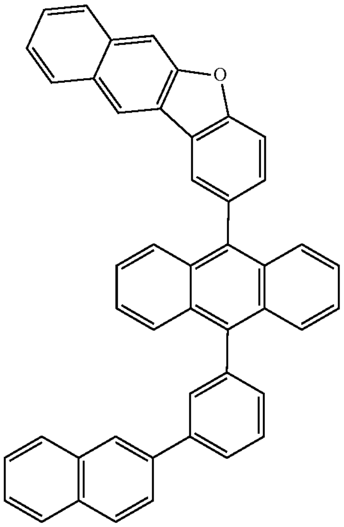
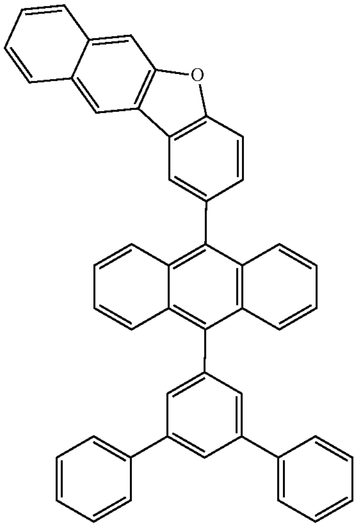

-continued
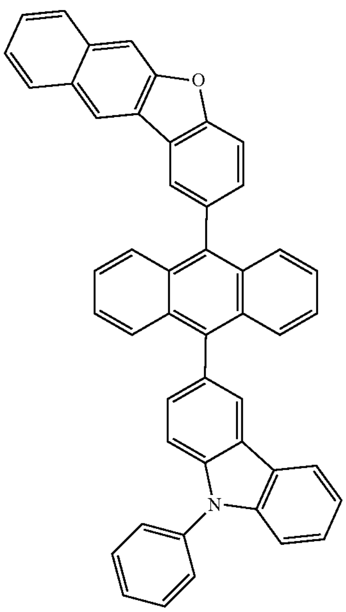
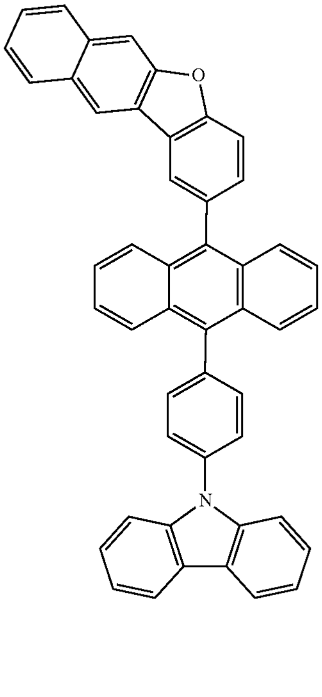
-continued
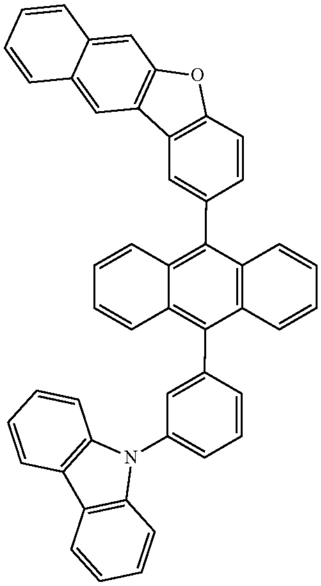
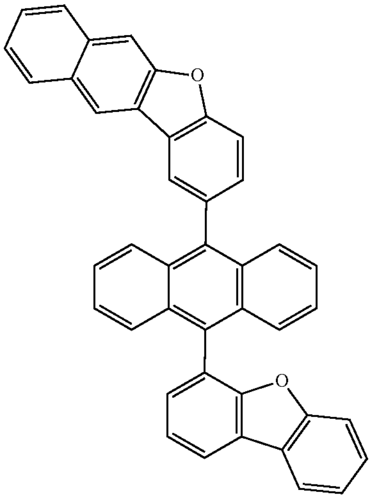
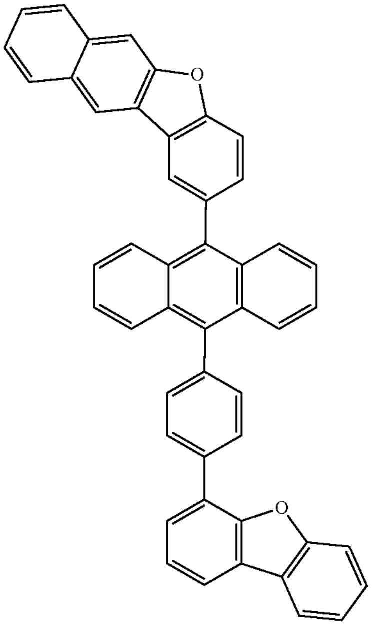

-continued
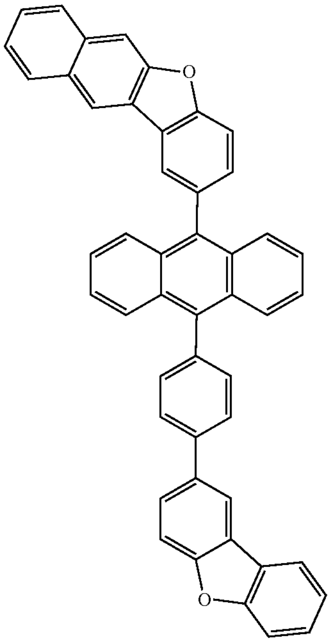
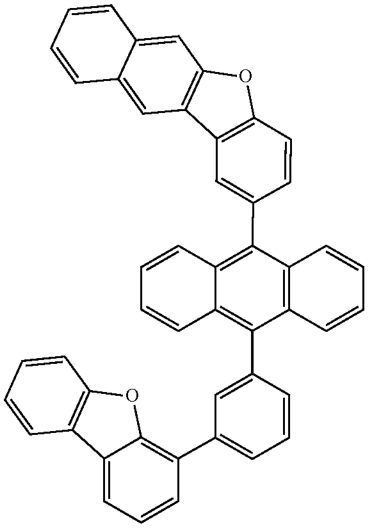
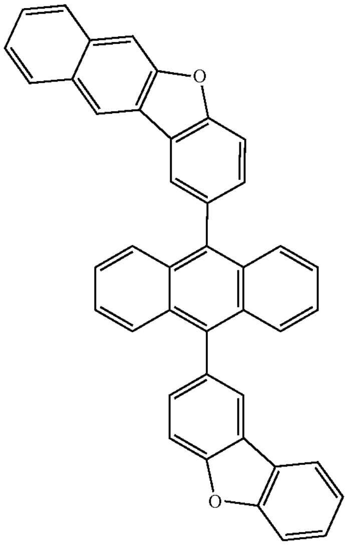
-continued
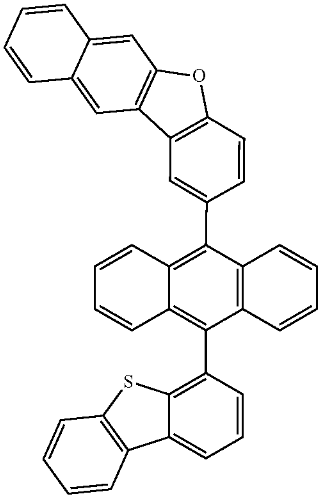
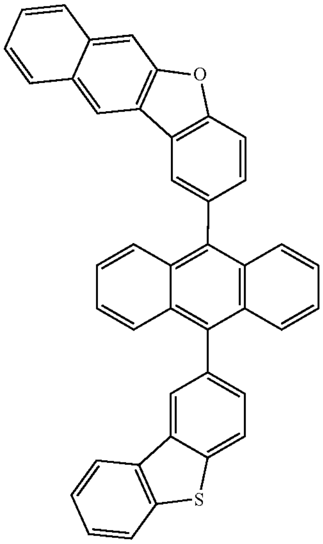
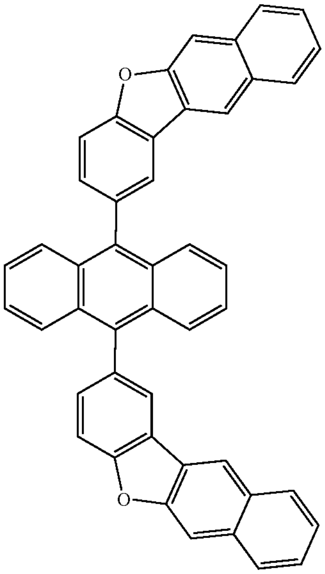

-continued
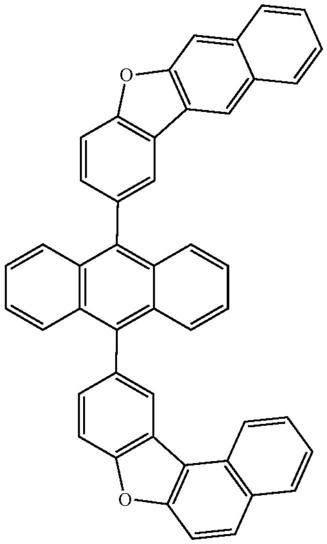
-continued
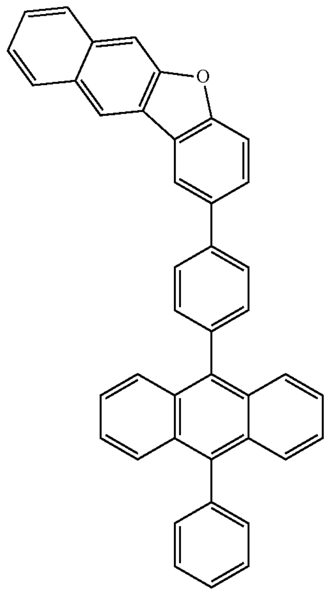
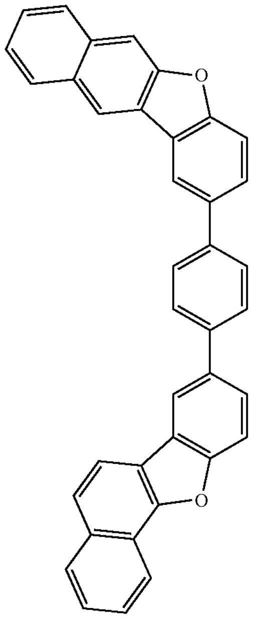
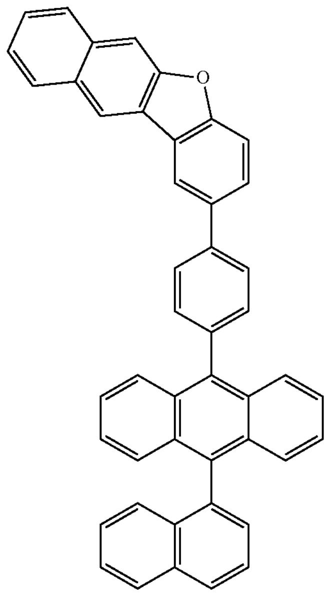

-continued
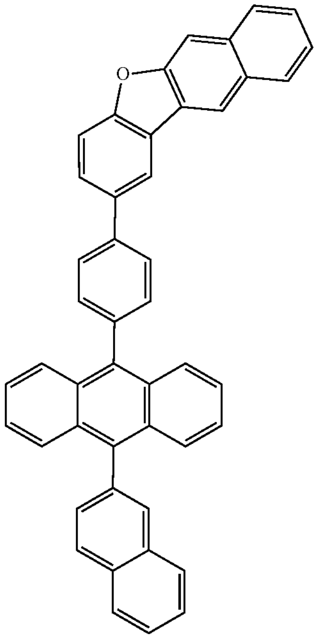
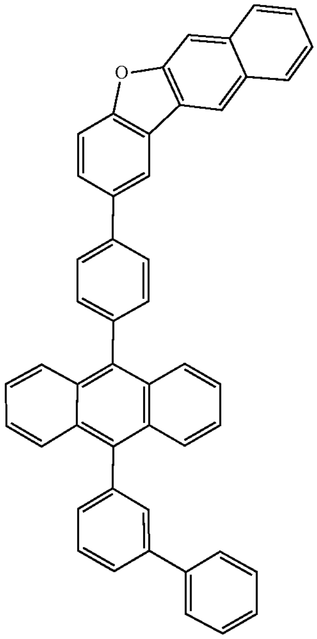
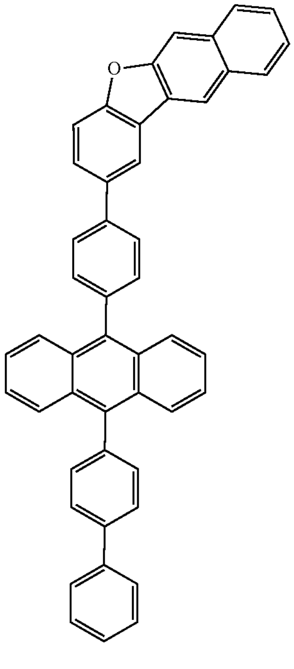
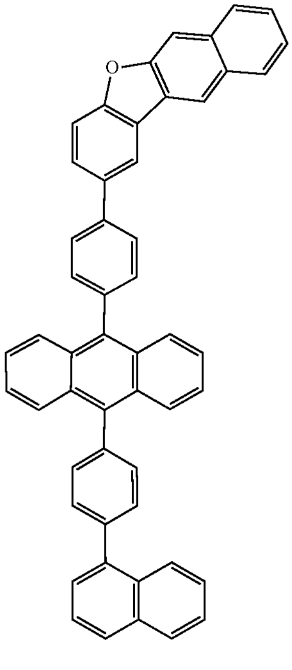

-continued
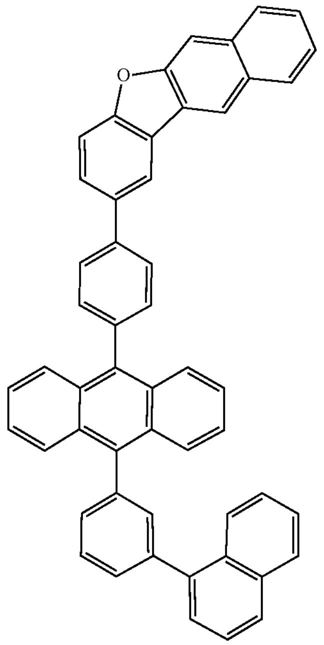
-continued
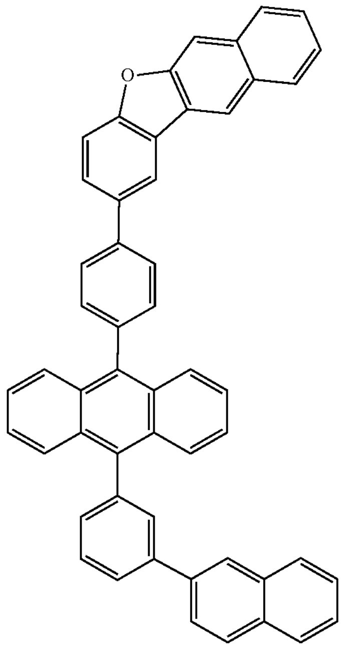
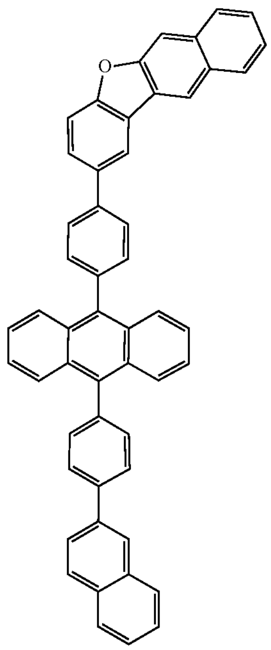
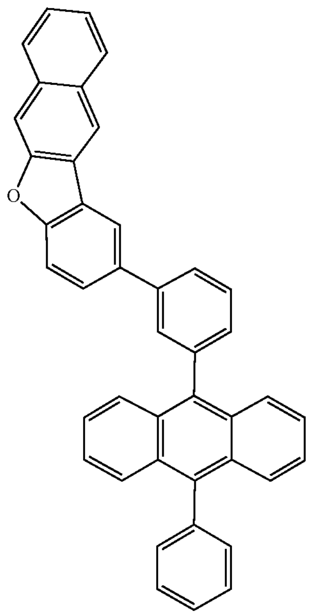

-continued
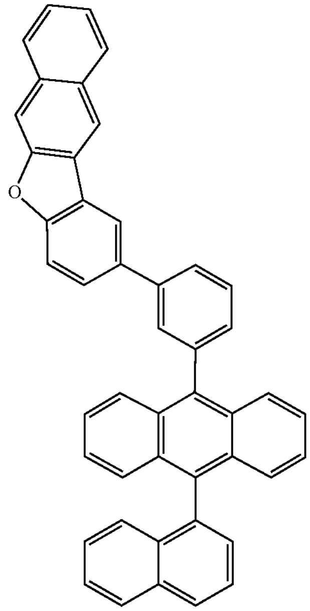
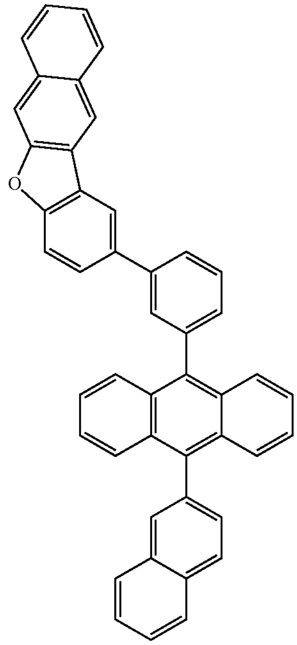
-continued
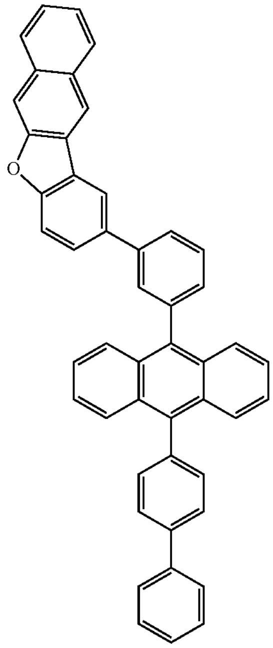
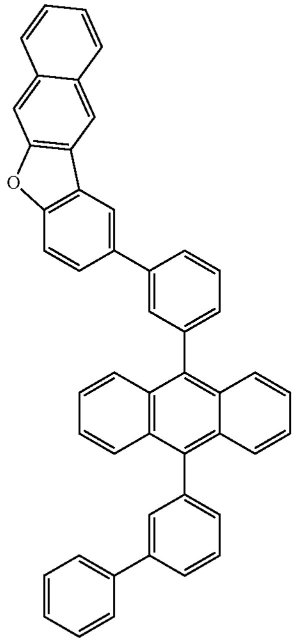

-continued
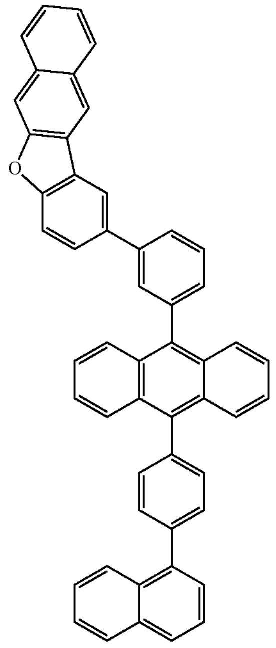
-continued
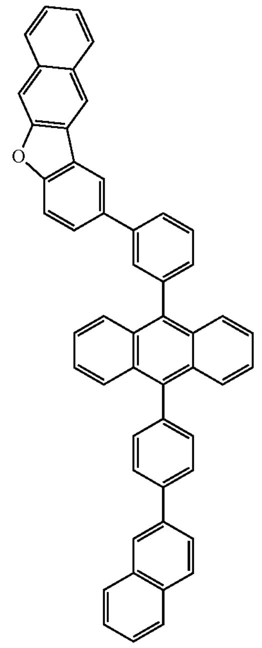
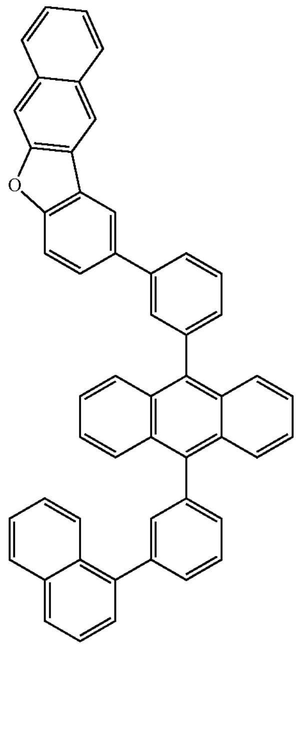
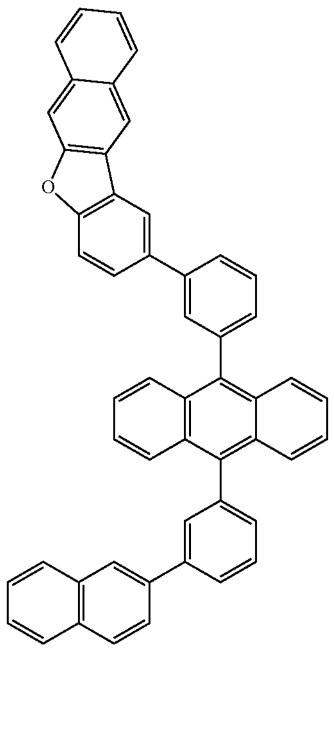

-continued
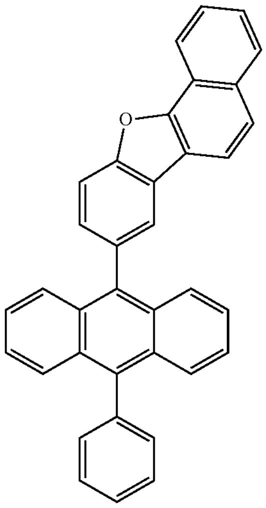
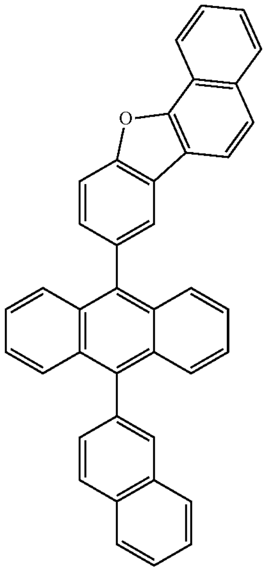
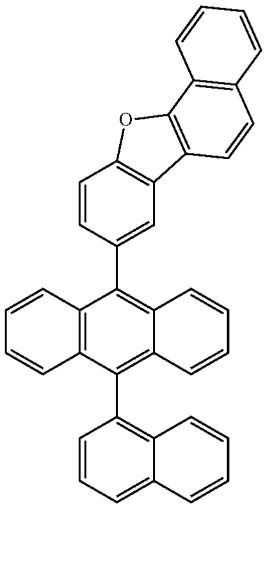
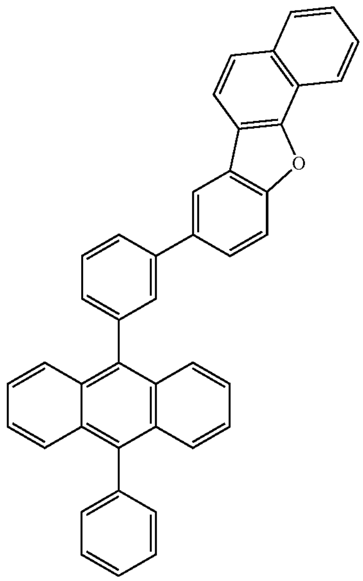
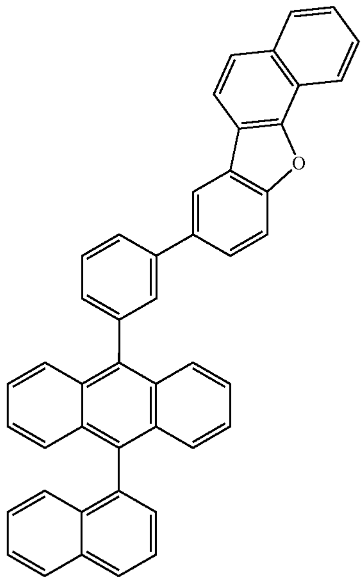

-continued
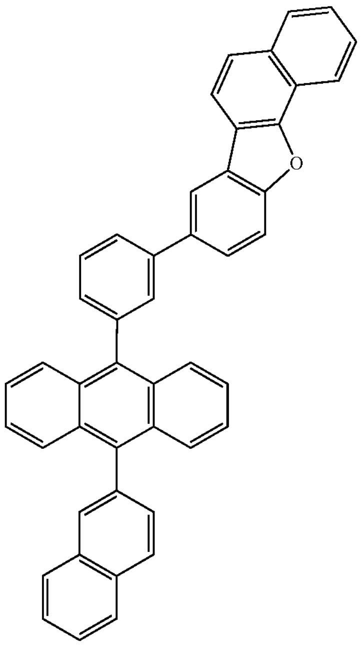
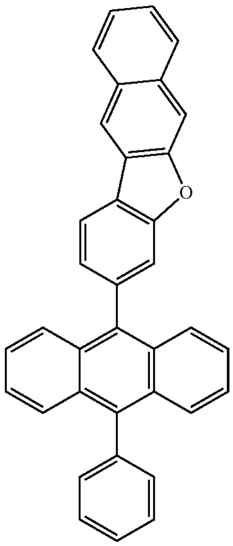
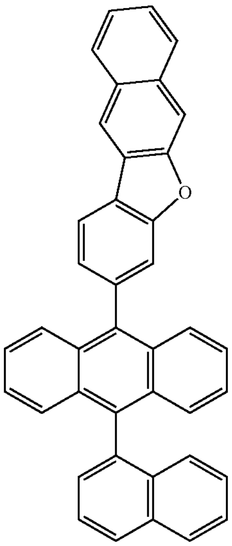
-continued
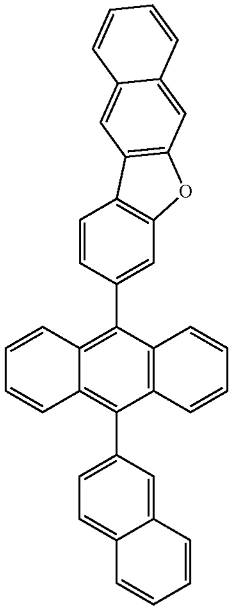
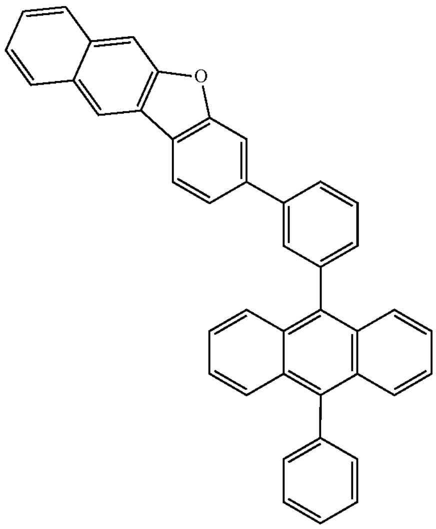
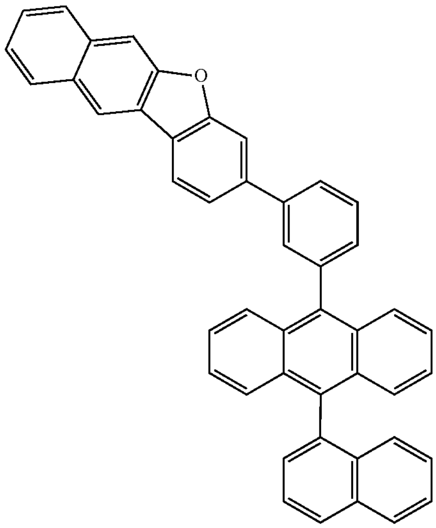

-continued
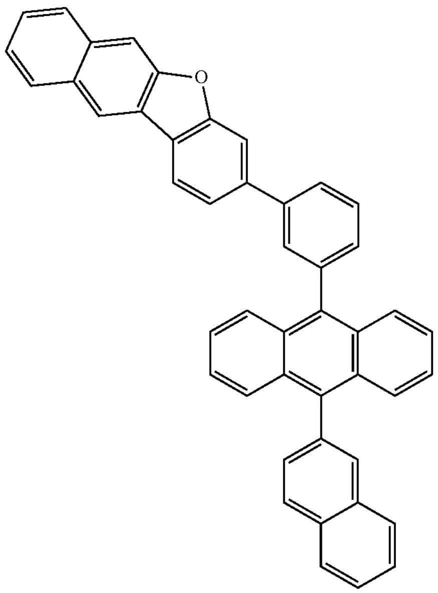
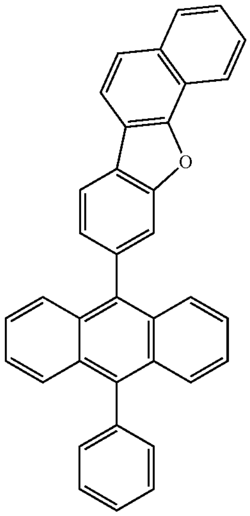
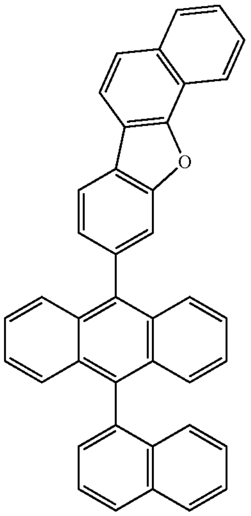
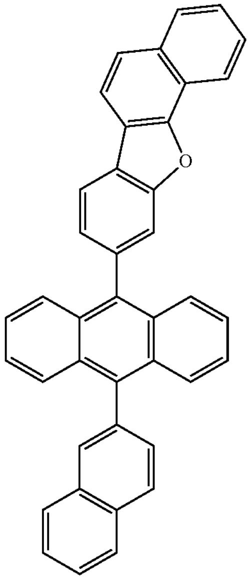
-continued
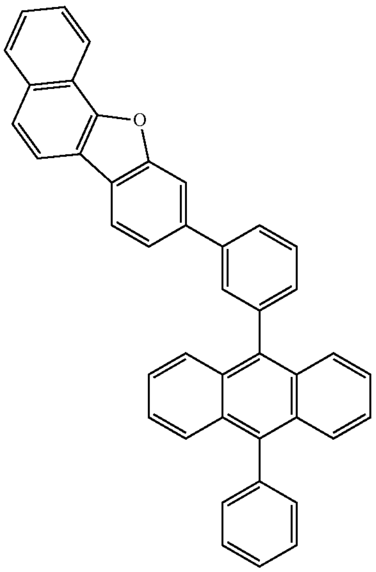
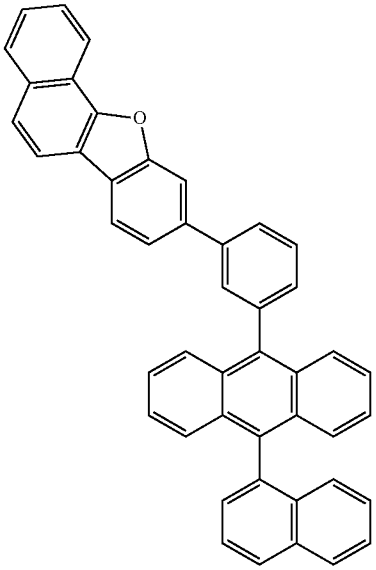

-continued
-continued
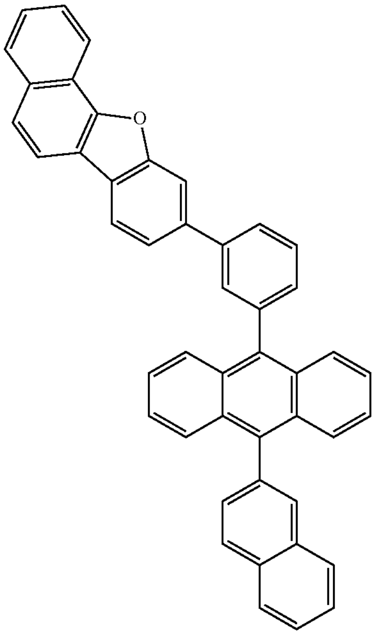
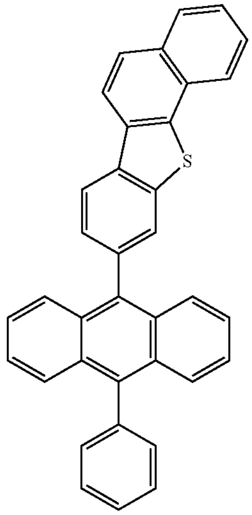
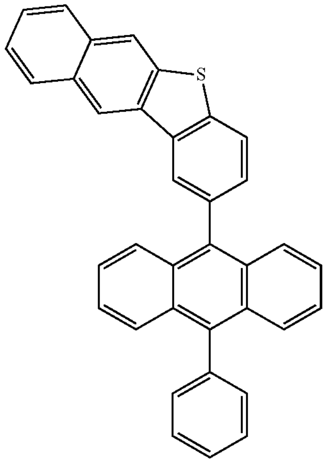
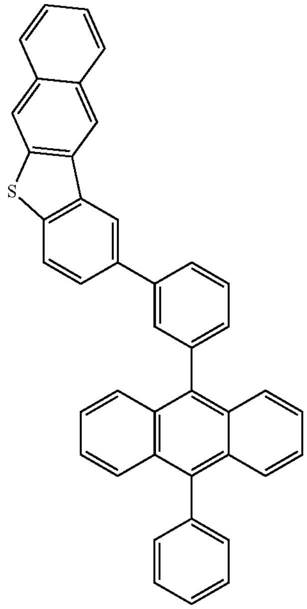
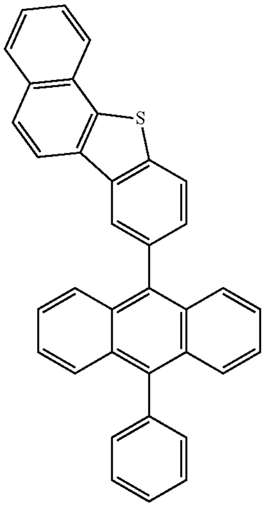
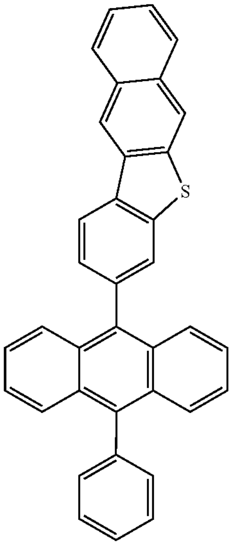
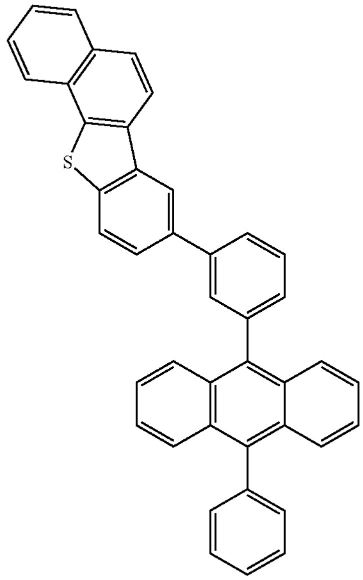

-continued
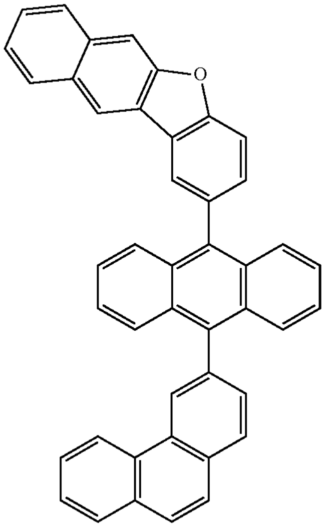
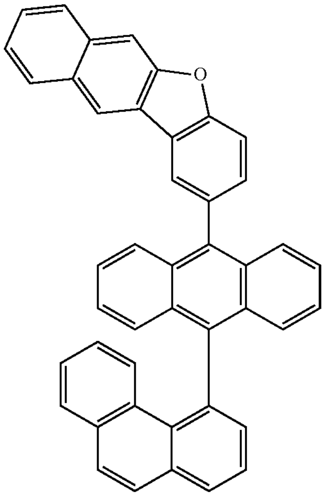
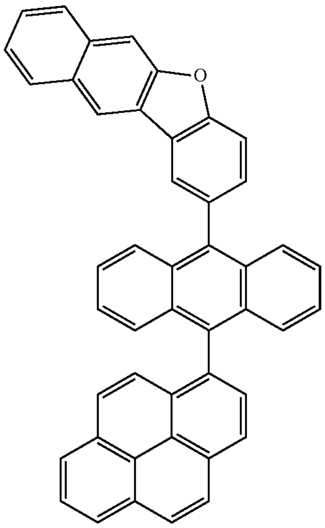
-continued
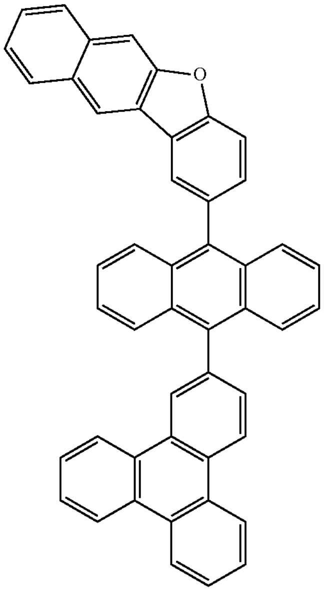
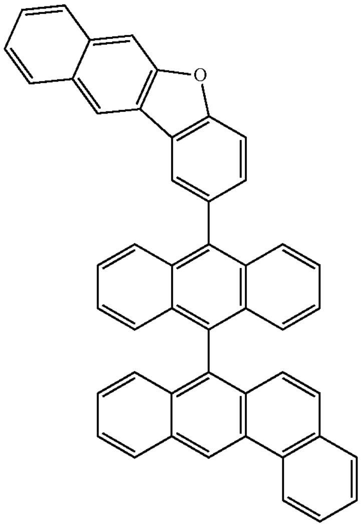
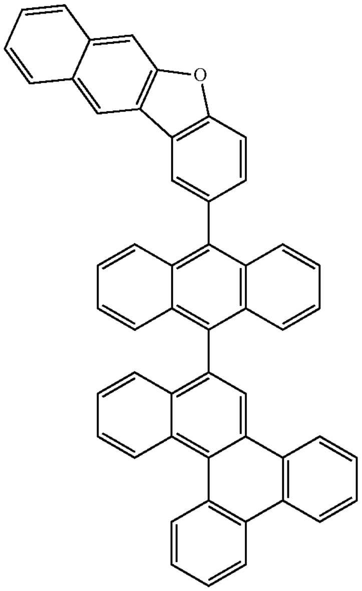

-continued
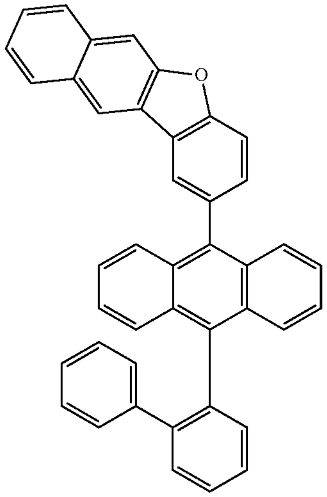
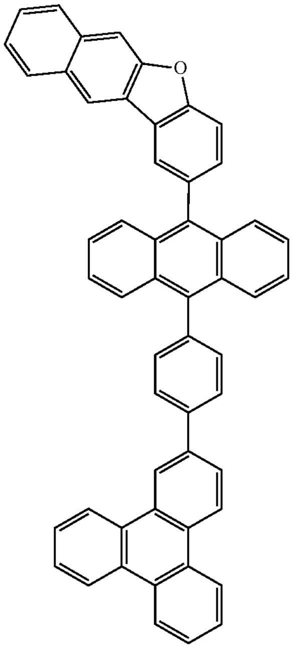
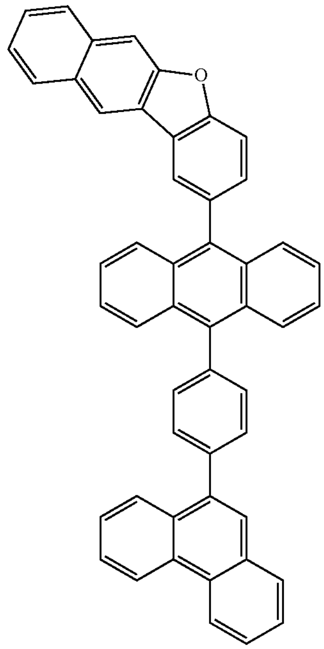
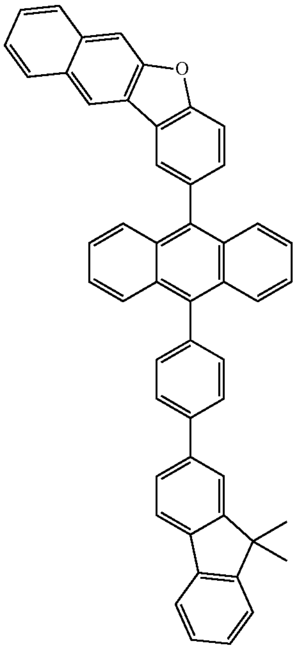

-continued
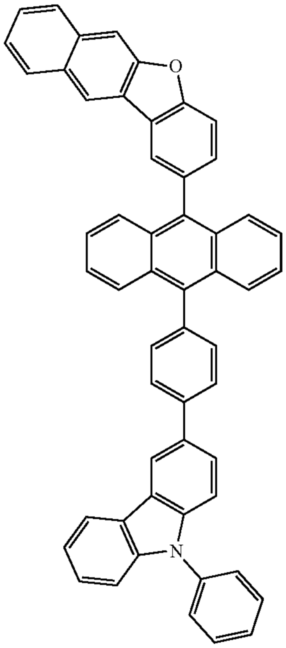
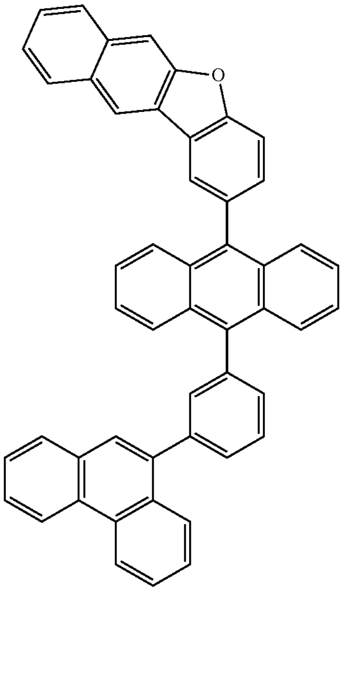
-continued
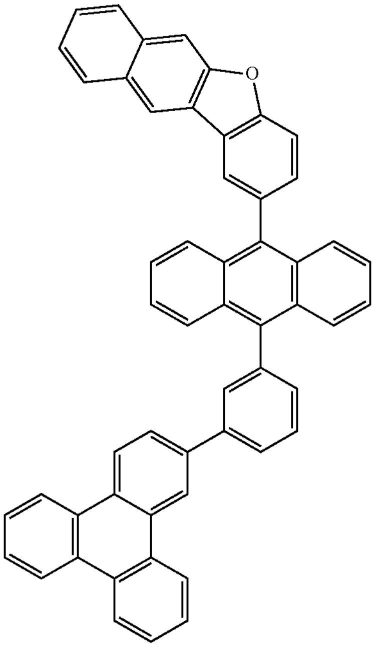
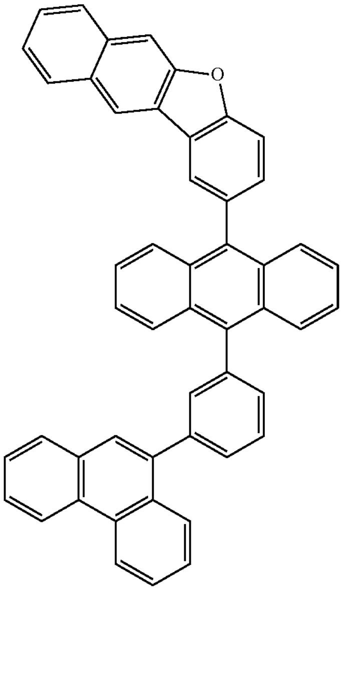

-continued
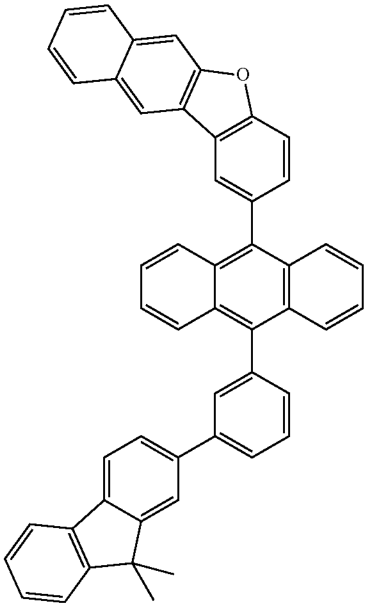
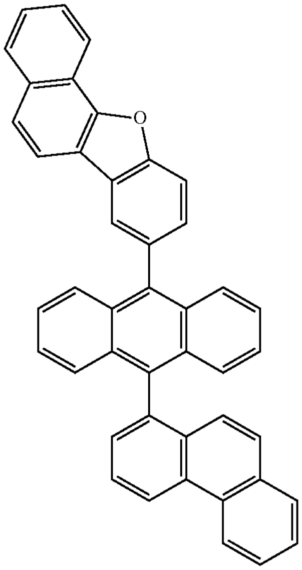
-continued
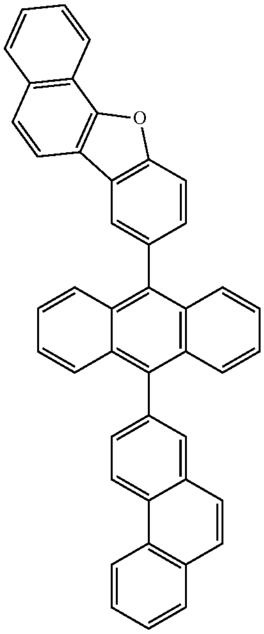
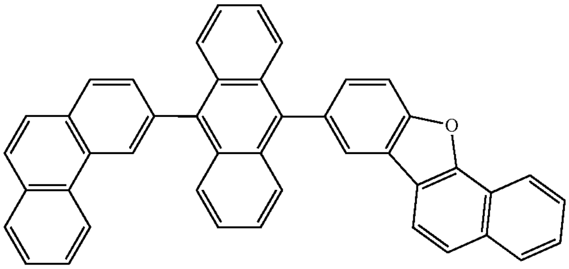
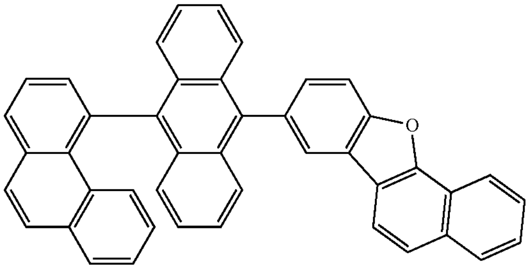
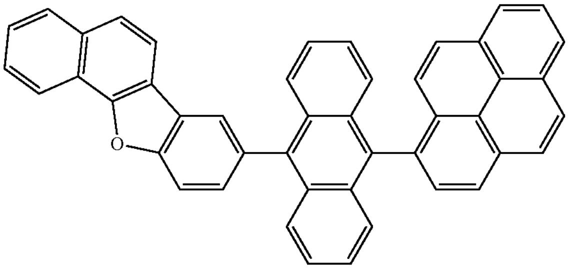

-continued
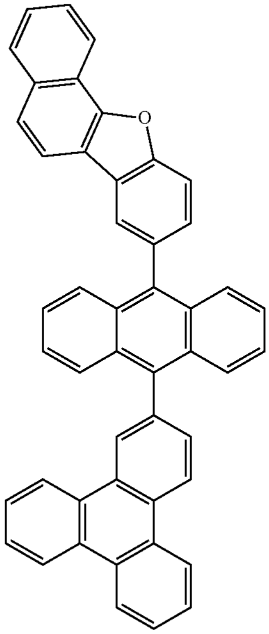
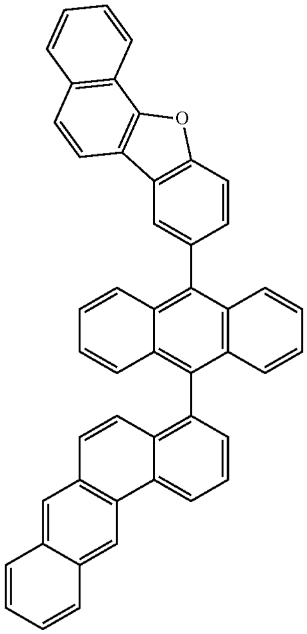
-continued
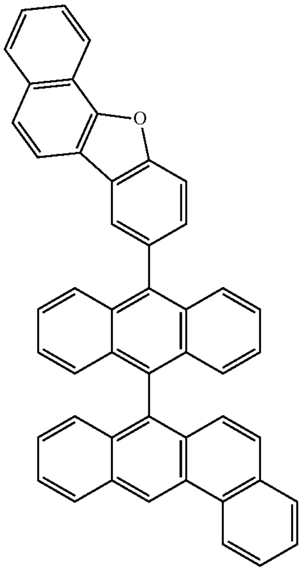
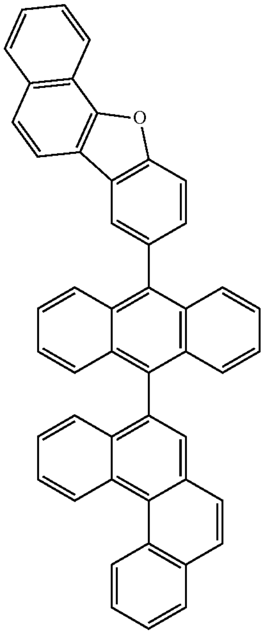

-continued
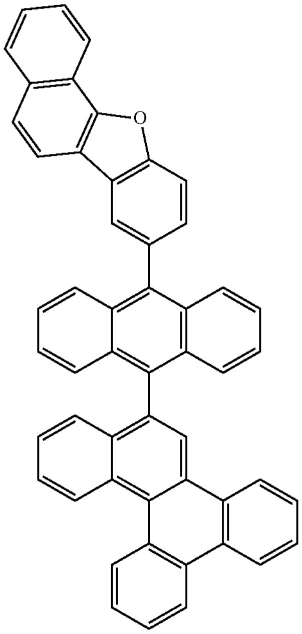
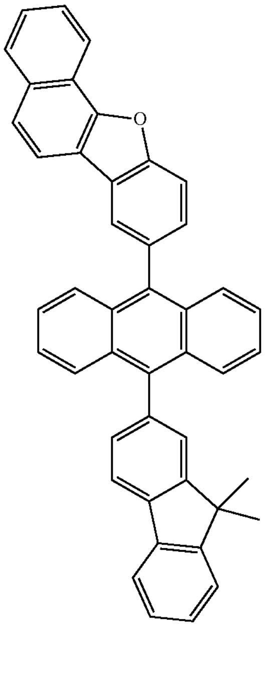
-continued
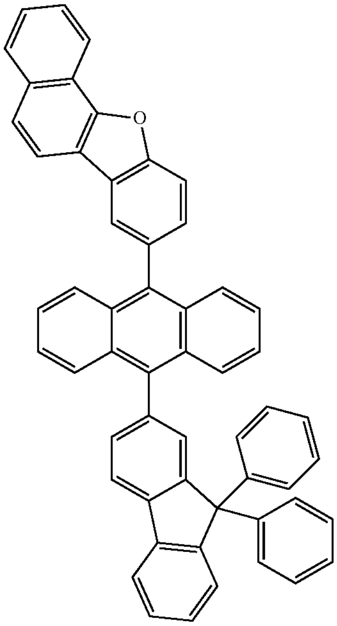
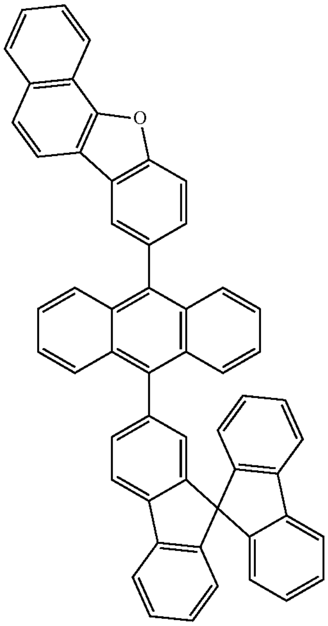

-continued
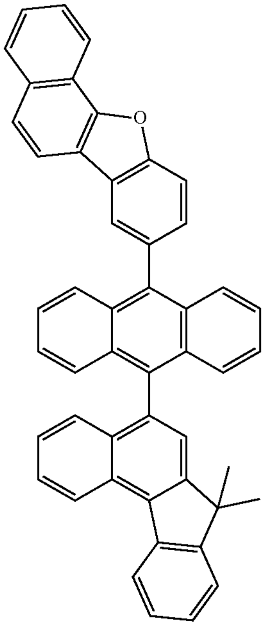
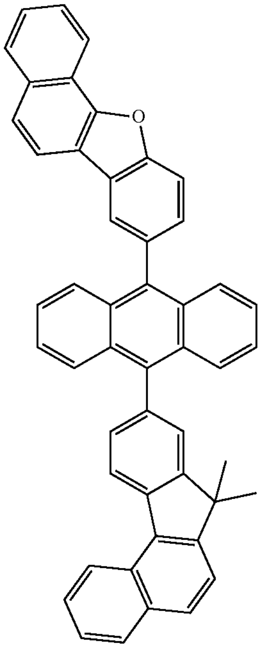
-continued
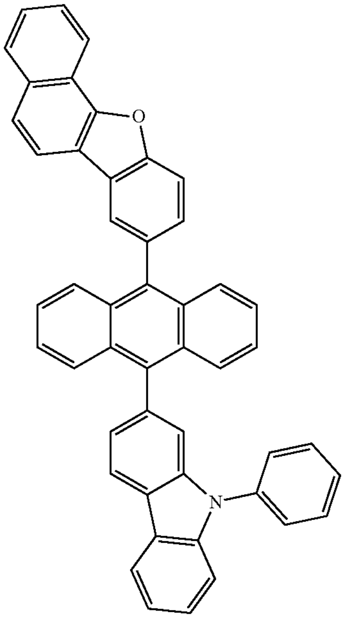
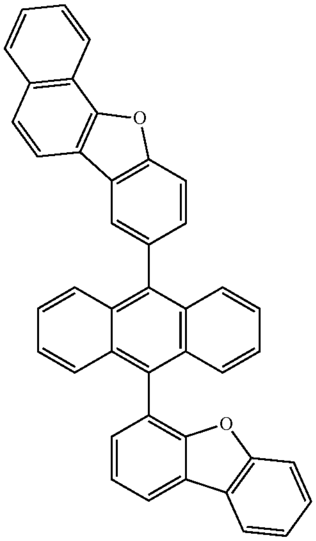

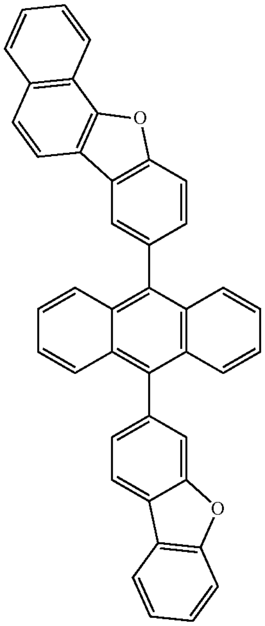
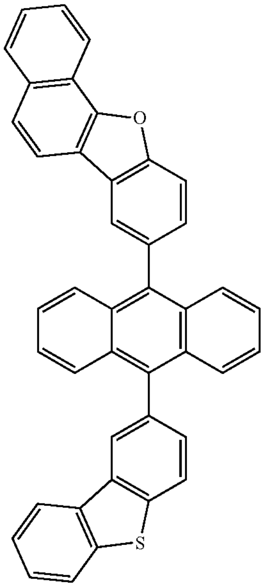
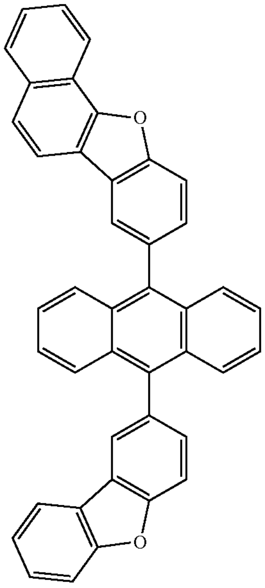
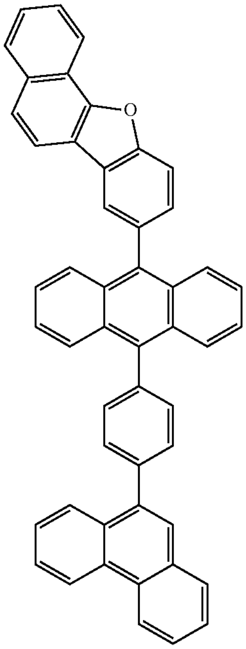

-continued
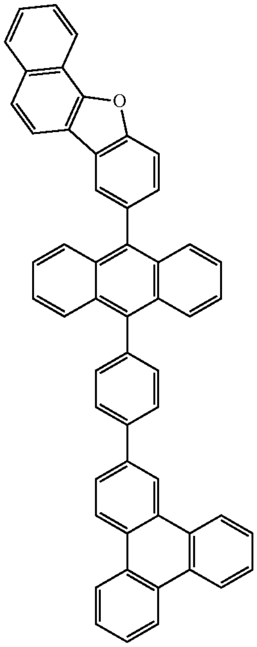
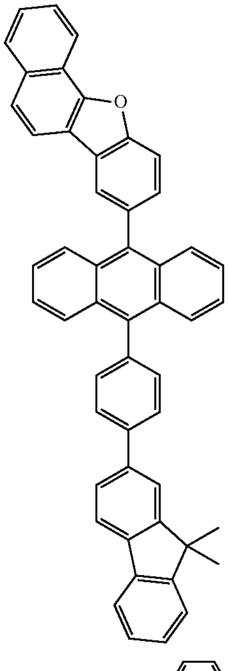
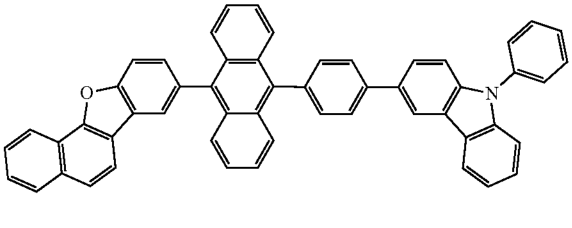
-continued
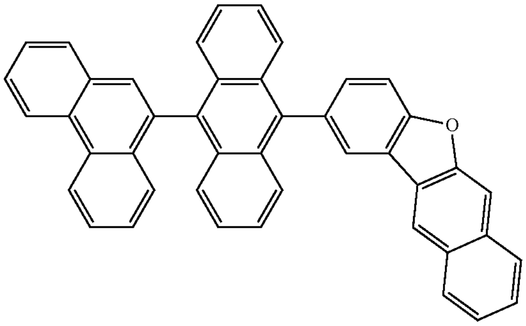
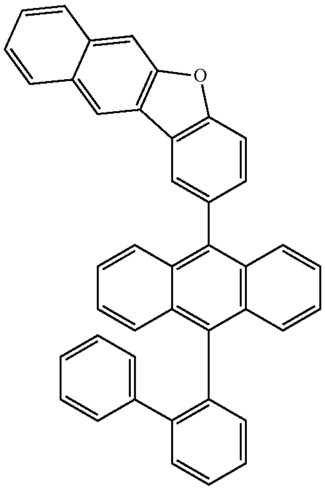
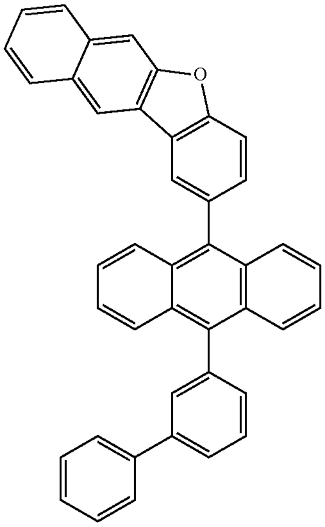

-continued
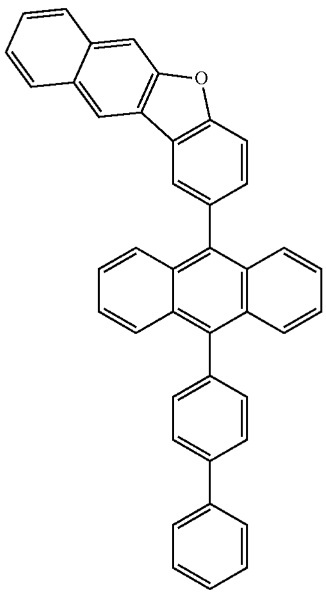
-continued
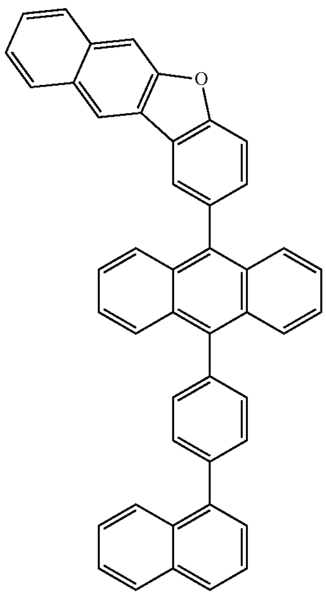
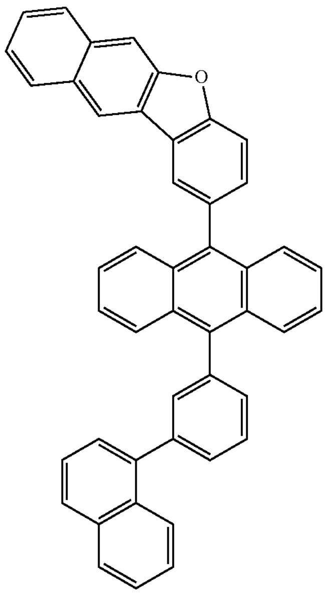
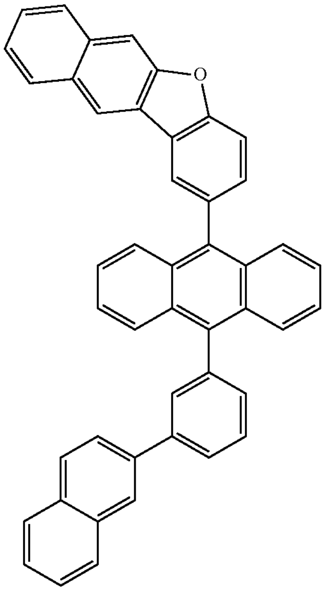

-continued
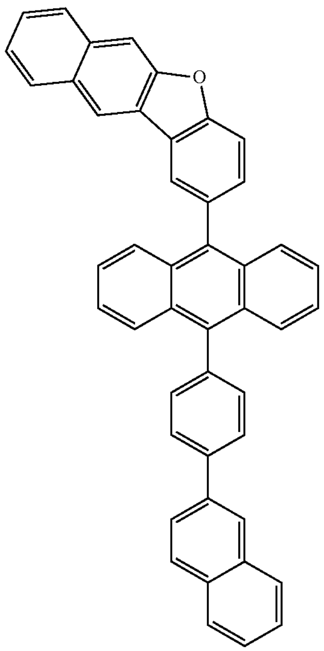
-continued
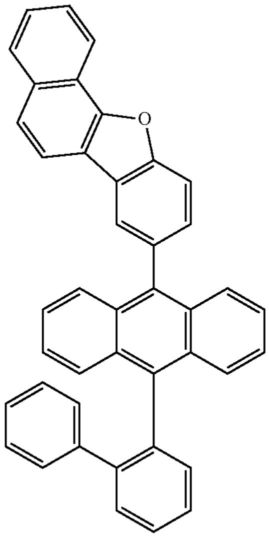
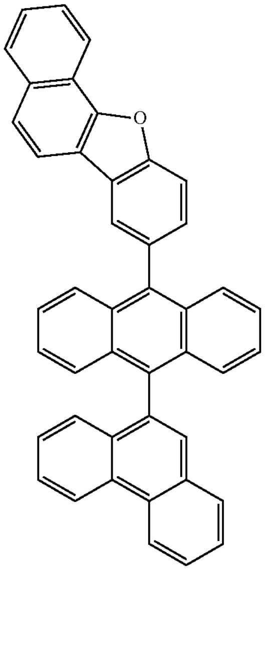
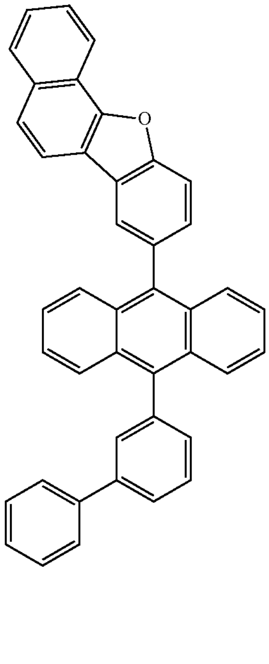

-continued
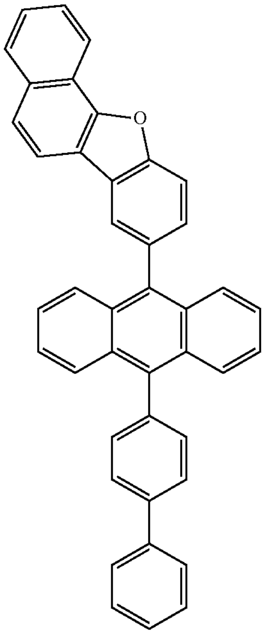
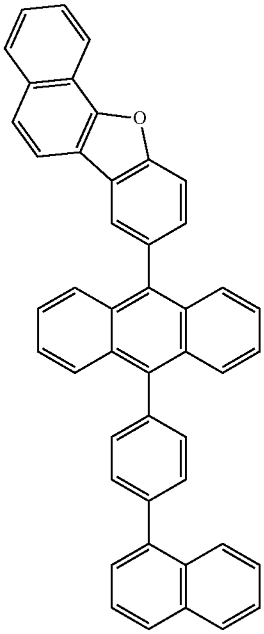
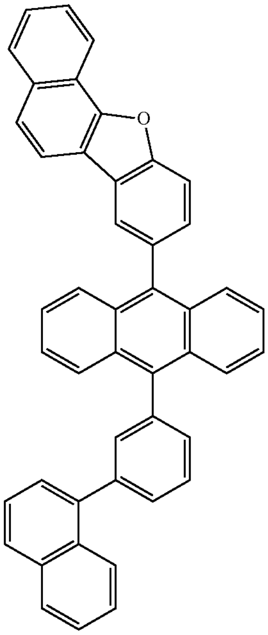
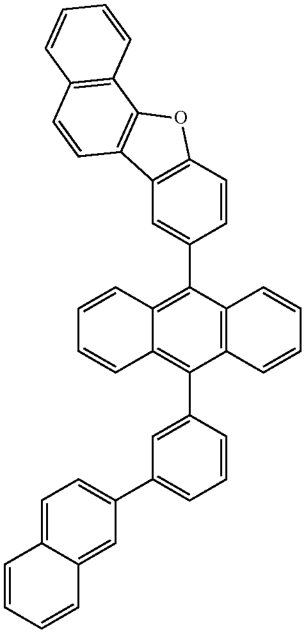
-continued

-continued
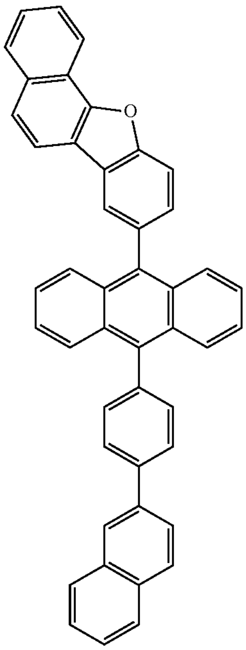
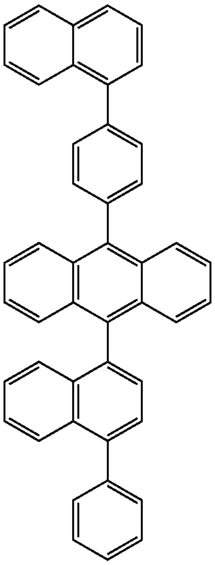
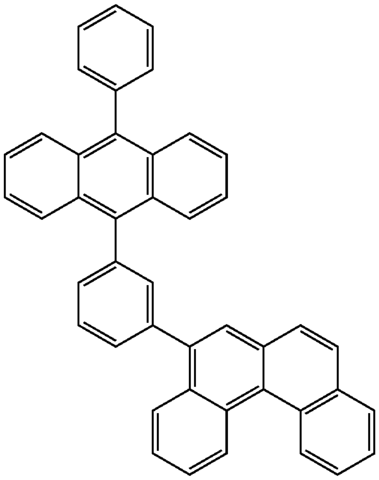
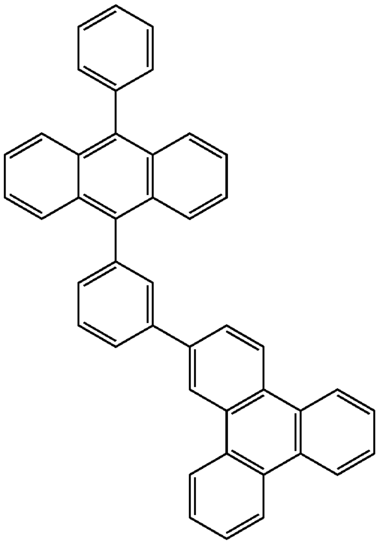
-continued
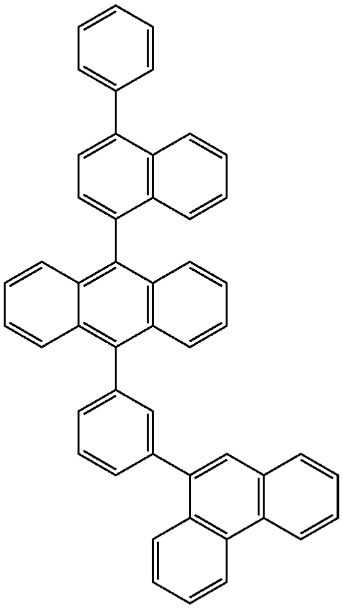
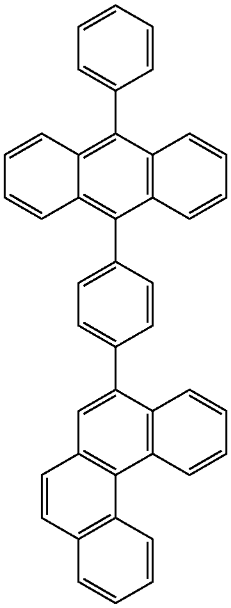
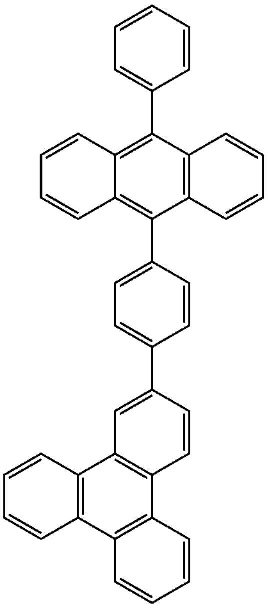

-continued
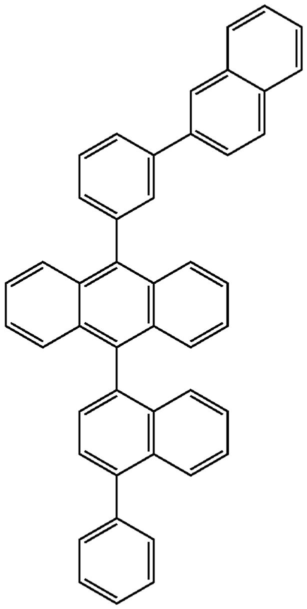
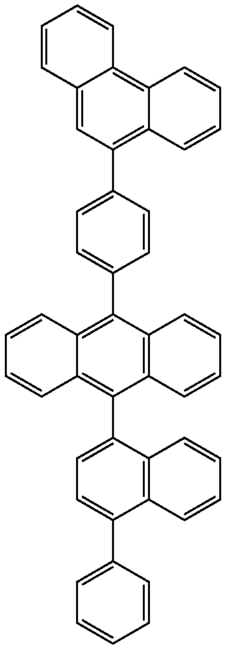
-continued
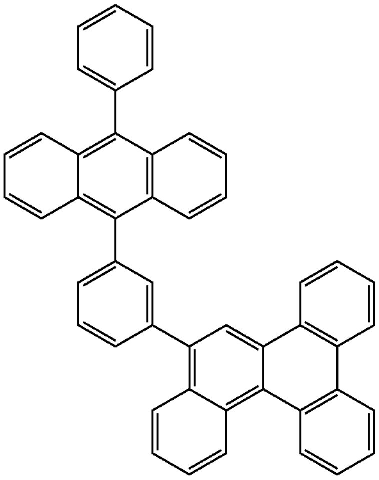
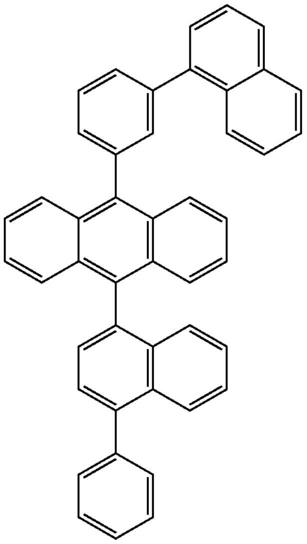
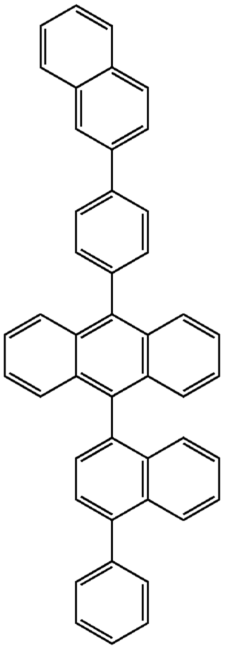
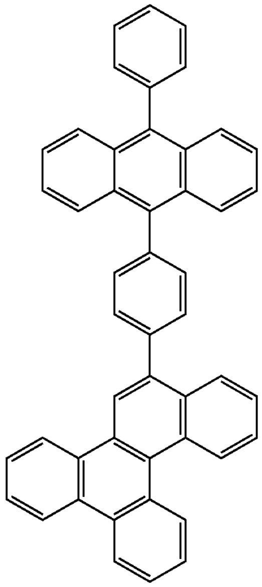

-continued
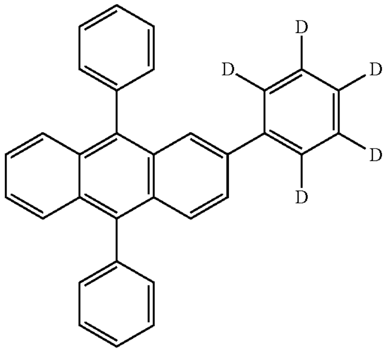
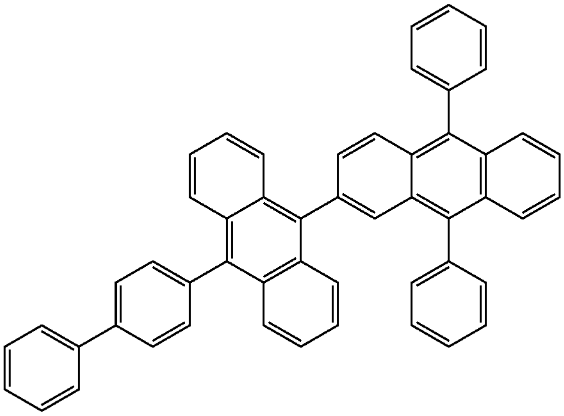
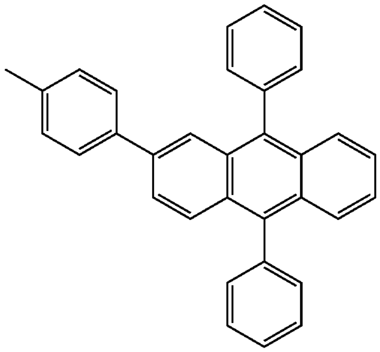
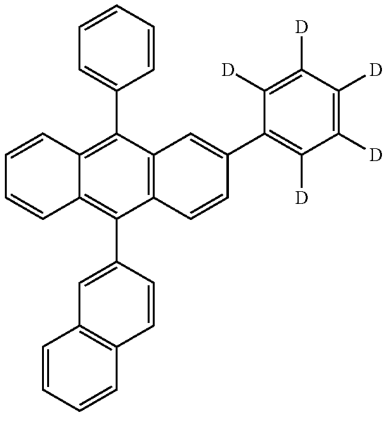
-continued
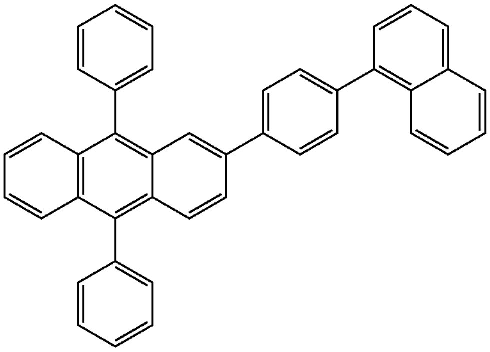
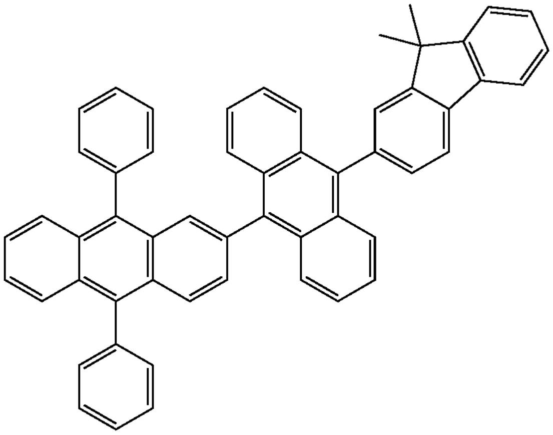
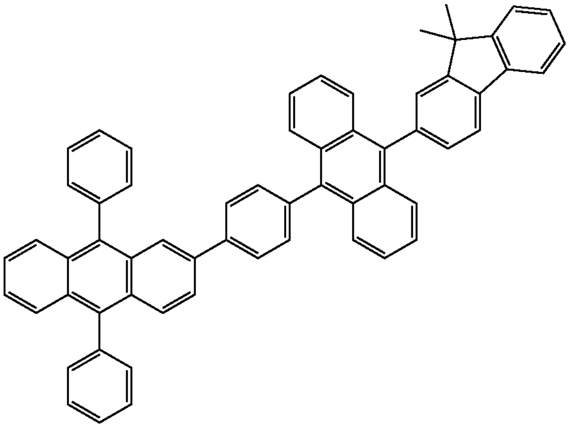
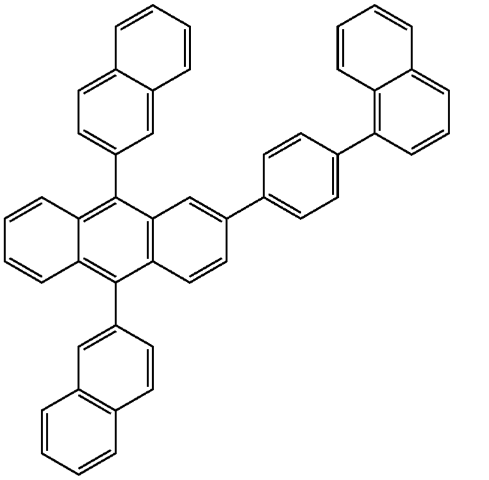

-continued
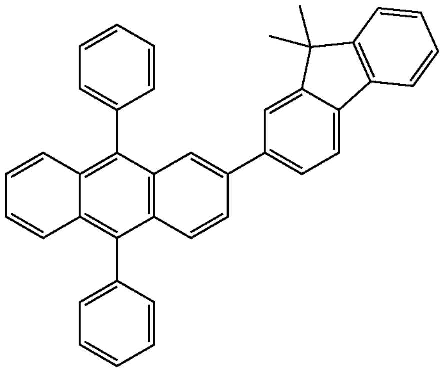
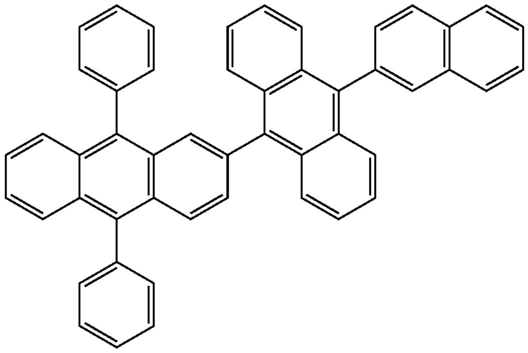
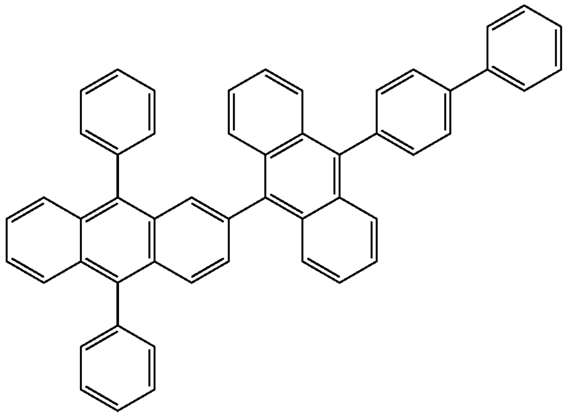
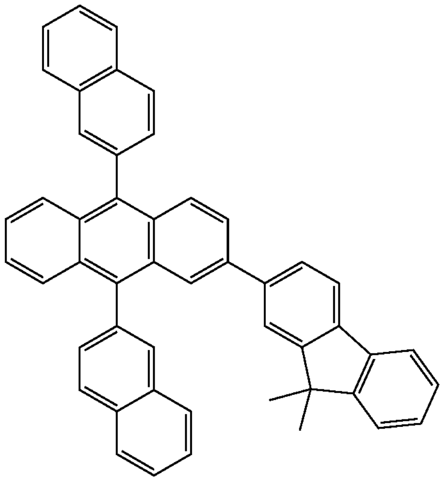
-continued
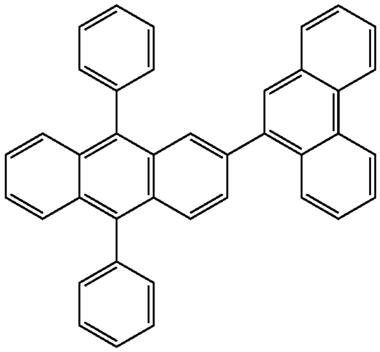
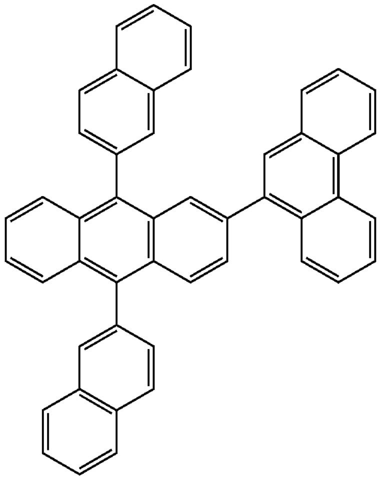
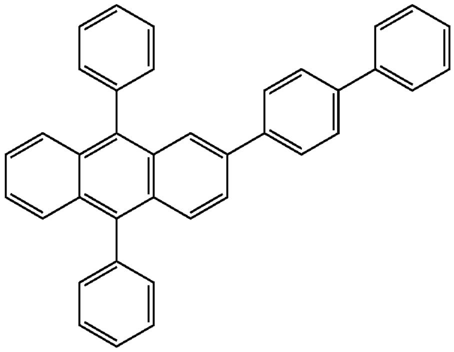
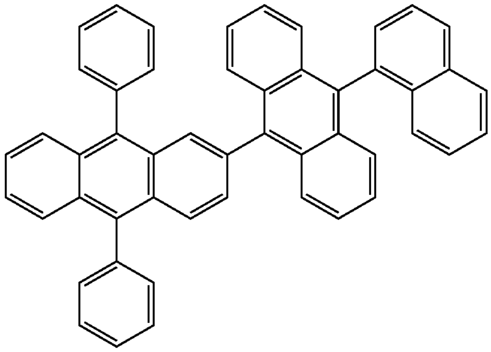

-continued
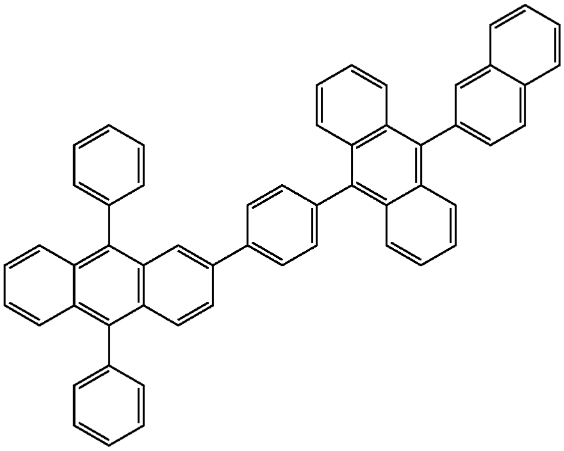
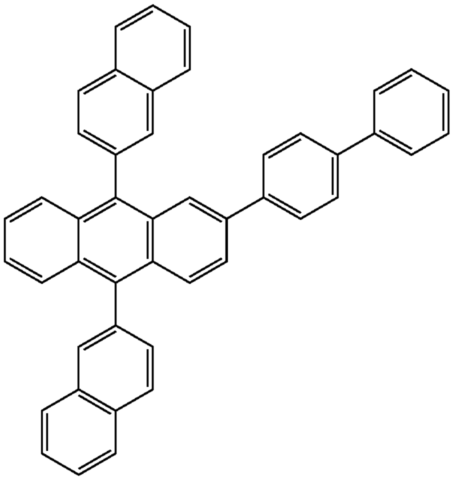
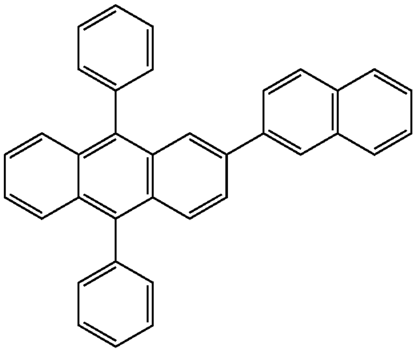
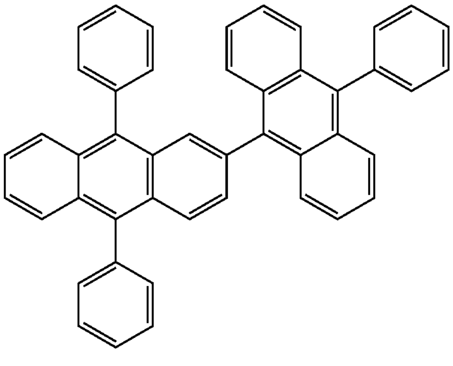
-continued
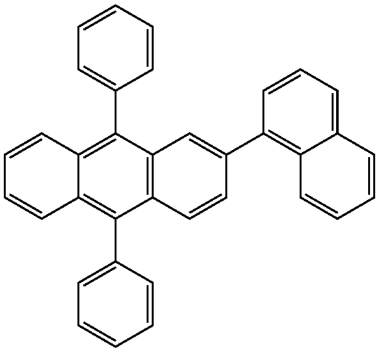
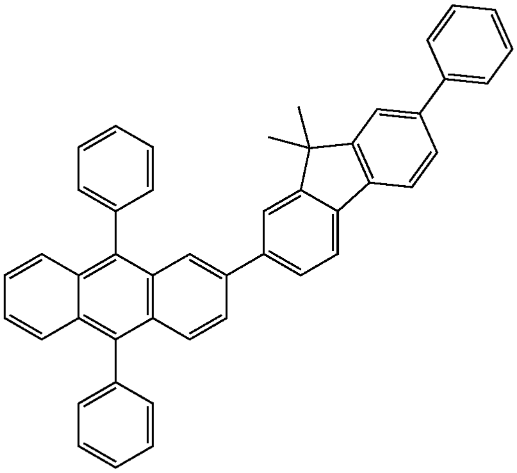
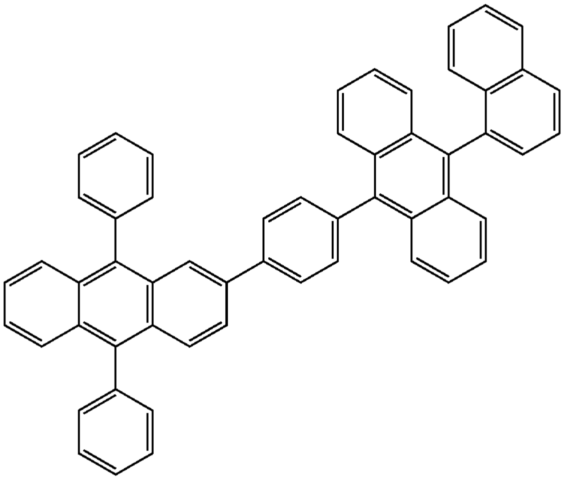

-continued
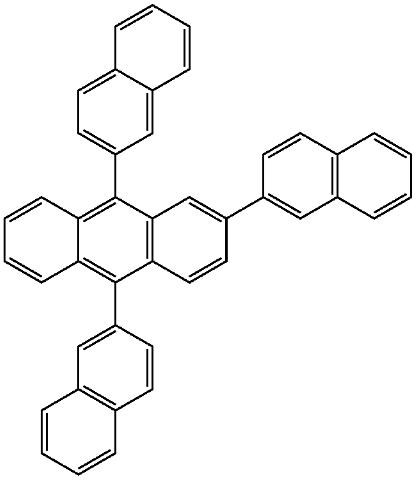
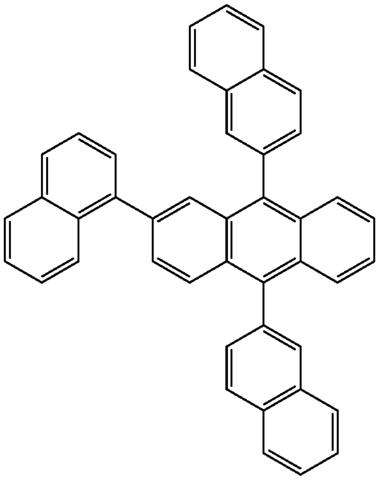
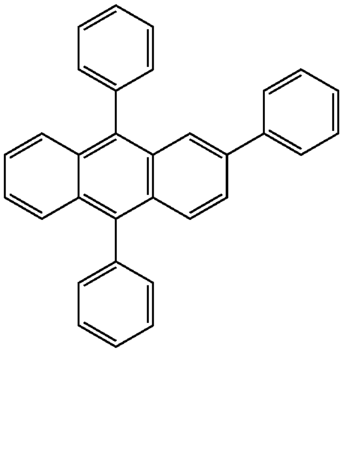
-continued
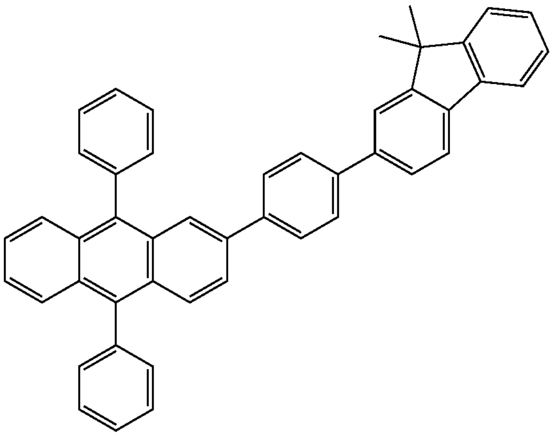
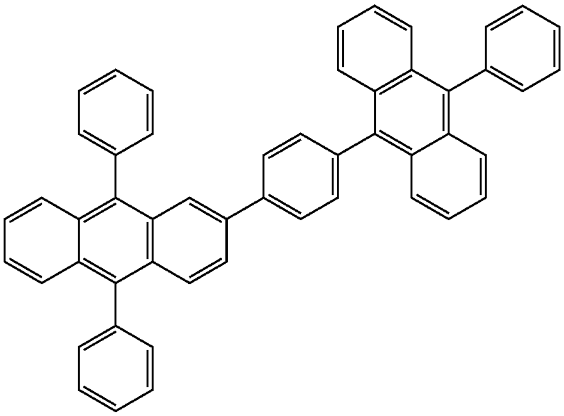
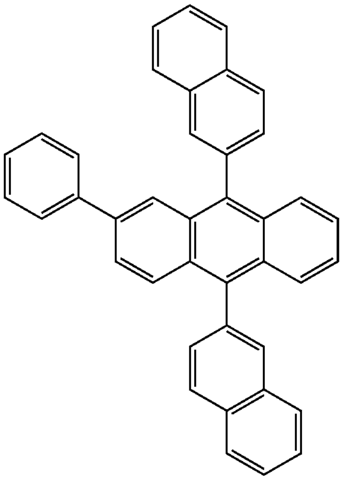
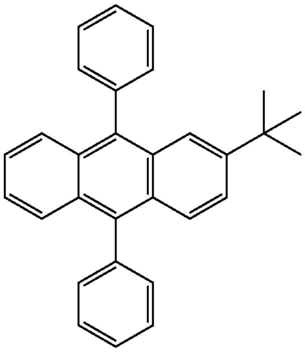

-continued
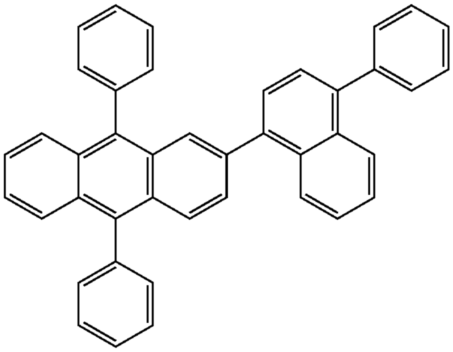
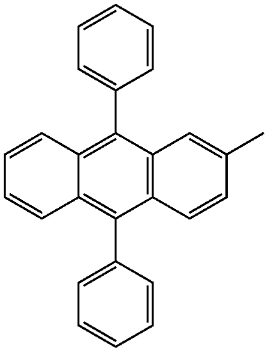
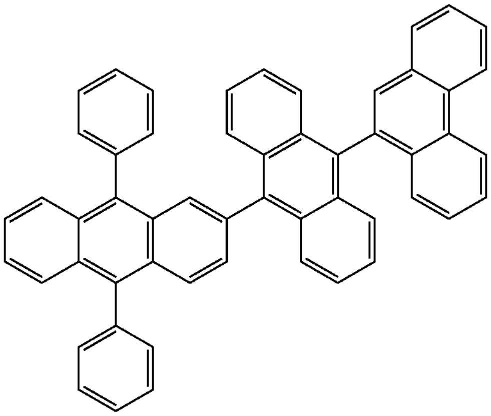
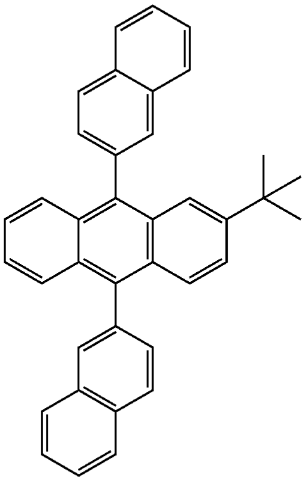
-continued
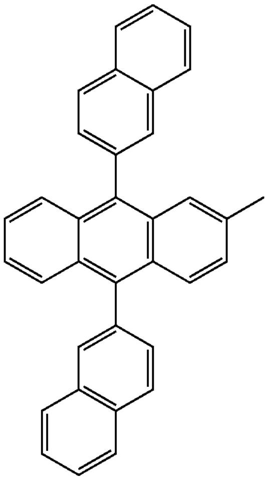
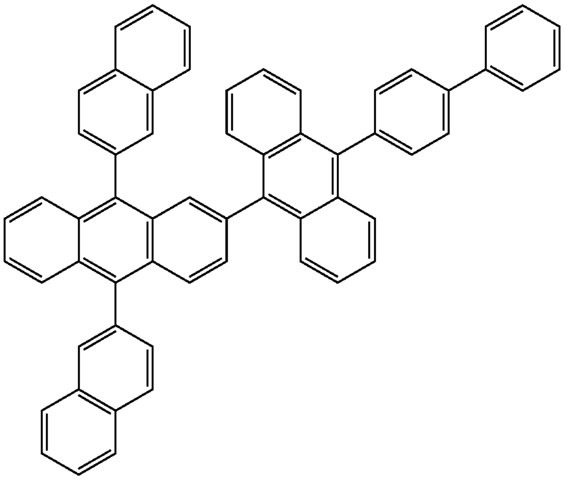
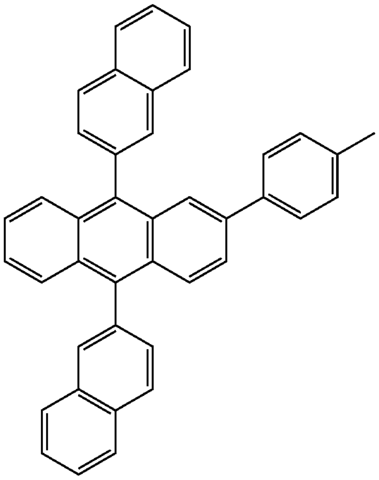

-continued
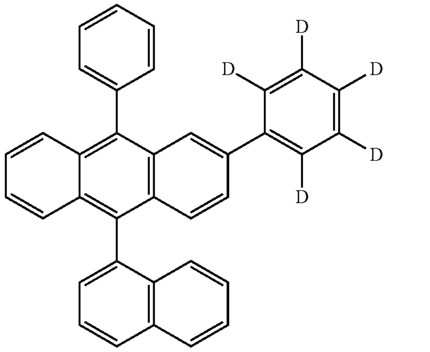
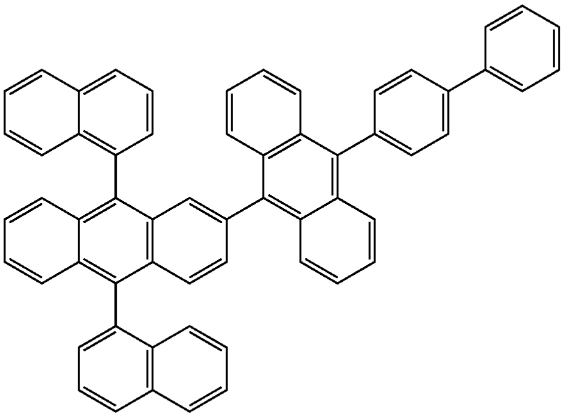
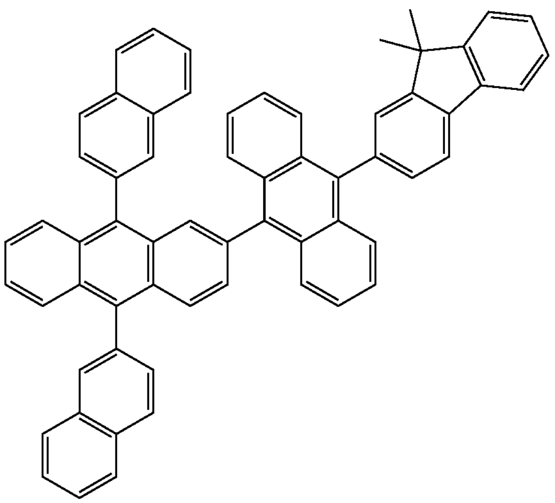
-continued
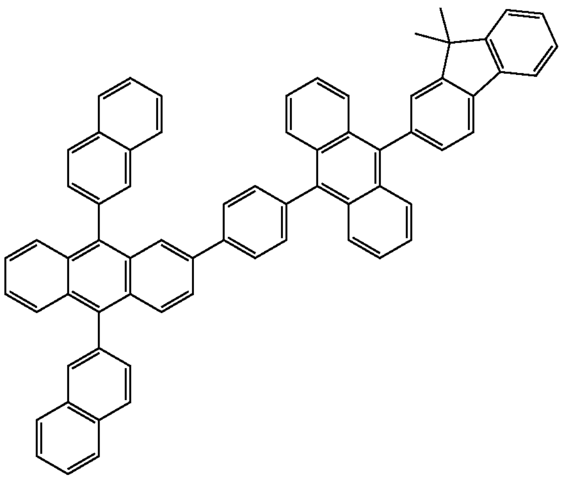
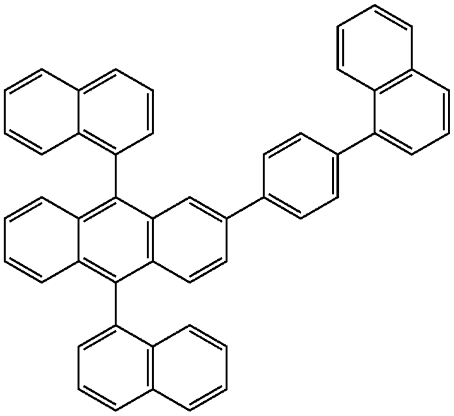
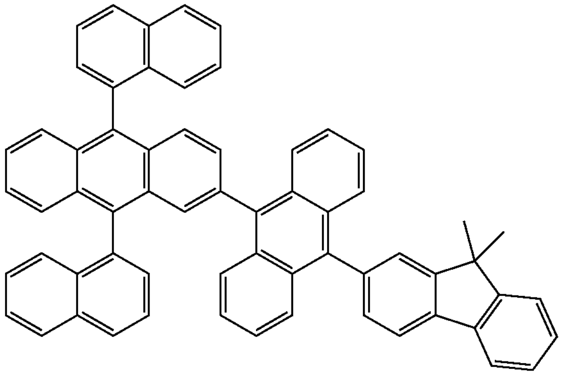
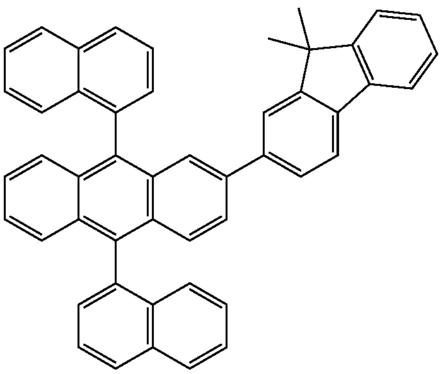

-continued
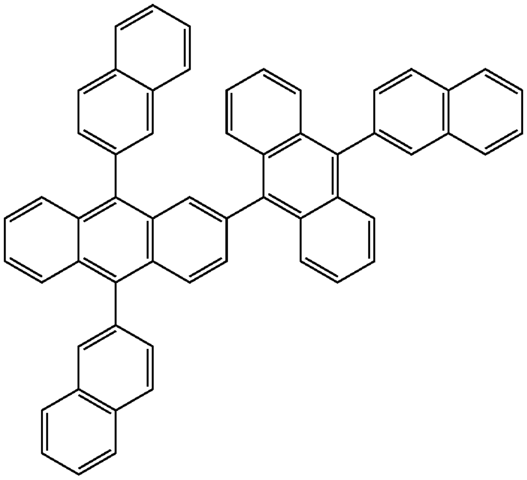
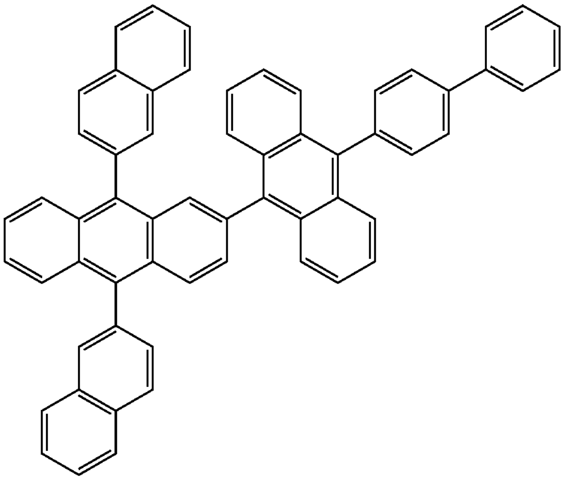
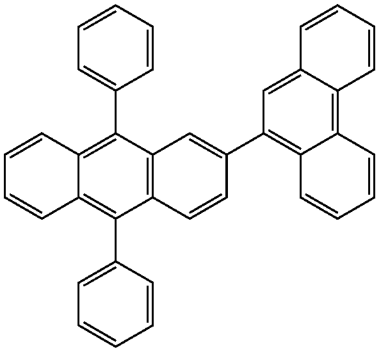
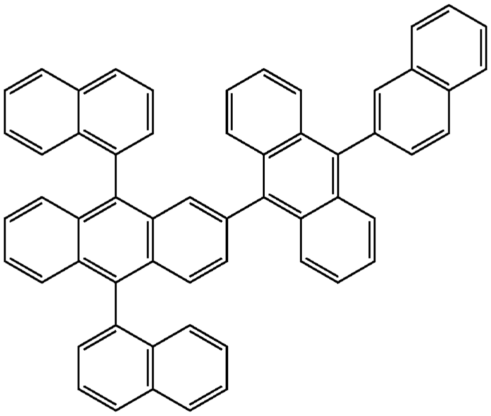
-continued
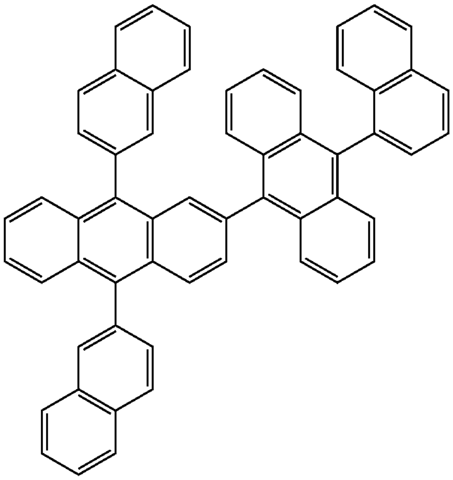
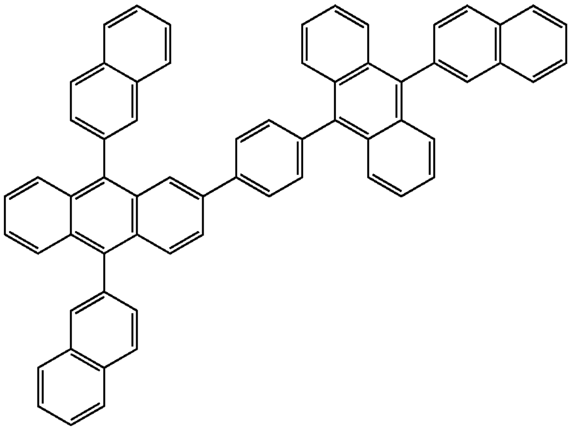
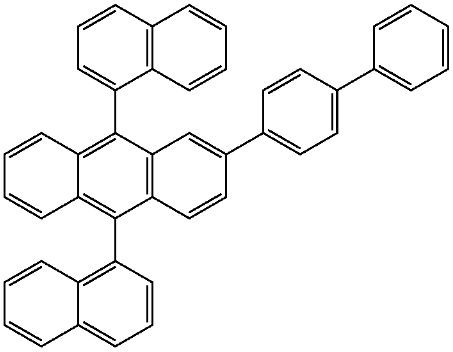
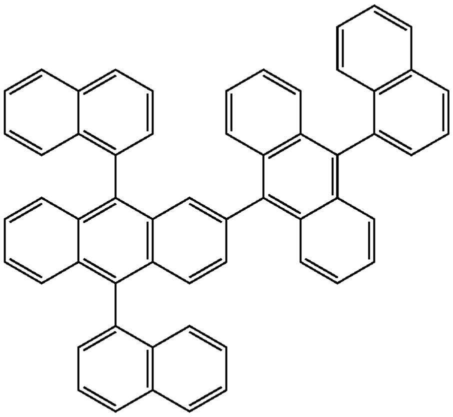

-continued
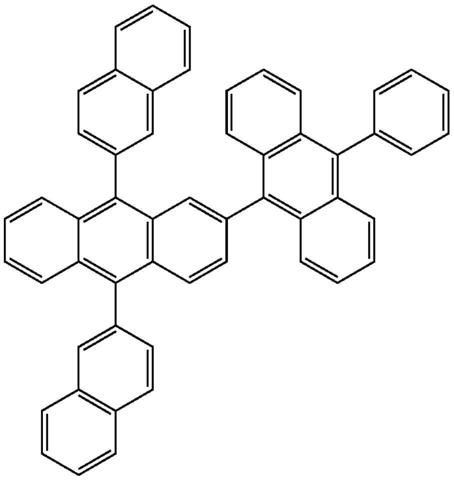
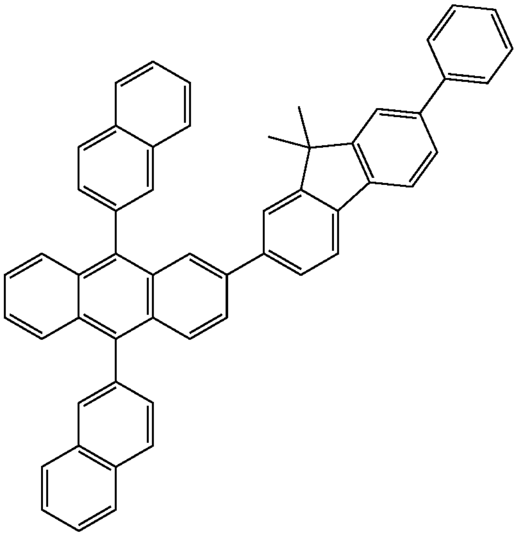
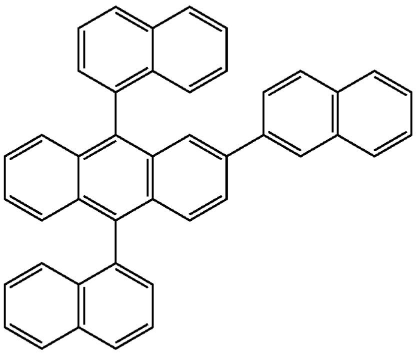
-continued
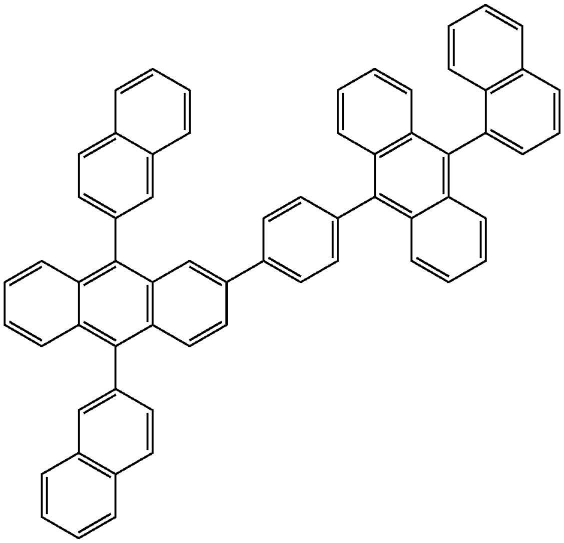
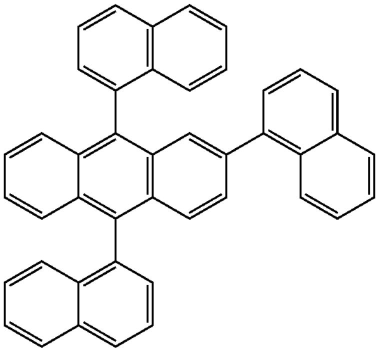
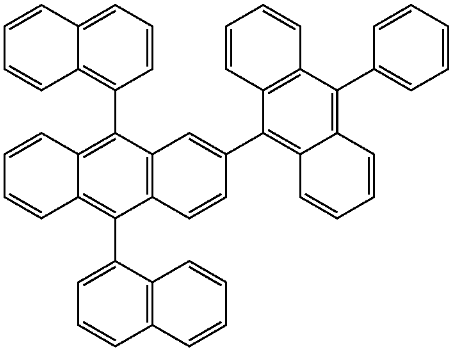
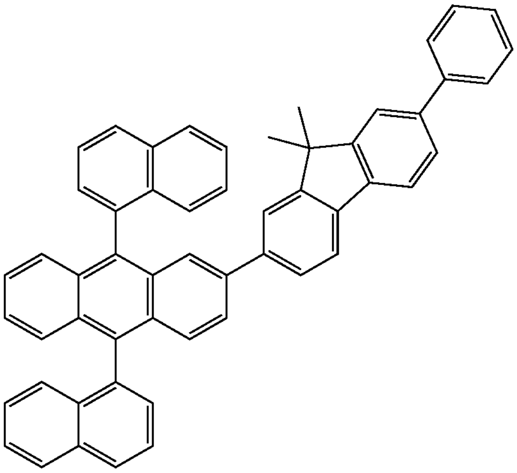

-continued
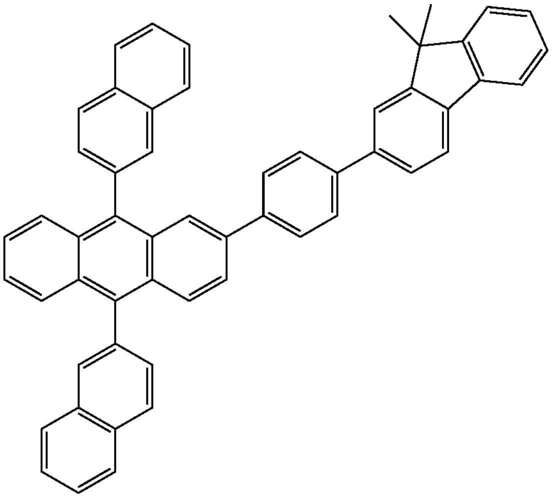
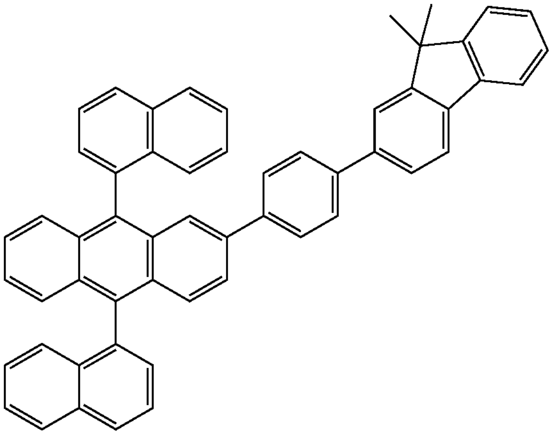
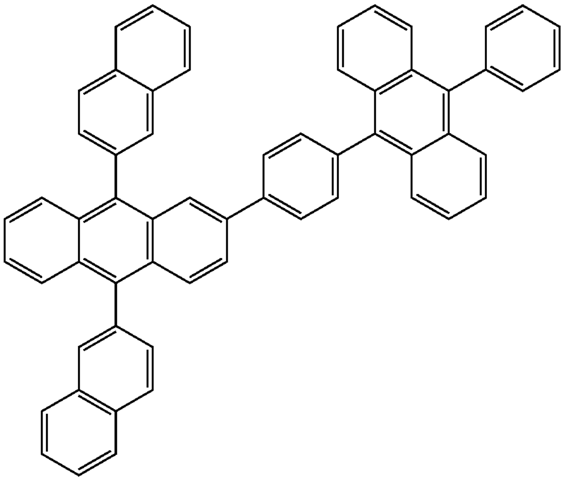
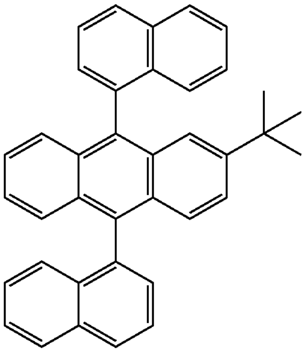
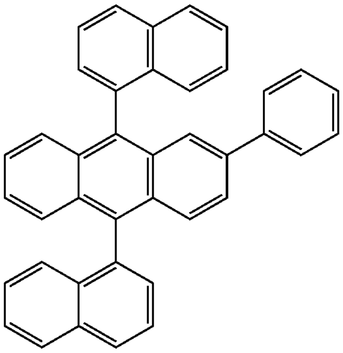
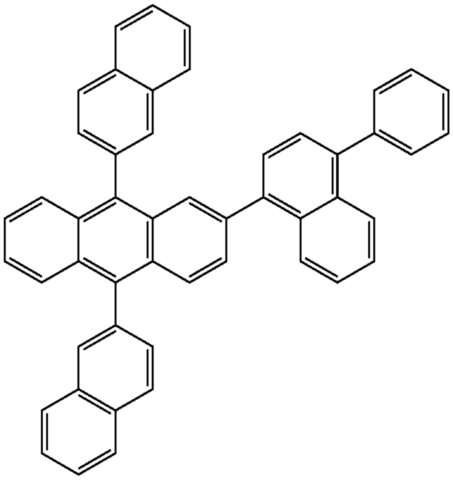
-continued -continued
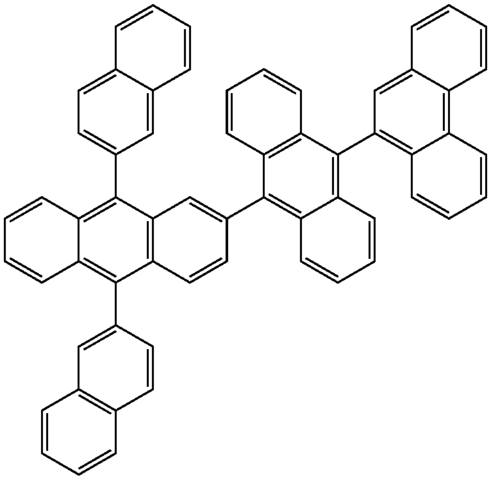
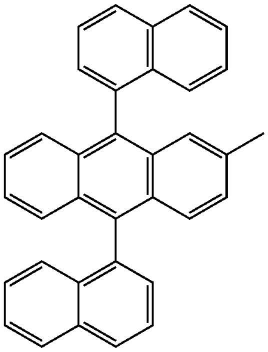
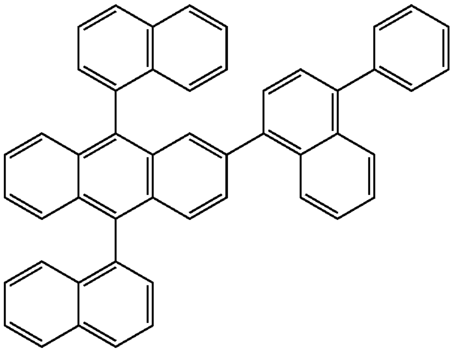
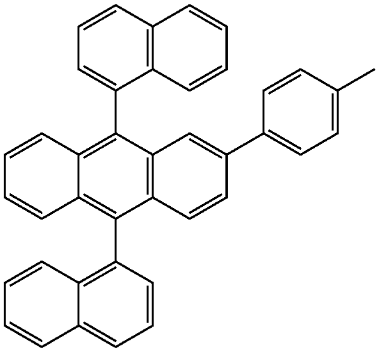
-continued
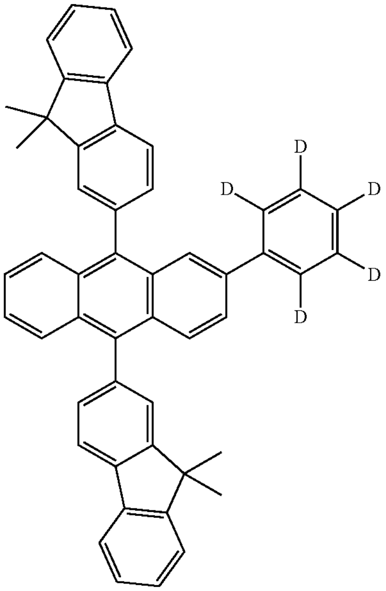
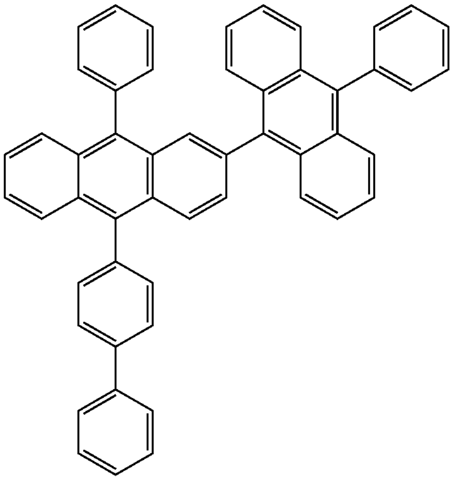
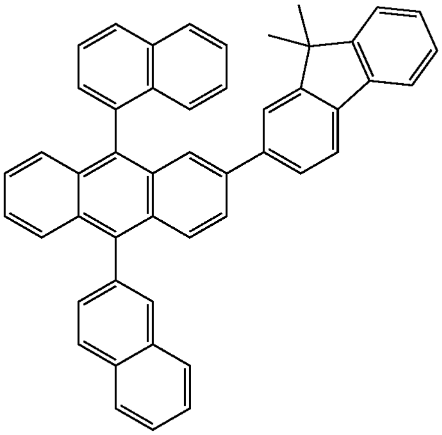

-continued
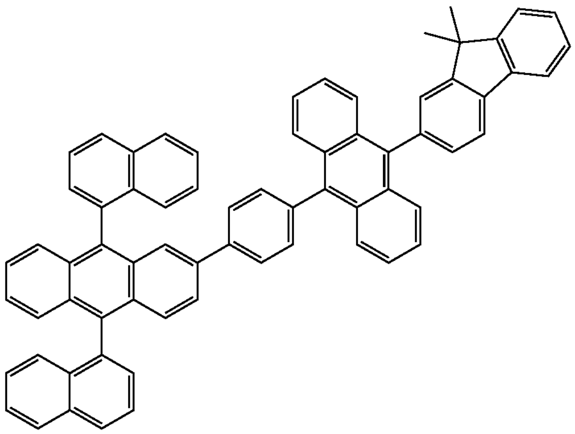
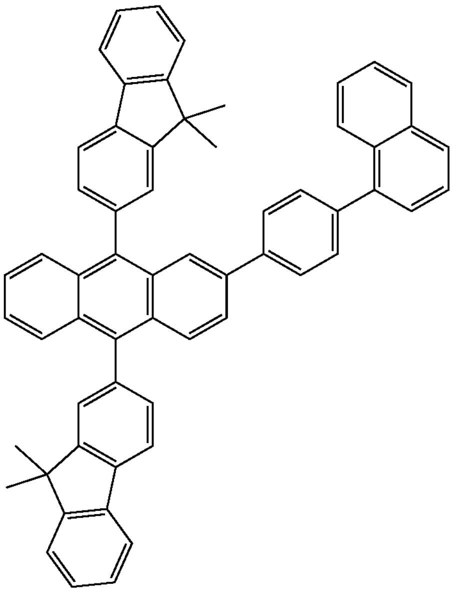
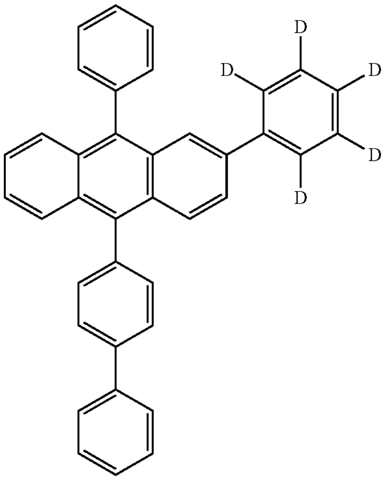
-continued
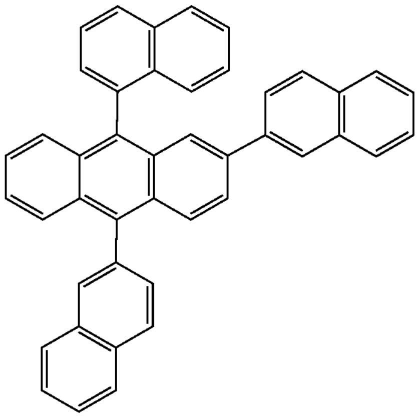
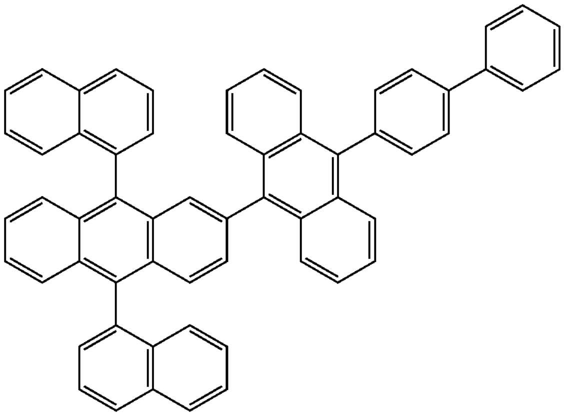
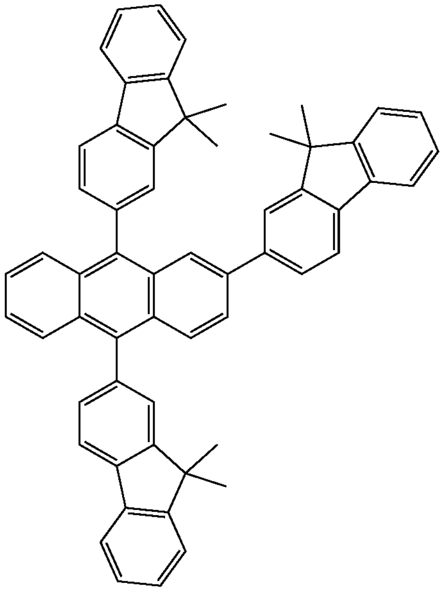 [SMILES: CC1(C)c2ccccc2-c2ccc(-c3ccc4c(-c5ccc6c(c5)C(C)(C)c5ccccc5-6)c5ccccc5c(-c5ccc6c(c5)C(C)(C)c5ccccc5-6)c4c3)cc21]

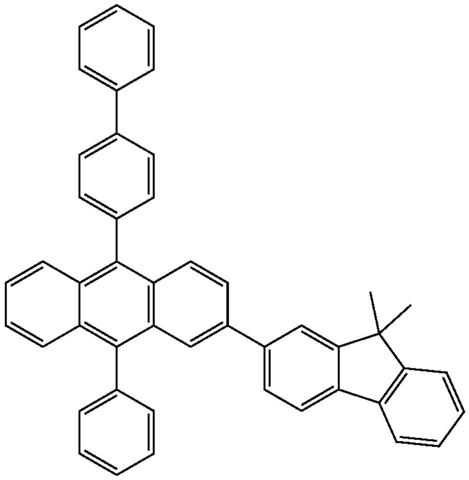
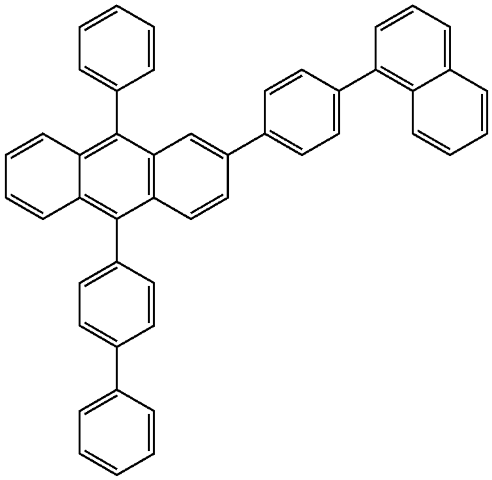
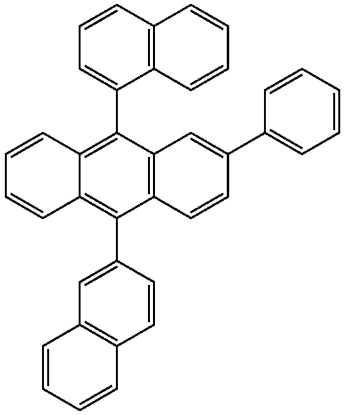
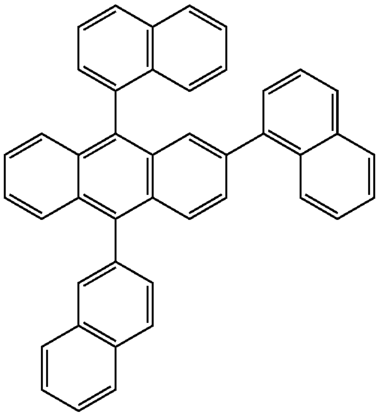
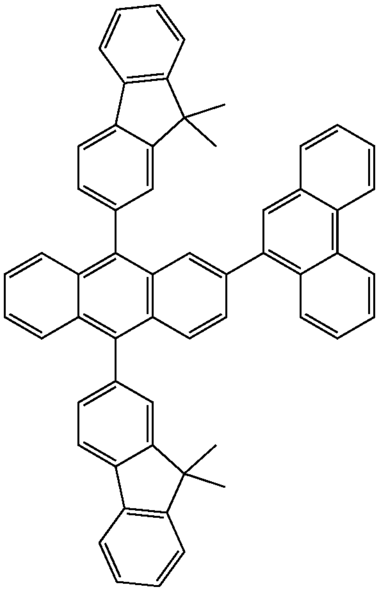
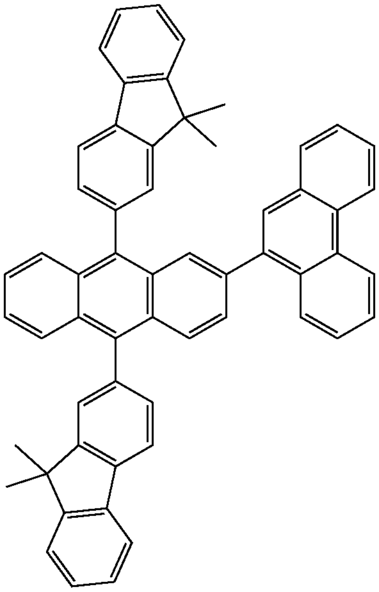

-continued
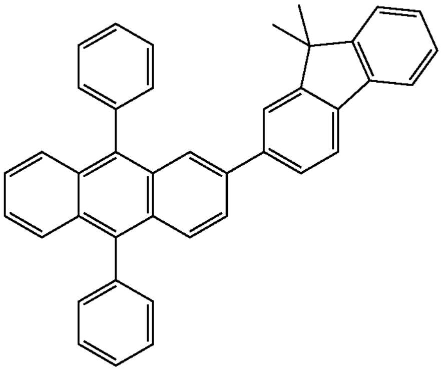
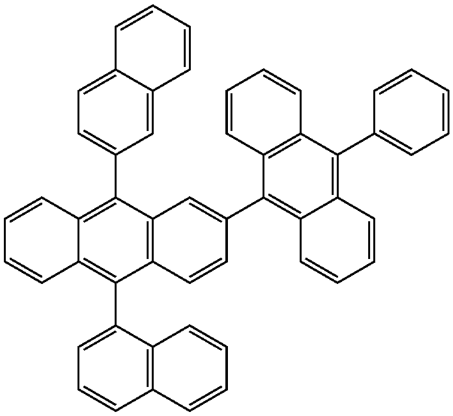
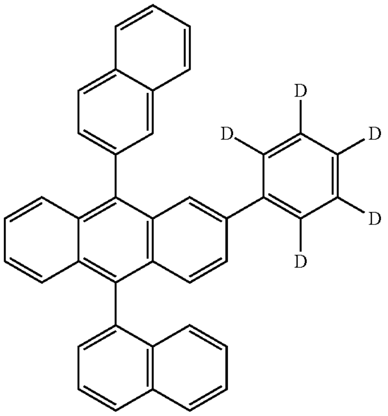
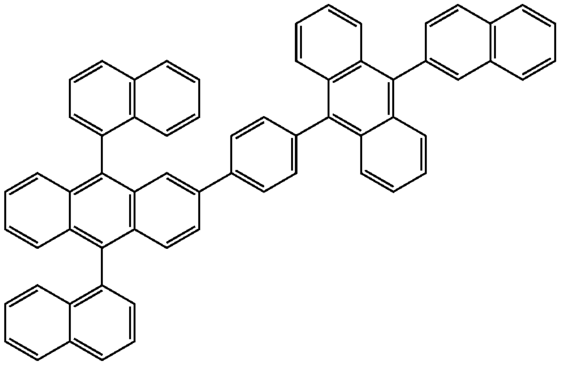
-continued
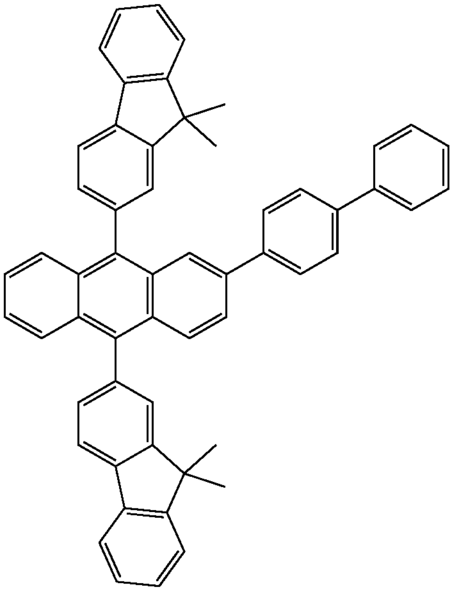
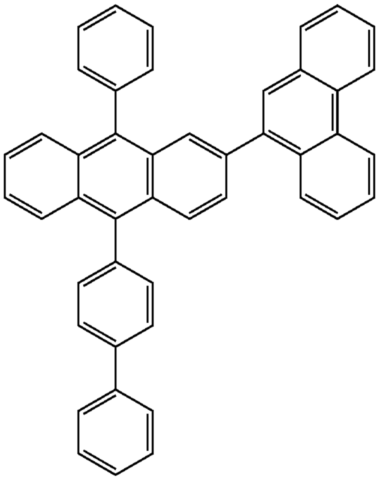
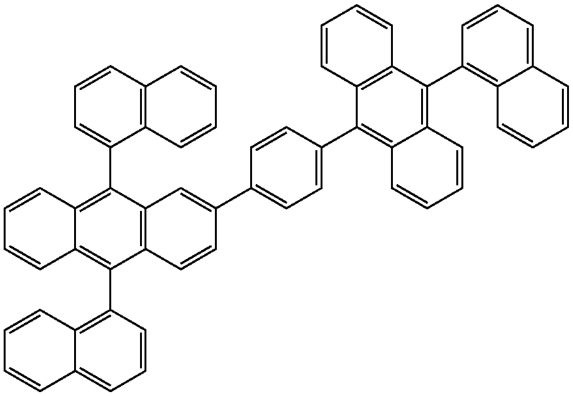

-continued
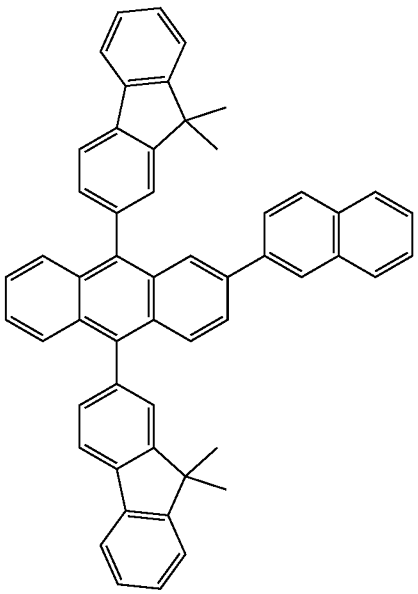
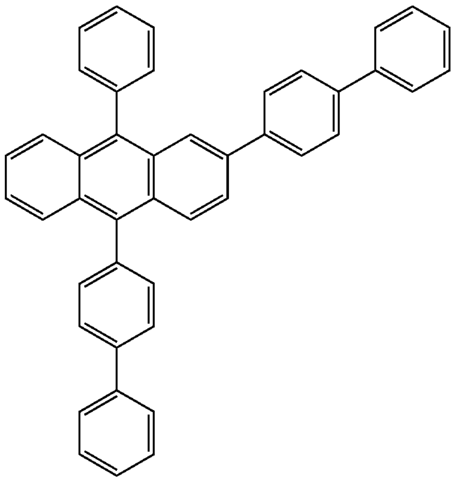
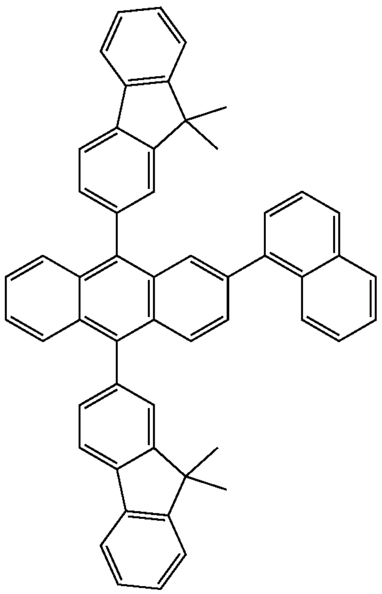
-continued
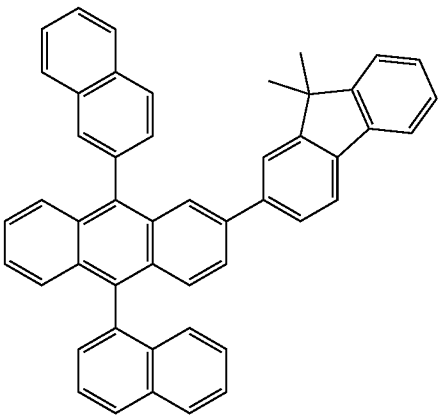
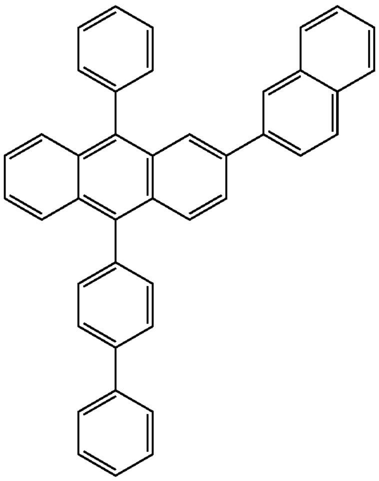 [SMILES: c1ccc(-c2ccc(-c3c4ccccc4c(-c4ccccc4)c4cc(-c5ccc6ccccc6c5)ccc34)cc2)cc1]
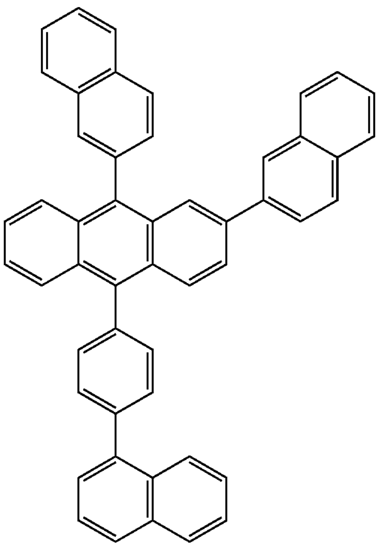

-continued
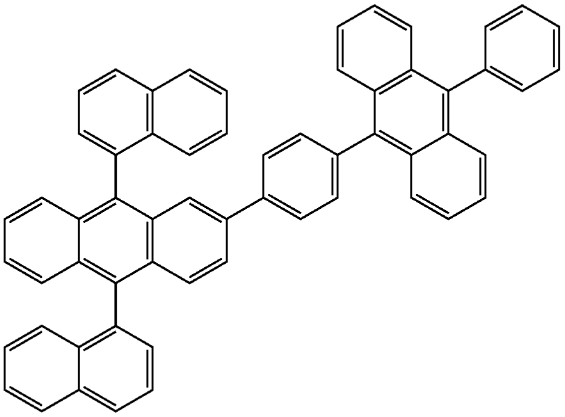
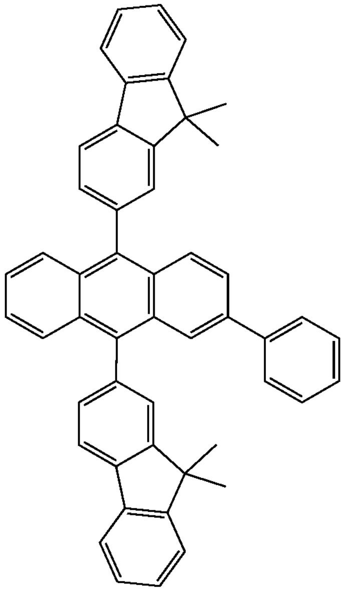
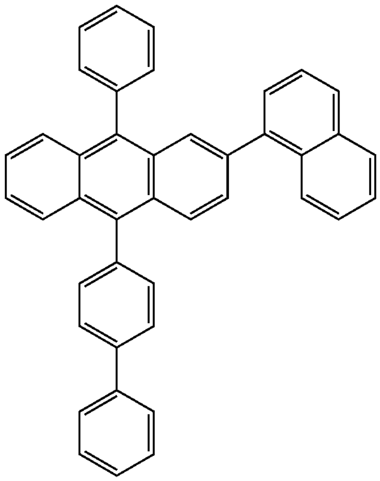
-continued
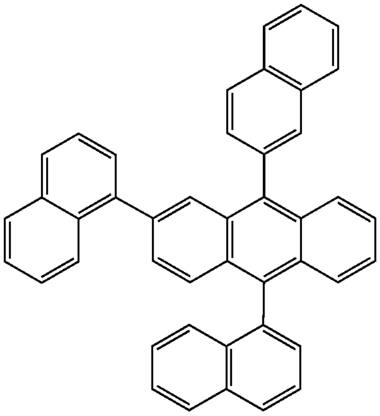
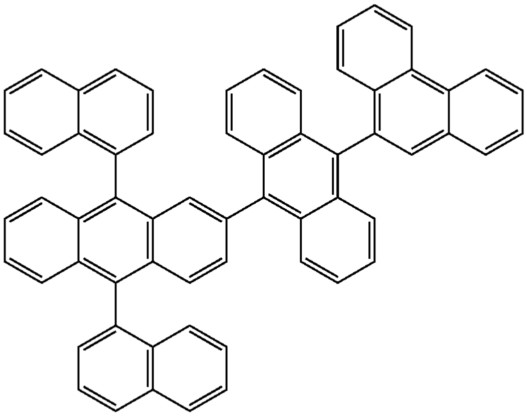
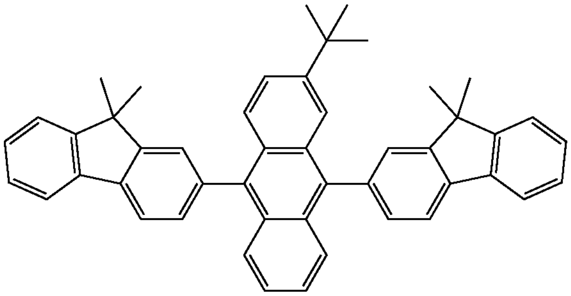
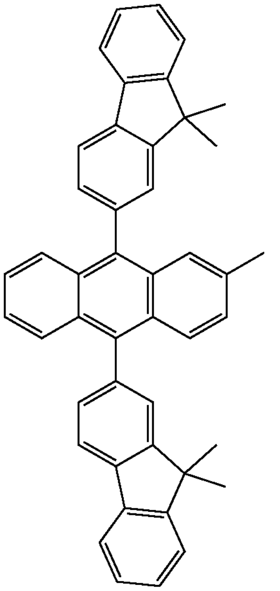

-continued
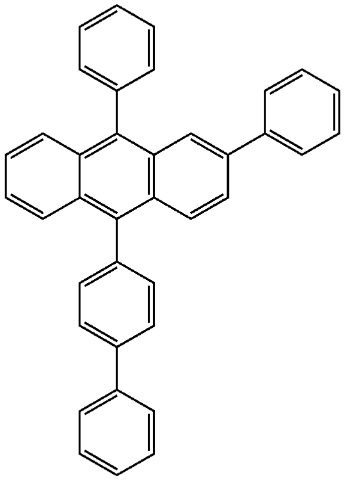
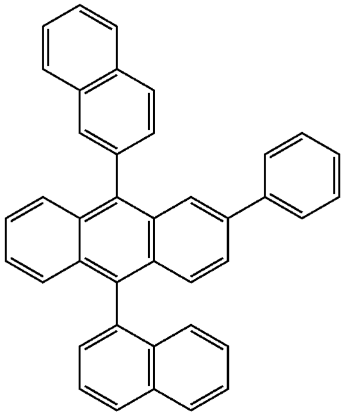
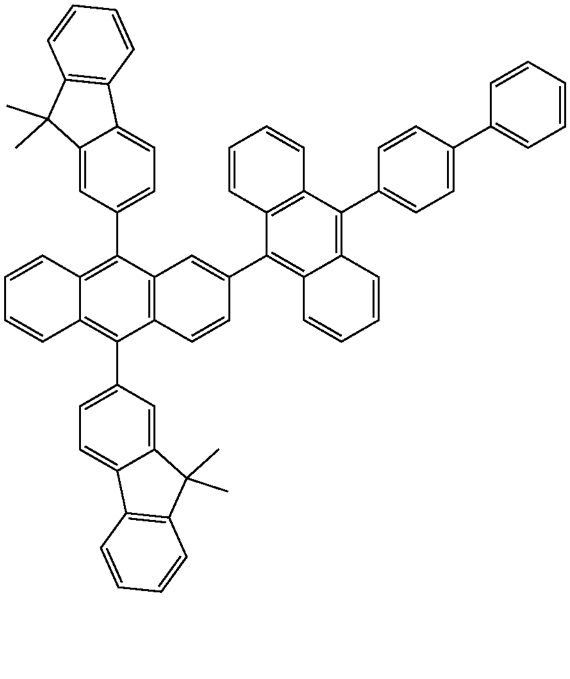
-continued
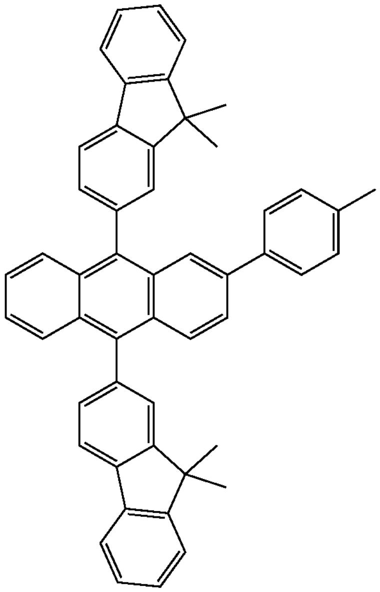
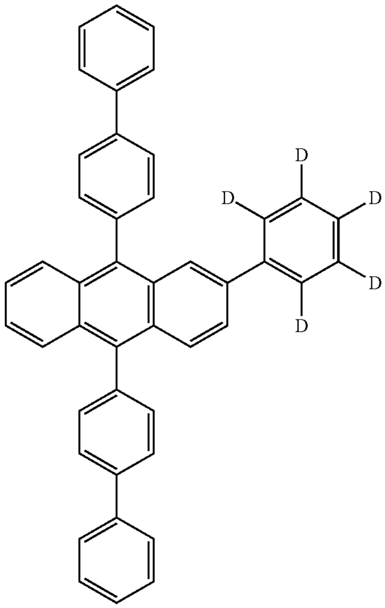

-continued
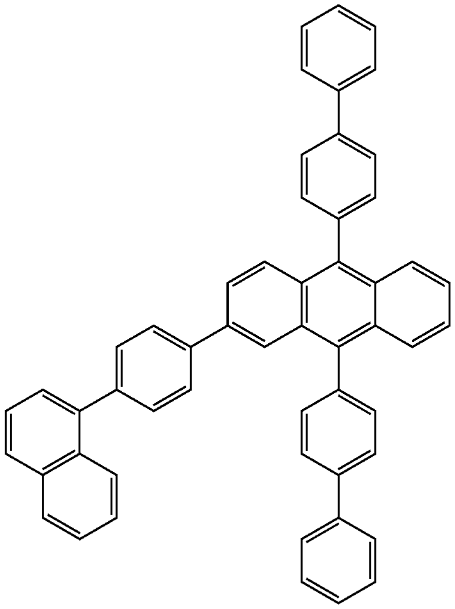
-continued
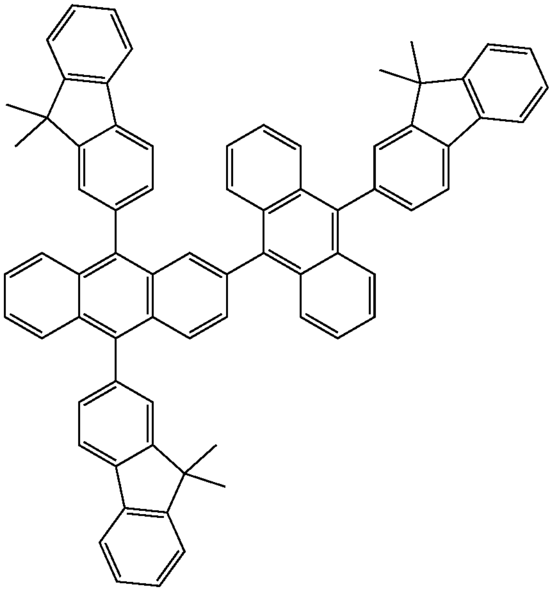
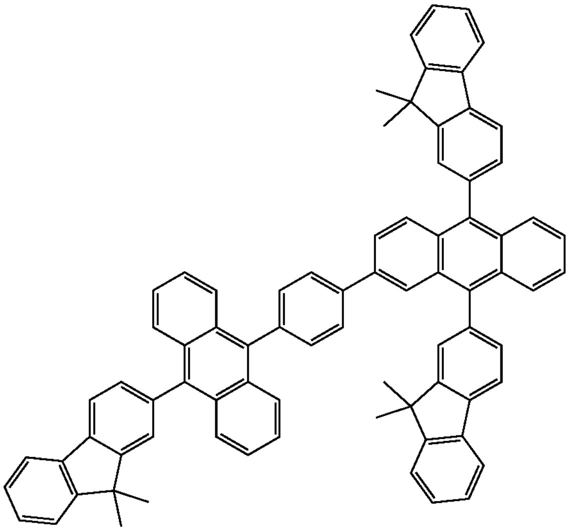
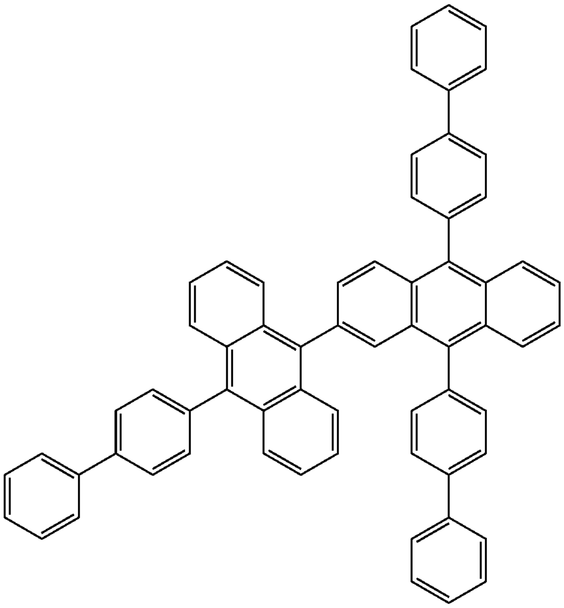
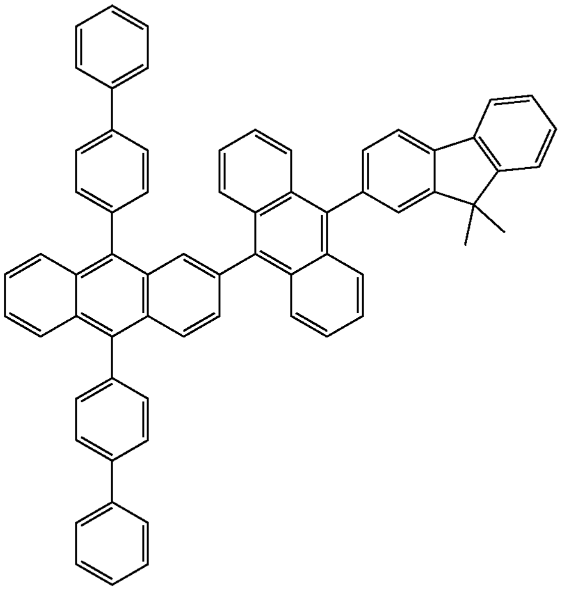

-continued
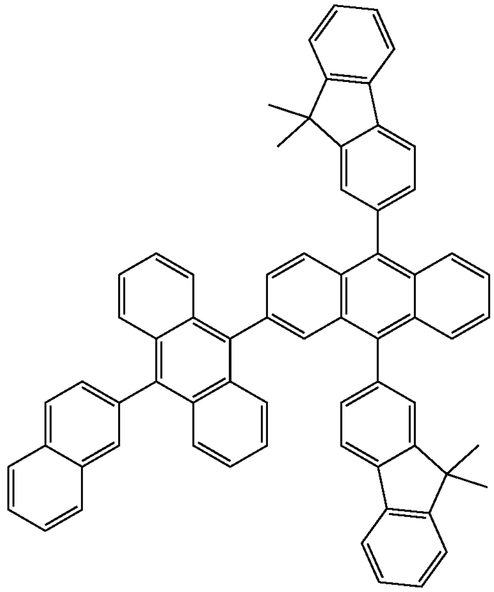
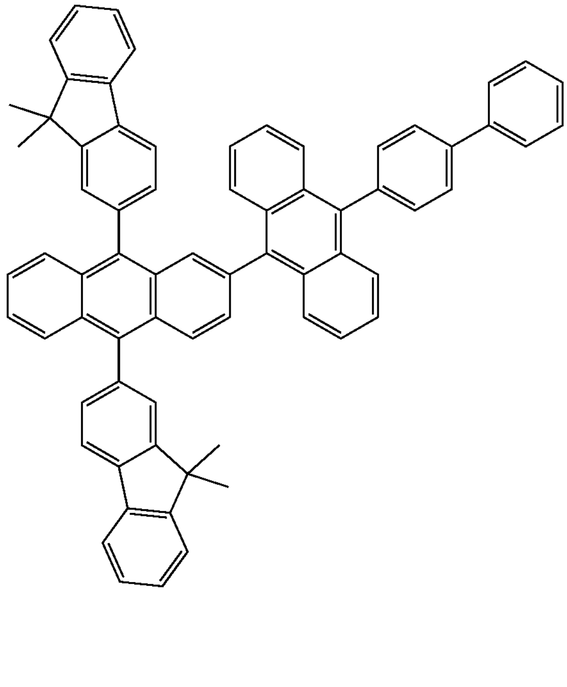
-continued
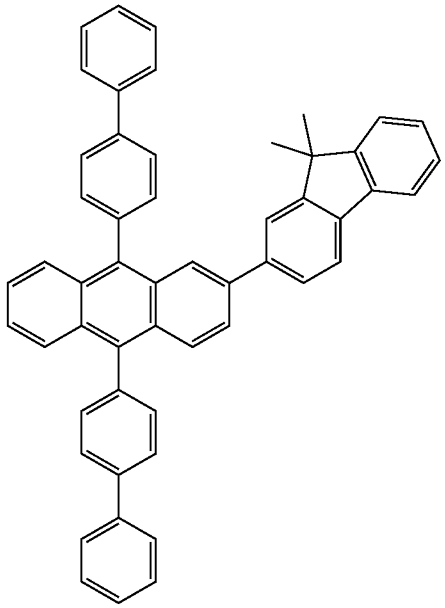
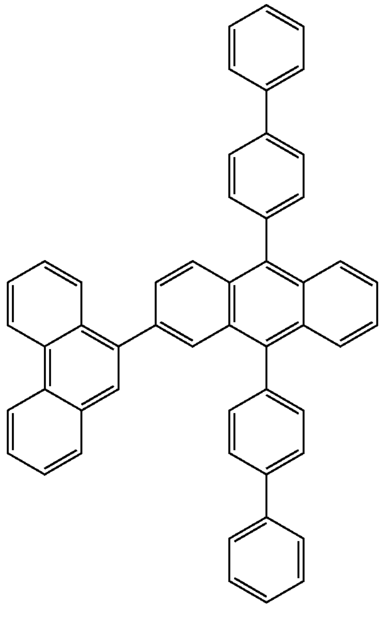

-continued
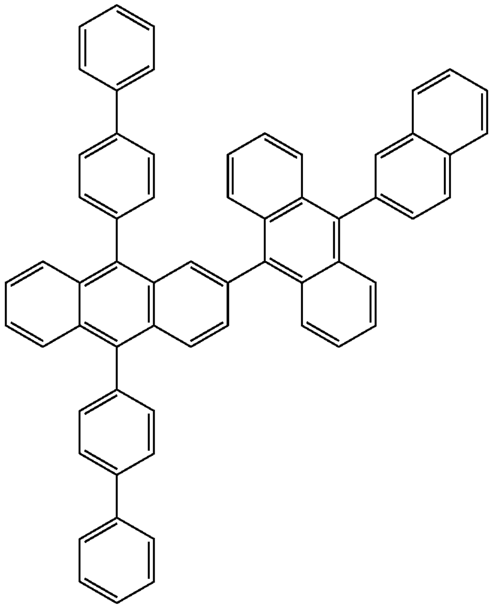
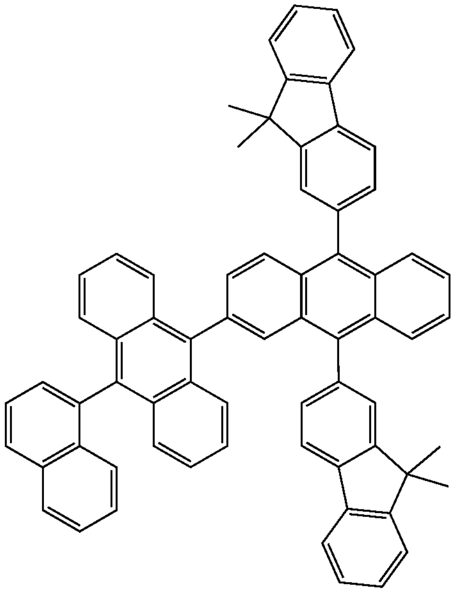
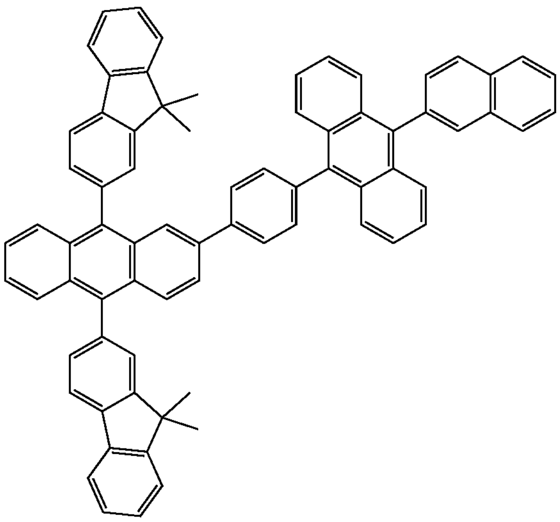
-continued
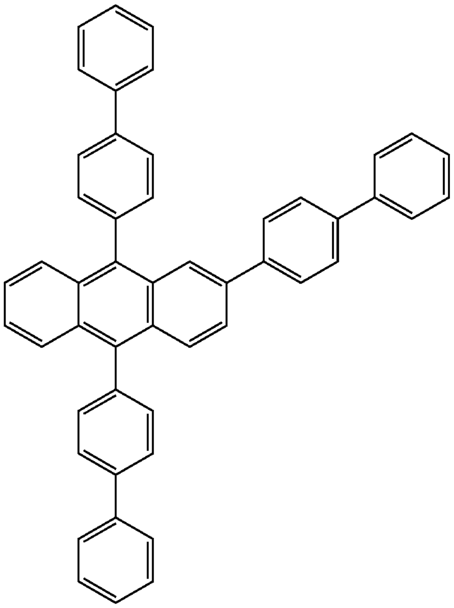
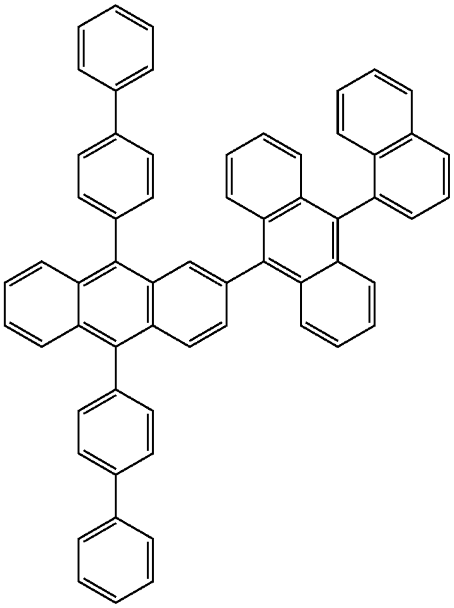

-continued
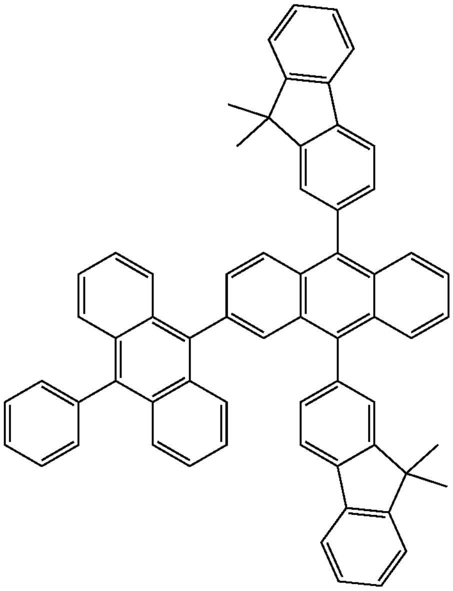
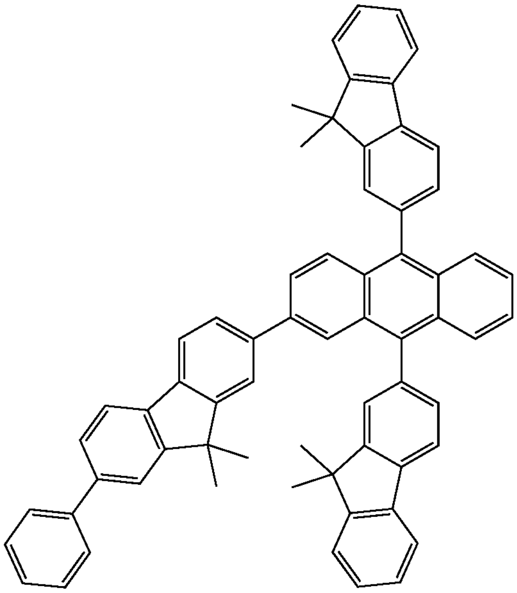
-continued
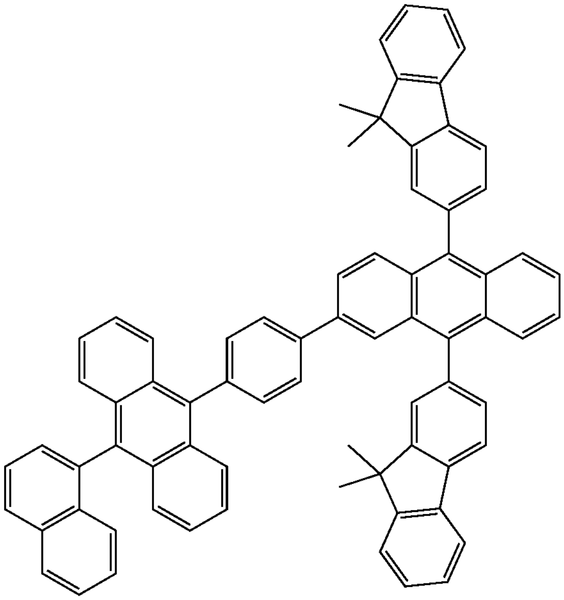
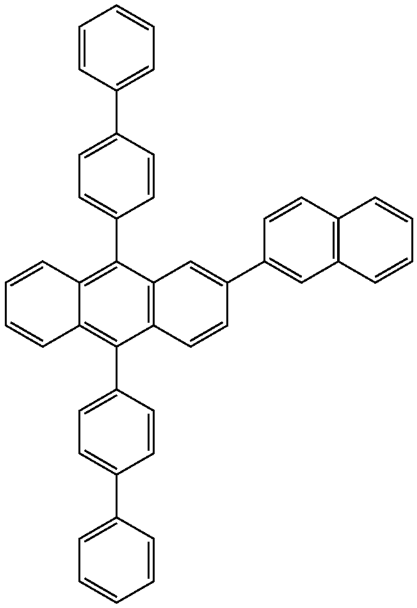

-continued
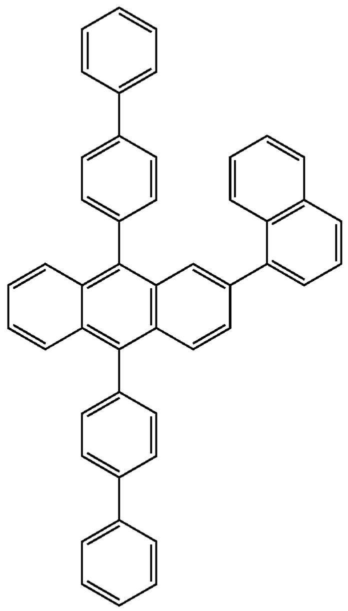
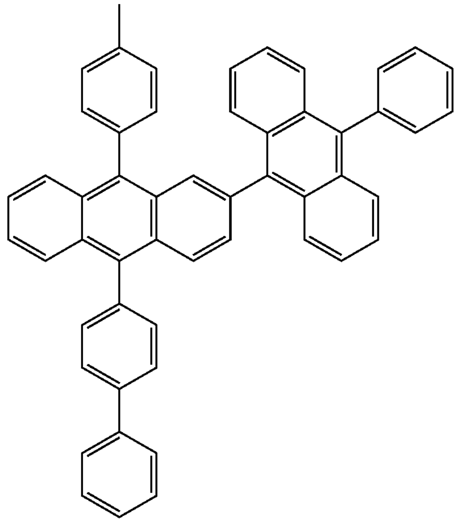
-continued
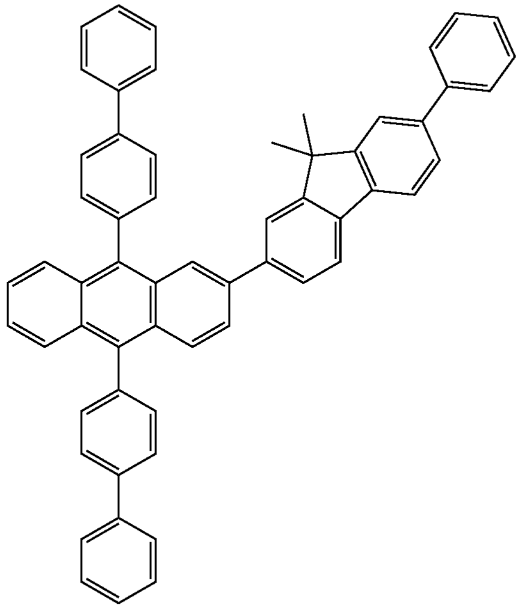
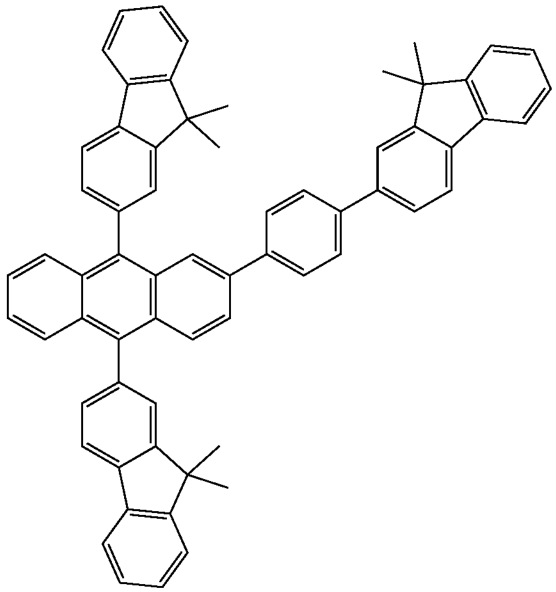

-continued
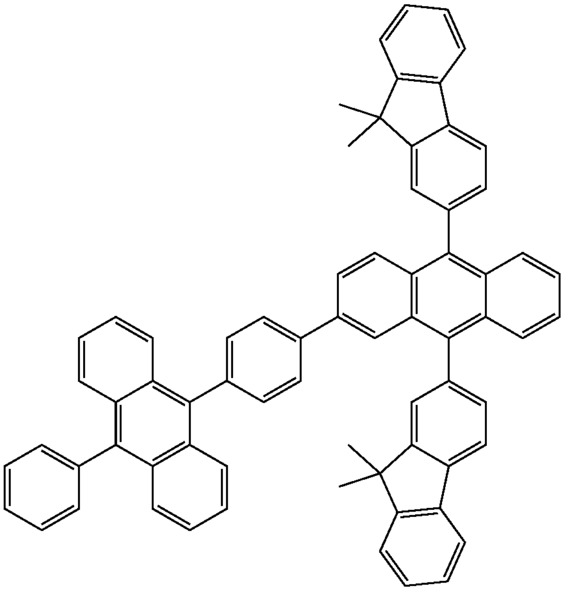
-continued
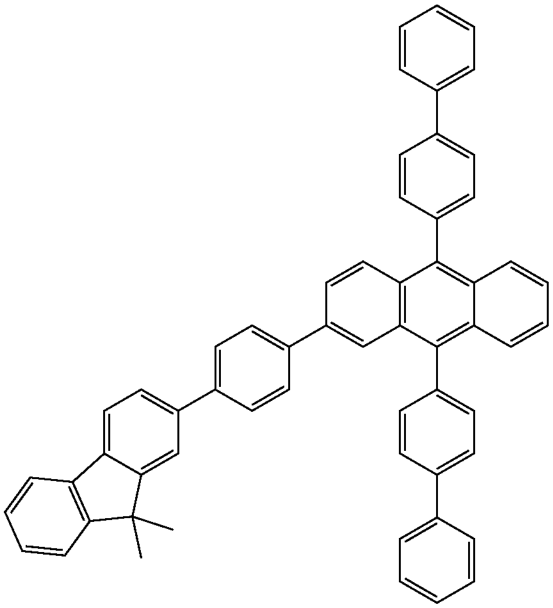
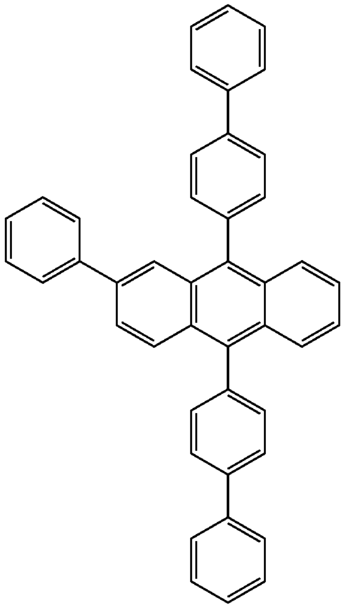
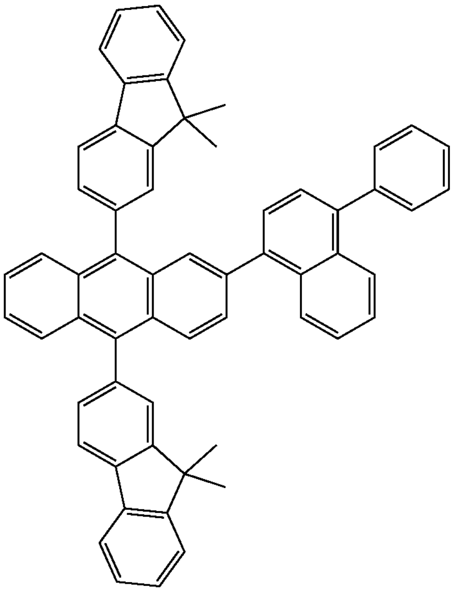

-continued
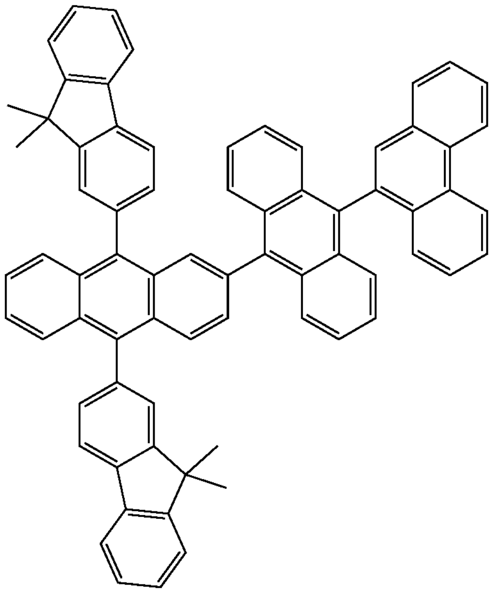
-continued
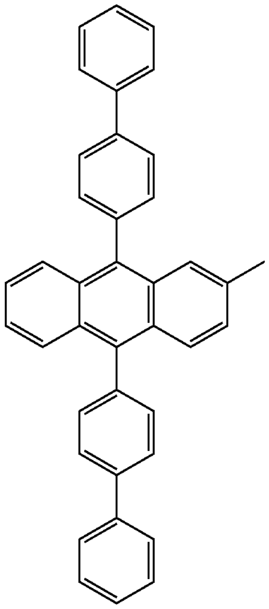
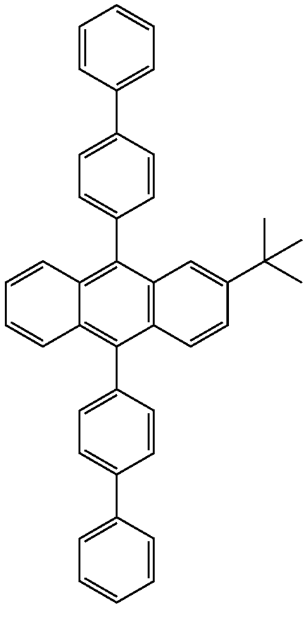
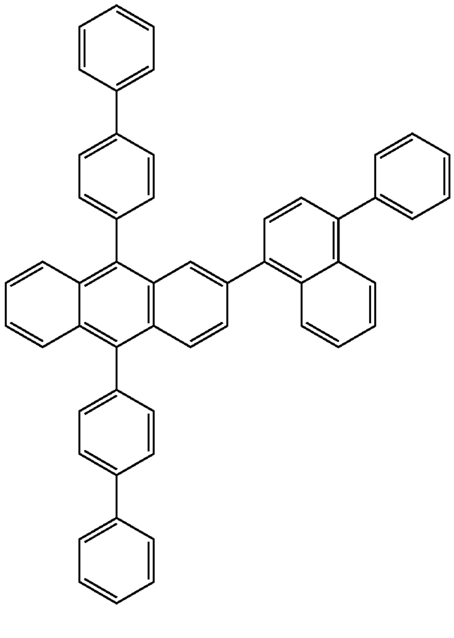

-continued
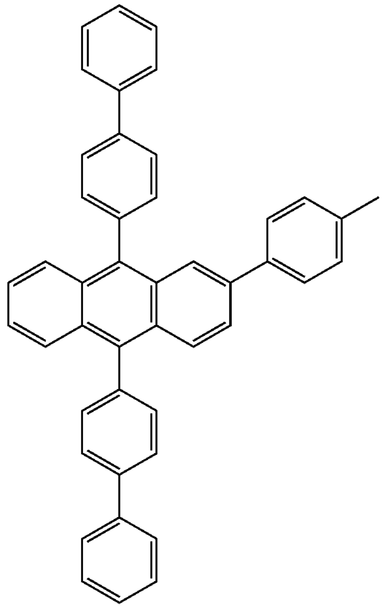
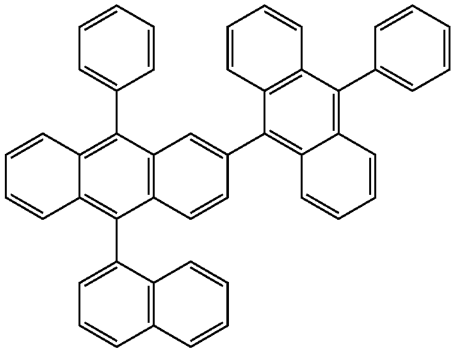
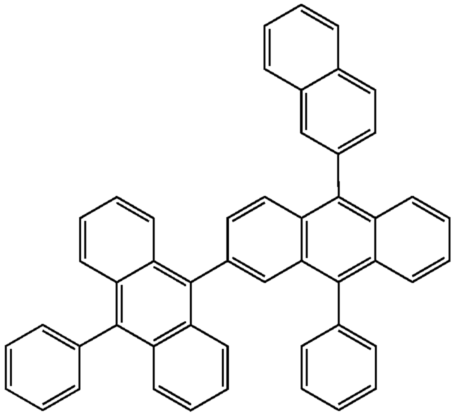
-continued
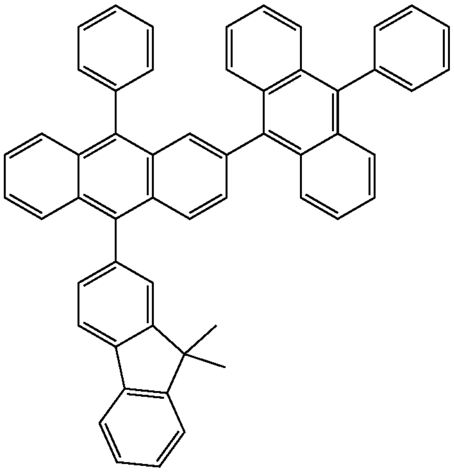
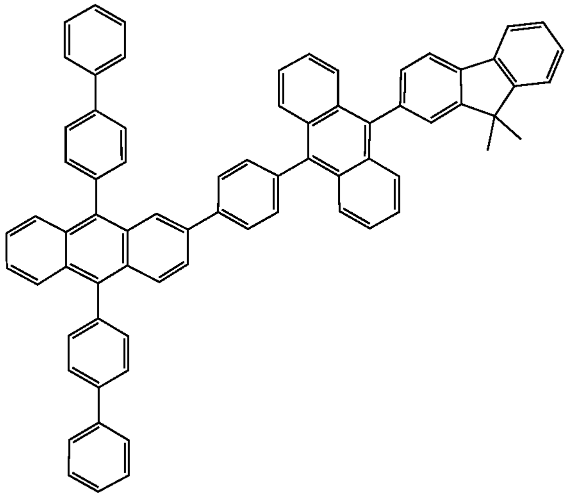
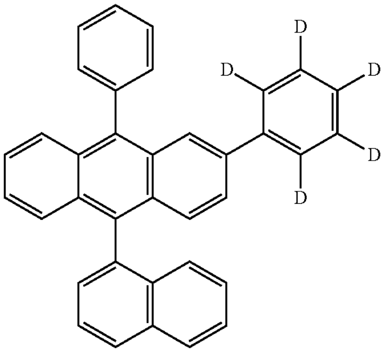

-continued
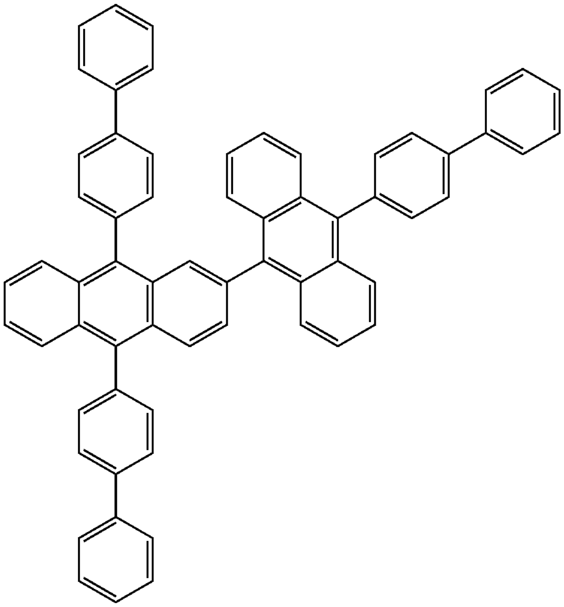
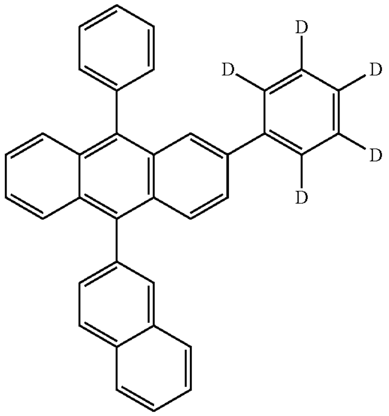
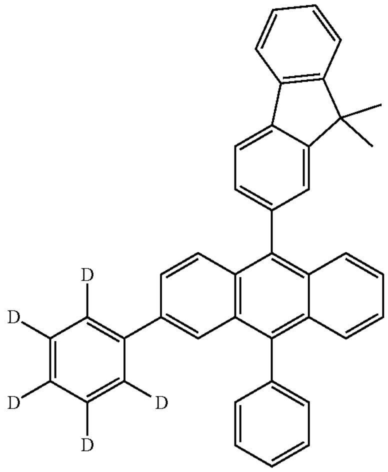
-continued
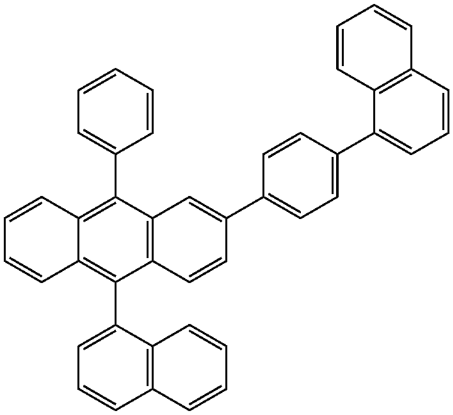
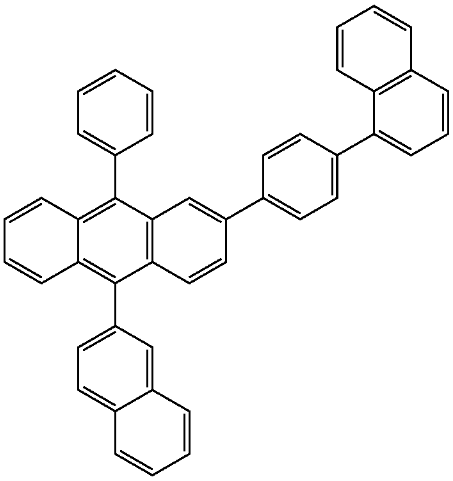 [SMILES: c1ccc(-c2c3ccccc3c(-c3ccc4ccccc4c3)c3ccc(-c4ccc(-c5cccc6ccccc56)cc4)cc23)cc1]
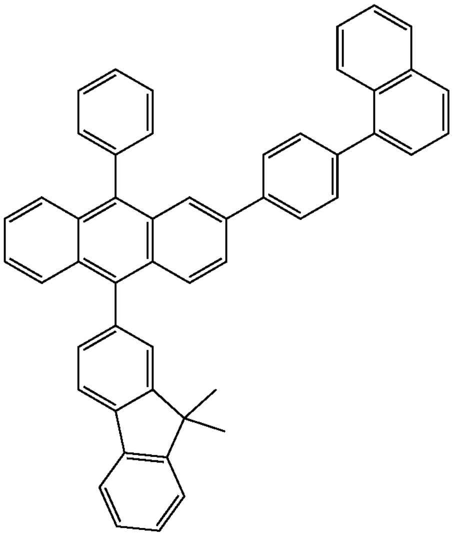

-continued
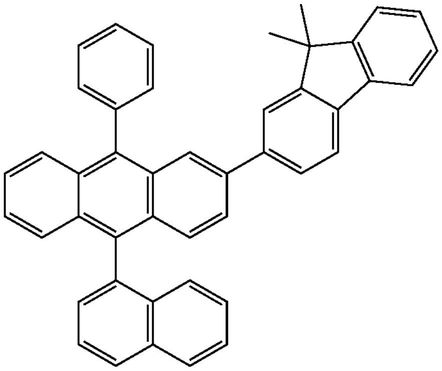
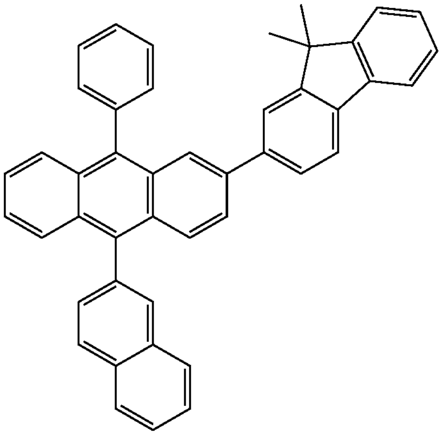
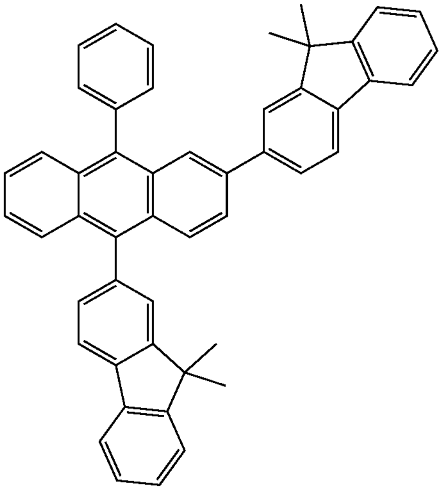
-continued
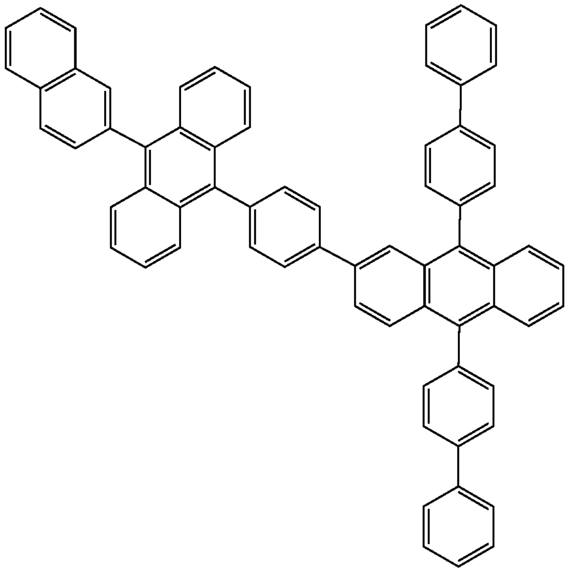
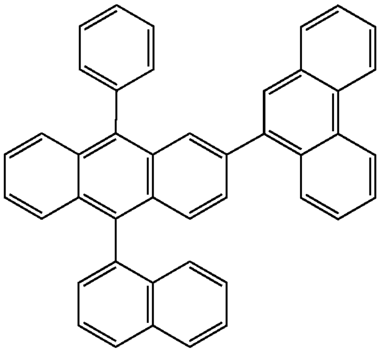
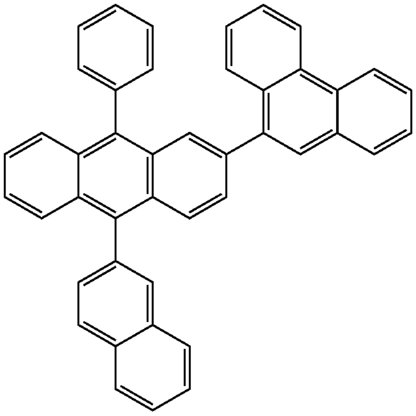

-continued
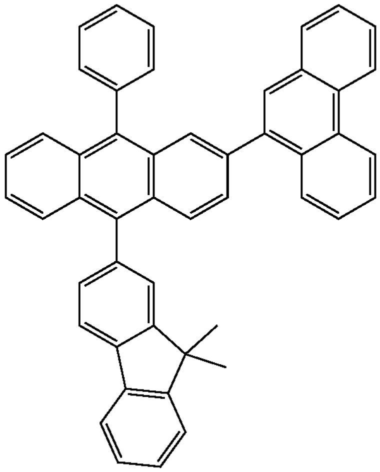
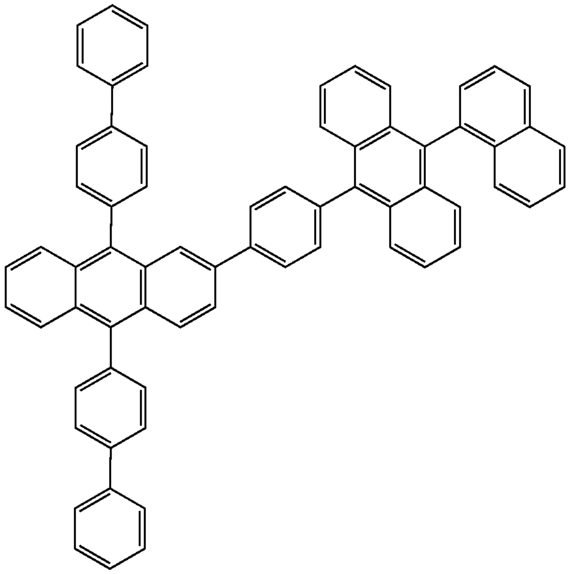
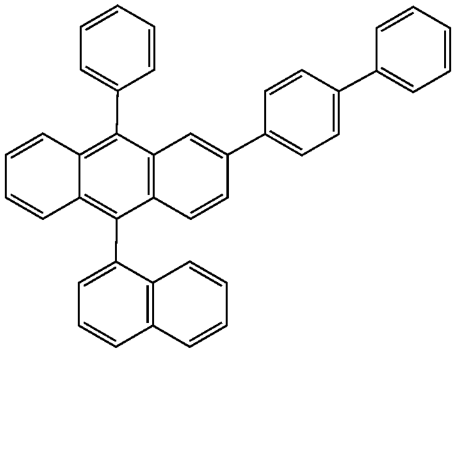
-continued
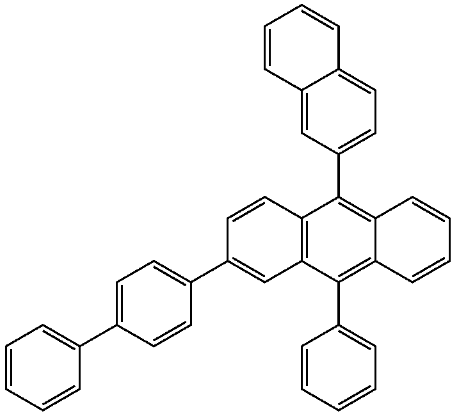
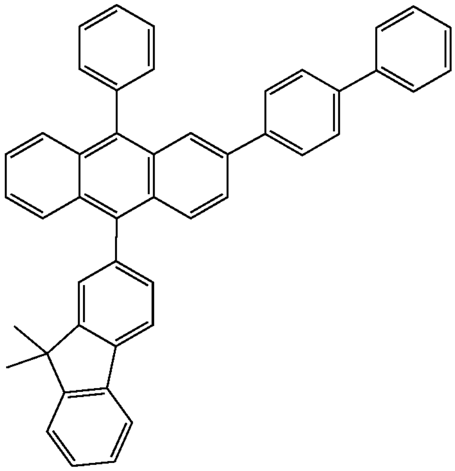
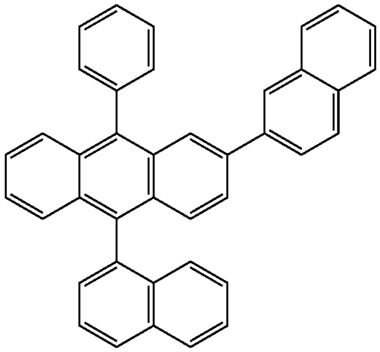
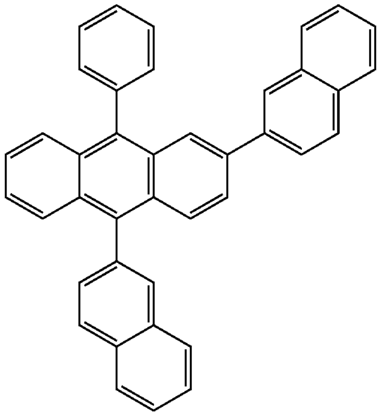

-continued
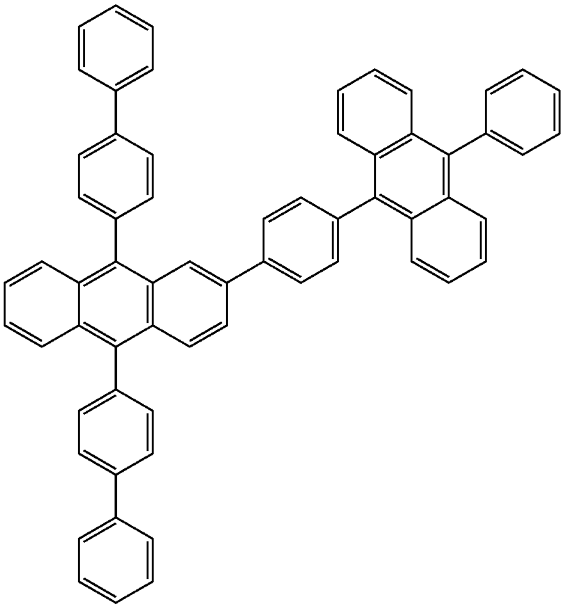
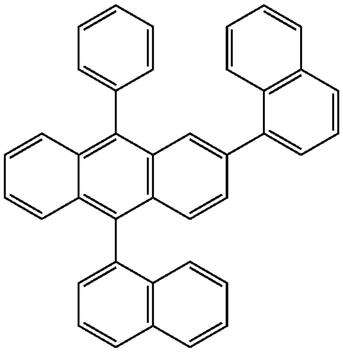
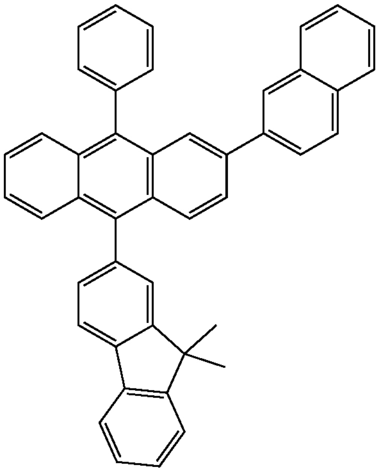
-continued
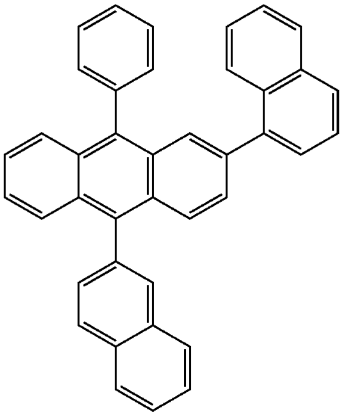
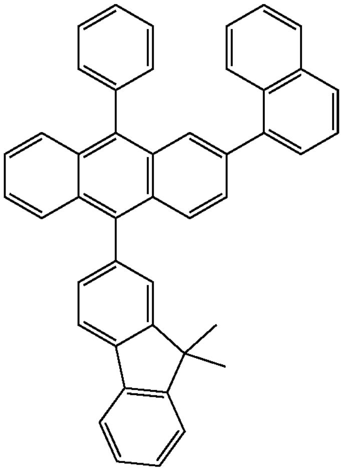
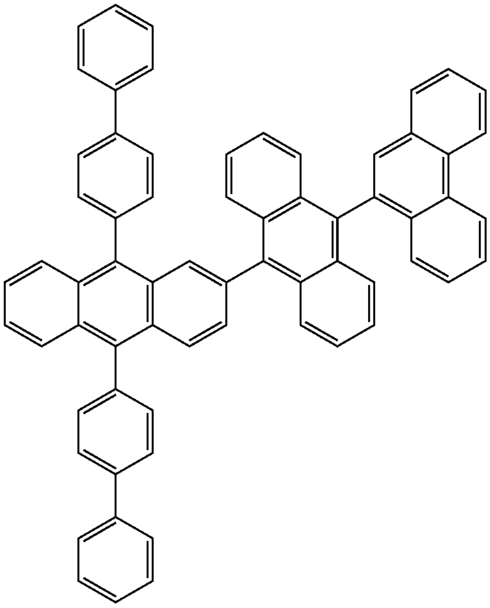

-continued
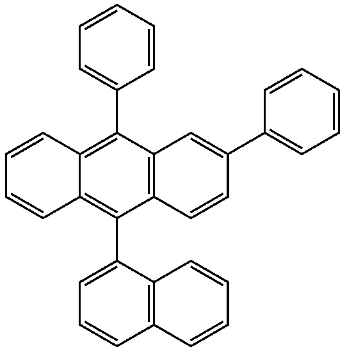
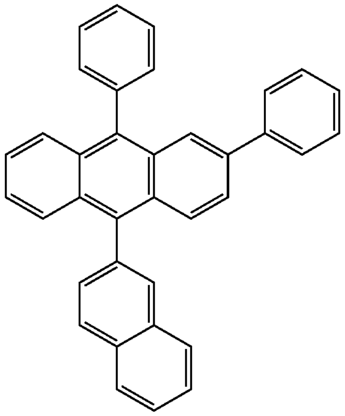
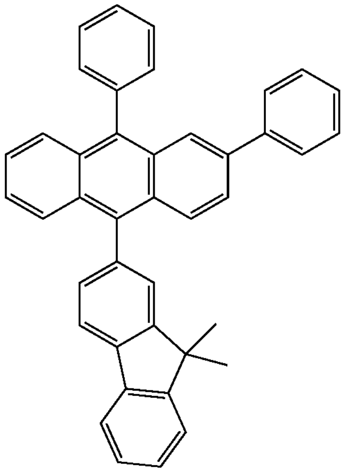
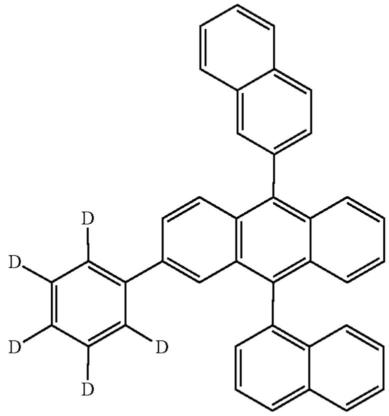
-continued
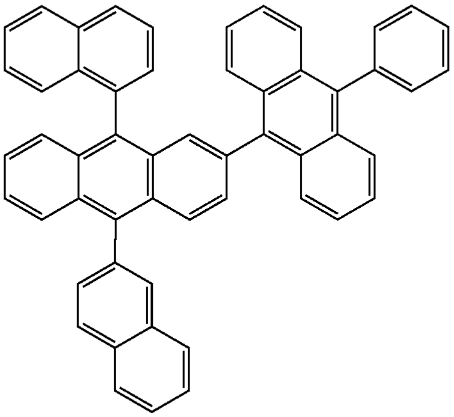
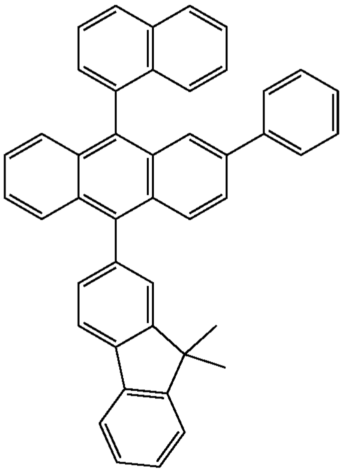
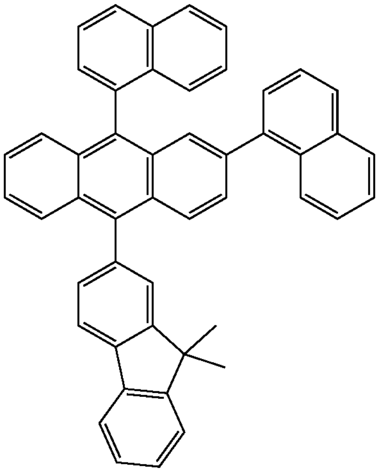

-continued
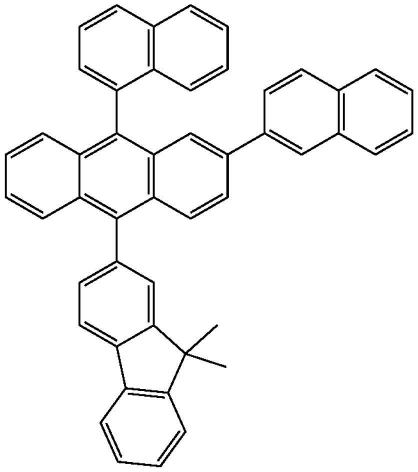
-continued
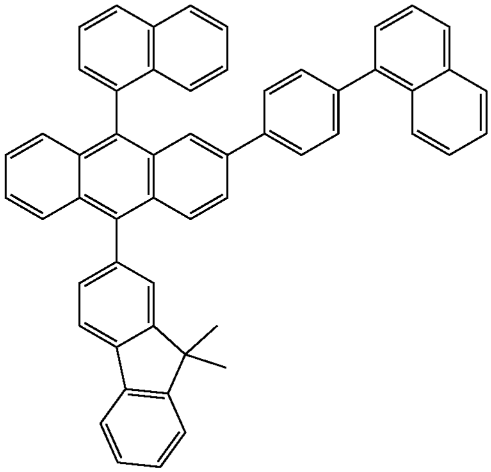
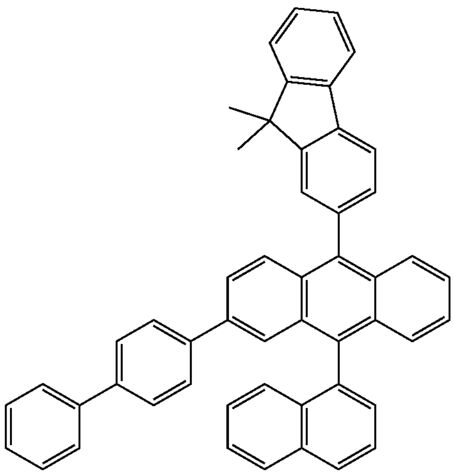
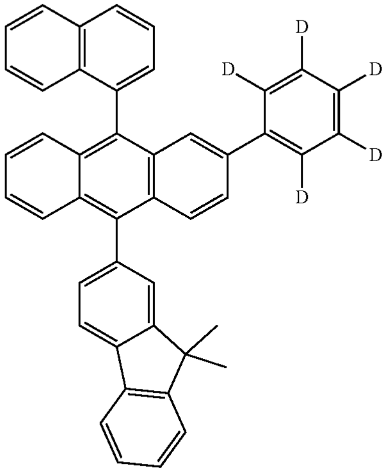
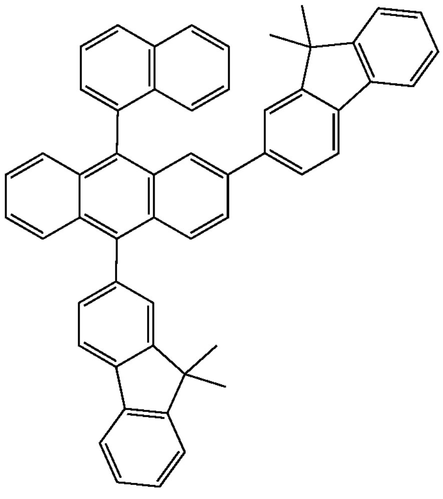
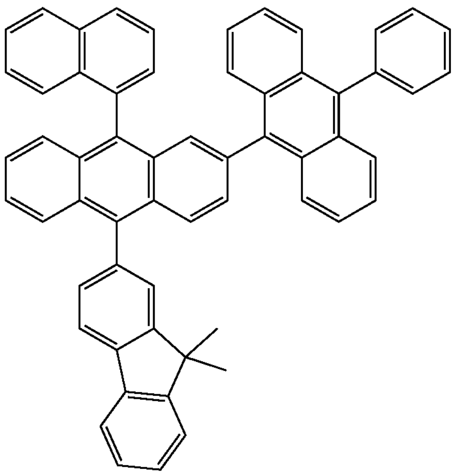

-continued
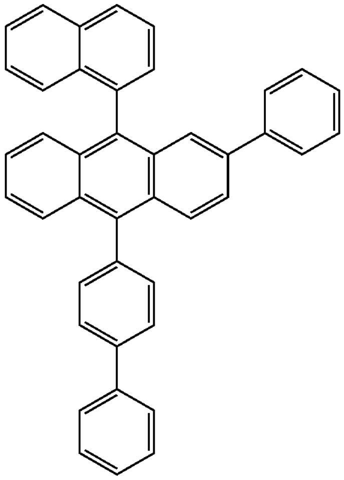
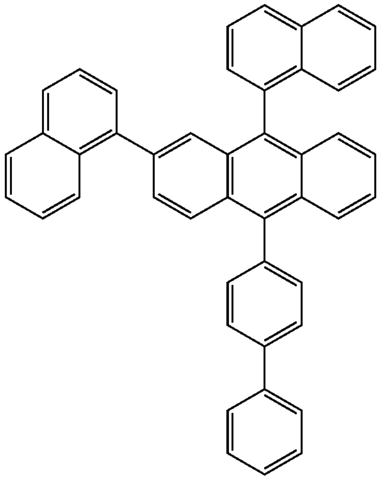
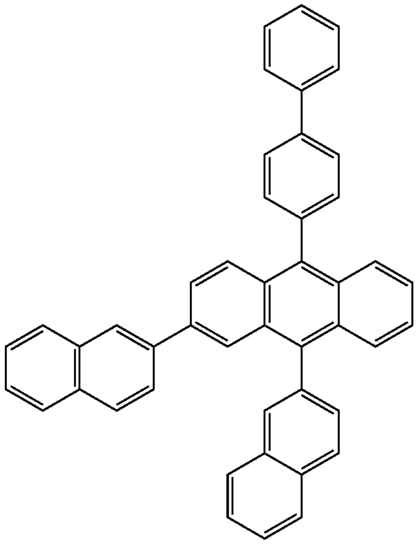
-continued
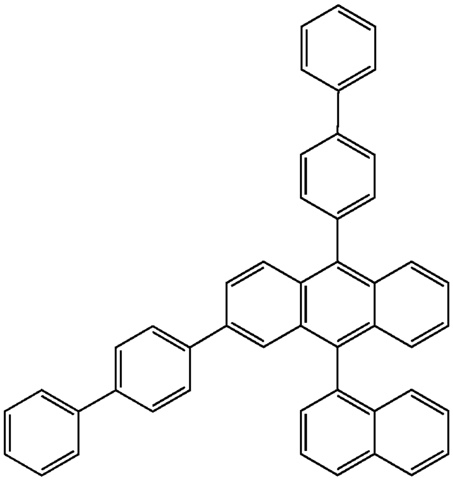
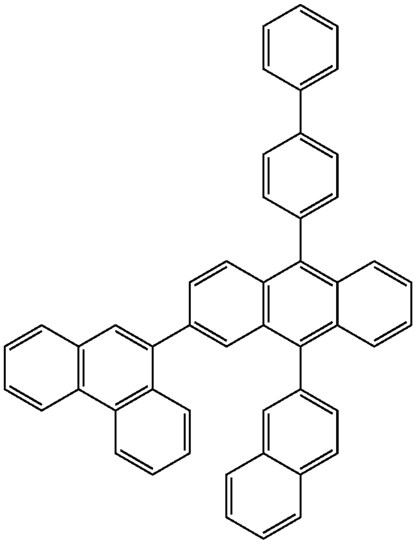
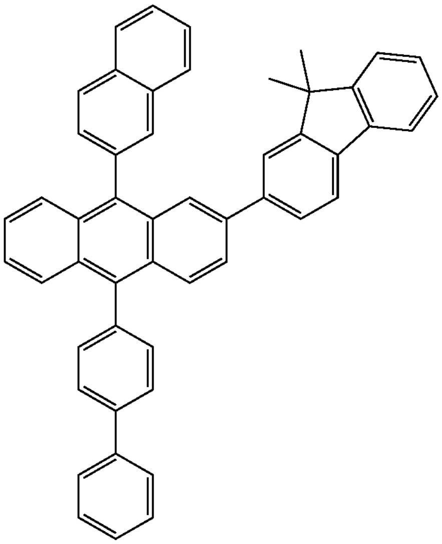

-continued
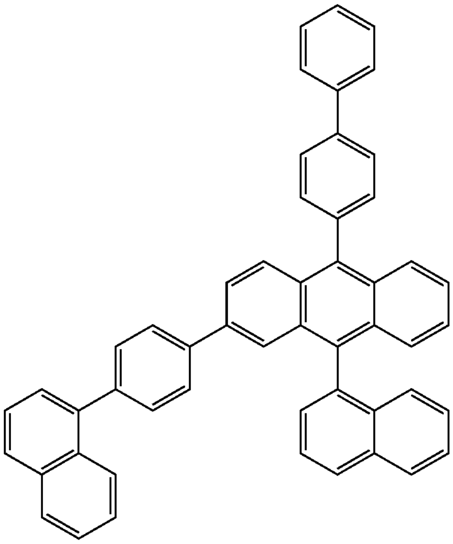
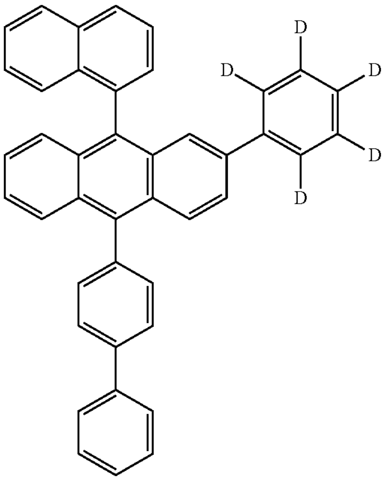
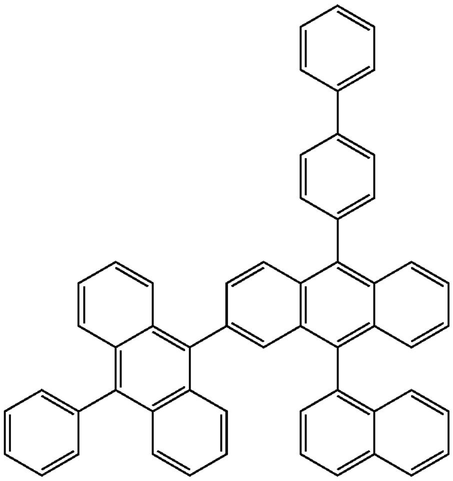
-continued
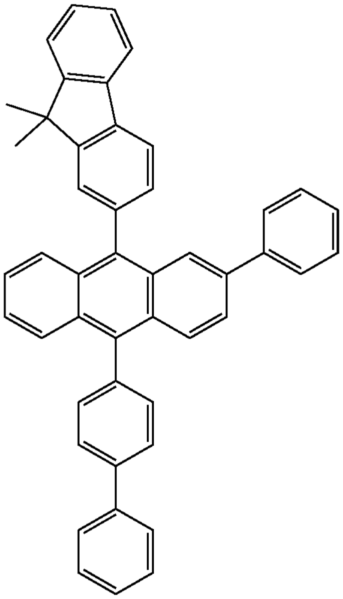
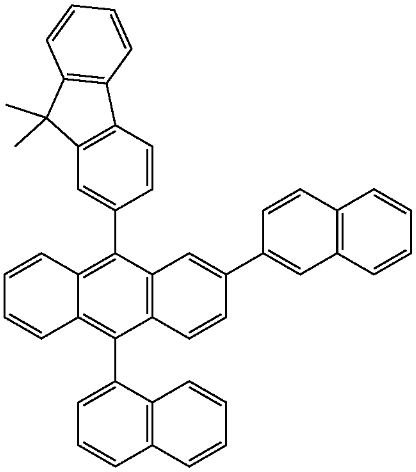
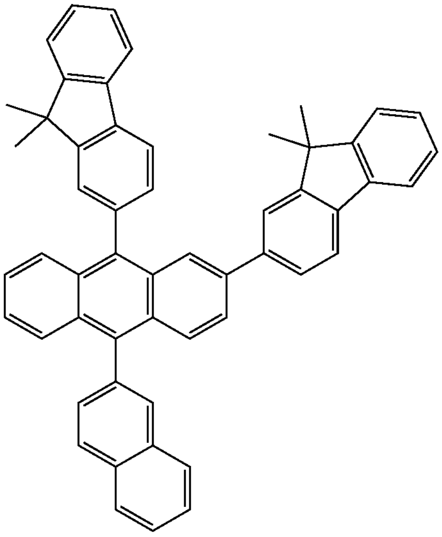

-continued
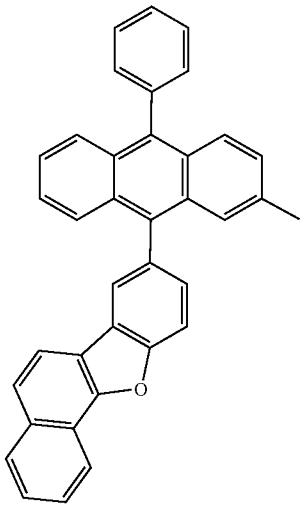
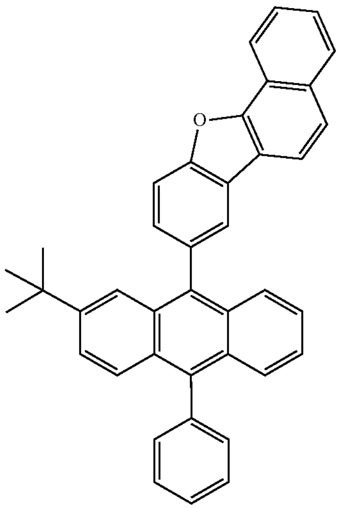
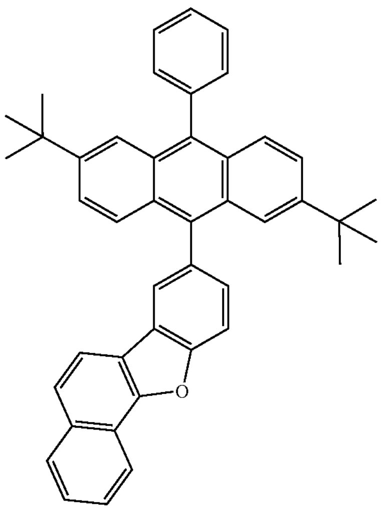
-continued
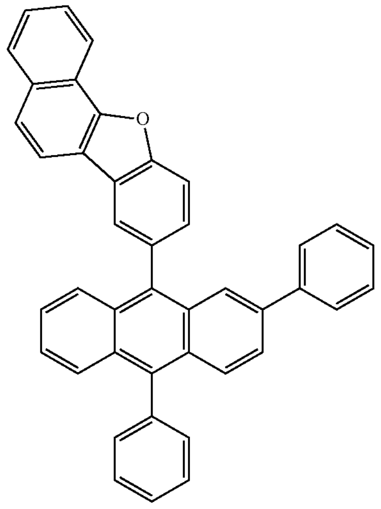
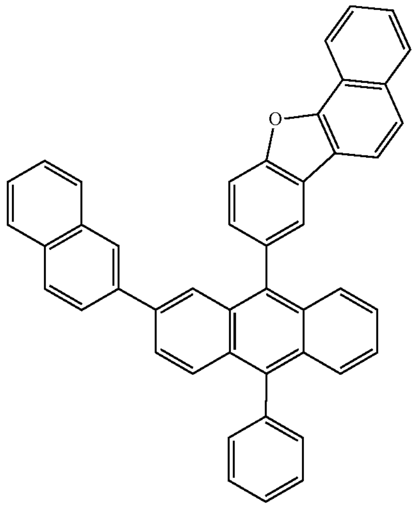
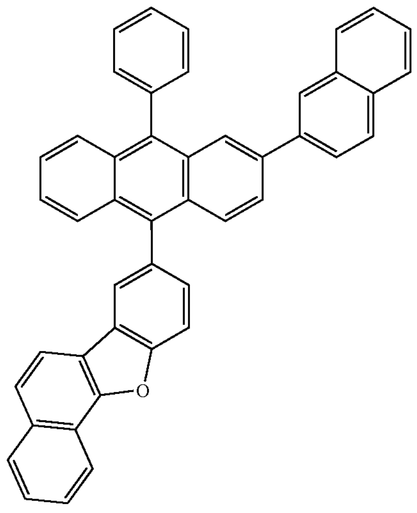

-continued
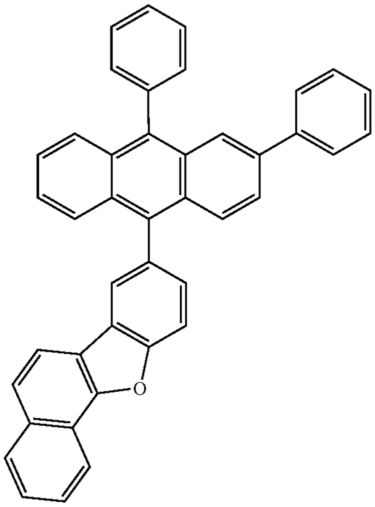
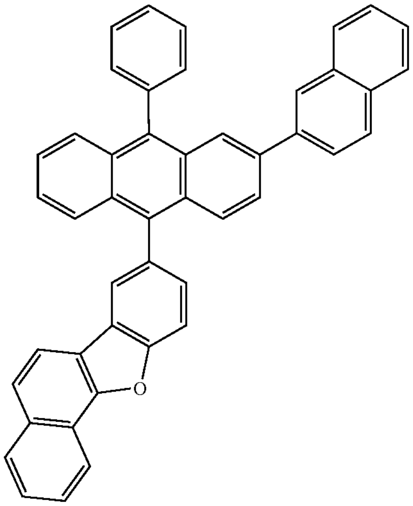
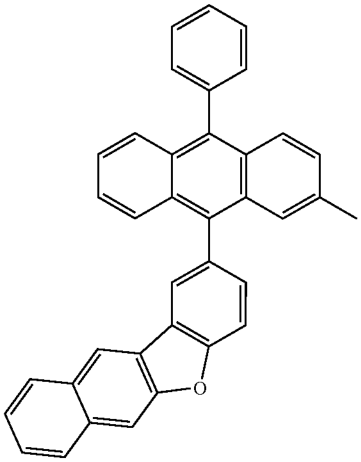
-continued
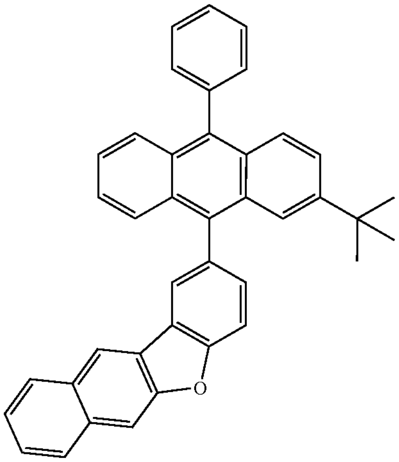
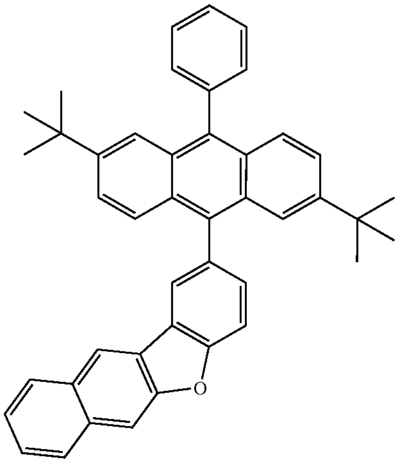
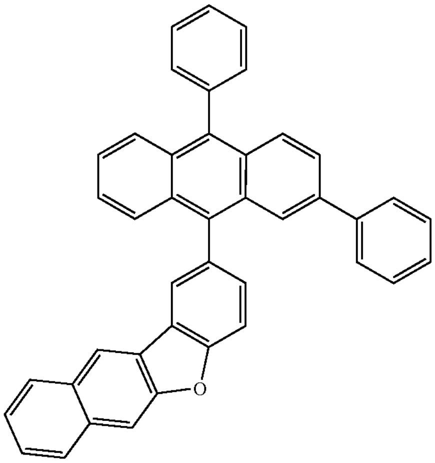

-continued

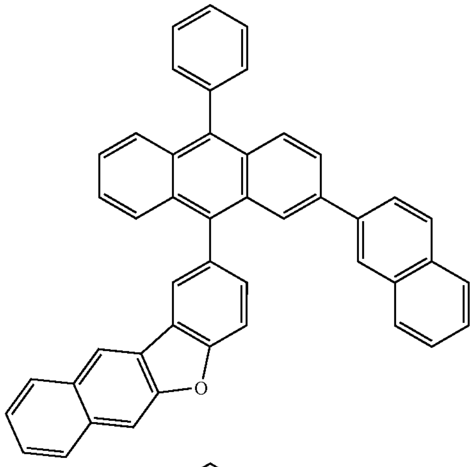

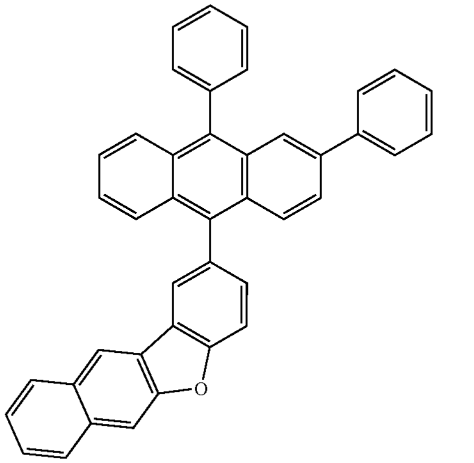

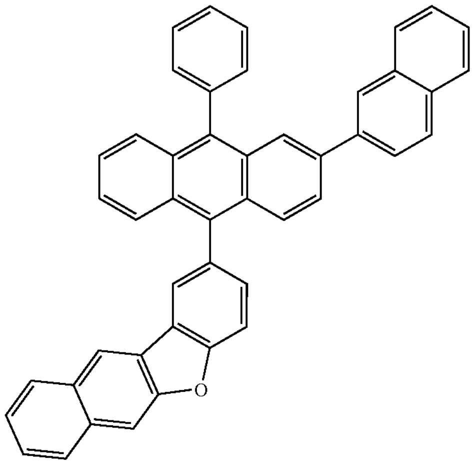

As used herein, the terms "TADF material" and "TADF emitter" may be understood interchangeably.

The concept of TADF is described in the state of the art. As an example, TADF, TADF emitter, in particular blue TADF emitter and blue TADF emitter, are described by Zysman-Colman et al. (Advance Materials, 2017, 29(22): 1605444, DOI: 10.1002/adma.201605444).

According to the present invention, a TADF material is characterized in that it exhibits a $\Delta E_{ST}$ value, which corresponds to the energy difference between the lowermost excited singlet state (S1) and the lowermost excited triplet state (T1), of less than 0.4 eV, preferably less than 0.3 eV, more preferably less than 0.2 eV, even more preferably less than 0.1 eV or even less than 0.05 eV.

As used herein, the terms organic electroluminescent device and optoelectronic light-emitting devices may be understood in the broadest sense as any device comprising a light-emitting layer B comprising, a TTA material, a TADF material $E^B$ and a NRCT emitter $S^B$.

As used herein, the terms "NRCT material" and "NRCT emitter" may be understood interchangeably.

The organic electroluminescent device may be understood in the broadest sense as any device based on organic materials that is suitable for emitting light in the visible or nearest ultraviolet (UV) range, i.e., in the range of a wavelength of from 380 to 800 nm. More preferably, organic electroluminescent device may be able to emit light in the visible range, i.e., of from 400 to 800 nm.

The NRCT emitter $S^B$ is chosen to exhibit an emission with a full width at half maximum (FWHM) below 0.35 eV, preferably less than 0.30 eV, more preferably less than 0.25 eV, even more preferably less than 0.20 or even less than 0.15 eV in PMMA with 5% by weight of the NRCT emitter $S^B$.

In a preferred embodiment, the TADF material $E^B$ exhibits a $\Delta E_{ST}$ value, which corresponds to the energy difference between the lowermost excited singlet state (S1) and the lowermost excited triplet state (T1), of less than 0.4 eV; and the NRCT emitter $S^B$ exhibits an emission with a full width at half maximum (FWHM) below 0.35 eV, in PMMA with 5% by weight of the NRCT emitter $S^B$.

In a preferred embodiment, the organic electroluminescent device is a device selected from the group consisting of an organic light emitting diode (OLED), a light emitting electrochemical cell (LEC), and a light-emitting transistor.

Particularly preferably, the organic electroluminescent device is an organic light emitting diode (OLED). Optionally, the organic electroluminescent device as a whole may be intransparent, semi-transparent or (essentially) transparent.

The term "layer" as used in the context of the present invention preferably is a body that bears an extensively planar geometry. The light-emitting layer B preferably bears a thickness of not more than 1 mm, more preferably not more than 0.1 mm, even more preferably not more than 10 μm, even more preferably not more than 1 μm, in particular not more than 0.1 μm.

In a preferred embodiment, the thermally activated delayed fluorescence (TADF) material $E^B$ is an organic TADF material. According to the invention, organic emitter or organic material means that the emitter or material (predominantly) consists of the elements hydrogen (H), carbon (C), nitrogen (N), boron (B), silicon (Si) and optionally fluorine (F), optionally bromine (Br) and optionally oxygen (O). Particularly preferably, it does not contain any transition metals.

In a preferred embodiment, the TADF material $E^B$ is an organic TADF material. In a preferred embodiment, the small FWHM emitter $S^B$ is an organic emitter. In a more preferred embodiment, the TADF material $E^B$ and the small FWHM emitter $S^B$ are both organic materials.

In a preferred embodiment, the TADF material $E^B$ is an organic TADF material, which is chosen from molecules of a structure of Formula I-TADF Formula I-TADF

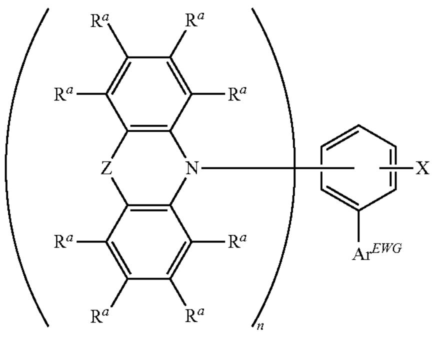

wherein n is at each occurrence independently from another 1 or 2;

X is at each occurrence independently from another selected $Ar^{EWG}$, CN or $CF_3$;

Z is at each occurrence independently from another selected from the group consisting of a direct bond, $CR^3R^4$, $C{=}CR^3R^4$, C=O, $C{=}NR^3$, $NR^3$, O, $SiR^3R^4$, S, S(O) and $S(O)_2$;

$Ar^{EWG}$ is at each occurrence independently from another a structure according to one of Formulas IIa to IIk Formula IIa

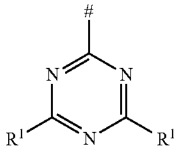

Formula IIb

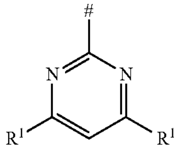

Formula IIc

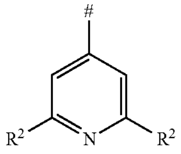

Formula IId

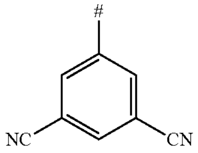

Formula IIe

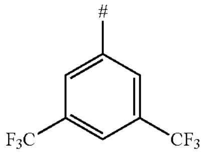

-continued

Formula IIf

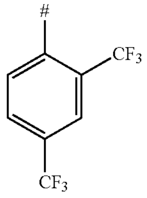

Formula IIg

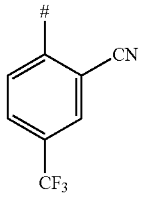

Formula IIh

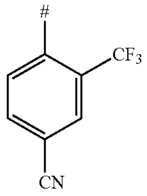

Formula IIi

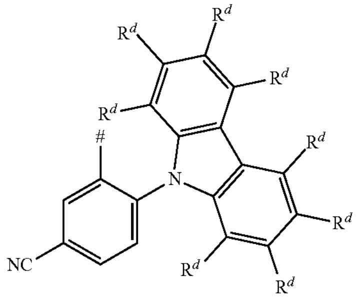

Formula IIj

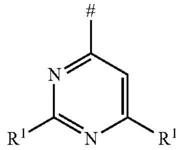

Formula IIk

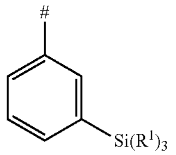

wherein # represents the binding site of the single bond linking $Ar^{EWG}$ to the substituted central phenyl ring of Formula I-TADF;

$R^1$ is at each occurrence independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^6$;

$R^2$ is at each occurrence independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^6$;

$R^a$, $R^3$ and $R^4$ is at each occurrence independently from another selected from the group consisting of hydrogen, deuterium, $N(R^5)_2$, $OR^5$, $SR^5$, $Si(R^5)_3$, $CF_3$, CN, F, $C_1$-$C_{40}$-alkyl which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-thioalkoxy which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$; and $C_6$-$C_{60}$-aryl which is optionally substituted with one or more substituents $R^5$; $C_3$-$C_{57}$-heteroaryl which is optionally substituted with one or more substituents $R^5$;

$R^5$ is at each occurrence independently from another selected from the group consisting of hydrogen, deuterium, $N(R^6)_2$, $OR^6$, $SR^6$, $Si(R^6)_3$, $CF_3$, CN, F, $C_1$-$C_{40}$-alkyl which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, C═$NR^6$, P(═O)($R^6$), SO, $SO_2$, $NR^6$, O, S or $CONR^6$;

$C_6$-$C_{60}$-aryl which is optionally substituted with one or more substituents $R^6$; and $C_3$-$C_{57}$-heteroaryl which is optionally substituted with one or more substituents $R^6$;

$R^6$ is at each occurrence independently from another selected from the group consisting of hydrogen, deuterium, OPh, $CF_3$, CN, F, $C_1$-$C_5$-alkyl, wherein one or more hydrogen atoms are optionally, independently from each other substituted by deuterium, CN, $CF_3$, or F;

$C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_6$-$C_{18}$-aryl which is optionally substituted with one or more $C_1$-$C_5$-alkyl substituents;

$C_3$-$C_{17}$-heteroaryl which is optionally substituted with one or more $C_1$-$C_5$-alkyl substituents;

$N(C_6$-$C_{18}$-aryl$)_2$;

$N(C_3$-$C_{17}$-heteroaryl$)_2$, and $N(C_3$-$C_{17}$-heteroaryl$)(C_6$-$C_{18}$-aryl);

$R^d$ is at each occurrence independently from another selected from the group consisting of hydrogen, deuterium, $N(R^5)_2$, $OR^5$, $SR^5$, $Si(R^5)_3$, $CF_3$, CN, F, $C_1$-$C_{40}$-alkyl which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-thioalkoxy which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$; and $C_6$-$C_{60}$-aryl which is optionally substituted with one or more substituents $R^5$; $C_3$-$C_{57}$-heteroaryl which is optionally substituted with one or more substituents $R^5$;

wherein the substituents $R^a$, $R^3$, $R^4$ or $R^5$ independently from each other optionally may form a mono- or polycyclic, aliphatic, aromatic and/or benzo-fused ring system with one or more substituents $R^a$, $R^3$, $R^4$ or $R^5$ and wherein the one or more substituents $R^d$ independently from each other optionally may form a mono- or polycyclic, aliphatic, aromatic and/or benzo-fused ring system with one or more substituents $R^d$.

According to the invention, the substituents $R^a$, $R^3$, $R^4$ or $R^5$ at each occurrence independently from each other may optionally form a mono- or polycyclic, aliphatic, aromatic and/or benzo-fused ring system with one or more substituents $R^a$, $R^3$, $R^4$ or $R^5$.

According to the invention, the substituents $R^d$ at each occurrence independently from each other may optionally form a mono- or polycyclic, aliphatic, aromatic and/or benzo-fused ring system with one or more other substituents $R^d$.

In a particularly preferred embodiment of the invention, Z is a direct bond at each occurrence.

In one embodiment of the invention, the TADF material $E^B$ comprises at least one triazine structure according to Formula IIa.

In a preferred embodiment, the TADF material $E^B$ is an organic TADF material, which is chosen from molecules of a structure of Formula II-TADF Formula II-TADF

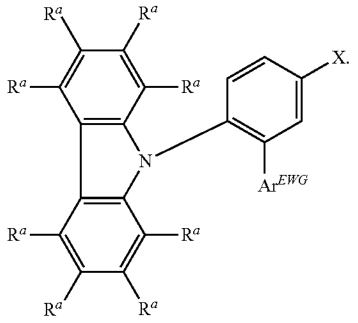

In one embodiment of the invention, $R^a$ is at each occurrence independently from another selected from the group consisting of hydrogen, deuterium, Me, $^i$Pr, $^t$Bu, CN, $CF_3$, Ph, which is optionally substituted with one or more substituents independently from each other selected from the group consisting of Me, $^i$Pr, $^t$Bu, CN, $CF_3$ and Ph;

pyridinyl, which is optionally substituted with one or more substituents independently from each other selected from the group consisting of Me, $^i$Pr, $^t$Bu, CN, $CF_3$ and Ph;

pyrimidinyl, which is optionally substituted with one or more substituents independently from each other selected from the group consisting of Me, $^i$Pr, $^t$Bu, CN, $CF_3$ and Ph;

carbazolyl, which is optionally substituted with one or more substituents independently from each other selected from the group consisting of Me, $^i$Pr, $^t$Bu, CN, $CF_3$ and Ph;

triazinyl, which is optionally substituted with one or more substituents independently from each other selected from the group consisting of Me, $^{i}$Pr, $^{t}$Bu, CN, $CF_3$ and Ph; and $N(Ph)_2$.

In one embodiment of the invention, $R^d$ is at each occurrence independently from another selected from the group consisting of hydrogen, deuterium, Me, $^{i}$Pr, $^{t}$Bu, CN, $CF_3$, Ph, which is optionally substituted with one or more substituents independently from each other selected from the group consisting of Me, $^{i}$Pr, $^{t}$Bu, CN, $CF_3$ and Ph;

pyridinyl, which is optionally substituted with one or more substituents independently from each other selected from the group consisting of Me, $^{i}$Pr, $^{t}$Bu, CN, $CF_3$ and Ph;

pyrimidinyl, which is optionally substituted with one or more substituents independently from each other selected from the group consisting of Me, $^{i}$Pr, $^{t}$Bu, CN, $CF_3$ and Ph;

carbazolyl, which is optionally substituted with one or more substituents independently from each other selected from the group consisting of Me, $^{i}$Pr, $^{t}$Bu, CN, $CF_3$ and Ph;

triazinyl, which is optionally substituted with one or more substituents independently from each other selected from the group consisting of Me, $^{i}$Pr, $^{t}$Bu, CN, $CF_3$ and Ph; and $N(Ph)_2$.

In a preferred embodiment, X is CN.

In one embodiment of the invention, the TADF material $E^B$ is chosen from a structure of Formula III:

(Formula III)

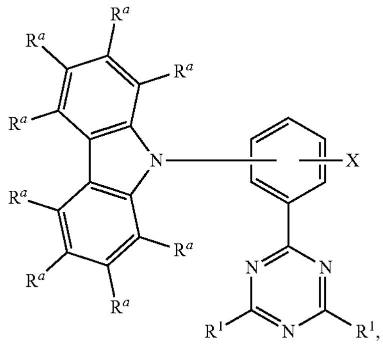

wherein $R^a$, X and $R^1$ are defined as above.

In one embodiment of the invention, $E^B$ is chosen from molecules of a structure of Formula IIIa:

(Formula IIIa)

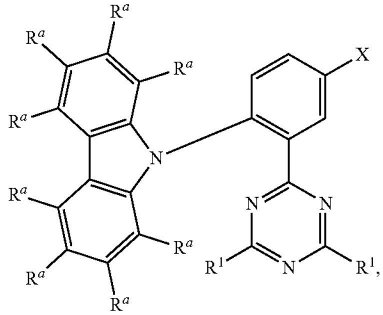

wherein $R^a$, X and $R^1$ are defined as above.

In one embodiment of the invention, $E^B$ is chosen from molecules of a structure of Formula IIIb:

(Formula IIIb)

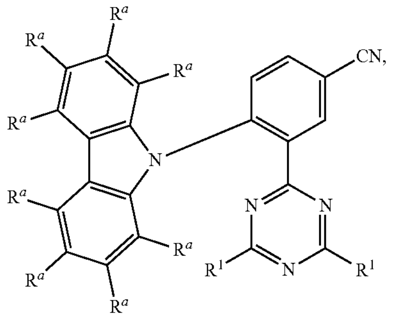

wherein $R^a$ and $R^1$ are defined as above.

In one embodiment of the invention, $E^B$ is chosen from molecules of a structure of Formula IIIc:

(Formula IIIc)

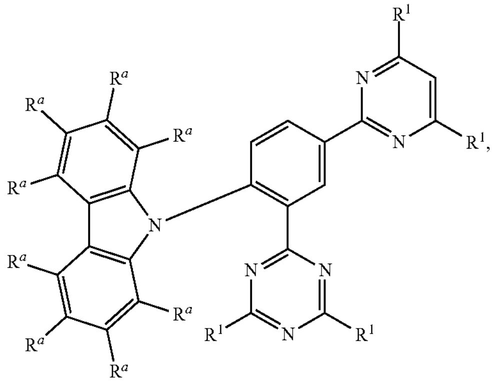

wherein $R^a$ and $R^1$ are defined as above.

In one embodiment of the invention, $E^B$ is chosen from molecules of a structure of Formula IIId:

(Formula IIId)

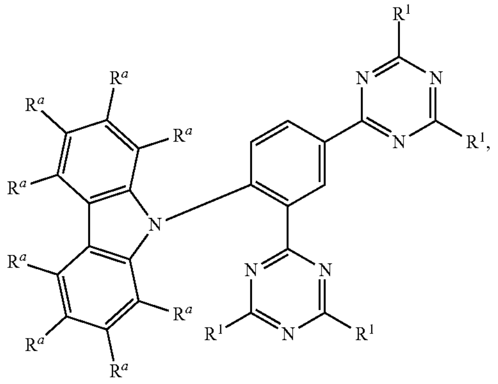

wherein $R^a$ and $R^1$ are defined as above.

In one embodiment of the invention, $E^B$ is chosen from molecules of a structure of Formula IV:

(Formula IV)

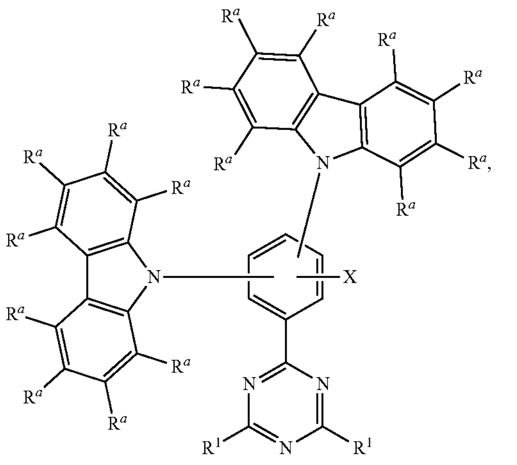

wherein $R^a$, $R^1$ and X are defined as above.

In one embodiment of the invention, $E^B$ is chosen from molecules of a structure of Formula IVa:

(Formula IVa)

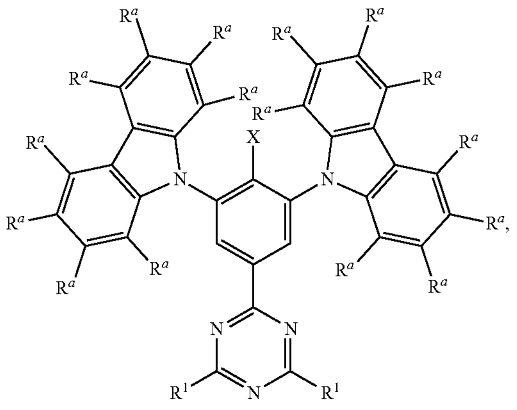

wherein $R^a$, $R^1$ and X are defined as above.

In one embodiment of the invention, $E^B$ is chosen from molecules of a structure of Formula IVb:

(Formula IVb)

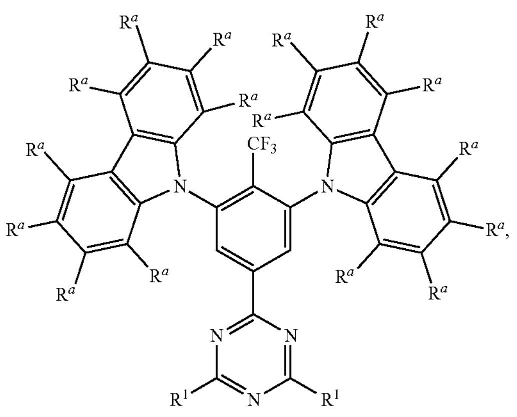

wherein $R^a$ and $R^1$ are defined as above.

In one embodiment of the invention, $E^B$ is chosen from molecules of a structure of Formula V:

(Formula V)

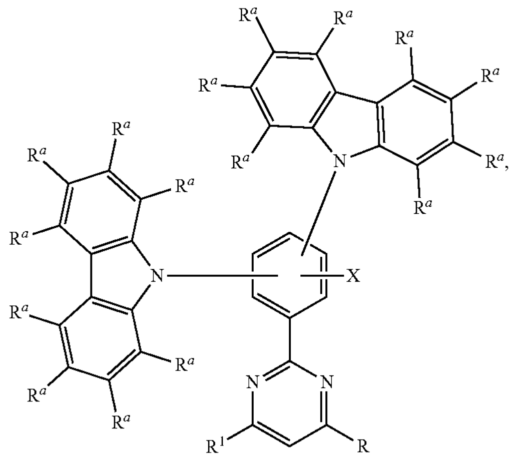

wherein $R^a$, $R^1$ and X are defined as above.

In one embodiment of the invention, $E^B$ is chosen from molecules of a structure of Formula Va:

(Formula Va)

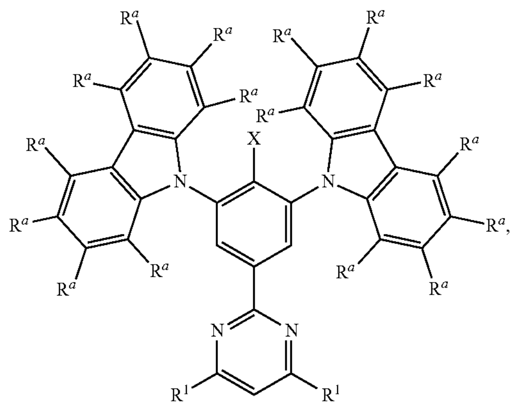

wherein $R^a$, $R^1$ and X are defined as above.

In one embodiment of the invention, $E^B$ is chosen from molecules of a structure of Formula Vb:

(Formula Vb)

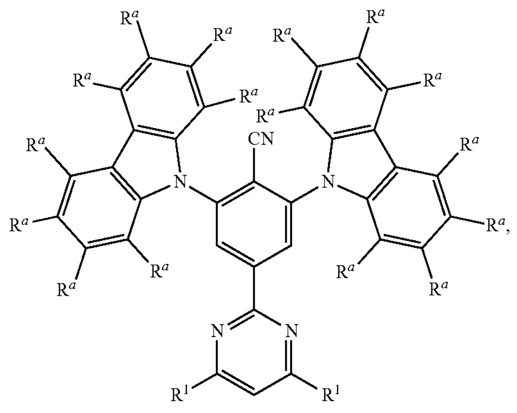

wherein $R^a$ and $R^1$ are defined as above.

In one embodiment of the invention, $E^B$ is chosen from molecules of a structure of Formula VI:

(Formula VI)

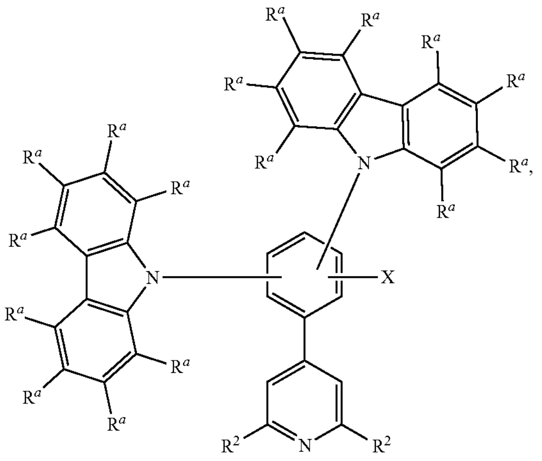

wherein $R^a$, $R^1$ and X are defined as above.

In one embodiment of the invention, $E^B$ is chosen from molecules of a structure of Formula VIa:

(Formula Via)

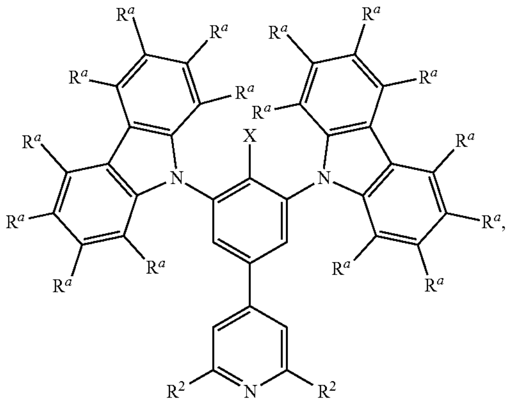

wherein $R^a$, $R^1$ and X are defined as above.

In one embodiment of the invention, $E^B$ is chosen from molecules of a structure of Formula VIb:

(Formula VIb)

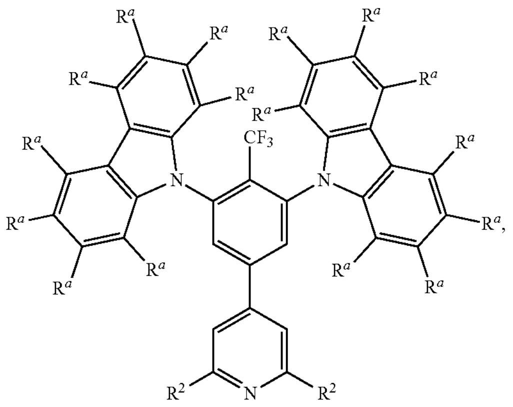

wherein $R^a$ and $R^1$ are defined as above.

In one embodiment of the invention, $E^B$ is chosen from molecules of a structure of Formula VII:

(Formula VII)

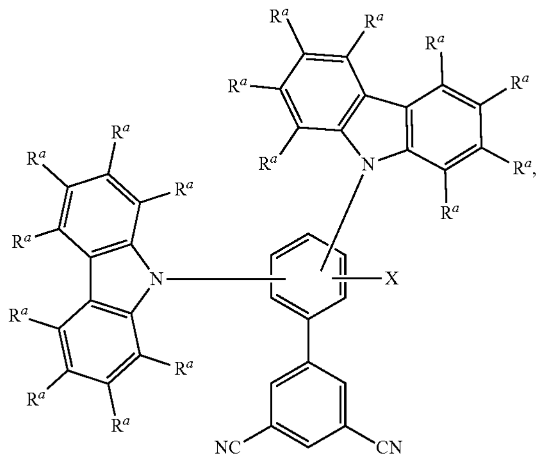

wherein $R^a$ and X are defined as above.

In one embodiment of the invention, $E^B$ is chosen from molecules of a structure of Formula VIIa:

(Formula VIIa)

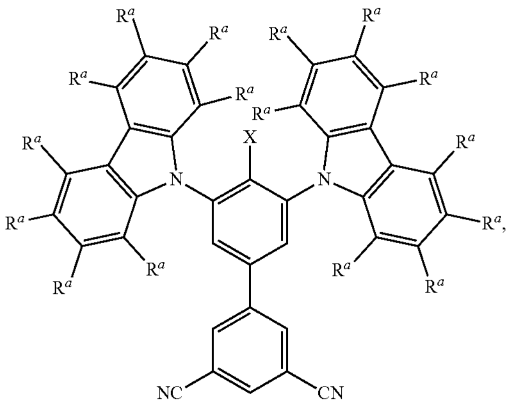

wherein $R^a$ and X are defined as above.

In one embodiment of the invention, $E^B$ is chosen from molecules of a structure of Formula VIIb:

(Formula VIIb)

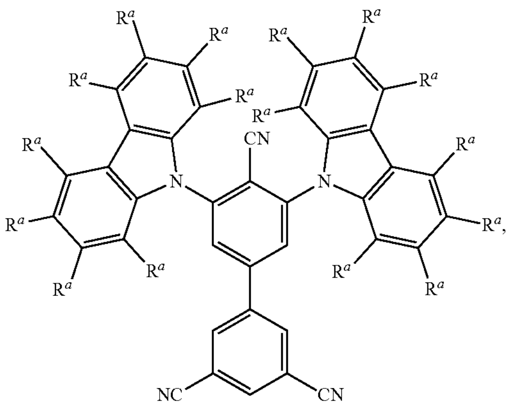

wherein $R^a$ is defined as above.

In one embodiment of the invention, $E^B$ is chosen from molecules of a structure of Formula VIII:

(Formula VIII)

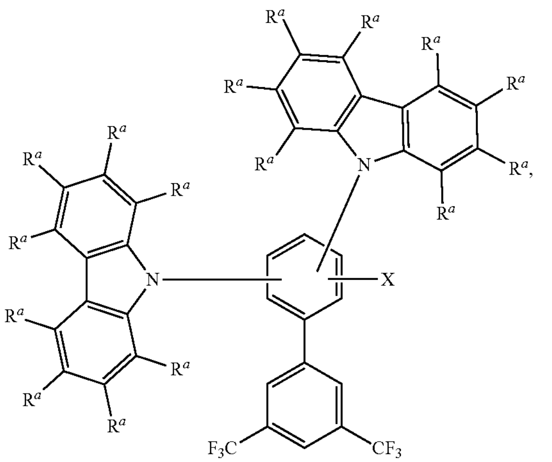

wherein $R^a$ and X are defined as above.

In one embodiment of the invention, $E^B$ is chosen from molecules of a structure of Formula VIIIa:

(Formula VIIIa)

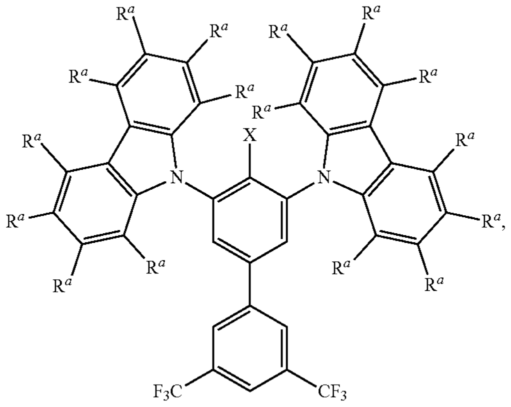

wherein $R^a$ and X are defined as above.

In one embodiment of the invention, $E^B$ is chosen from molecules of a structure of Formula VIIIb:

(Formula VIIIb)

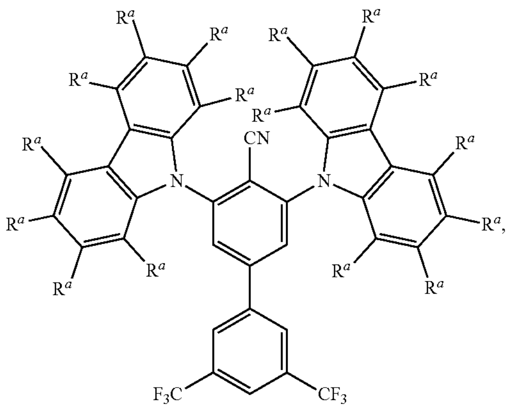

wherein $R^a$ is defined as above.

In one embodiment of the invention, $E^B$ is chosen from molecules of a structure of Formula IX:

(Formula IX)

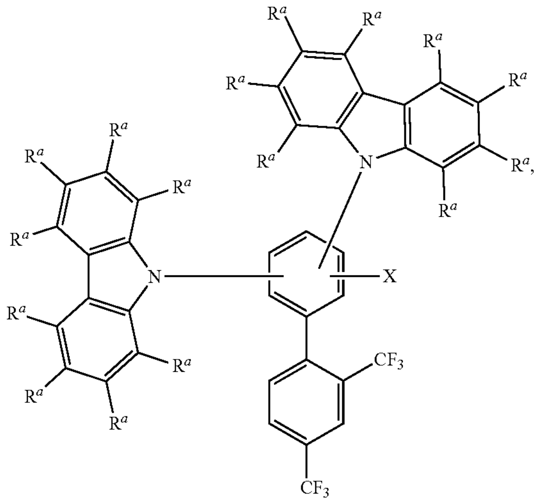

wherein $R^a$ and X are defined as above.

In one embodiment of the invention, $E^B$ is chosen from molecules of a structure of Formula IXa:

(Formula IXa)

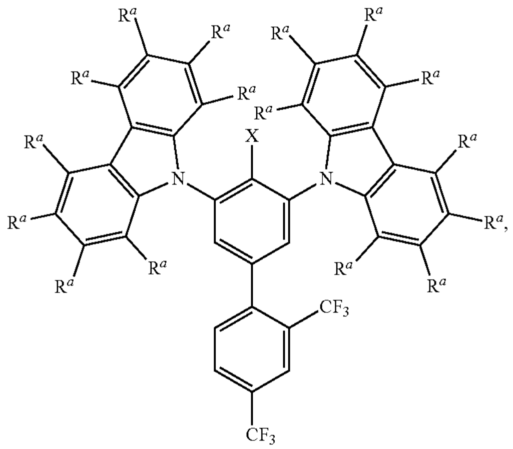

wherein $R^a$ and X are defined as above.

In one embodiment of the invention, $E^B$ is chosen from molecules of a structure of Formula IXb:

(Formula IXb)

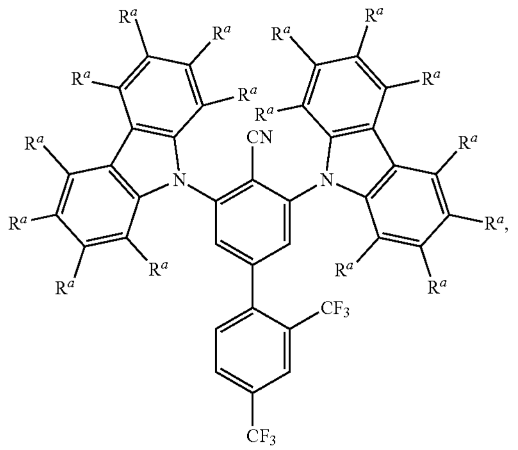

wherein $R^a$ is defined as above.

In one embodiment of the invention, $E^B$ is chosen from molecules of a structure of Formula X:

(Formula X)

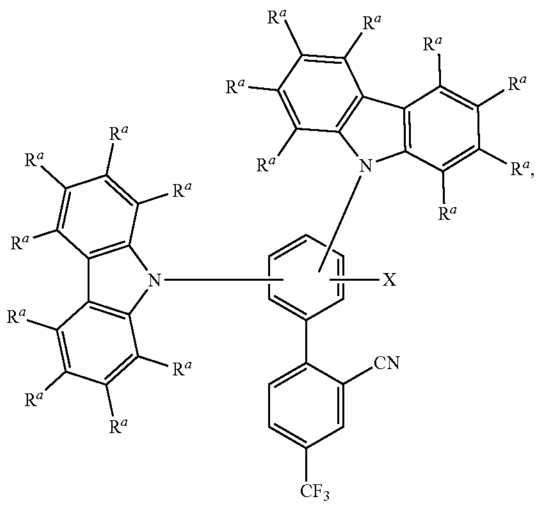

wherein $R^a$ and X are defined as above.

In one embodiment of the invention, $E^B$ is chosen from molecules of a structure of Formula Xa:

(Formula Xa)

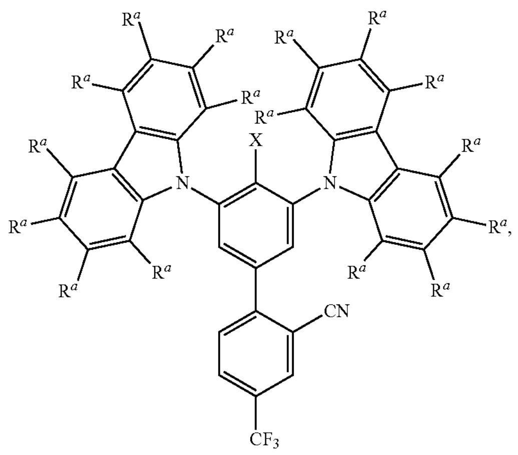

wherein $R^a$ and X are defined as above.

In one embodiment of the invention, $E^B$ is chosen from molecules of a structure of Formula Xb:

(Formula Xb)

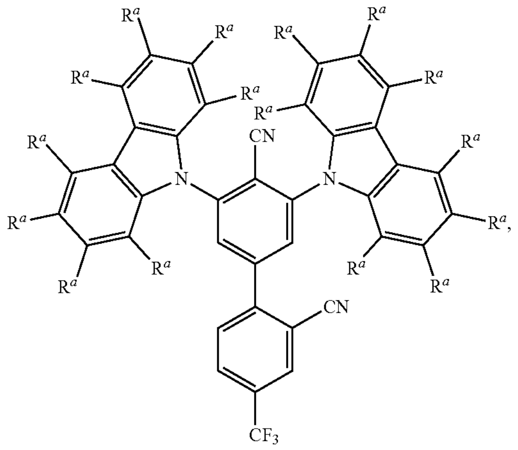

wherein $R^a$ is defined as above.

In one embodiment of the invention, $E^B$ is chosen from molecules of a structure of Formula XI:

(Formula XI)

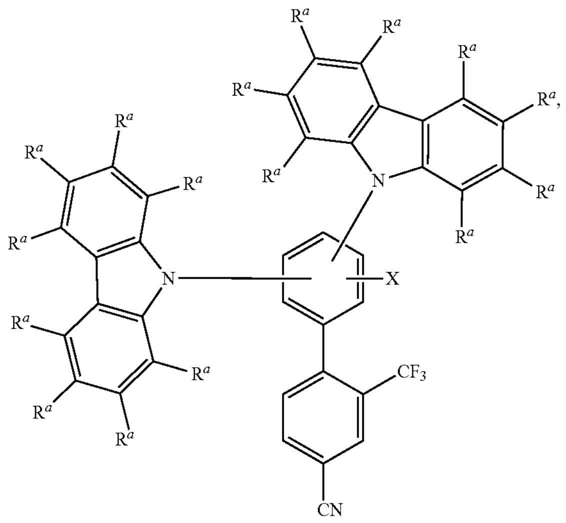

wherein $R^a$ and X are defined as above.

In one embodiment of the invention, $E^B$ is chosen from molecules of a structure of Formula XIa:

(Formula XIa)

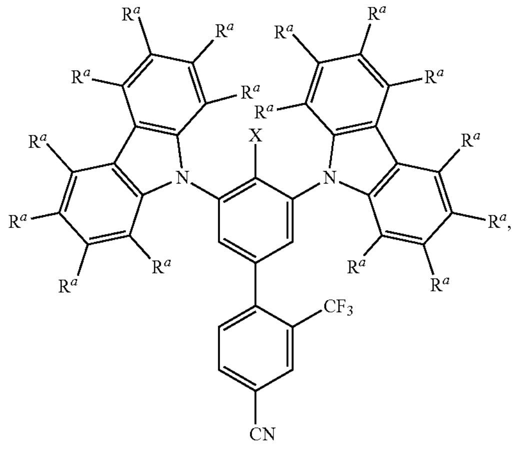

wherein $R^a$ and X are defined as above.

In one embodiment of the invention, $E^B$ is chosen from molecules of a structure of Formula XIb:

(Formula XIb)

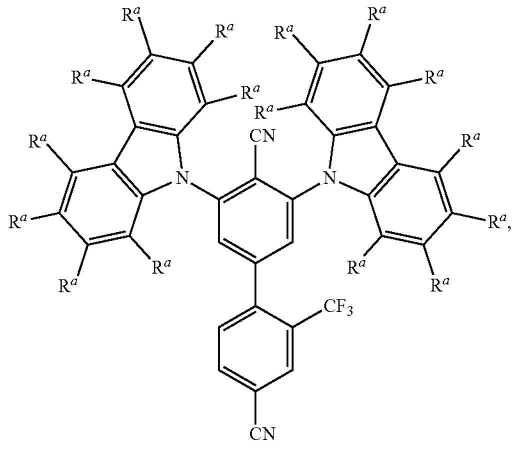

wherein $R^a$ is defined as above.

In one embodiment of the invention, $E^B$ is chosen from molecules of a structure of Formula XII:

(Formula XII)

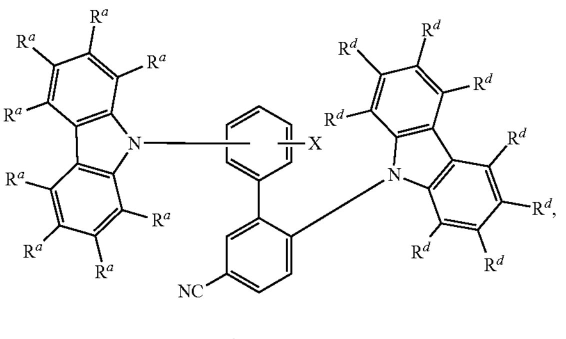

wherein $R^a$, X and $R^d$ are defined as above.

In one embodiment of the invention, $E^B$ is chosen from molecules of a structure of Formula XIIa:

(Formula XIIa)

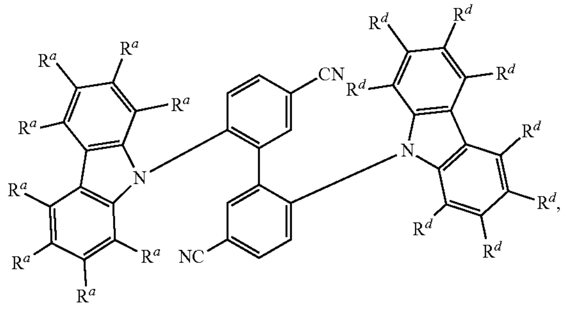

wherein $R^a$, X and $R^d$ are defined as above.

In one embodiment of the invention, $E^B$ is chosen from molecules of a structure of Formula XIIb:

(Formula XIIb)

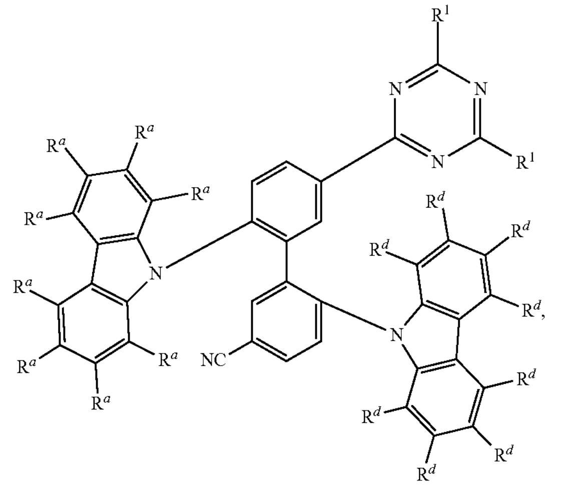

wherein $R^a$, X and $R^d$ are defined as above.

The synthesis of the molecules of a structure of Formula I-TADF can be accomplished via standard reactions and reaction conditions known to the skilled artesian. Typically, in a first step a coupling reaction, preferably a palladium catalyzed coupling reaction, is performed.

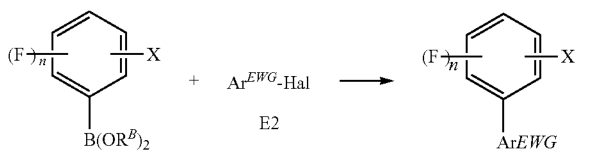

E1 E2 E3

E1 can be any boronic acid ($R^B$=H) or an equivalent boronic acid ester ($R^B$=alkyl or aryl), in particular two $R^B$ form a ring to give e.g. boronic acid pinacol esters, of fluoro-(trifluoromethyl)phenyl, difluoro-(trifluoromethyl)phenyl, fluoro-(cyano)phenyl or difluoro-(cyano) phenyl. As second reactant E2 preferably $Ar^{EWG}$—Br is used. Reaction conditions of such palladium catalyzed coupling reactions are known the person skilled in the art, e.g. from WO 2017/005699, and it is known that the reacting groups of E1 and E2 can be interchanged to optimize the reaction yields.

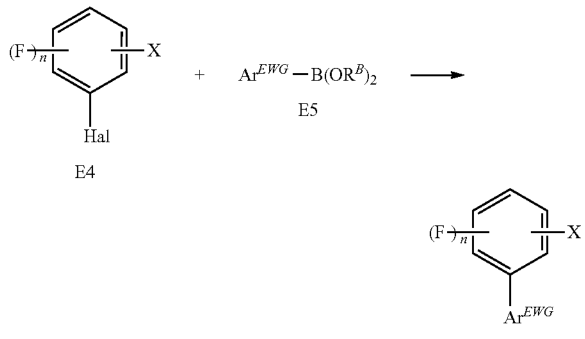

E4 E5 E3

In a second step, the molecules according to Formula I-TADF are obtained via the reaction of a nitrogen heterocycle in a nucleophilic aromatic substitution with the aryl halide, preferably aryl fluoride, or aryl dihalide, preferably aryl difluoride, E3. Typical conditions include the use of a base, such as tribasic potassium phosphate or sodium hydride, for example, in an aprotic polar solvent, such as dimethyl sulfoxide (DMSO) or N,N-dimethylformamide (DMF), for example.

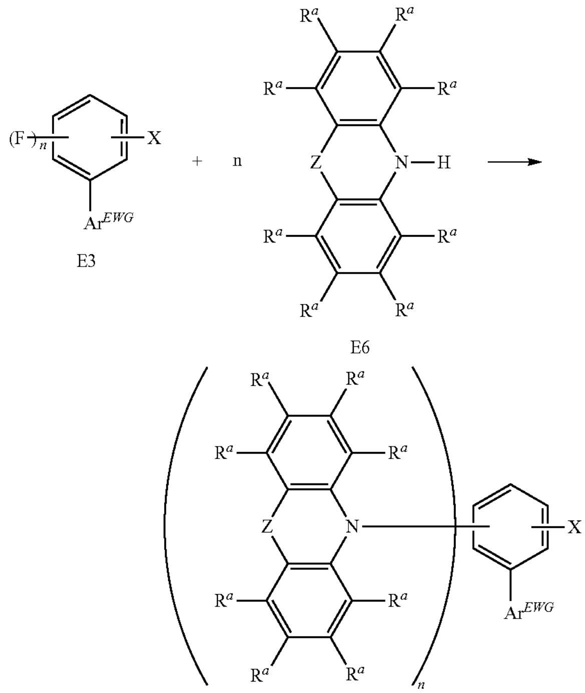

E3 E6

In particular, the donor molecule E6 is a 3,6-substituted carbazole (e.g., 3,6-dimethylcarbazole, 3,6 diphenylcarbazole, 3,6-di-tert-butylcarbazole), a 2,7-substituted carbazole (e.g., 2,7 dimethylcarbazole, 2,7-diphenylcarbazole, 2,7-di-tert-butylcarbazole), a 1,8-substituted carbazole (e.g., 1,8-dimethylcarbazole, 1,8-diphenylcarbazole, 1,8-di-tert-butylcarbazole), a 1 substituted carbazole (e.g., 1-methylcarbazole, 1-phenylcarbazole, 1-tert-butylcarbazole), a 2 substituted carbazole (e.g., 2-methylcarbazole, 2-phenylcarbazole, 2-tert-butylcarbazole), or a 3 substituted carbazole (e.g., 3-methylcarbazole, 3-phenylcarbazole, 3-tert-butylcarbazole).

Alternatively, a halogen-substituted carbazole, particularly 3-bromocarbazole, can be used as E6.

In a subsequent reaction a boronic acid ester functional group or boronic acid functional group may be exemplarily introduced at the position of the one or more halogen substituents, which was introduced via E6, to yield the corresponding carbazol-3-ylboronic acid ester or carbazol-3-ylboronic acid, e.g., via the reaction with bis(pinacolato) diboron (CAS No. 73183-34-3). Subsequently, one or more substituents $R^a$ may be introduced in place of the boronic acid ester group or the boronic acid group via a coupling reaction with the corresponding halogenated reactant $R^a$-Hal, preferably $R^a$—Cl and $R^a$—Br. Alternatively, one or more substituents $R^a$ may be introduced at the position of the one or more halogen substituents, which was introduced via D-H, via the reaction with a boronic acid of the substituent $R^a$ [$R^a$—$B(OH)_2$] or a corresponding boronic acid ester.

An alternative synthesis route comprises the introduction of a nitrogen heterocycle via copper- or palladium-catalyzed coupling to an aryl halide or aryl pseudohalide, preferably an aryl bromide, an aryl iodide, aryl triflate or an aryl tosylate.

As used throughout the present application, the terms "aryl" and "aromatic" may be understood in the broadest sense as any mono-, bi- or polycyclic aromatic moieties. If not otherwise indicated, an aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono-, bi- or polycyclic heteroaromatic moieties that include at least one heteroatom, in particular which bear from one to three heteroatoms per aromatic ring.

Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

As used throughout the present application, the term "alkyl" may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term "alkylene" refers to a divalent residue that bears two binding sites to other molecular structures and thereby serving as a linker structure.

If not otherwise indicated, as used herein, in particular in the context of aryl, arylene, heteroaryl, alkyl and the like, the term "substituted" may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

In a particularly preferred embodiment, the at least one TADF material $E^B$ is a blue TADF material, preferably a deep-blue TADF material.

The compounds $H^N$ and the emitters $E^B$ and $S^B$ may be comprised in the organic electroluminescent device in any amount and any ratio.

In a preferred embodiment, in the organic electroluminescent device of the present invention, the light-emitting layer B comprises more compound $H^N$ than emitter $E^B$, according to the weight.

In a preferred embodiment, in the organic electroluminescent device of the present invention, the light-emitting layer B comprises more TADF material $E^B$ than emitter $S^B$, according to the weight.

In a preferred embodiment, in the organic electroluminescent device of the present invention, the light-emitting layer B comprises 10-96.5% by weight, or 10-96% by weight, or 10-84% by weight, or 40-74% by weight, or 50 to 96.5% by weight of the TTA material $H^N$.

In a preferred embodiment, in the organic electroluminescent device of the present invention, the light-emitting layer B comprises 3-50% by weight, or 15-30% by weight, of the TADF material $E^B$.

In a preferred embodiment, in the organic electroluminescent device of the present invention, the light-emitting layer B (optionally) comprises 0.5-30% by weight, or 1-30% by weight, or 1-10% by weight, or 1-5% by weight, of the emitter $S^B$.

In a preferred embodiment, in the organic electroluminescent device of the present invention, the light-emitting layer B (optionally) comprises 0-74% by weight, or 0-34% by weight, or 0-25% by weight, or 0-10% by weight, or 0-5% by weight, of one or more solvents.

In a preferred embodiment, in the organic electroluminescent device of the present invention, the light-emitting layer B comprises (or consist of):

(i) 10-96.5% by weight, preferably 10-96% by weight of the TTA material $H^N$;
(ii) 3-50% by weight of the TADF material $E^B$; and
(iii) 0.5-30% by weight, preferably 1-30% by weight of the emitter $S^B$; and optionally
(iv) 0-74% by weight of one or more solvents.

In a preferred embodiment, in the organic electroluminescent device of the present invention, the light-emitting layer B comprises (or consist of):

(i) 10-84% by weight of the TTA material $H^N$;
(ii) 3-50% by weight of the TADF material $E^B$; and
(iii) 1-30% by weight of the emitter $S^B$; and optionally
(iv) 0-74% by weight of one or more solvents.

In a preferred embodiment, the percentage numbers of (i)-(iv) sum up to 100% by weight.

In another preferred embodiment, in the organic electroluminescent device of the present invention, the light-emitting layer B comprises (or consist of):

(i) 40-74% by weight of the TTA material $H^N$;
(ii) 15-30% by weight of the TADF material $E^B$; and
(iii) 1-5% by weight of the emitter $S^B$; and optionally
(iv) 0-34% by weight of one or more solvents.

In a preferred embodiment, the percentage numbers of (i)-(iv) sum up to 100% by weight.

In a preferred embodiment, the TADF material $E^B$ exhibits an emission maximum (determined in poly(methyl methacrylate) (PMMA), $\lambda_{max}^{PMMA}(E^B)$) in the range from 440 to 470 nm. In a preferred embodiment, TADF material $E^B$ exhibits an emission maximum $\lambda_{max}^{PMMA}(E^B)$ in the range from 445 to 465 nm.

According to the invention, a NRCT emitter shows a delayed component in the time-resolved photoluminescence spectrum and exhibits a near-range HOMO-LUMO separation as described by Hatakeyama et al. (Advanced Materials, 2016, 28(14):2777-2781, DOI: 10.1002/adma.201505491). In some embodiments, the NRCT emitter is a TADF material.

In one embodiment, the NRCT emitter $S^B$ is a blue boron containing NRCT emitter.

In a preferred embodiment, the NRCT emitter $S^B$ comprises or consists of a polycyclic aromatic compound.

In a preferred embodiment, the NRCT emitter $S^B$ comprises or consists of a polycyclic aromatic compound according to formula (1) or (2) or a specific example described in US-A 2015/236274. US-A 2015/236274 also describes examples for synthesis of such compounds.

In one embodiment, the NRCT emitter $S^B$ comprises or consists of a structure according to Formula I-NRCT:

Formula I-NRCT

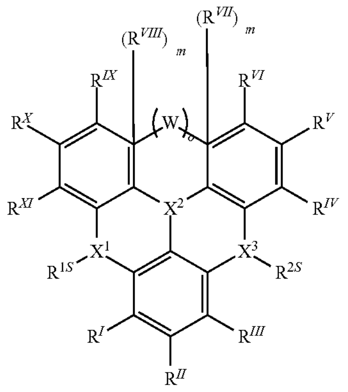

wherein
is 0 or 1.
m=1-o.
$X^1$ is N or B.
$X^2$ is N or B.
$X^3$ is N or B.
W is selected from the group consisting of $Si(R^{3S})_2$, $C(R^{3S})_2$ and $BR^{3S}$.
each of $R^{1S}$, $R^{2S}$ and $R^{3S}$ is independently from each other selected from the group consisting of:
$C_1$-$C_5$-alkyl, which is optionally substituted with one or more substituents $R^{6S}$;
$C_6$-$C_{60}$-aryl, which is optionally substituted with one or more substituents $R^{6S}$; and
$C_3$-$C_{57}$-heteroaryl, which is optionally substituted with one or more substituents $R^{6S}$;
each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of: hydrogen, deuterium, $N(R^{5S})_2$, $OR^{5S}$, $Si(R^{5S})_3$, $B(OR^{5S})_2$, $OSO_2R^{5S}$, $CF_3$, CN, halogen,
$C_1$-$C_{40}$-alkyl, which is optionally substituted with one or more substituents $R^{5S}$ and wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, C═$NR^{5S}$, P(═O)($R^{5S}$), SO, $SO_2$, $NR^{5S}$, O, S or $CONR^{5S}$;

$C_1$-$C_{40}$-alkoxy, which is optionally substituted with one or more substituents $R^{5S}$ and wherein one or more non-adjacent $CH_2$-groups are each optionally substituted by $R^{5S}C$═$CR^{5S}$, C≡C, Si($R^{5S}$)$_2$, Ge($R^{5S}$)$_2$, Sn($R^{5S}$)$_2$, C═O, C═S, C═Se, C═$NR^{5S}$, P(═O)($R^{5S}$), SO, $SO_2$, $NR^{5S}$, O, S or $CONR^{5S}$;

$C_1$-$C_{40}$-thioalkoxy, which is optionally substituted with one or more substituents $R^{5S}$ and wherein one or more non-adjacent $CH_2$-groups are each optionally substituted by $R^{5S}C$═$CR^{5S}$, C≡C, Si($R^{5S}$)$_2$, Ge($R^{5S}$)$_2$, Sn($R^{5S}$)$_2$, C═O, C═S, C═Se, C═$NR^{5S}$, P(═O)($R^{5S}$), SO, $SO_2$, $NR^{5S}$, O, S or $CONR^{5S}$;

$C_2$-$C_{40}$-alkenyl, which is optionally substituted with one or more substituents $R^{5S}$ and wherein one or more non-adjacent $CH_2$-groups are each optionally substituted by $R^{5S}C$═$CR^{5S}$, C≡C, Si($R^{5S}$)$_2$, Ge($R^{5S}$)$_2$, Sn($R^{5S}$)$_2$, C═O, C═S, C═Se, C═$NR^{5S}$, P(═O)($R^{5S}$), SO, $SO_2$, $NR^{5S}$, O, S or $CONR^{5S}$;

$C_2$-$C_{40}$-alkynyl, which is optionally substituted with one or more substituents $R^{5S}$ and wherein one or more non-adjacent $CH_2$-groups are each optionally substituted by $R^{5S}C$═$CR^{5S}$, C≡C, Si($R^{5S}$)$_2$, Ge($R^{5S}$)$_2$, Sn($R^{5S}$)$_2$, C═O, C═S, C═Se, C═$NR^{5S}$, P(═O)($R^{5S}$), SO, $SO_2$, $NR^{5S}$, O, S or $CONR^{5S}$;

$C_6$-$C_{60}$-aryl, which is optionally substituted with one or more substituents $R^{5S}$; and $C_3$-$C_{57}$-heteroaryl, which is optionally substituted with one or more substituents $R^{5S}$.

$R^{5S}$ is at each occurrence independently from another selected from the group consisting of: hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

N($C_6$-$C_{18}$-aryl)$_2$,

N($C_3$-$C_{17}$-heteroaryl)$_2$; and

N($C_3$-$C_{17}$-heteroaryl)($C_6$-$C_{18}$-aryl).

$R^{6S}$ is at each occurrence independently from another selected from the group consisting of hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

N($C_6$-$C_{18}$-aryl)$_2$,

N($C_3$-$C_{17}$-heteroaryl)$_2$; and

N($C_3$-$C_{17}$-heteroaryl)($C_6$-$C_{18}$-aryl).

According to a preferred embodiment, two or more of the substituents selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ that are positioned adjacent to another may each form a mono- or polycyclic, aliphatic, aromatic and/or benzo-fused ring system with another.

According to a preferred embodiment, at least one of $X^1$, $X^2$ and $X^3$ is B and at least one of $X^1$, $X^2$ and $X^3$ is N.

According to a preferred embodiment of the invention, at least one substituent selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ optionally forms a mono- or polycyclic, aliphatic, aromatic and/or benzo-fused ring system with one or more substituents of the same group that is/are positioned adjacent to the at least one substituent.

According to a preferred embodiment of the invention, at least one of $X^1$, $X^2$ and $X^3$ is B and at least one of $X^1$, $X^2$ and $X^3$ is N.

In one embodiment, NRCT emitter $S^B$ comprises or consists of a structure according to Formula 1 and $X^1$ and $X^3$ each are N and $X^2$ is B:

Formula Ia

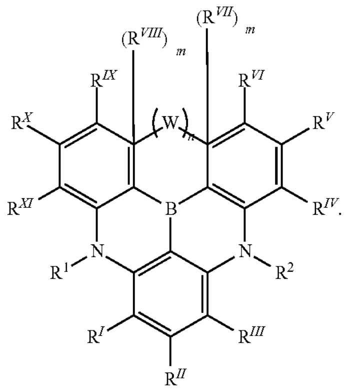

In one embodiment, NRCT emitter $S^B$ comprises or consists of a structure according to Formula 1 and $X^1$ and $X^3$ each are B and $X^2$ is N:

Formula Ib

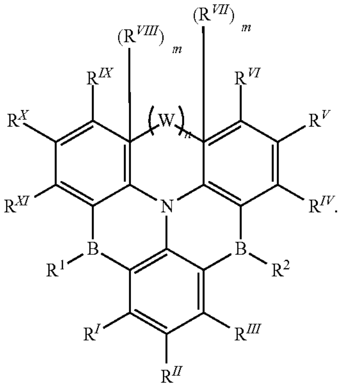

In one embodiment, the small FWHM emitter $S^B$ comprises or consists of a structure according to Formula 1 and o=0.

In one embodiment, each of $R^{1S}$ and $R^{2S}$ is each independently from each other selected from the group consisting of $C_1$-$C_5$-alkyl, which is optionally substituted with one or more substituents $R^{6S}$;

$C_6$-$C_{30}$-aryl, which is optionally substituted with one or more substituents $R^{6S}$; and $C_3$-$C_{30}$-heteroaryl, which is optionally substituted with one or more substituents $R^{6S}$.

In one embodiment, $R^{1S}$ and $R^{2S}$ is each independently from each other selected from the group consisting of Me, $^i$Pr, $^t$Bu, CN, $CF_3$, Ph, which is optionally substituted with one or more substituents independently from each other selected from the group consisting of Me, $^i$Pr, $^t$Bu, CN, $CF_3$, and Ph;

pyridinyl, which is optionally substituted with one or more substituents independently from each other selected from the group consisting of Me, $^i$Pr, $^t$Bu, CN, $CF_3$, and Ph;

pyrimidinyl, which is optionally substituted with one or more substituents independently from each other selected from the group consisting of Me, $^i$Pr, $^t$Bu, CN, $CF_3$, and Ph; and triazinyl, which is optionally substituted with one or more substituents independently from each other selected from the group consisting of Me, $^i$Pr, $^t$Bu, CN, $CF_3$, and Ph.

In one embodiment, each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of: hydrogen, deuterium, halogen, Me, $^i$Pr, $^t$Bu, CN, $CF_3$, Ph, which is optionally substituted with one or more substituents independently from each other selected from the group consisting of Me, $^i$Pr, $^t$Bu, CN, $CF_3$, and Ph;

pyridinyl, which is optionally substituted with one or more substituents independently from each other selected from the group consisting of Me, $^i$Pr, $^t$Bu, CN, $CF_3$, and Ph;

pyrimidinyl, which is optionally substituted with one or more substituents independently from each other selected from the group consisting of Me, $^i$Pr, $^t$Bu, CN, $CF_3$, and Ph;

carbazolyl, which is optionally substituted with one or more substituents independently from each other selected from the group consisting of Me, $^i$Pr, $^t$Bu, CN, $CF_3$, and Ph;

triazinyl, which is optionally substituted with one or more substituents independently from each other selected from the group consisting of Me, $^i$Pr, $^t$Bu, CN, $CF_3$, and Ph;

and $N(Ph)_2$.

In one embodiment, each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of: hydrogen, deuterium, halogen, Me, $^i$Pr, $^t$Bu, CN, $CF_3$, Ph, which is optionally substituted with one or more substituents independently from each other selected from the group consisting of Me, $^i$Pr, $^t$Bu, CN, $CF_3$, and Ph;

pyridinyl, which is optionally substituted with one or more substituents independently from each other selected from the group consisting of Me, $^i$Pr, $^t$Bu, CN, $CF_3$, and Ph;

pyrimidinyl, which is optionally substituted with one or more substituents independently from each other selected from the group consisting of Me, $^i$Pr, $^t$Bu, CN, $CF_3$, and Ph;

carbazolyl, which is optionally substituted with one or more substituents independently from each other selected from the group consisting of Me, $^i$Pr, $^t$Bu, CN, $CF_3$, and Ph;

triazinyl, which is optionally substituted with one or more substituents independently from each other selected from the group consisting of Me, $^i$Pr, $^t$Bu, CN, $CF_3$, and Ph;

and $N(Ph)_2$; and $R^{1S}$ and $R^{2S}$ is each independently from each other selected from the group consisting of $C_1$-$C_5$-alkyl, which is optionally substituted with one or more substituents $R^{6S}$;

$C_6$-$C_{30}$-aryl, which is optionally substituted with one or more substituents $R^{6S}$; and $C_5$-$C_{30}$-heteroaryl, which is optionally substituted with one or more substituents $R^{6S}$.

In one embodiment, the NRCT emitter $S^B$ is a blue boron-containing NRCT emitter selected from the following group:

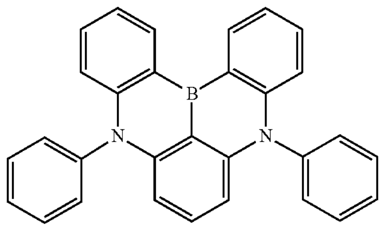

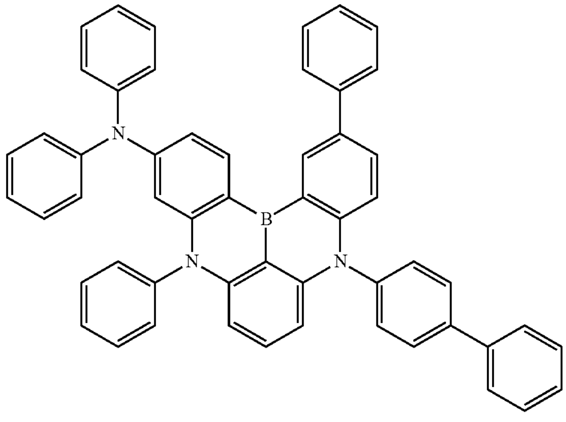

-continued
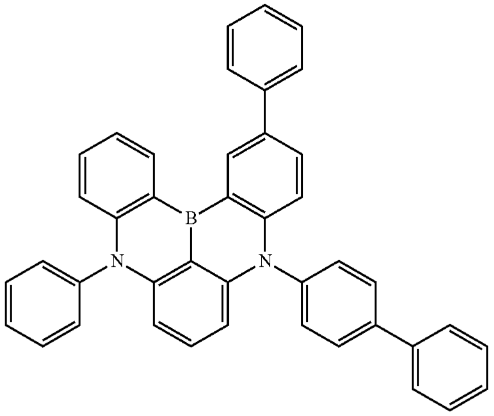
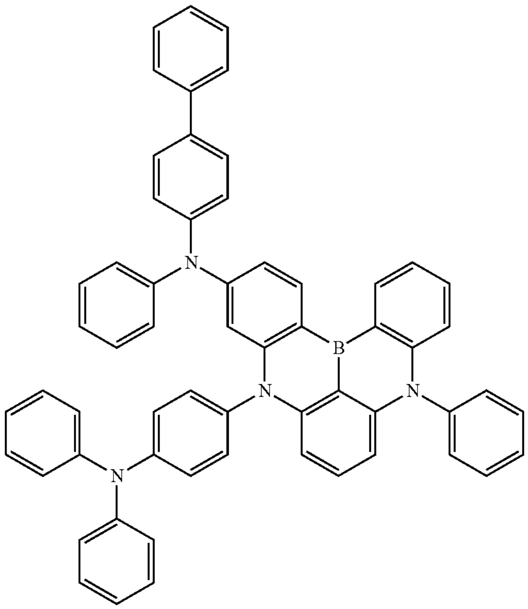
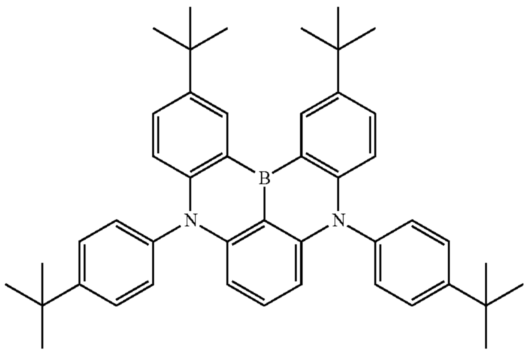
-continued
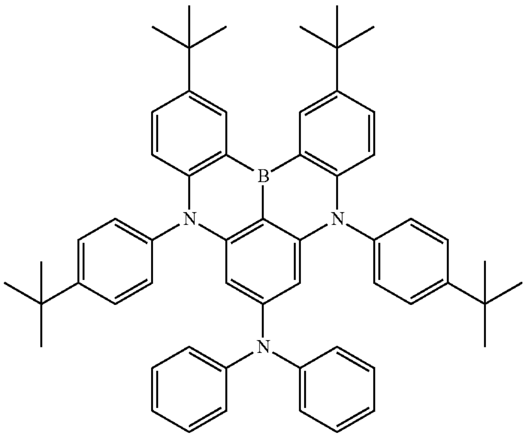
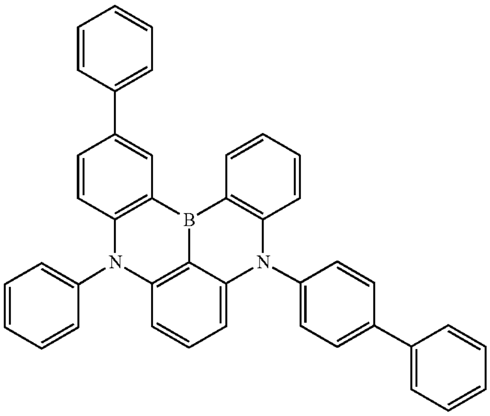
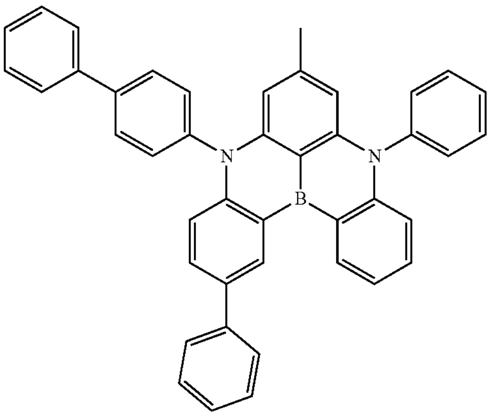
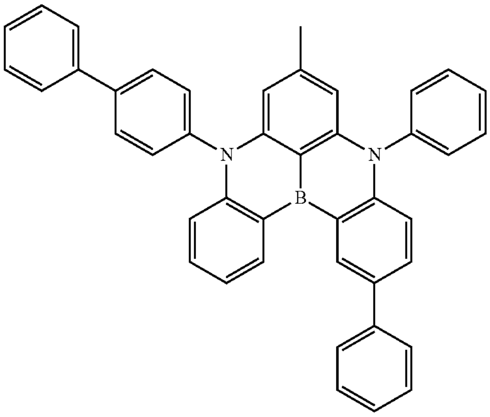

-continued
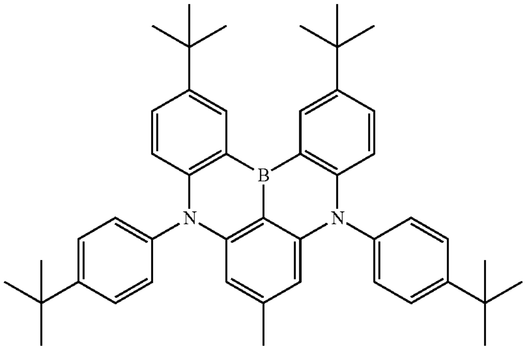
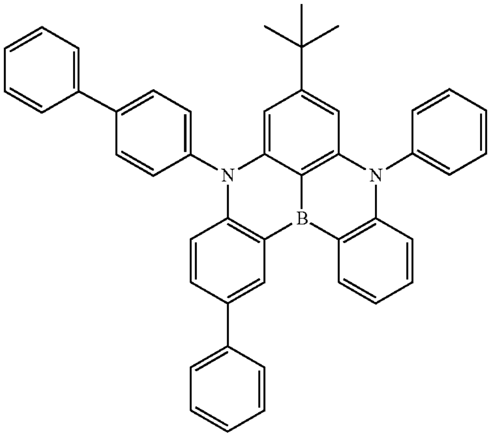
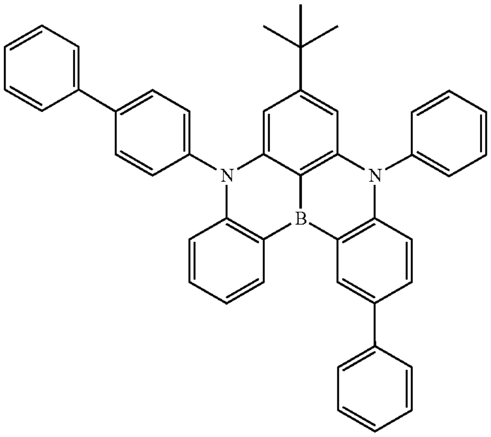
-continued
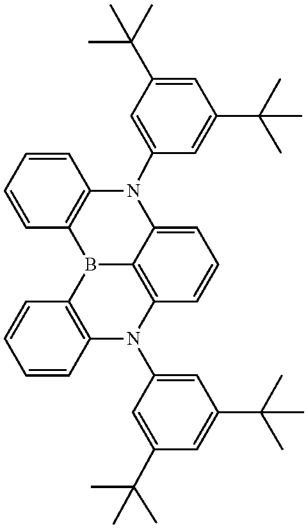
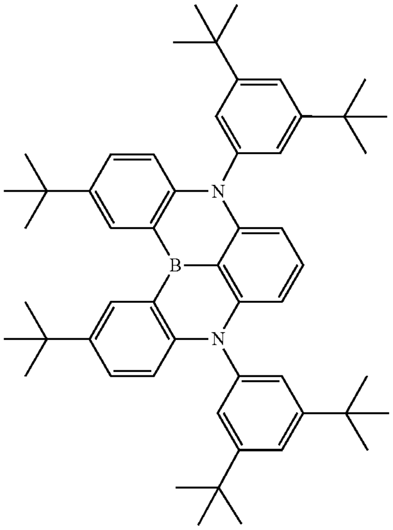
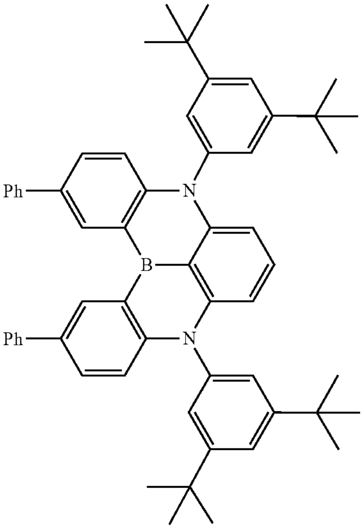

-continued

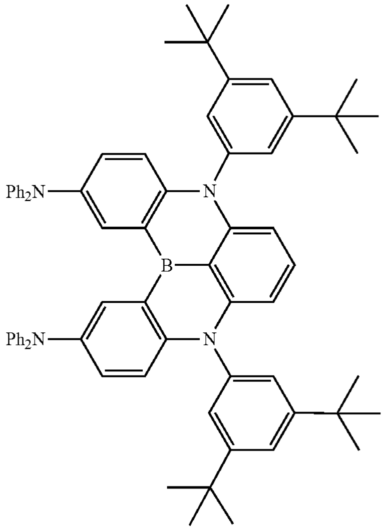

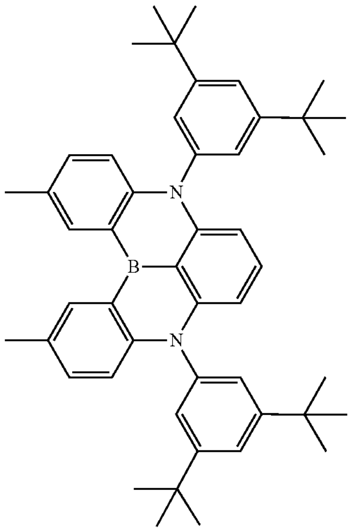

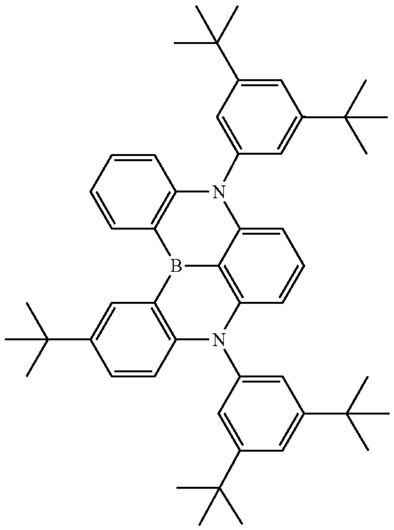

-continued

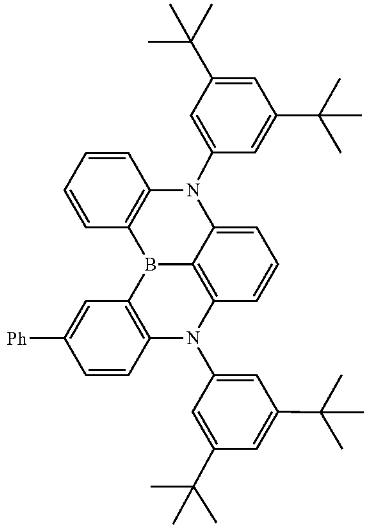

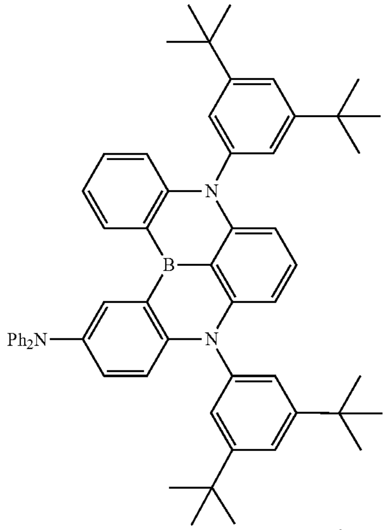

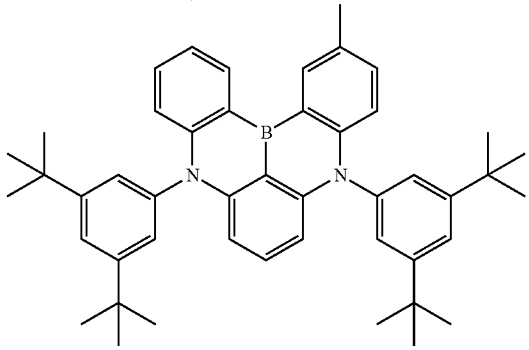

In a preferred embodiment, the NRCT emitter $S^B$ exhibits an emission maximum (determined in poly(methyl methacrylate) (PMMA), $\lambda_{max}^{PMMA}(S^B)$) in the range from 440 to 475 nm. In a preferred embodiment, NRCT material $S^B$ exhibits an emission maximum $\lambda_{max}^{PMMA}(S^B)$ in the range from 445 to 465 nm.

The person skilled in the art will notice that the light-emitting layer B will typically be incorporated in the organic electroluminescent device of the present invention. Preferably, such organic electroluminescent device comprises at least the following layers: at least one light-emitting layer B, at least one anode layer A and at least one cathode layer C.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer C contains at least one component selected from the group consisting of Al, Au, Ag, Pt, Cu, Zn, Ni, Fe, Pb, In, W, Pd, LiF, Ca, Ba, Mg, and mixtures or alloys of two or more thereof.

Preferably, the light-emitting layer B is located between an anode layer A and a cathode layer C. Accordingly, the general set-up is preferably A-B-C. This does of course not exclude the presence of one or more optional further layers. These can be present at each side of A, of B and/or of C.

In a preferred embodiment, the organic electroluminescent device comprises at least the following layers:

A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;

B) the light-emitting layer B; and

C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof, wherein the light-emitting layer B is located between the anode layer A and the a cathode layer C.

In one embodiment, when the organic electroluminescent device is an OLED, it may optionally comprise the following layer structure:

A) an anode layer A, exemplarily comprising indium tin oxide (ITO);

HTL) a hole transport layer HTL;

B) a light-emitting layer B according to present invention as described herein;

ETL) an electron transport layer ETL; and

C) a cathode layer, exemplarily comprising Al, Ca and/or Mg.

Preferably, the order of the layers herein is A-HTL-B-ETL-C.

Furthermore, the organic electroluminescent device may optionally comprise one or more protective layers protecting the device from damaging exposure to harmful species in the environment including, exemplarily moisture, vapor and/or gases.

Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C transparent. Preferably, the anode layer A comprises a large content or even consists of transparent conductive oxides (TCOs).

Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene:polystyrene sulfonate), PEDOT (poly-3,4-ethylendioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)-benzi-dine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)-amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant. Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), TCTA, 2-TNATA, mCBP (3,3-di(9H-carbazol-9-yl)biphenyl), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, tris-Pcz, CzSi (9-(4-tert-butylphenyl)-3,6-bis(triphenylsilyl)-9H-carbazole), 3',5'-di-(N-carbazolyl)-[1,1'-biphenyl]-2-carbonitrile (DCPBN; CAS 1918991-70-4), 3-(N-carbazolyl)-N-phenylcarbazole (NCNPC) and/or DCB (N,N'-dicarbazolyl-1,4-dimethylbenzene).

Orbital and excited state energies can be determined by means of experimental methods known to the person skilled in the art. Experimentally, the energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, where $E^{gap}$ is determined as follows:

For TTA material compounds, the onset of emission of a neat film, which corresponds to the energy of the first excited singlet state S1, is used as $E^{gap}$, unless stated otherwise.

For TADF material compounds, the onset of emission of a film with 10% by weight of host in poly(methyl methacrylate) (PMMA), which corresponds to the energy of the first excited singlet state S1, is used as $E^{gap}$, unless stated otherwise.

For NRCT emitter compounds, the onset of emission of a film with 5% by weight of host in poly(methyl methacrylate) (PMMA), which corresponds to the energy of the first excited singlet state S1, is used as $E^{gap}$, unless stated otherwise.

For host compounds, the energy of the first excited triplet state T1 is determined from the onset of the time-gated emission spectrum at 77 K, typically with a delay time of 1 ms and an integration time of 1 ms, if not otherwise stated, measured in a film of poly(methyl methacrylate) (PMMA) with 10% by weight of host.

For TTA material compounds, the energy of the first excited triplet state T1 is determined from the onset of the time-gated emission spectrum at 77 K, typically with a delay time of 1 ms and an integration time of 1 ms, if not otherwise stated, measured in a neat film of the TTA material.

For TADF material compounds, the energy of the first excited triplet state T1 is determined from the onset of the time-gated emission spectrum at 77 K, typically with a delay time of 1 ms and an integration time of 1 ms, if not otherwise stated, measured in a film of poly(methyl methacrylate) (PMMA) with 10% by weight of TADF material.

For NRCT emitter compounds, the energy of the first excited triplet state T1 is determined from the onset of the time-gated emission spectrum at 77 K, typically with a delay time of 1 ms and an integration time of 1 ms, if not otherwise stated measured in a film of poly(methyl methacrylate) (PMMA) with 1% by weight of NRCT emitter.

In the electron transport layer (ETL), any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter ETM may also be a star-shaped heterocycle such as 1,3,5-tri(1-phenyl-1H-benzo[d]imidazol-2-yl)phenyl (TPBi). The ETM may exemplarily be NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl) diphenylsilane), BmPyPhB (1,3-bis[3,5-di(pyridin-3-yl) phenyl]benzene) and/or BTB (4,4'-bis-[2-(4,6-diphenyl-1,3,5-triazinyl)]-1,1'-biphenyl). Optionally, the electron transport layer may be doped with materials such as Liq (8-hydroxyquinolinolatolithium). Optionally, a second electron transport layer may be located between electron transport layer and the cathode layer C. The electron transport layer (ETL) may also block holes or a hole-blocking layer (HBL) is introduced.

The HBL may, for example, comprise BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), DTST (2,4-diphenyl-6-(3'-triphenylsilylphenyl)-1,3,5-triazine), DTDBF (2,8-bis(4,6-diphenyl-1,3,5-triazinyl)dibenzofurane) and/or TCB/TCP (1,3,5-tris(N-carbazolyl)benzol/1,3,5-tris(carbazol)-9-yl) benzene).

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer C may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscale silver wires.

An OLED may further, optionally, comprise a protection layer between the electron transport layer (ETL) D and the cathode layer C (which may be designated as electron injection layer (EIL)). This layer may comprise lithium fluoride, caesium fluoride, silver, Liq (8-hydroxyquinolinolatolithium), $Li_2O$, $BaF_2$, MgO and/or NaF.

As used herein, if not defined more specifically in a particular context, the designation of the colors of emitted and/or absorbed light is as follows:

violet: wavelength range of >380-420 nm;
deep blue: wavelength range of >420-475 nm;
sky blue: wavelength range of >475-500 nm;
green: wavelength range of >500-560 nm;
yellow: wavelength range of >560-580 nm;
orange: wavelength range of >580-620 nm;
red: wavelength range of >620-800 nm.

With respect to emitter compounds, such colors refer to the emission maximum $\lambda_{max}^{PMMA}$ of a poly(methyl methacrylate) (PMMA) film with 10% by weight of the emitter. Therefore, exemplarily, a deep blue emitter has an emission maximum $\lambda_{max}^{PMMA}$ in the range of from 420 to 475 nm, a sky blue emitter has an emission maximum $\lambda_{max}^{PMMA}$ in the range of from 475 to 500 nm, a green emitter has an emission maximum $\lambda_{max}^{PMMA}$ in a range of from 500 to 560 nm, a red emitter has an emission maximum $\lambda_{max}^{PMMA}$ in a range of from 620 to 800 nm.

A deep blue emitter may preferably have an emission maximum $\lambda_{max}^{PMMA}$ of not more than 475 nm, more preferably below 470 nm, even more preferably below 465 nm or even below 460 nm. It will typically be above 420 nm, preferably above 430 nm, more preferably of at least 440 nm. In a preferred embodiment, the device exhibits an emission maximum $\lambda_{max}(D)$ of 420 to 475 nm, 430 to 470 nm, 440 to 465 nm, or 450 to 460 nm. In a preferred embodiment, the device exhibits an emission maximum $\lambda_{max}(D)$ of 440 to 475 nm. In a preferred embodiment, the device exhibits an emission maximum $\lambda_{max}(D)$ of 450 to 470 nm.

Accordingly, a further embodiment of the present invention relates to an OLED, which exhibits an external quantum efficiency at 1000 cd/m$^2$ of more than 10%, more preferably of more than 13%, more preferably of more than 15%, even more preferably of more than 18% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/$m^2$ of more than 100 h, preferably more than 200 h, more preferably more than 400 h, even more preferably more than 750 h or even more than 1000 h.

A further embodiment of the present invention relates to an OLED, which emits light at a distinct color point. According to the present invention, the OLED emits light with a narrow emission band (small full width at half maximum (FWHM)). In a preferred embodiment, the OLED according to the invention emits light with a FWHM of the main emission peak of below 0.30 eV, more preferably of below 0.25 eV, even more preferably of below 0.20 eV or even below 0.18 eV.

A further aspect of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al., Society for Information Display International Symposium Digest of Technical Papers, 2015, 46(1):312-313, DOI:10.1002/sdtp.10480). Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

As used throughout the present application, the terms “aryl” and “aromatic” may be understood in the broadest sense as any mono-, bi- or polycyclic aromatic moieties. If not otherwise indicated, an aryl may also be optionally substituted by one or more substituents which are exemplified further throughout the present application. Accordingly, the term “arylene” refers to a divalent residue that bears two binding sites to other molecular structures and thereby serving as a linker structure. As used throughout the present application, the terms “heteroaryl” and “heteroaromatic” may be understood in the broadest sense as any mono-, bi- or polycyclic heteroaromatic moieties that include at least one heteroatom, in particular which bear from one to three heteroatoms per aromatic ring.

Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term “heteroarylene” refers to a divalent residue that bears two binding sites to other molecular structures and thereby serving as a linker structure.

As used throughout the present application, the term “alkyl” may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term “alkylene” refers to a divalent residue that bears two binding sites to other molecular structures and thereby serving as a linker structure.

If not otherwise indicated, as used herein, in particular in the context of aryl, arylene, heteroaryl, alkyl and the like, the term “substituted” may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

Unless otherwise specified, any of the layers of the various embodiments may be deposited by any suitable method. The layers in the context of the present invention, including the light-emitting layer B, may optionally be prepared by means of liquid processing (also designated as “film processing”, “fluid processing”, “solution processing” or “solvent processing”). This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., drop-casting) and rolling methods, and printing methods (e.g., inkjet printing, gravure printing, blade coating). This may optionally be carried out in an inert atmosphere (e.g., in a nitrogen atmosphere).

In another preferred embodiment, the layers in the context of the present invention may be prepared by any other method known in the art, including but not limited to vacuum processing methods well-known to those skilled in the art such as, e.g., thermal (co-)evaporation, organic vapor phase deposition (OVPD), and deposition by organic vapor jet printing (OVJP).

When preparing layers by means of liquid processing, the solutions including the components of the layers (i.e., with respect to the light-emitting layer B of the present invention, at least one host compound $H^B$ and, typically, at least one first TADF material $E^B$, at least one second TADF material $S^B$ and optionally one or more other host compounds $H^{B2}$) may further comprise a volatile organic solvent. Such volatile organic solvent may optionally be one selected from the group consisting of tetrahydrofuran, dioxane, chlorobenzene, diethylene glycol diethyl ether, 2-(2-ethoxyethoxy) ethanol, gamma-butyrolactone, N-methyl pyrrolidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). Also a combination of two or more solvents may be used. After applied in liquid state, the layer may subsequently be dried and/or hardened by any means of the art, exemplarily at ambient conditions, at increased temperature (e.g., about 50° C. or about 60° C.) or at diminished pressure.

Optionally, an organic electroluminescent device (e.g., an OLED) may exemplarily be an essentially white organic electroluminescent device or a blue organic electroluminescent device. Exemplarily such white organic electroluminescent device may comprise at least one (deep) blue emitter compound (e.g., TADF material $E^B$) and one or more emitter compounds emitting green and/or red light. Then, there may also optionally be energy transmittance between two or more compounds as described above.

The organic electroluminescent device as a whole may also form a thin layer of a thickness of not more than 5 mm, more than 2 mm, more than 1 mm, more than 0.5 mm, more than 0.25 mm, more than 100 μm, or more than 10 μm.

An organic electroluminescent device (e.g., an OLED) may be a small-sized (e.g., having a surface not larger than 5 $mm^2$, or even not larger than 1 $mm^2$), medium-sized (e.g., having a surface in the range of 0.5 to 20 $cm^2$), or a large-sized (e.g., having a surface larger than 20 $cm^2$). An organic electroluminescent device (e.g., an OLED) according to the present invention may optionally be used for generating screens, as large-area illuminating device, as luminescent wallpaper, luminescent window frame or glass, luminescent label, luminescent poser or flexible screen or display. Next to the common uses, an organic electroluminescent device (e.g., an OLED) may exemplarily also be used as luminescent films, "smart packaging" labels, or innovative design elements. Further they are usable for cell detection and examination (e.g., as bio labelling).

One of the main purposes of an organic electroluminescent device is the generation of light. Thus, the present invention further relates to a method for generating light of a desired wavelength range, comprising the step of providing an organic electroluminescent device according to any the present invention.

As laid out above, it was surprisingly found that the organic electroluminescent device of the present invention bears particularly good technical properties, such as longer lifetime, good quantum yields and desirable emission properties. In particular lifetime is significantly and unexpectedly increased.

Accordingly, a further aspect of the present invention relates to the use of a thermally activated delayed fluorescence (TADF) material $E^B$ in combination with at least one triplet-triplet annihilation (TTA) material $H^N$ and at least one organic near-range-charge-transfer (NRCT) emitter $S^B$ in a light-emitting layer B of an organic electroluminescent device, which is preferably characterized as described herein, for increasing the lifetime of the organic electroluminescent device.

Therefore, the present invention also relates to the use a triplet-triplet annihilation (TTA) material $H^N$ in combination with at least one thermally activated delayed fluorescence (TADF) material $E^B$ and at least one organic near-range-charge-transfer (NRCT) emitter $S^B$ in a light-emitting layer B of an organic electroluminescent device, which is preferably characterized as described herein, for increasing the lifetime of the organic electroluminescent device.

Therefore, the present invention also relates to the use an organic near-range-charge-transfer (NRCT) emitter $S^B$ in combination with at least one thermally activated delayed fluorescence (TADF) material $E^B$ and at least one triplet-triplet annihilation (TTA) material $H^N$ in a light-emitting layer B of an organic electroluminescent device, which is preferably characterized as described herein, for increasing the lifetime of the organic electroluminescent device.

In other words, the present invention also relates to a method for increasing lifetime of an organic electroluminescent device, said method comprising the step of combining in a light-emitting layer B:

a triplet-triplet annihilation (TTA) material $H^N$, a thermally activated delayed fluorescence (TADF) material $E^B$, an organic near-range-charge-transfer (NRCT) emitter $S^B$, and optionally one or more further materials such as those selected from the group consisting of one or more hosts and one or more solvents.

This step of combining the materials in a light-emitting layer B may be performed by any means such as mixing the components and/or co-depositing such.

As used herein, the term "lifetime" may be understood in the broadest sense as the operating time in which still high emission of light intensity is obtained. Preferably, lifetime may be characterized as the operating time in which the light emission intensity decreases to 95% of the initial light emission intensity (LT95). It will be understood that comparable values are obtainable when comparable conditions are used (for example emission at 15 $mA/cm^2$ at room temperature).

As used herein, the term "increasing lifetime" and analogous expressions may be understood in the broadest sense as extending the lifetime when light is emitted at comparable conditions (current density, light emission, temperature, etc). when compared to a comparable device wherein one of the materials in the light-emitting layer B (e.g., $H^N$, $E^B$, or $S^B$) is missing.

In a preferred, the lifetime (LT95) is increased by at least 10%, at least 20%, at least 30%, at least 40%, at least 50%, at least 75%, at least 1.5 fold, at least 2 fold, at least 5 fold, or even 10 fold or longer.

Accordingly, a further aspect of the present invention relates to a method for generating light of a desired wavelength range, comprising the steps of (i) providing an organic electroluminescent device according to the present invention; and (ii) applying an electrical current to said organic electroluminescent device.

A further aspect of the present invention relates to a process of making the organic electroluminescent devices by assembling the elements described above. The present invention also relates to a method for generating blue, green, yellow, orange, red or white light, in particular blue or white light by using said organic electroluminescent device.

The Examples and claims further illustrate the invention.

EXAMPLES

Cyclic Voltammetry

Cyclic voltammograms of solutions having concentration of $10^{-3}$ mol/l of the organic molecules in dichloromethane or a suitable solvent and a suitable supporting electrolyte (e.g. 0.1 mol/l of tetrabutylammonium hexafluorophosphate) are measured. The measurements are conducted at room temperature and under nitrogen atmosphere with a three-electrode assembly (Working and counter electrodes: Pt wire, reference electrode: Pt wire) and calibrated using $FeCp_2/FeCp_2^+$ as internal standard. HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration were used. The Turbomole program package was used for all calculations.

Photophysical Measurements

Sample pretreatment: Spin-coating

Apparatus: Spin150, SPS euro.

The sample concentration is 10 mg/ml, dissolved in a suitable solvent.

Program: 1) 3 s at 400 U/min; 20 s at 1000 U/min at 1000 Upm/s. 3) 10 s at 4000 U/min at 1000 Upm/s. After coating, the films are tried at 70° C. for 1 min.

Photoluminescence spectroscopy and TCSPC (Time-correlated single-photon counting) Steady-state emission spectroscopy is recorded using a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, puls duration: 1.1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) was done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates were determined using the software U6039-05 version 3.6.0. Emission maxima are given in nm, quantum yields 4) in % and CIE coordinates as x,y values.

PLQY was determined using the following protocol:

1) Quality assurance: Anthracene in ethanol (known concentration) is used as reference 2) Excitation wavelength: the absorption maximum of the organic molecule is determined and the molecule is excited using this wavelength 3) Measurement Quantum yields are measured for sample of solutions or films under nitrogen atmosphere. The yield is calculated using the equation:

$$\Phi_{PL} = \frac{n_{photon},\ emited}{n_{photon},\ \text{absorbed}} = \frac{\int \frac{\lambda}{hc}\left[Int_{emitted}^{sample}(\lambda) - Int_{absorbed}^{sample}(\lambda)\right]d\lambda}{\int \frac{\lambda}{hc}\left[Int_{emitted}^{reference}(\lambda) - Int_{absorbed}^{reference}(\lambda)\right]d\lambda}$$

wherein $n_{photon}$ denotes the photon count and Int. is the intensity.

Production and Characterization of Organic Electroluminescence Devices

Via vacuum-deposition methods OLED devices comprising organic molecules according to the invention can be produced. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT97 to the time point, at which the measured luminance decreased to 97% of the initial luminance etc.

Accelerated lifetime measurements are performed (e.g. applying increased current densities). Exemplarily LT80 values at 500 cd/m$^2$ are determined using the following equation:

$$LT80\left(500\frac{cd^2}{m^2}\right) = LT80(L_0)\left(\frac{L_0}{500\frac{cd^2}{m^2}}\right)^{1.6}$$

wherein $L_0$ denotes the initial luminance at the applied current density.

The values correspond to the average of several pixels (typically two to eight), the standard deviation between these pixels is given. Figures show the data series for one OLED pixel.

Example D1 and Comparative Examples C1

TADF1

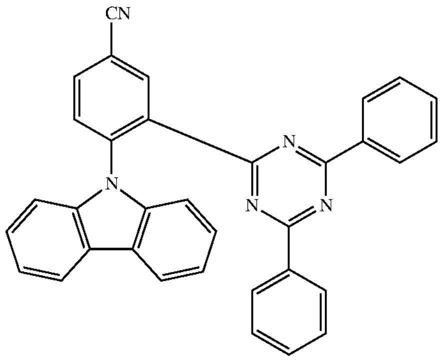

NRCT1

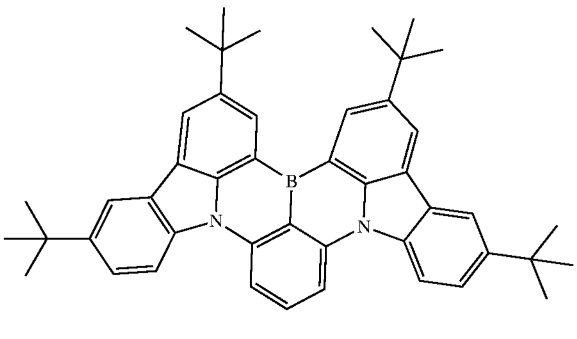

-continued

TTA1

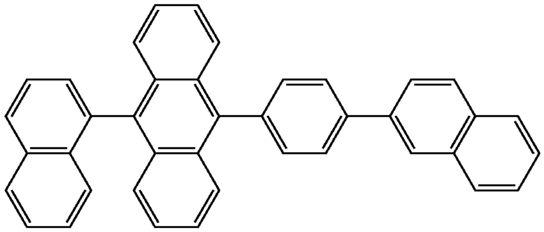

ET1

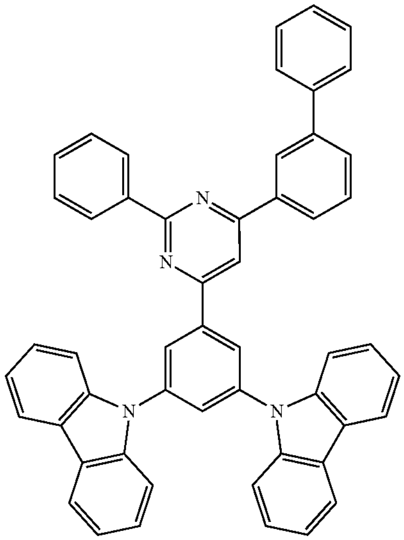

HT1

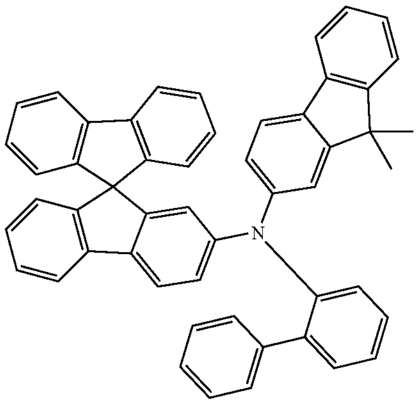

-continued

HT2

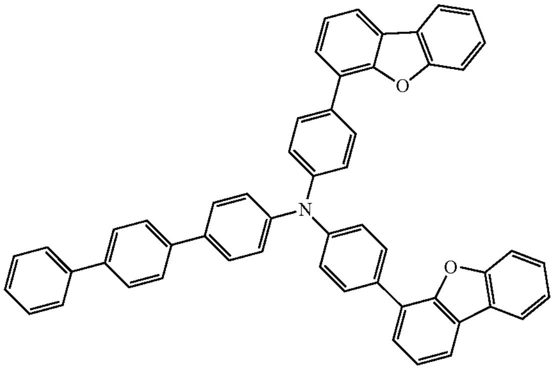

TABLE 1

| Properties of the materials. | | | | |
|---|---|---|---|---|
| | Example compound | S1 [eV] | T1 [eV] | $\lambda_{max}^{PMMA}$ [nm] |
| TTA material $H^N$ | TTA1 | 3.16 | | |
| TADF material $E^B$ | TADF1 | 2.87 | 2.80 | 476 |
| NRCT emitter $S^B$ | NRCT1 | 2.65 | 2.47 | 495 |

TABLE 2

Setup of an example organic electroluminescent device (OLED), wherein different ingredients were co-deposited in layer 5 (all percentages refer to weight percent)

| Layer | Thickness | D1 | C1 |
|---|---|---|---|
| 9 | 100 nm | Al | Al |
| 8 | 2 nm | Liq | Liq |
| 7 | 11 nm | NBPhen | NBPhen |
| 6 | 20 nm | ET1 | ET1 |
| 5 | 20 nm | TTA1 (92%): TADF1 (7%): NRCT1 (1%) | TTA1 (99%): NRCT1 (1%) |
| 4 | 10 nm | HT2 | HT2 |
| 3 | 50 nm | HT1 | HT1 |
| 2 | 7 nm | HAT-CN | HAT-CN |
| 1 | 50 nm | ITO | ITO |
| substrate | | glass | glass |

Device D1 yielded an external quantum efficiency (EQE) at 1000 cd/m$^2$ of 7.03±0.05% and an LT95 value at 15 mA/cm$^2$ of 11.2 h. The emission maximum is at 488 nm with a FWHM of 28 nm at 3.4 V.

Comparative device C1 comprise the same layer arrangement as device D1, except that the emitting layer of C1 contains only TTA1 and NRCT1.

Device C1 yielded an external quantum efficiency (EQE) at 1000 cd/m$^2$ of 9.18±0.08% and an LT95 value at 15 mA/cm$^2$ of 0.9 h. The emission maximum is at 488 nm with a FWHM of 28 nm at 3.4 V.

In comparison to device C1, device D1 shows an EQE at 1000 cd/m$^2$, which is reduced by a factor of 1.31, while the LT95 value at 15 mA/cm$^2$ is increased by a factor of 12.4, while for both devices, i.e. C1 and D1, the emission maximum and FWHM, measured at 3.4 V, remain unchanged.

Examples D2 and Comparative Example C2

TADF2

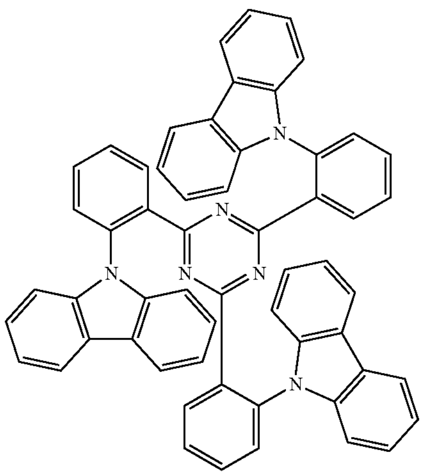

NRCT2

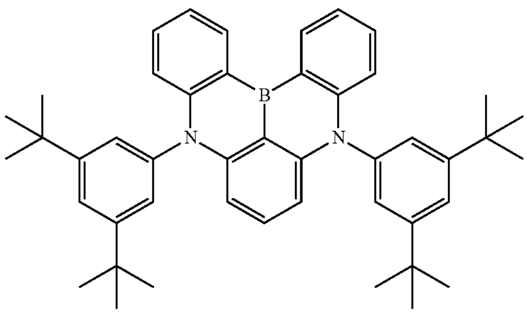

TABLE 3

| Properties of the materials. | | | | |
|---|---|---|---|---|
| | Example compound | S1 [eV] | T1 [eV] | $\lambda_{max}^{PMMA}$ [nm] |
| TTA material $H^N$ | TTA1 | 3.16 | | |
| TADF material $E^B$ | TADF2 | 2.90 | 2.86 | 468 |
| NRCT emitter $S^B$ | NRCT2 | 2.62 | 2.83 | 458 |

For TADF2, the S1, T1 and $I_{max}^{PMMA}$ values were measured at a concentration of 10% in PMMA.

TABLE 4

| Setup of an example organic electroluminescent device (OLED) (the percentages refer to weight percent) | | | |
|---|---|---|---|
| Layer | Thickness | D2 | C2 |
| 9 | 100 nm | Al | Al |
| 8 | 2 nm | Liq | Liq |
| 7 | 11 nm | NBPhen | NBPhen |
| 6 | 20 nm | ET1 | ET1 |
| 5 | 20 nm | TTA1 (92%): TADF2 (7%): NRCT2 (1%) | TTA1 (99%): NRCT2 (1%) |
| 4 | 10 nm | HT2 | HT2 |
| 3 | 50 nm | HT1 | HT1 |
| 2 | 7 nm | HAT-CN | HAT-CN |
| 1 | 50 nm | ITO | ITO |
| substrate | | glass | glass |

Device D2 yielded an external quantum efficiency (EQE) at 1000 cd/$m^2$ of 7.64±0.03% and an LT95 value at 15 mA/$cm^2$ of 16.2 h. The emission maximum is at 460 nm with a FWHM of 26 nm at 4.1 V.

Comparative device C2 comprise the same layer arrangement as device D2, except that the emitting layer of C2 contains only TTA1 and NRCT2.

Device C2 yielded an external quantum efficiency (EQE) at 1000 cd/$m^2$ of 9.81±0.02% and an LT95 value at 15 mA/$cm^2$ of 2.6 h. The emission maximum is at 460 nm with a FWHM of 26 nm at 4.2 V.

In comparison to device C2, device D2 shows an EQE at 1000 cd/$m^2$, which is reduced by a factor of 1.28, while the LT95 value at 15 mA/$cm^2$ is increased by a factor of 6.2, while for both devices, i.e. C2 and D2, the emission maximum and FWHM, measured at 4.1 V and 4.2 V, respectively, remain unchanged.

What is claimed is:

1. An organic electroluminescent device comprising a light-emitting layer B comprising:

(i) a first compound $H^N$, which has a lowermost excited singlet state energy level $S1^N$, a lowermost excited triplet state energy level $T1^N$, (ii) a second compound $E^B$, which has a lowermost excited singlet state energy level $S1^E$ and a lowermost excited triplet state energy level $T1^E$, and (iii) a third compound $S^B$, which has a lowermost excited singlet state energy level $S1^S$ and a lowermost excited triplet state energy level $T1^S$ wherein the relations expressed by the following formulas (1) to (3) apply:

$$S1^E > S1^S \quad (1)$$

$$S1^N > S1^S \quad (2)$$

$$S1^S < 2.95\ eV \quad (3),$$

wherein the second compound $E^B$ comprises a structure according to Formula I-TADF:

Formula I-TADF

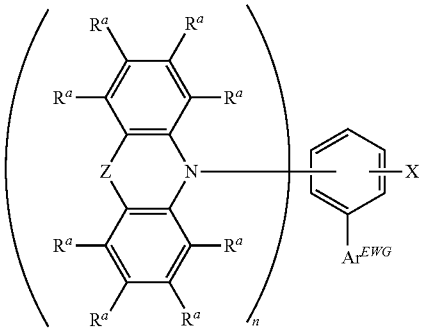

wherein n is 1 or 2;

X is selected from the group of $Ar^{EWG}$, CN or $CF_3$;

Z is selected from the group of a direct bond, $CR^3R^4$, $C{=}CR^3R^4$, C=O, $C{=}NR^3$, $NR^3$, O, $SiR^3R^4$, S, S(O) and $S(O)_2$;

$Ar^{EWG}$ is selected from one of Formulas IIa to IIk;

Formula IIa

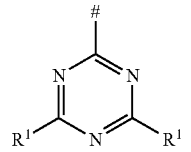

Formula IIb

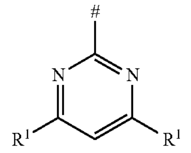

Formula IIc

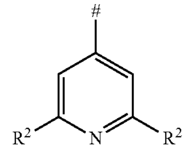

Formula IId

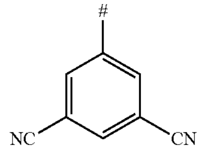

Formula IIe

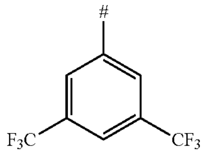

Formula IIf

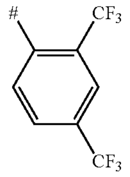

Formula IIg

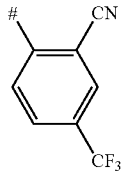

Formula IIh

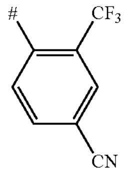

Formula IIj

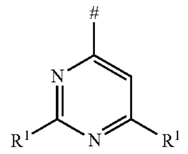

-continued

Formula IIi

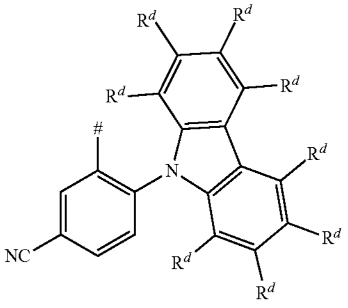

Formula IIk

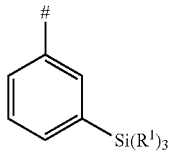

wherein # represents the binding site of the single bond linking $Ar^{EWG}$ to the substituted central phenyl ring of Formula I-TADF;

each of $R^1$ and $R^2$ is independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^6$;

each of $R^a$, $R^3$ and $R^4$ is independently from another selected from the group consisting of:

hydrogen, deuterium, $N(R^5)_2$, $OR^5$, $SR^5$, $Si(R^5)_3$, $CF_3$, CN, F, $C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C=C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$; and $C_6$-$C_{60}$-aryl, which is optionally substituted with one or more substituents $R^5$; $C_3$-$C_{57}$-heteroaryl which is optionally substituted with one or more substituents $R^5$;

$R^5$ is at each occurrence independently from another selected from the group consisting of hydrogen, deuterium, $N(R^6)_2$, $OR^6$, $SR^6$, $Si(R^6)_3$, $CF_3$, CN, F, $C_1$-$C_{40}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_6$-$C_{60}$-aryl, which is optionally substituted with one or more substituents $R^6$; and $C_3$-$C_{57}$-heteroaryl, which is optionally substituted with one or more substituents $R^6$;

$R^6$ is at each occurrence independently from another selected from the group consisting of hydrogen, deuterium, OPh, $CF_3$, CN, F, $C_1$-$C_5$-alkyl, wherein one or more hydrogen atoms are optionally, independently from each other substituted by deuterium, CN, $CF_3$, or F;

$C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$, and $N(C_3$-$C_{12}$-heteroaryl)($C_6$-$C_{18}$-aryl);

$R^d$ is at each occurrence independently from another selected from the group consisting of hydrogen, deuterium, $N(R^5)_2$, $OR^5$, $SR^5$, $Si(R^5)_3$, $CF_3$, CN, F, $C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$; and $C_6$-$C_{60}$-aryl, which is optionally substituted with one or more substituents $R^5$; $C_3$-$C_{57}$-heteroaryl which is optionally substituted with one or more substituents $R^5$;

wherein the substituents $R^a$, $R^3$, $R^4$ or $R^5$ independently from each other optionally may form a mono- or polycyclic, aliphatic, aromatic and/or benzo-fused ring system with one or more substituents $R^a$, $R^3$, $R^4$ or $R^5$ and wherein the one or more substituents $R^d$ independently from each other optionally may form a mono- or polycyclic, aliphatic, aromatic and/or benzo-fused ring system with one or more substituents $R^d$.

2. The organic electroluminescent device according to claim 1, wherein the second compound $E^B$ exhibits a $\Delta E_{ST}$ value, which corresponds to the energy difference between the lowermost excited singlet state (S1) and the lowermost excited triplet state (T1), of less than 0.4 eV; and wherein the third compound $S^B$ exhibits an emission with a full width at half maximum (FWHM) below 0.35 eV, in PMMA with 5% by weight of the third compound $S^B$.

3. The organic electroluminescent device according to claim 1, wherein said organic electroluminescent device is a device selected from the group consisting of an organic light emitting diode, a light emitting electrochemical cell, and a light-emitting transistor.

4. The organic electroluminescent device according to claim 1, wherein the second compound $E^B$ is an organic TADF material.

5. The organic electroluminescent device according to claim 1, wherein the device exhibits an emission maximum $\lambda_{max}(D)$ of 440 to 475 nm.

6. The organic electroluminescent device according to claim 1, wherein the light-emitting layer B comprises:

(i) 10-96.5% by weight of the first compound $H^N$;

(ii) 3-50% by weight of the second compound $E^B$; and (iii) 0.5-30% by weight of the third compound $S^B$; and (iv) optionally 0-74% by weight of one or more solvents.

7. The organic electroluminescent device according to claim 1, wherein the light-emitting layer B comprises:

(i) 40-74% by weight of the first compound $H^N$;

(ii) 15-30% by weight of the second compound $E^B$; and (iii) 1-5% by weight of the third compound $S^B$; and (iv) optionally 0-34% by weight of one or more solvents.

8. An organic electroluminescent device comprising a light-emitting layer B comprising:

(i) a first compound $H^N$, which has a lowermost excited singlet state energy level $S1^N$, a lowermost excited triplet state energy level $T1^N$, (ii) a second compound $E^B$, which has a lowermost excited singlet state energy level $S1^E$ and a lowermost excited triplet state energy level $T1^E$, and (iii) a third compound $S^B$, which has a lowermost excited singlet state energy level $S1^S$ and a lowermost excited triplet state energy level $T1^S$ wherein the relations expressed by the following formulas (1) to (3) apply:

$$S1^E > S1^S \quad (1)$$

$$S1^N > S1^S \quad (2)$$

$$S1^S < 2.95 \text{ eV} \quad (3),$$

wherein the first compound $H^N$ is an anthracene derivative.

9. The organic electroluminescent device according to claim 1, wherein the third compound $S^B$ comprises a structure according to Formula I-NRCT:

Formula I-NRCT

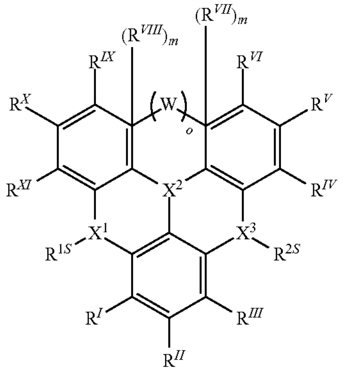

wherein o is 0 or 1;

m=1-o;

$X^1$ is N or B;

$X^2$ is N or B;

$X^3$ is N or B;

W is selected from the group consisting of $Si(R^{3S})_2$, $C(R^{3S})_2$ and $BR^{3S}$;

each of $R^{1S}$, $R^{2S}$ and $R^{3S}$ is independently selected from the group consisting of:

$C_1$-$C_5$-alkyl, which is optionally substituted with one or more substituents $R^{6S}$;

$C_6$-$C_{60}$-aryl, which is optionally substituted with one or more substituents $R^{6S}$; and $C_3$-$C_{57}$-heteroaryl, which is optionally substituted with one or more substituents $R^6S$;

each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently selected from the group consisting of:

hydrogen, deuterium, $N(R^{5S})_2$, $OR^{5S}$, $Si(R^{5S})_3$, $B(OR^{5S})_2$, $OSO_2R^{5S}$, $CF_3$, CN, halogen, $C_1$-$C_{40}$-alkyl, which is optionally substituted with one or more substituents $R^{5S}$ and wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C=O, C=S, C=Se, $C{=}NR^{5S}$, $P({=}O)(R^{5S})$, SO, $SO_2$, $NR^{5S}$, O, S or $CONR^{5S}$;

$C_1$-$C_{40}$-alkoxy, which is optionally substituted with one or more substituents $R^{5S}$ and wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C=O, C=S, C=Se, $C{=}NR^{5S}$, $P({=}O)(R^{5S})$, SO, $SO_2$, $NR^{5S}$, O, S or $CONR^{5S}$;

$C_1$-$C_{40}$-thioalkoxy, which is optionally substituted with one or more substituents $R^{5S}$ and wherein one or more non-adjacent $CH_2$-groups are each optionally substituted by $R^{5S}C{=}CR^{5S}$, C=C, $Si(R^{5S})_2$, $Ge(R^{5S})_2$, $Sn(R^{5S})_2$, C=O, C=S, C=Se, $C{=}NR^{5S}$, $P({=}O)(R^{5S})$, SO, $SO_2$, $NR^{5S}$, O, S or $CONR^{5S}$;

$C_2$-$C_{40}$-alkenyl, which is optionally substituted with one or more substituents $R^{5S}$ and wherein one or more non-adjacent $CH_2$-groups are each optionally substituted by $R^{5S}C{=}CR^{5S}$, C=C, $Si(R^{5S})_2$, $Ge(R^{5S})_2$, $Sn(R^{5S})_2$, C=O, C=S, C=Se, $C{=}NR^{5S}$, $P({=}O)(R^{5S})$, SO, $SO_2$, $NR^{5S}$, O, S or $CONR^{5S}$;

$C_2$-$C_{40}$-alkynyl, which is optionally substituted with one or more substituents $R^{5S}$ and wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C=O, C=S, C=Se, $C{=}NR^{5S}$, $P({=}O)(R^{5S})$, SO, $SO_2$, $NR^{5S}$, O, S or $CONR^{5S}$;

$C_6$-$C_{60}$-aryl, which is optionally substituted with one or more substituents $R^{5S}$; and $C_3$-$C_{57}$-heteroaryl, which is optionally substituted with one or more substituents $R^{5S}$;

$R^{5S}$ is at each occurrence independently from another selected from the group consisting of: hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl$)(C_6$-$C_{18}$-aryl);

$R^{6S}$ is at each occurrence independently from another selected from the group consisting of hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl) $(C_6$-$C_{18}$-aryl);

wherein two or more of the substituents selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ that are positioned adjacent to another may optionally each form a ring system with another, wherein the ring system is selected from the group consisting of mono- or polycyclic ring system, aliphatic ring system, aromatic ring system, benzo-fused ring system and combinations thereof; and wherein at least one of $X^1$, $X^2$ and $X^3$ is B and at least one of $X^1$, $X^2$ and $X^3$ is N.

10. The organic electroluminescent device according to claim 9, wherein $X^1$ and $X^3$ each are N and $X^2$ is B.

11. The organic electroluminescent device according to claim 9, wherein $X^1$ and $X^3$ each are B and $X^2$ is N.

12. The organic electroluminescent device according to claim 9, wherein o=0.

13. The organic electroluminescent device according to claim 9, wherein each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently selected from the group consisting of:

hydrogen, deuterium, halogen, Me, $^i$Pr, $^t$Bu, CN, $CF_3$,

Ph, which is optionally substituted with one or more substituents independently selected from the group consisting of Me, $^i$Pr, $^t$Bu, CN, $CF_3$, and Ph, pyridinyl, which is optionally substituted with one or more substituents independently selected from the group consisting of Me, $^i$Pr, $^t$Bu, CN, $CF_3$, and Ph, pyrimidinyl, which is optionally substituted with one or more substituents independently selected from the group consisting of Me, $^i$Pr, $^t$Bu, CN, $CF_3$, and Ph, carbazolyl, which is optionally substituted with one or more substituents independently selected from the group consisting of Me, $^i$Pr, $^t$Bu, CN, $CF_3$, and Ph, triazinyl, which is optionally substituted with one or more substituents independently selected from the group consisting of Me, $^i$Pr, $^t$Bu, CN, $CF_3$, and Ph, and $N(Ph)_2$; and $R^{1S}$ and $R^{2S}$ are each independently selected from the group consisting of $C_1$-$C_5$-alkyl, which is optionally substituted with one or more substituents $R^{6S}$;

$C_6$-$C_{30}$-aryl, which is optionally substituted with one or more substituents $R^{6S}$; and $C_3$-$C_{30}$-heteroaryl, which is optionally substituted with one or more substituents $R^{6S}$.

14. The organic electroluminescent device according to claim 1, wherein the device exhibits an emission maximum $\lambda_{max}$(D) of 450 to 470 nm.

15. The organic electroluminescent device according to claim 1, wherein the device exhibits a CIEx color coordinate of between 0.02 and 0.30 and/or a CIEy color coordinate of between 0.00 and 0.45.

16. The organic electroluminescent device according to claim 1, wherein the third compound $S^B$ is an organic material.

17. The organic electroluminescent device according to claim 8, wherein the device exhibits a CIEx color coordinate of between 0.02 and 0.30 and/or a CIEy color coordinate of between 0.00 and 0.45.

18. An organic electroluminescent device comprising a light-emitting layer B comprising:

(i) a first compound $H^N$, which has a lowermost excited singlet state energy level $S1^N$, a lowermost excited triplet state energy level $T1^N$, (ii) a second compound $E^B$, which has a lowermost excited singlet state energy level $S1^E$ and a lowermost excited triplet state energy level $T1^E$, and (iii) a third compound $S^B$, which has a lowermost excited singlet state energy level $S1^S$ and a lowermost excited triplet state energy level $T1^S$ wherein the relations expressed by the following formulas (1) to (3) apply:

$$S1^E>S1^S \quad (1)$$

$$S1^N>S1^S \quad (2)$$

$$S1^S<2.95\text{ eV} \quad (3),$$

wherein the second compound $E^B$ is a carbazole derivative.

19. The organic electroluminescent device according to claim 18, wherein the device exhibits a CIEx color coordinate of between 0.02 and 0.30 and/or a CIEy color coordinate of between 0.00 and 0.45.

* * * * *